US009086627B2

(12) United States Patent
Kato et al.

(10) Patent No.: US 9,086,627 B2
(45) Date of Patent: Jul. 21, 2015

(54) PATTERN FORMING METHOD, MULTI-LAYERED RESIST PATTERN, MULTI-LAYERED FILM FOR ORGANIC SOLVENT DEVELOPMENT, MANUFACTURING METHOD OF ELECTRONIC DEVICE, AND ELECTRONIC DEVICE

(71) Applicant: FUJIFILM Corporation, Tokyo (JP)

(72) Inventors: Keita Kato, Shizuoka (JP); Michihiro Shirakawa, Shizuoka (JP); Tadahiro Odani, Shizuoka (JP); Atsushi Nakamura, Shizuoka (JP); Hidenori Takahashi, Shizuoka (JP); Kaoru Iwato, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 14/257,314

(22) Filed: Apr. 21, 2014

(65) Prior Publication Data

US 2014/0227637 A1 Aug. 14, 2014

Related U.S. Application Data

(63) Continuation of application No. PCT/JP2012/078264, filed on Oct. 25, 2012.

(30) Foreign Application Priority Data

Oct. 27, 2011 (JP) ................................ 2011-236456

(51) Int. Cl.

| | |
|---|---|
| ***G03F 7/26*** | (2006.01) |
| ***G03F 7/09*** | (2006.01) |
| ***G03F 7/095*** | (2006.01) |
| ***G03F 7/039*** | (2006.01) |
| ***G03F 7/20*** | (2006.01) |
| ***G03F 7/32*** | (2006.01) |

(52) U.S. Cl.

CPC .............. *G03F 7/094* (2013.01); *G03F 7/0392* (2013.01); *G03F 7/0397* (2013.01); *G03F 7/091* (2013.01); *G03F 7/095* (2013.01); *G03F 7/20* (2013.01); *G03F 7/2041* (2013.01); *G03F 7/325* (2013.01)

(58) Field of Classification Search

CPC ......... G03F 7/095; G03F 7/40; G03F 7/0955; G03F 7/00; G03F 7/2024; G03F 7/26; G03F 7/091; G03F 7/203; G03F 7/2053; G03F 7/38; G03F 7/094; H01L 21/0274; H01L 21/312; H01L 21/31144; H01L 21/0273; H05K 3/0082; H05K 2203/0577; Y10S 430/128; Y10S 438/948; B41C 2210/02; B41C 2210/04; B41C 2210/06; B41C 2210/12; G02B 5/1857

USPC ................................. 430/311, 325, 331, 322

See application file for complete search history.

(56) References Cited

U.S. PATENT DOCUMENTS

| | | | | |
|---|---|---|---|---|
| 6,054,254 | A | 4/2000 | Sato et al. | |
| 2003/0215736 | A1 * | 11/2003 | Oberlander et al. | 430/270.1 |
| 2007/0238052 | A1 | 10/2007 | Zampini et al. | |
| 2009/0042147 | A1 | 2/2009 | Tsubaki | |
| 2011/0003250 | A1 | 1/2011 | Amara et al. | |
| 2011/0020755 | A1 | 1/2011 | Tsubaki | |
| 2012/0088194 | A1 | 4/2012 | Tsubaki | |
| 2012/0251950 | A1 | 10/2012 | Horiguchi et al. | |
| 2013/0005150 | A1 | 1/2013 | Ogihara et al. | |
| 2013/0045601 | A1 | 2/2013 | Ogihara et al. | |

FOREIGN PATENT DOCUMENTS

| | | | |
|---|---|---|---|
| JP | 11-72925 | A | 3/1999 |
| JP | 2007-293332 | A | 11/2007 |
| JP | 2008-116926 | A | 5/2008 |
| JP | 2008-309878 | A | 12/2008 |
| JP | 2010-113035 | A | 5/2010 |
| JP | 2011-53652 | A | 3/2011 |
| JP | 2012-53307 | A | 3/2012 |
| JP | 2013-033187 | A | 2/2013 |
| JP | 2013-041140 | A | 2/2013 |
| WO | 2011/074433 | A1 | 6/2011 |

OTHER PUBLICATIONS

International Search Report (PCT/ISA/210), dated Nov. 27, 2012, issued by the International Searching Authority in counterpart International Patent Application No. PCT/JP2012/078264.
Written Opinion (PCT/ISA/237), dated Nov. 27, 2012, issued by the International Searching Authority in counterpart International Patent Application No. PCT/JP2012/078264.
Office Action dated May 7, 2015, in counterpart Japanese Application No. 2011-236456.

* cited by examiner

*Primary Examiner* — Caleen Sullivan
(74) *Attorney, Agent, or Firm* — Sughrue Mion, PLLC

(57) ABSTRACT

A pattern forming method contains: (i) a step of forming a bottom anti-reflective coating on a substrate by using a first resin composition (I), (ii) a step of forming a resist film on the bottom anti-reflective coating by using a second resin composition (II), (iii) a step of exposing a multi-layered film having the bottom anti-reflective coating and the resist film, and (iv) a step of developing the bottom anti-reflective coating and the resist film in the exposed multi-layered film by using an organic solvent-containing developer to form a negative pattern.

19 Claims, No Drawings

PATTERN FORMING METHOD, MULTI-LAYERED RESIST PATTERN, MULTI-LAYERED FILM FOR ORGANIC SOLVENT DEVELOPMENT, MANUFACTURING METHOD OF ELECTRONIC DEVICE, AND ELECTRONIC DEVICE

CROSS REFERENCE TO RELATED APPLICATION

This is a continuation of International Application No. PCT/JP2012/078264 filed on Oct. 25, 2012, and claims priority from Japanese Patent Application No. 2011-236456 filed on Oct. 27, 2011, the entire disclosures of which are incorporated therein by reference.

TECHNICAL FIELD

The present invention relates to a pattern forming method suitably used for the process of producing a semiconductor such as IC or the production of a liquid crystal device or a circuit board such as thermal head and further for the lithography in other photo-fabrication processes, a multi-layered resist pattern, a multi-layered film for organic solvent development, a manufacturing method of an electronic device, and an electronic device. In particular, the present invention relates to a pattern forming method suitably used for exposure by an ArF or KrF exposure apparatus, a multi-layered resist pattern, a multi-layered film for organic solvent development, a manufacturing method of an electronic device, and an electronic device.

BACKGROUND ART

Since the advent of a resist for KrF excimer laser (248 nm), an image forming method called chemical amplification is used as an image forming method for a resist so as to compensate for sensitivity reduction caused by light absorption. For example, the image forming method by positive chemical amplification is an image forming method of decomposing an acid generator in the exposed area upon exposure to excimer laser, electron beam, extreme-ultraviolet light or the like to produce an acid, converting an alkali-insoluble group into an alkali-soluble group by using the generated acid as a reaction catalyst in the baking after exposure (PEB: Post Exposure Bake), and removing the exposed area with an alkali developer.

As for the alkali developer used in the method above, various alkali developers have been proposed, but an aqueous alkali developer of 2.38 mass % TMAH (an aqueous tetramethylammonium hydroxide solution) is being used for general purposes.

Also, as an application of the above-described resist technology, a microfabrication application such as application to ion implantation employed when implanting an ion (charge injection), which is one step of the logic device fabrication or the like, is expanding.

In the case of using a resist composition for the application to ion implantation, the resist composition is sometimes coated, exposed and developed on a substrate previously subjected to patterning (hereinafter, referred to as a stepped substrate), and microfabrication on a stepped substrate is required.

However, the effect of standing wave due to reflection of exposure light from the substrate or the diffused reflection of exposure light due to the stepped portion of a stepped substrate may impair the profile of the pattern obtained.

To solve such a problem, a method of providing a Bottom Anti-Reflective Coating (BARC) between the resist film and the substrate is known, but when a bottom anti-reflective coating is provided, particularly in the case of using the resist composition for the application to ion implantation, a step of removing the bottom anti-reflective coating by etching is required before ion implantation and the production cost rises.

Under these circumstances, in recent years, a Developable Bottom Anti-Reflective Coating (DBARC) capable of being removed at the same time with the resist film in the development step is known (see, for example, JP-A-2011-53652 (the term "JP-A" as used herein means an "unexamined published Japanese patent application"), JP-A-2010-113035, and JP-A-2008-116926). Use of DBARC makes it possible to move on to the ion implantation step without performing the step of etching the bottom anti-reflective coating.

However, the conventional pattern forming method using DBARC has a problem that scum is liable to remain on the substrate after development.

Also, in the production of a semiconductor device or the like, formation of patterns having various profiles such as line, trench and hole is required, but in the case of forming particularly a pattern having a fine space (for example, a fine pattern having a trench or hole profile) by the conventional pattern forming method using DBARC, a good pattern profile can be hardly obtained.

SUMMARY OF INVENTION

Considering the above-described problems, an object of the present invention is to provide a pattern forming method ensuring that even in the case of forming a pattern having a fine space, scum on the substrate can be reduced and a pattern having a good cross-sectional profile can formed, a multi-layered resist pattern formed by the method, a multi-layered film for organic solvent development suitably used in the pattern forming method, a manufacturing method of an electronic device, and an electronic device.

As a result of intensive studies to obtain the above-described object, the present inventors have accomplished the present invention.

That is, the present invention has the following configurations.

[1] A pattern forming method comprising:

(i) a step of forming a bottom anti-reflective coating on a substrate by using a first resin composition (I), (ii) a step of forming a resist film on the bottom anti-reflective coating by using a second resin composition (II), (iii) a step of exposing a multi-layered film having the bottom anti-reflective coating and the resist film, and (iv) a step of developing the bottom anti-reflective coating and the resist film in the exposed multi-layered film by using an organic solvent-containing developer to form a negative pattern, wherein the first resin composition (I) contains a first resin capable of increasing the polarity by the action of an acid to decrease the solubility for an organic solvent-containing developer, the second resin composition (II) contains a second resin capable of increasing the polarity by the action of an acid to decrease the solubility for an organic solvent-containing developer, at least either one of the first resin composition (I) and the second resin composition (II) contains a compound capable of generating an acid upon irradiation with an actinic ray or radiation, and the first resin in the first resin composition (I) is a resin containing a repeating unit having an aromatic ring or the first resin composition (I) further contains an aromatic compound.

[2] The pattern forming method as described in [1], wherein the content of a crosslinking agent selected from the group consisting of a crosslinking agent capable of crosslinking the first resin by the action of an acid to form a crosslinked product and a crosslinking agent capable of crosslinking to another crosslinking agent by the action of an acid to form a crosslinked product is 1 mass % or less based on the entire solid content of the first resin composition (I).

[3] The pattern forming method as described in [1] or [2], wherein the first resin composition (I) does not contain a crosslinking agent selected from the group consisting of a crosslinking agent capable of crosslinking the first resin by the action of an acid to form a crosslinked product and a crosslinking agent capable of crosslinking to another crosslinking agent by the action of an acid to form a crosslinked product.

[4] The pattern forming method as described in any one of [1] to [3], wherein the weight average molecular weight of the first resin is from 1,000 to 200,000.

[5] The pattern forming method as described in any one of [1] to [4], wherein the first resin composition (I) does not contain the compound capable of generating an acid upon irradiation with an actinic ray or radiation.

[6] The pattern forming method as described in any one of [1] to [5], wherein the exposure in the step (iii) is exposure to an ArF excimer laser.

[7] The pattern forming method as described in any one of [1] to [5], wherein the exposure in the step (iii) is exposure to a KrF excimer laser, and the first resin in the first resin composition (I) is a resin containing a repeating unit having a polycyclic aromatic group or the first resin composition (I) further contains a polycyclic aromatic compound.

[8] The pattern forming method as described in any one of [1] to [7], wherein the organic solvent-containing developer is a developer containing at least one kind of an organic solvent selected from a ketone-based solvent, an ester-based solvent, an alcohol-based solvent, an amide-based solvent and an ether-based solvent.

[9] A multi-layered resist pattern formed by the pattern forming method as described in any one of [1] to [8].

[10] A multi-layered film for organic solvent development, comprising:

a bottom anti-reflective coating formed on a substrate by using a first resin composition (I), and a resist film formed on the bottom anti-reflective coating by using a second resin composition (II), wherein the first resin composition (I) contains a first resin capable of increasing the polarity by the action of an acid to decrease the solubility for an organic solvent-containing developer, the second resin composition (II) contains a second resin capable of increasing the polarity by the action of an acid to decrease the solubility for an organic solvent-containing developer, at least either one of the first resin composition (I) and the second resin composition (II) contains a compound capable of generating an acid upon irradiation with an actinic ray or radiation, and the first resin in the first resin composition (I) is a resin containing a repeating unit having an aromatic ring or the first resin composition (I) further contains an aromatic compound.

[11] A manufacturing method of an electronic device, comprising the pattern forming method as described in any one of [1] to [8].

[12] An electronic device manufactured by the manufacturing method of an electronic device as described in [11].

The present invention preferably further includes the following configurations.

[13] The pattern forming method as described in any one of [1] to [8], further comprising:

a heating step at least either before the exposure step (iii) or after the exposure step (iii) but before the development step (iv).

[14] The pattern forming method as described in any one of [1] to [8] and [13], wherein at least either one of the first resin composition (I) and the second resin composition (II) contains a basic compound.

[15] The pattern forming method as described in any one of [1] to [8], [13] and [14], wherein the solvent contained in the second resin composition (II) is an alcohol not having an oxygen atom except for a hydroxyl group, an ester compound having a carbon number of 7 or more, or an ether compound not having an oxygen atom except for an ether bond.

According to the present invention, a pattern forming method ensuring that even in the case of forming a pattern having a fine space, scum on the substrate can be reduced and a pattern having a good cross-sectional profile can formed, a multi-layered resist pattern formed by the method, a multi-layered film for organic solvent development suitably used in the pattern forming method, a manufacturing method of an electronic device, and an electronic device can be provided.

DESCRIPTION OF EMBODIMENTS

The mode for carrying out the present invention is described in detail below.

In the description of the present invention, when a group (atomic group) is denoted without specifying whether substituted or unsubstituted, the group encompasses both a group having no substituent and a group having a substituent. For example, "an alkyl group" encompasses not only an alkyl group having no substituent (unsubstituted alkyl group) but also an alkyl group having a substituent (substituted alkyl group).

In the description of the present invention, the term "actinic ray" or "radiation" means, for example, a bright line spectrum of mercury lamp, a far ultraviolet ray typified by excimer laser, an extreme-ultraviolet ray (EUV light), an X-ray or an electron beam (EB). Also, in the present invention, the "light" means an actinic ray or radiation.

In the description of the present invention, unless otherwise indicated, the "exposure" encompasses not only exposure to a mercury lamp, a far ultraviolet ray typified by excimer laser, an extreme-ultraviolet ray, an X-ray, EUV light or the like but also lithography with a particle beam such as electron beam and ion beam.

The pattern forming method of the present invention is a pattern forming method comprising:

(i) a step of forming a bottom anti-reflective coating on a substrate by using a first resin composition (I), (ii) a step of forming a resist film on the bottom anti-reflective coating by using a second resin composition (II), (iii) a step of exposing a multi-layered film having the bottom anti-reflective coating and the resist film, and (iv) a step of developing the bottom anti-reflective coating and the resist film in the exposed multi-layered film by using an organic solvent-containing developer to form a negative pattern, wherein the first resin composition (I) contains a first resin capable of increasing the polarity by the action of an acid to decrease the solubility for an organic solvent-containing developer, the second resin composition (II) contains a second resin capable of increasing the polarity by the action of an acid to decrease the solubility for an organic solvent-containing developer, at least either one of the first resin composition (I) and the second resin composition (II) contains a compound capable of generating an acid upon irradiation with an actinic ray or radiation, and the first resin in the first resin composition (I) is a resin containing a repeating unit having an aromatic ring or the first resin composition (I) further contains an aromatic compound.

That is, in the present invention, the "negative pattern" has a pattern part formed by development of developing a bottom anti-reflective coating and a pattern part formed by development of developing a resist film.

The reason why according to the pattern forming method of the present invention, scum on the substrate can be reduced and a good pattern can be formed in the negative pattern formation by an organic solvent-containing developer is not clearly known but presumed as follows.

First, in the case of performing pattern formation by a positive image forming method using an alkali developer, the exposed area must be removed with an alkali developer. However, the resist film constituting the exposed area uses an organic material as the main component and therefore, its affinity for an alkali developer is not sufficiently high. On the other hand, in the negative image forming method using an organic solvent-containing developer (organic developer) employed in the present invention, the unexposed area is removed with an organic developer and the unexposed area of the resist film using an organic material as the main component has high affinity for an organic developer. This is considered to make it possible to unfailingly remove the unexposed area in the development step and reduce scum on the substrate.

Also, in the pattern forming method of the present invention, the first resin in the first resin composition (I) is a resin containing a repeating unit having an aromatic ring, or the first resin composition (I) further contains an aromatic compound.

The aromatic ring in the resin or aromatic compound above has a function capable of absorbing exposure light and therefore, the exposure light can be prevented from being reflected on the substrate. In turn, as compared with the case of falling under neither "the first resin in the first resin composition (I) is a resin containing a repeating unit having an aromatic ring" nor "the first resin composition (I) further contains an aromatic compound", the effect of standing wave due to reflection of exposure light from the substrate or the diffused reflection of exposure light due to the stepped portion in a stepped substrate can be reduced, and this is considered to bring about realization of an excellent cross-sectional profile of the pattern.

Furthermore, the fact that, as described above, the unexposed area can be unfailingly removed with an organic solvent is considered to also contribute to improving the cross-sectional profile of the pattern.

In the pattern forming method of the present invention, the developer is preferably a developer containing at least one kind of an organic solvent selected from the group consisting of a ketone-based solvent, an ester-based solvent, an alcohol-based solvent, an amide-based solvent and an ether-based solvent.

The pattern forming method of the present invention preferably further comprises a step of performing rinsing by using an organic solvent-containing rinsing solution.

The rinsing solution is preferably a rinsing solution containing at least one kind of an organic solvent selected from the group consisting of a hydrocarbon-based solvent, a ketone-based solvent, an ester-based solvent, an alcohol-based solvent, an amide-based solvent and an ether-based solvent.

The pattern forming method of the present invention may further comprise a step of performing development by using an alkali developer.

The present invention also relates to a multi-layered resist pattern formed by the pattern forming method of the present invention.

The present invention also relates to a multi-layered film for organic solvent development, comprising a bottom anti-reflective coating formed on a substrate by using a first resin composition (I), and a resist film formed on the bottom anti-reflective coating by using a second resin composition (II), wherein the first resin composition (I) contains a first resin capable of increasing the polarity by the action of an acid to decrease the solubility for an organic solvent-containing developer, the second resin composition (II) contains a second resin capable of increasing the polarity by the action of an acid to decrease the solubility for an organic solvent-containing developer, at least either one of the first resin composition (I) and the second resin composition (II) contains a compound capable of generating an acid upon irradiation with an actinic ray or radiation, and the first resin in the first resin composition (I) is a resin containing a repeating unit having an aromatic ring or the first resin composition (I) further contains an aromatic compound.

The term "for organic solvent development" as used herein means an application where the composition is subjected to at least a step of performing development by using an organic solvent-containing developer.

The resin compositions (I) and (II) for use in the present invention are described below.

The resin compositions (I) and (II) according to the present invention are used for negative development (development where the solubility for developer is decreased upon exposure, as a result, the exposed area remains as a pattern and the unexposed area is removed).

[1] (a) Resin Capable of Increasing the Polarity by the Action of an Acid to Decrease the Solubility for an Organic Solvent-Containing Developer As described above, the first resin composition (I) contains a first resin capable of increasing the polarity by the action of an acid to decrease the solubility for an organic solvent-containing developer, and the second resin composition (II) contains a second resin capable of increasing the polarity by the action of an acid to decrease the solubility for an organic solvent-containing developer.

Each of the resin compositions (I) and (II) for use in the present invention may be a so-called chemical amplification actinic ray-sensitive or radiation-sensitive resin composition, that is, a resin composition containing the above-described resin and the later-described compound capable of generating an acid upon irradiation with an actinic ray or radiation. The actinic ray-sensitive or radiation-sensitive resin composition may contain a component other than the resin and the later-described compound capable of generating an acid upon irradiation with an actinic ray or radiation. This component is described later.

In the present invention, the first resin contained in the resin composition (I) is preferably different from the second resin contained in the resin composition (II).

Preferred embodiments of the present invention include:

an embodiment where both the first resin and the second resin are a resin of the later-described preferred resin embodiment (1);

an embodiment where both the first resin and the second resin are a resin of the later-described preferred resin embodiment (2); and at least one of the first resin and the second resin is a resin of the later-described preferred resin embodiment (1) and another one is a resin of the later-described preferred resin embodiment (2), but an embodiment where the first resin is a resin of the later-described preferred resin embodiment (1) and the second resin is a resin of the later-described preferred resin embodiment (2) is preferred.

The present invention is not limited thereto, and the first resin and the second resin (sometimes, these are collectively referred to simply as "resin (A)") may be a resin constructed by appropriately selecting the respective repeating units described later. For example, the resin (A) may be a copolymer of a repeating unit (for example, the later-described repeating unit having an aromatic ring) described later in [Preferred Resin Embodiment (1)] and a repeating unit (for example, the later-described repeating unit represented by formula (AAI)) described later in [Preferred Resin Embodiment (2)].

However, in the present invention, as described above, the first resin in the first resin composition (I) is a resin containing a repeating unit having an aromatic ring or the first resin composition (I) further contains an aromatic compound.

The resin (A) is a resin capable of increasing the polarity by the action of an acid to decrease the solubility for an organic solvent-containing developer and is preferably a resin (hereinafter, sometimes simply referred to as "acid-decomposable resin") having a group (hereinafter, sometimes simply referred to as "acid-decomposable group) capable of decomposing by the action of an acid to produce a polar group.

The resin (A) contained in the resin composition (I) or (II) for use in the present invention includes, for example, a resin having an acid-decomposable group in either one or both of the main chain and the side chain of the resin.

Incidentally, the resin (A) is also a resin capable of increasing the polarity by the action of an acid to increase the solubility for an alkali developer.

[Repeating Unit Having Acid-Decomposable Group]

The acid-decomposable group preferably has a structure where a polar group is protected by a group capable of decomposing and leaving by the action of an acid.

The polar group is not particularly limited as long as it is a group capable of being sparingly solubilized or insolubilized in an organic solvent-containing developer, but examples thereof include a carboxyl group, an acidic group (a group capable of dissociating in an aqueous 2.38 mass % tetramethylammonium hydroxide solution which has been conventionally used as the developer for a resist) such as sulfonic acid group, and a hydroxyl group (e.g., alcoholic hydroxyl group, phenolic hydroxyl group).

The alcoholic hydroxyl group is a hydroxyl group bonded to a hydrocarbon group and indicates a hydroxyl group except for a hydroxyl group directly bonded on an aromatic ring (phenolic hydroxyl group), and an aliphatic alcohol as an acid group, which is substituted with an electron-withdrawing group such as fluorine atom at the α-position (for example, a fluorinated alcohol group (e.g., hexafluoroisopropanol)), is excluded. The alcoholic hydroxyl group is preferably a hydroxyl group having a pKa of 12 to 20.

The group preferred as the acid-decomposable group is a group where a hydrogen atom of the group above is substituted for by a group capable of leaving by the action of an acid.

Examples of the group capable of leaving by the action of an acid include $-C(R_{36})(R_{37})(R_{38})$, $-C(R_{36})(R_{37})(OR_{39})$ and $-C(R_{01})(R_{02})(OR_{39})$.

In the formulae, each of $R_{36}$ to $R_{39}$ independently represents an alkyl group, a cycloalkyl group, an aryl group, an aralkyl group or an alkenyl group. $R_{36}$ and $R_{37}$ may combine with each other to form a ring.

Each of $R_{01}$ and $R_{02}$ independently represents a hydrogen atom, an alkyl group, a cycloalkyl group, an aryl group, an aralkyl group or an alkenyl group.

The alkyl group of $R_{36}$ to $R_{39}$, $R_{01}$ and $R_{02}$ is preferably an alkyl group having a carbon number of 1 to 8, and examples thereof include a methyl group, an ethyl group, a propyl group, an n-butyl group, a sec-butyl group, a hexyl group and an octyl group.

The cycloalkyl group of $R_{36}$ to $R_{39}$, $R_{01}$ and $R_{02}$ may be monocyclic or polycyclic. The monocyclic cycloalkyl group is preferably a cycloalkyl group having a carbon number of 3 to 8, and examples thereof include a cyclopropyl group, a cyclobutyl group, a cyclopentyl group, a cyclohexyl group, and a cyclooctyl group. The polycyclic cycloalkyl group is preferably a cycloalkyl group having a carbon number of 6 to 20, and examples thereof include an adamantyl group, a norbornyl group, an isoboronyl group, a camphanyl group, a dicyclopentyl group, an α-pinel group, a tricyclodecanyl group, a tetracyclododecyl group, and an androstanyl group. Incidentally, at least one carbon atom in the cycloalkyl group may be substituted with a heteroatom such as oxygen atom.

The aryl group of $R_{36}$ to $R_{39}$, $R_{01}$ and $R_{02}$ is preferably an aryl group having a carbon number of 6 to 10, and examples thereof include a phenyl group, a naphthyl group, and an anthryl group.

The aralkyl group of $R_{36}$ to $R_{39}$, $R_{01}$ and $R_{02}$ is preferably an aralkyl group having a carbon number of 7 to 12, and examples thereof include a benzyl group, a phenethyl group, and a naphthylmethyl group.

The alkenyl group of $R_{36}$ to $R_{39}$, $R_{01}$ and $R_{02}$ is preferably an alkenyl group having a carbon number of 2 to 8, and examples thereof include a vinyl group, an allyl group, a butenyl group, and a cyclohexenyl group.

The ring formed by combining $R_{36}$ and $R_{37}$ is preferably a cycloalkyl group (monocyclic or polycyclic). The cycloalkyl group is preferably a monocyclic cycloalkyl group such as cyclopentyl group and cyclohexyl group, or a polycyclic cycloalkyl group such as norbornyl group, tetracyclodecanyl group, tetracyclododecanyl group and adamantyl group, more preferably a monocyclic cycloalkyl group having a carbon number of 5 to 6, still more preferably a monocyclic cycloalkyl group having a carbon number of 5.

[Preferred Resin Embodiment (1)]

In one preferred embodiment of the present invention, the resin (A) is a resin of the preferred resin embodiment (1) described below.

The resin of the preferred resin embodiment (1) is preferably a resin containing a repeating unit having an aromatic ring. The repeating unit having an aromatic ring includes, for example, the later-described repeating unit represented by formula (VI) and the later-described repeating unit having an aromatic group.

The resin of the preferred resin embodiment (1) is preferably a resin composed of at least one repeating unit selected from the group consisting of a repeating unit represented by the following formula (III), the later-descried repeating unit represented by formula (VI), and the later-described repeating unit having an aromatic group, and, if desired, at least one repeating unit selected from respective repeating units described later in [Other Repeating Units].

The repeating unit having an acid-decomposable group, which is contained in the resin (A) as a resin of the preferred embodiment (1), is preferably a repeating unit represented by the following formula (III):

(III)

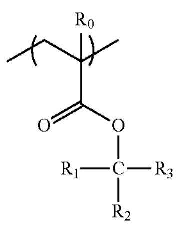

In formula (III), $R_0$ represents a hydrogen atom or a linear or branched alkyl group.

Each of $R_1$ to $R_3$ independently represents a linear or branched alkyl group or a monocyclic or polycyclic cycloalkyl group.

Two members out of $R_1$ to $R_3$ may combine to form a monocyclic or polycyclic cycloalkyl group.

The linear or branched alkyl group of $R_0$ may have a substituent and is preferably a linear or branched alkyl group having a carbon number of 1 to 4, and examples thereof include a methyl group, an ethyl group, an n-propyl group, an isopropyl group, an n-butyl group, an isobutyl group, and a tert-butyl group. Examples of the substituent include a hydroxyl group and a halogen atom (for example, fluorine atom).

$R_0$ is preferably a hydrogen atom, a methyl group, a trifluoromethyl group, or a hydroxymethyl group.

The alkyl group of $R_1$ to $R_3$ is preferably an alkyl group having a carbon number of 1 to 4, such as methyl group, ethyl group, n-propyl group, isopropyl group, n-butyl group, isobutyl group and tert-butyl group.

The cycloalkyl group of $R_1$ to $R_3$ is preferably a monocyclic cycloalkyl group such as cyclopentyl group and cyclohexyl group, or a polycyclic cycloalkyl group such as norbornyl group, tetracyclodecanyl group, tetracyclododecanyl group and adamantyl group.

The cycloalkyl group formed by combining two members out of $R_1$ to $R_3$ is preferably a monocyclic cycloalkyl group such as cyclopentyl group and cyclohexyl group, or a polycyclic cycloalkyl group such as norbornyl group, tetracyclodecanyl group, tetracyclododecanyl group and adamantyl group, more preferably a monocyclic cycloalkyl group having a carbon number of 5 or 6.

One preferred embodiment is an embodiment where $R_1$ is a methyl group or an ethyl group and $R_2$ and $R_3$ are combined to form the above-described cycloalkyl group.

Each of the groups above may have a substituent, and examples of the substituent include a hydroxyl group, a halogen atom (such as fluorine atom), an alkyl group (having a carbon number of 1 to 4), a cycloalkyl group (having a carbon number of 3 to 8), an alkoxy group (having a carbon number of 1 to 4), a carboxyl group, and an alkoxycarbonyl group (having a carbon number of 2 to 6). The carbon number is preferably 8 or less.

A particularly preferred embodiment of the repeating unit represented by formula (III) is an embodiment where each of $R_1$, $R_2$ and $R_3$ independently represents a linear or branched alkyl group.

In this embodiment, the linear or branched alkyl group of $R_1$, $R_2$ and $R_3$ is preferably an alkyl group having a carbon number of 1 to 4, and examples thereof include a methyl group, an ethyl group, an n-propyl group, an isopropyl group, an n-butyl group, an isobutyl group, and a tert-butyl group.

$R_1$ is preferably a methyl group, an ethyl group, an n-propyl group or an n-butyl group, more preferably a methyl group or an ethyl group, still more preferably a methyl group.

$R_2$ is preferably a methyl group, an ethyl group, an n-propyl group, an isopropyl group or an n-butyl group, more preferably a methyl group or an ethyl group, still more preferably a methyl group.

$R_3$ is preferably a methyl group, an ethyl group, an n-propyl group, an isopropyl group, an n-butyl group, an isobutyl group or a tert-butyl group, more preferably a methyl group, an ethyl group, an isopropyl group or an isobutyl group, still more preferably a methyl group, an ethyl group or an isopropyl group.

Preferable specific examples of the acid-decomposable group-containing repeating unit are illustrated below, but the present invention is not limited thereto.

In specific examples, Rx represents a hydrogen atom, $CH_3$, $CF_3$ or $CH_2OH$, and each of Rxa and Rxb represents an alkyl group having a carbon number of 1 to 4. Z represents a substituent, and when a plurality of Z's are present, each Z may be the same as or different from every other Z. p represents 0 or a positive integer. Specific examples and preferred examples of Z are the same as specific examples and preferred examples of the substituent which may be substituted on each of the groups such as $R_1$ to $R_3$.

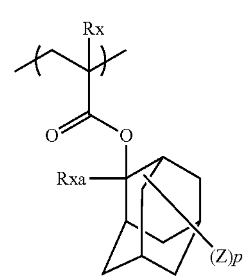

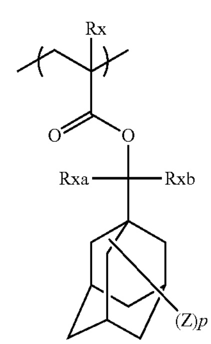

-continued
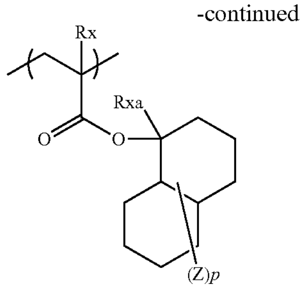
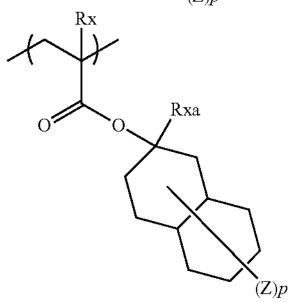
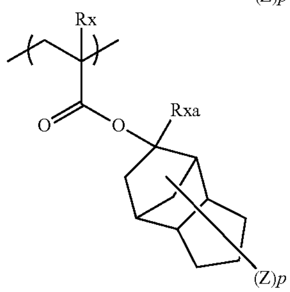
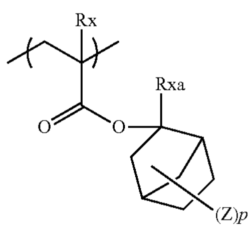
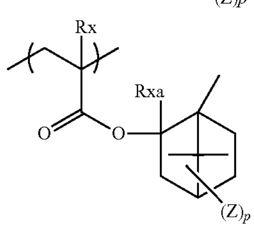
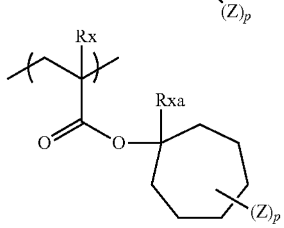
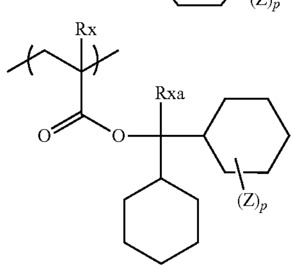
-continued
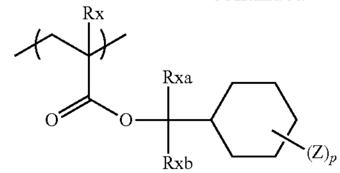
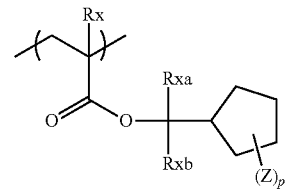
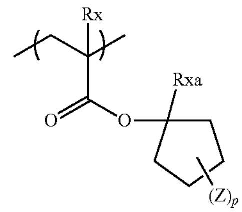
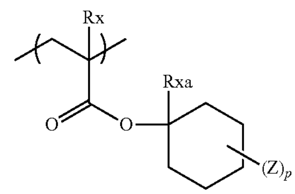
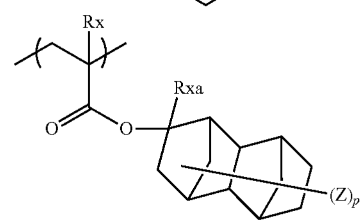
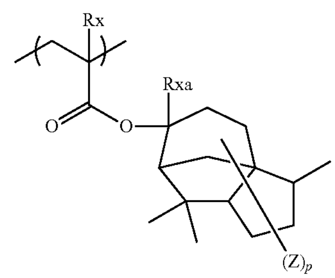
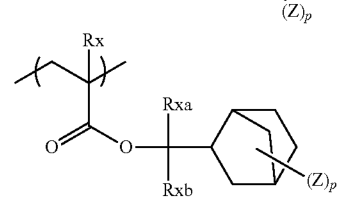
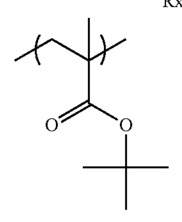
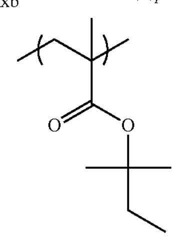
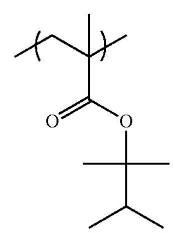
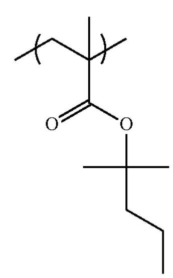
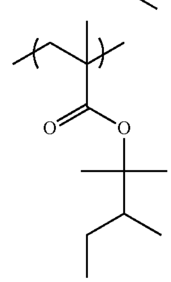
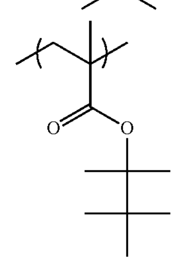

-continued
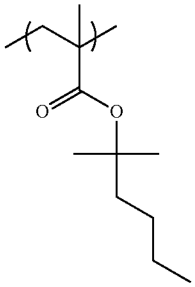
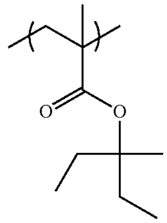
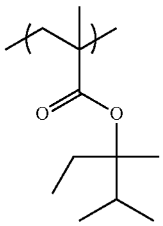
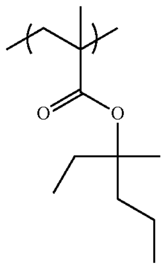
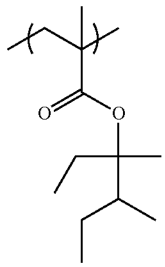
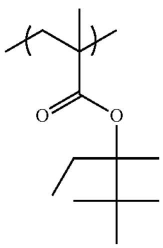
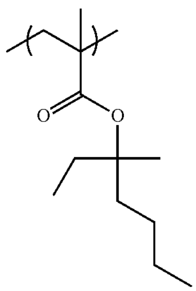
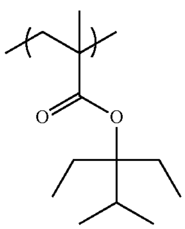
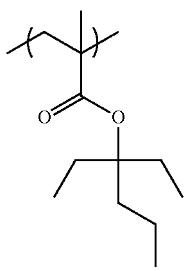
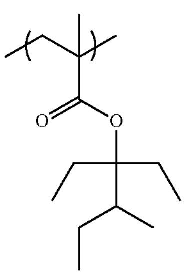
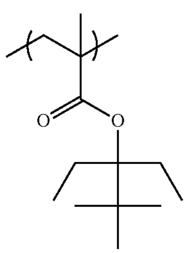
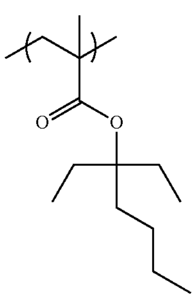
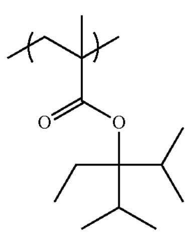
-continued
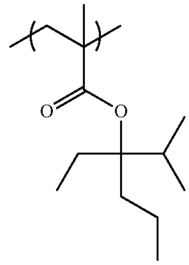
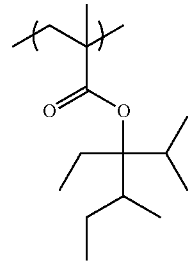
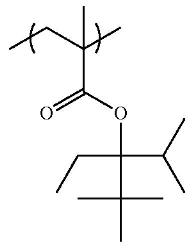
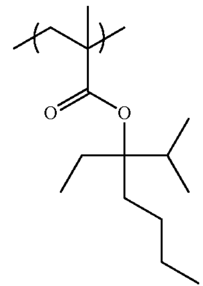
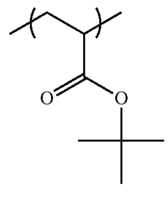
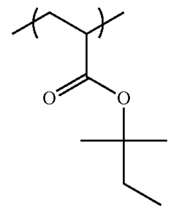
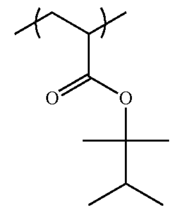
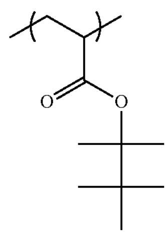
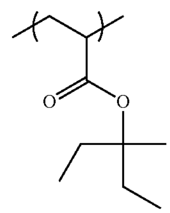
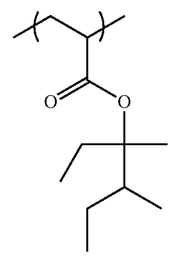
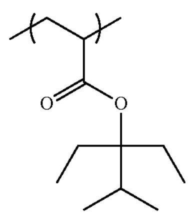
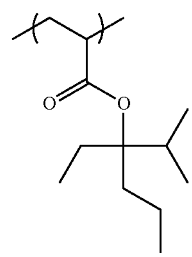
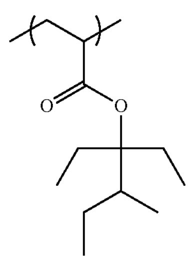
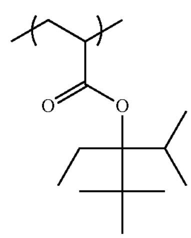

-continued

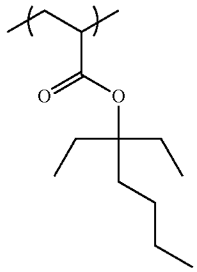

The resin (A) may contain a repeating unit represented by the following formula (VI):

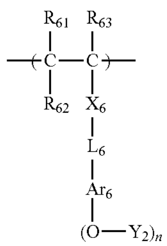

(VI)

In formula (VI), each of $R_{61}$, $R_{62}$ and $R_{63}$ independently represents a hydrogen atom, an alkyl group, a cycloalkyl group, a halogen atom, a cyano group, or an alkoxycarbonyl group. $R_{62}$ may combine with $Ar_6$ to form a ring, and in this case, $R_{62}$ represents a single bond or an alkylene group.

$X_6$ represents a single bond, —COO—, or —CONR$_{64}$—. $R_{64}$ represents a hydrogen atom or an alkyl group.

$L_6$ represents a single bond or an alkylene group.

$Ar_6$ represents a (n+1)-valent aromatic ring group and in the case of combining with $R_{62}$ to form a ring, represents a (n+2)-valent aromatic ring group.

$Y_2$ represents, when n≥2, each independently represents, a hydrogen atom or a group capable of leaving by the action of an acid. However, at least one $Y_2$ represents a group capable of leaving by the action of an acid.

n represents an integer of 1 to 4.

Formula (VI) is described in more detail.

The alkyl group of $R_{61}$ to $R_{63}$ in formula (VI) is preferably an alkyl group having a carbon number of 20 or less, such as methyl group, ethyl group, propyl group, isopropyl group, n-butyl group, sec-butyl group, hexyl group, 2-ethylhexyl group, octyl group and dodecyl group, which may have a substituent, more preferably an alkyl group having a carbon number of 8 or less.

Preferred examples of the alkyl group contained in the alkoxycarbonyl group are the same as those of the alkyl group in $R_{61}$ to $R_{63}$.

The cycloalkyl group may be either monocyclic or polycyclic and is preferably a monocyclic cycloalkyl group having a carbon number of 3 to 8, such as cyclopropyl group, cyclopentyl group and cyclohexyl group, which may have a substituent.

The halogen atom includes a fluorine atom, a chlorine atom, a bromine atom and an iodine atom, with a fluorine atom being preferred.

In the case where $R_{62}$ represents an alkylene group, the alkylene group is preferably an alkylene group having a carbon number of 1 to 8, such as methylene group, ethylene group, propylene group, butylene group, hexylene group and octylene group, which may have a substituent.

Examples of the alkyl group of $R_{64}$ in —CONR$_{64}$— (wherein $R_{64}$ represents a hydrogen atom or an alkyl group) represented by $X_6$ are the same as those of the alkyl group of $R_{61}$ to $R_{63}$.

$X_6$ is preferably a single bond, —COO—, or —CONH—, more preferably a single bond or —COO—.

The alkylene group in $L_6$ is preferably an alkylene group having a carbon number of 1 to 8, such as methylene group, ethylene group, propylene group, butylene group, hexylene group and octylene group, which may have a substituent. The ring formed by combining $R_{62}$ and $L_6$ is preferably a 5- or 6-membered ring.

Preferred examples of the divalent aromatic ring group when n in the (n+1)-valent aromatic ring group as $Ar_6$ is 1 include an arylene group having a carbon number of 6 to 18, such as phenylene group, tolylene group and naphthylene group, and a divalent aromatic ring group containing a heterocyclic ring such as thiophene, furan, pyrrole, benzothiophene, benzofuran, benzopyrrole, triazine, imidazole, benzimidazole, triazole, thiadiazole and thiazole.

Specific preferred examples of the (n+1)-valent aromatic ring group where n is an integer of 2 or more include groups formed by removing arbitrary (n−1) hydrogen atoms from the above-described specific examples of the divalent aromatic ring group.

The (n+1)-valent aromatic ring group as $Ar_6$ may further have a substituent.

Examples of the substituent which the above-described alkyl group, cycloalkyl group, alkoxycarbonyl group, alkylene group and (n+1)-valent aromatic ring group may have include an alkyl group, a cycloalkyl group, an aryl group, an amino group, an amido group, a ureido group, a urethane group, a hydroxyl group, a carboxyl group, a halogen atom, an alkoxy group, a thioether group, an acyl group, an acyloxy group, an alkoxycarbonyl group, a cyano group, and a nitro group. The carbon number of the substituent is preferably 8 or less.

n is preferably 1 or 2, more preferably 1.

Each of n $Y_2$s independently represents a hydrogen atom or a group capable of leaving by the action of an acid, provided that at least one of n $Y_2$s represents a group capable of leaving by the action of an acid.

Examples of the group $Y_2$ capable of leaving by the action of an acid include —C($R_{36}$)($R_{37}$)($R_{38}$), —C(═O)—O—C($R_{36}$)($R_{37}$)($R_{38}$), —C($R_{01}$)($R_{02}$)(O$R_{39}$), —C($R_{01}$)($R_{02}$)—C(═O)—O—C($R_{36}$)($R_{37}$)($R_{38}$) and —CH($R_{36}$)(Ar).

In the formulae, each of $R_{36}$ to $R_{39}$ independently represents an alkyl group, a cycloalkyl group, a monovalent aromatic ring group, a group formed by combining an alkylene group and a monovalent aromatic ring group, or an alkenyl group. $R_{36}$ and $R_{37}$ may combine with each other to form a ring.

Each of $R_{01}$ and $R_{02}$ independently represents a hydrogen atom, an alkyl group, a cycloalkyl group, a monovalent aromatic ring group, a group formed by combining an alkylene group and a monovalent aromatic ring group, or an alkenyl group.

Ar represents a monovalent aromatic ring group.

The alkyl group of $R_{36}$ to $R_{39}$, $R_{01}$ and $R_{02}$ is preferably an alkyl group having a carbon number of 1 to 8, and examples thereof include a methyl group, an ethyl group, a propyl group, an n-butyl group, a sec-butyl group, a hexyl group, and an octyl group.

The cycloalkyl group of $R_{36}$ to $R_{39}$, $R_{01}$ and $R_{02}$ may be monocyclic or polycyclic. The monocyclic cycloalkyl group is preferably a cycloalkyl group having a carbon number of 3 to 8, and examples thereof include a cyclopropyl group, a cyclobutyl group, a cyclopentyl group, a cyclohexyl group, and a cyclooctyl group. The polycyclic cycloalkyl group is preferably a cycloalkyl group having a carbon number of 6 to 20, and examples thereof include an adamantyl group, a norbornyl group, an isoboronyl group, a camphanyl group, a dicyclopentyl group, an α-pinel group, a tricyclodecanyl group, a tetracyclododecyl group, and an androstanyl group. Incidentally, a part of carbon atoms in the cycloalkyl group may be substituted with a heteroatom such as oxygen atom.

The monovalent aromatic ring group of $R_{36}$ to $R_{39}$, $R_{01}$, $R_{02}$ and Ar is preferably a monovalent aromatic ring group having a carbon number of 6 to 10, and examples thereof include an aryl group such as phenyl group, naphthyl group and anthranyl group, and a divalent aromatic ring group containing a heterocyclic ring such as thiophene, furan, pyrrole, benzothiophene, benzofuran, benzopyrrole, triazine, imidazole, benzimidazole, triazole, thiadiazole and thiazole.

The group formed by combining an alkylene group and a monovalent aromatic ring group of $R_{36}$ to $R_{39}$, $R_{01}$ and $R_{02}$ is preferably an aralkyl group having a carbon number of 7 to 12, and examples thereof include a benzyl group, a phenethyl group, and a naphthylmethyl group.

The alkenyl group of $R_{36}$ to $R_{39}$, $R_{01}$ and $R_{02}$ is preferably an alkenyl group having a carbon number of 2 to 8, and examples thereof include a vinyl group, an allyl group, a butenyl group, and a cyclohexenyl group.

The ring formed by combining $R_{36}$ and $R_{37}$ with each other may be either monocyclic or polycyclic. The monocyclic ring is preferably a cycloalkyl structure having a carbon number of 3 to 8, and examples thereof include a cyclopropane structure, a cyclobutane structure, a cyclopentane structure, a cyclohexane structure, a cycloheptane structure, and a cyclooctane structure. The polycyclic ring is preferably a cycloalkyl structure having a carbon number of 6 to 20, and examples thereof include an adamantane structure, a norbornane structure, a dicyclopentane structure, a tricyclodecane structure, and a tetracyclododecane structure. Incidentally, a part of carbon atoms in the cycloalkyl structure may be substituted with a heteroatom such as oxygen atom.

Each of the groups above as $R_{36}$ to $R_{39}$, $R_{01}$, $R_{02}$ and Ar may have a substituent, and examples of the substituent include an alkyl group, a cycloalkyl group, an aryl group, an amino group, an amido group, a ureido group, a urethane group, a hydroxyl group, a carboxyl group, a halogen atom, an alkoxy group, a thioether group, an acyl group, an acyloxy group, an alkoxycarbonyl group, a cyano group, and a nitro group. The carbon number of the substituent is preferably 8 or less.

The group $Y_2$ capable of leaving by the action of an acid is more preferably a structure represented by the following formula (VI-A):

(VI-A)

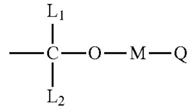

In the formula, each of $L_1$ and $L_2$ independently represents a hydrogen atom, an alkyl group, a cycloalkyl group, a monovalent aromatic ring group, or a group formed by combining an alkylene group and a monovalent aromatic ring group.

M represents a single bond or a divalent linking group.

Q represents an alkyl group, a cycloalkyl group which may contain a heteroatom, a monovalent aromatic ring group which may contain a heteroatom, an amino group, an ammonium group, a mercapto group, a cyano group, or an aldehyde group.

At least two members of Q, M and $L_1$ may combine to form a ring (preferably a 5- or 6-membered ring).

The alkyl group as $L_1$ and $L_2$ is, for example, an alkyl group having a carbon number of 1 to 8, and specific preferred examples thereof include a methyl group, an ethyl group, a propyl group, an n-butyl group, a sec-butyl group, a hexyl group, and an octyl group.

The cycloalkyl group as $L_1$ and $L_2$ is, for example, a cycloalkyl group having a carbon number of 3 to 15, and specific preferred examples thereof include a cyclopentyl group, a cyclohexyl group, a norbornyl group, and an adamantyl group.

The monovalent aromatic ring group as $L_1$ and $L_2$ is, for example, an aryl group having a carbon number of 6 to 15, and specific preferred examples thereof include a phenyl group, a tolyl group, a naphthyl group, and an anthryl group.

The group as $L_1$ and $L_2$ formed by combining an alkylene group and a monovalent aromatic ring group is, for example, an aralkyl group having a carbon number of 6 to 20, such as benzyl group and phenethyl group.

Examples of the divalent linking group as M include an alkylene group (e.g., methylene group, ethylene group, propylene group, butylenes group, hexylene group, octylene group), a cycloalkylene group (e.g., cyclopentylene group, cyclohexylene group, adamantylene group), an alkenylene group (e.g., ethenylene group, propenylene group, butenylene group), a divalent aromatic ring group (e.g., phenylene group, tolylene group, naphthylene group), —S—, —O—, —CO—, —$SO_2$—, —N($R_0$)—, and a divalent linking group formed by combining a plurality of these members. $R_0$ is a hydrogen atom or an alkyl group (for example, an alkyl group having a carbon number of 1 to 8, and specifically, a methyl group, an ethyl group, a propyl group, an n-butyl group, a sec-butyl group, a hexyl group, an octyl group or the like).

Examples of the alkyl group as Q are the same as those of respective groups as $L_1$ and $L_2$.

Examples of the heteroatom-free aliphatic hydrocarbon ring group and heteroatom-free monovalent aromatic ring group in the cycloalkyl group as Q which may contain a heteroatom and the monovalent aromatic ring group as Q which may contain a heteroatom include the above-described cycloalkyl group and monovalent aromatic ring group as $L_1$ and $L_2$, and the carbon number thereof is preferably from 3 to 15.

Examples of the heteroatom-containing cycloalkyl group and heteroatom-containing monovalent aromatic ring group include a group having a heterocyclic structure such as thiirane, cyclothiolane, thiophene, furan, pyrrole, benzothiophene, benzofuran, benzopyrrole, triazine, imidazole, benzimidazole, triazole, thiadiazole, thiazole and pyrrolidone, but the group is not limited thereto as long as it is a structure generally called a heterocyclic ring (a ring composed of carbon and a heteroatom or a ring composed of a heteroatom).

As for the ring which may be formed by combining at least two members out of Q, M and $L_1$, there is a case where at least two members out of Q, M and $L_1$ are combined to form, for example, a propylene group or a butylene group, thereby forming a 5- or 6-membered ring containing oxygen atom.

In formula (VI-A), each of the groups represented by $L_1$, $L_2$, M and Q may have a substituent, and examples of the substituent include those described above as the substituent which may be substituted on $R_{36}$ to $R_{39}$, $R_{01}$, $R_{02}$ and Ar. The carbon number of the substituent is preferably 8 or less.

The group represented by -M-Q is preferably a group having a carbon number of 1 to 30, more preferably a group having a carbon number of 5 to 20.

Specific preferred examples of the repeating unit represented by formula (VI) are illustrated below, but the present invention is not limited thereto.

(VI-1)

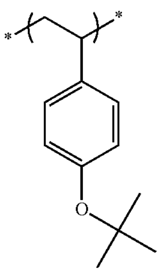

(VI-2)

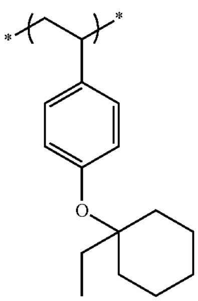

(VI-3)

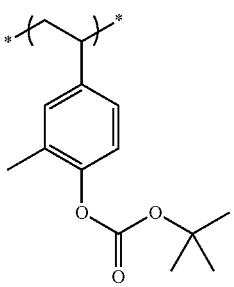

(VI-4)

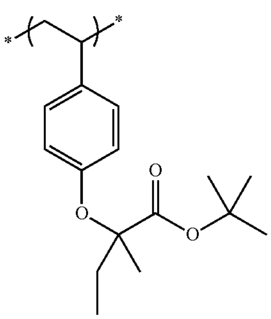

-continued (VI-5)

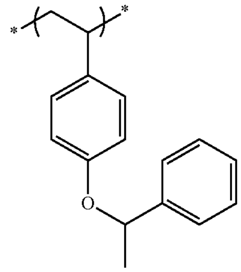

(VI-6)

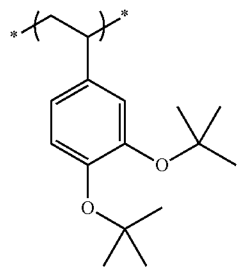

(VI-7)

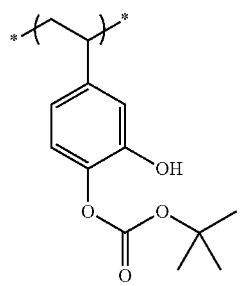

(VI-8)

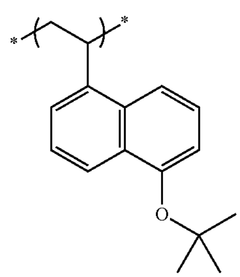

(VI-9)

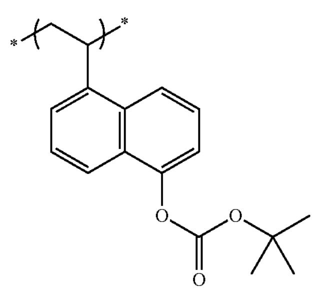

-continued
(VI-10)
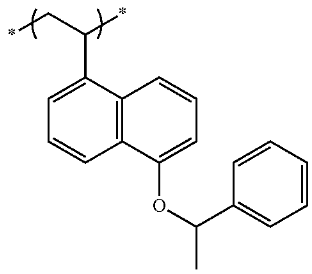
(VI-11)
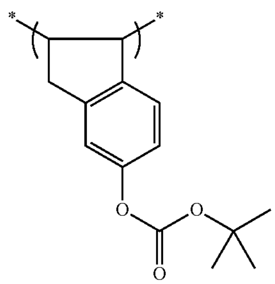
(VI-12)
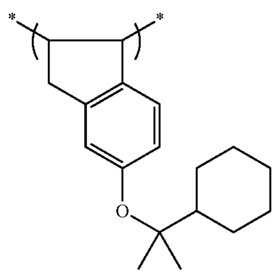
(VI-13)
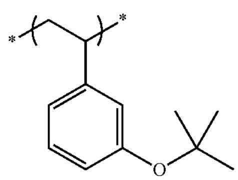
(VI-14)
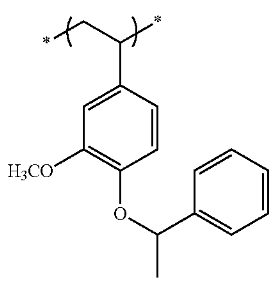
(VI-15)
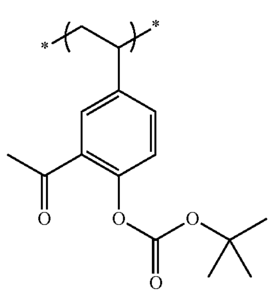
-continued
(VI-16)
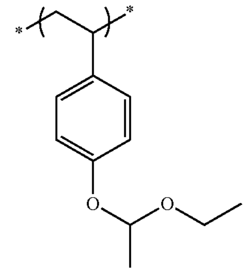
(VI-17)
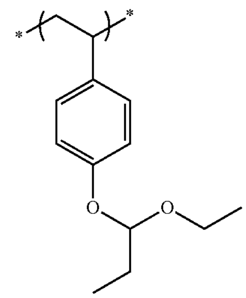
(VI-18)
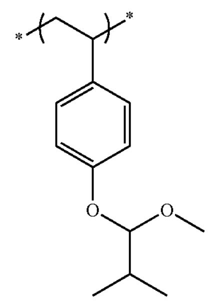
(VI-19)
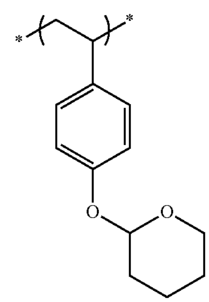
(VI-20)
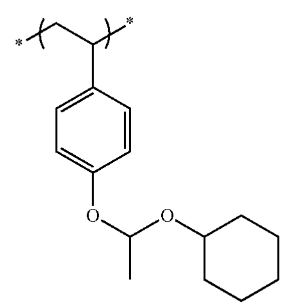

-continued
(VI-21)
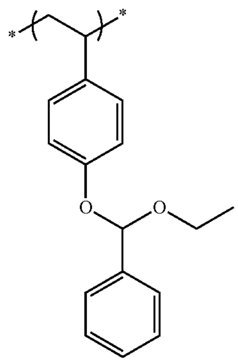
(VI-22)
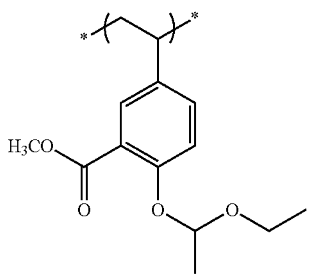
(VI-23)
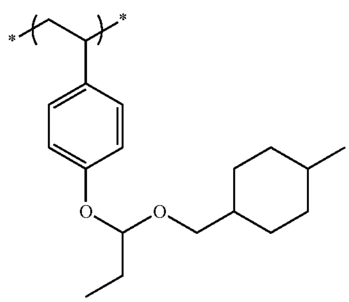
(VI-24)
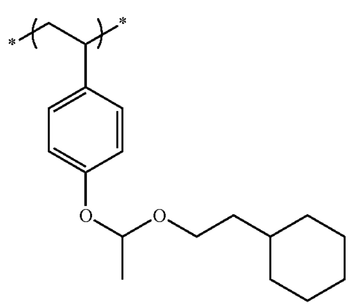
(VI-25)
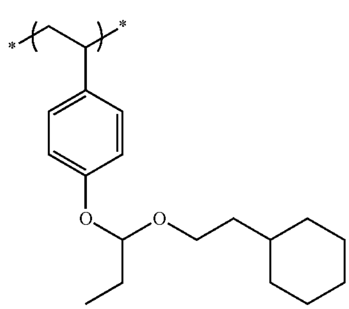
-continued
(VI-26)
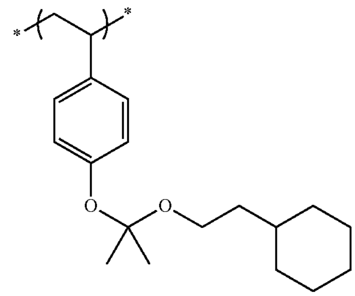
(VI-27)
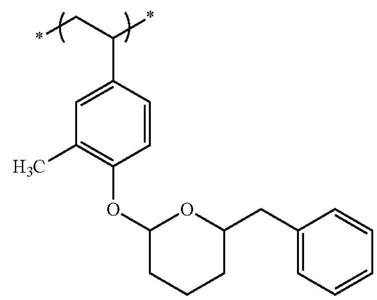
(VI-28)
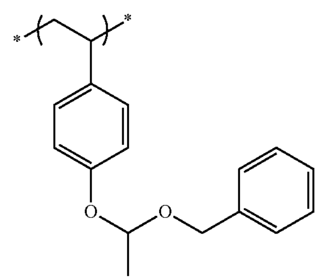
(VI-29)
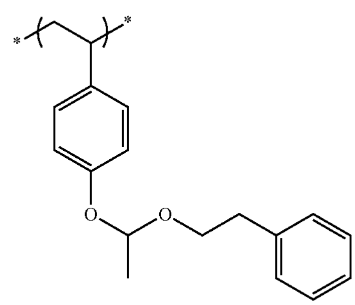
(VI-30)
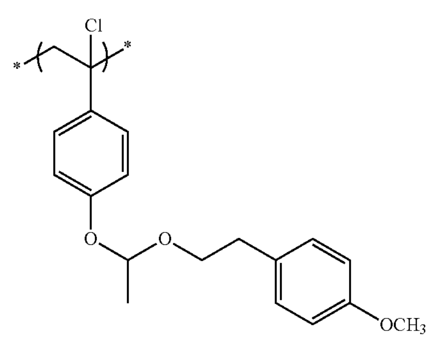

-continued
(VI-31)
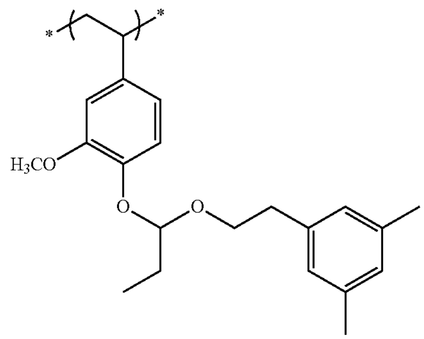
(VI-32)
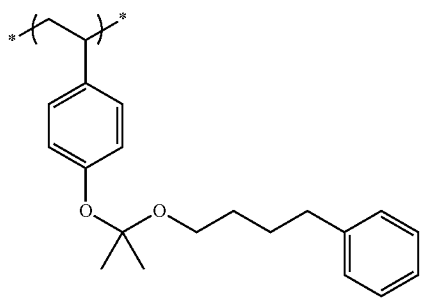
(VI-33)
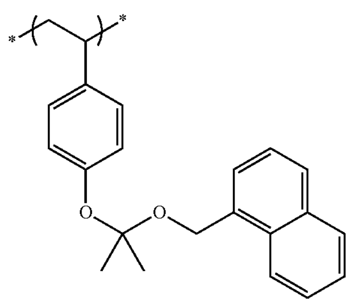
(VI-34)
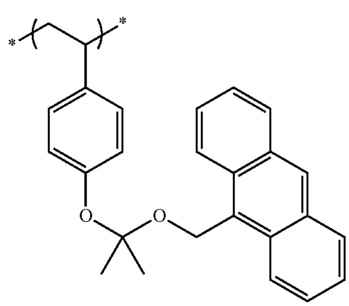
(VI-35)
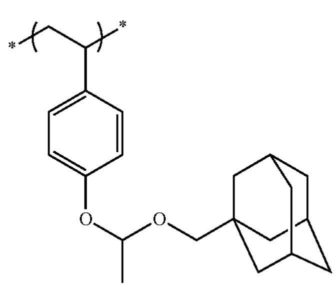
-continued
(VI-36)
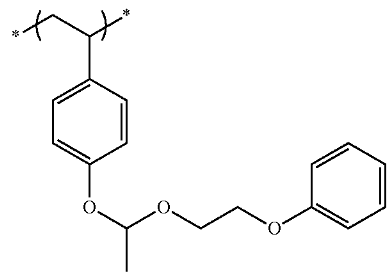
(VI-37)
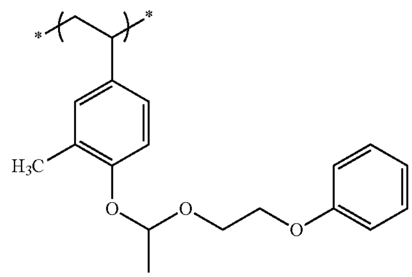
(VI-38)
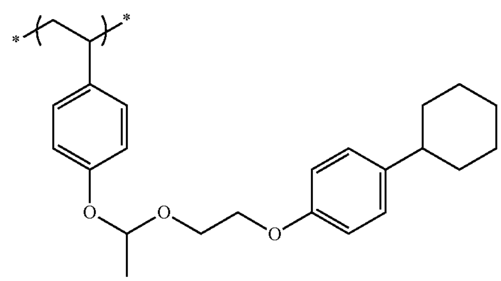
(VI-39)
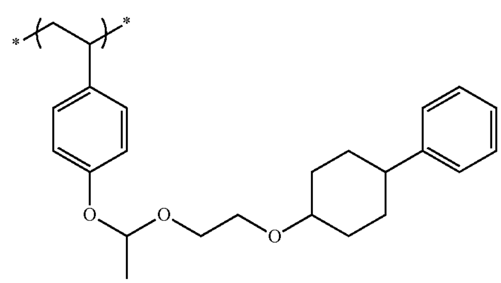
(VI-40)
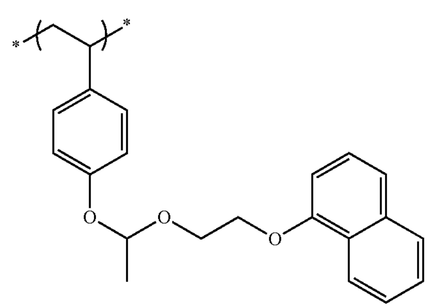

-continued
(VI-41)
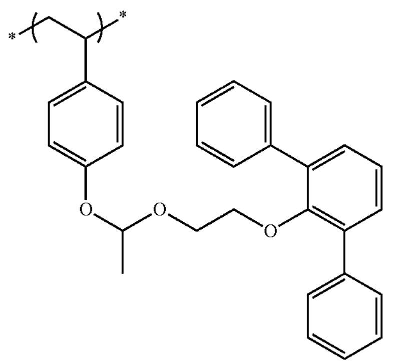
(VI-42)
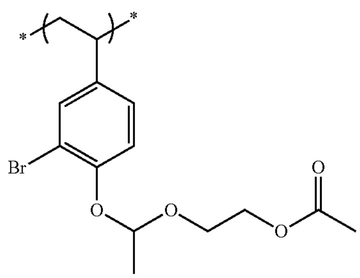
(VI-43)
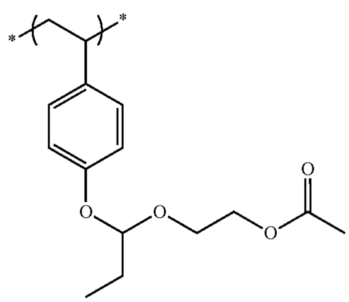
(VI-44)
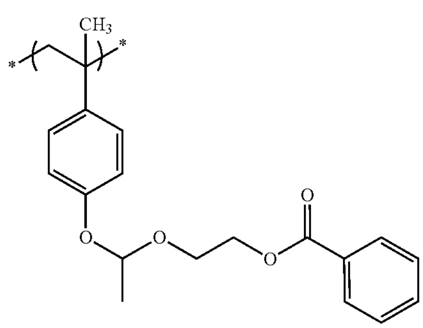
(VI-45)
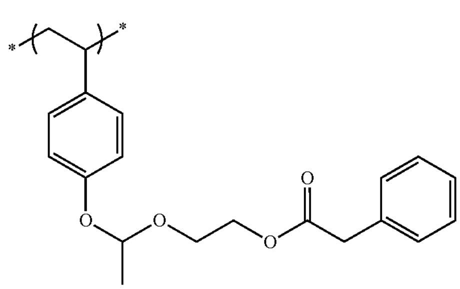
-continued
(VI-46)
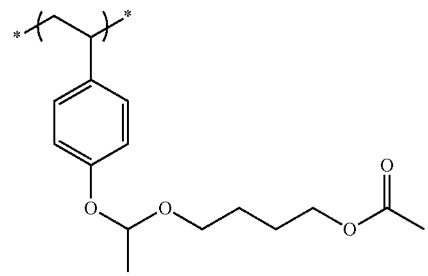
(VI-47)
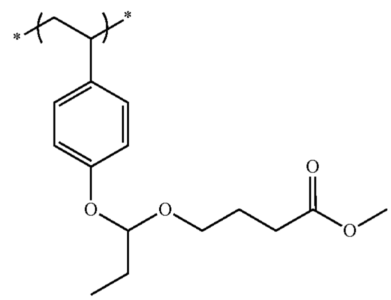
(VI-48)
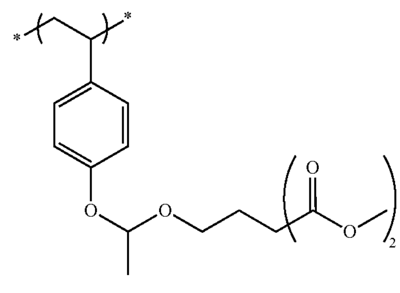
(VI-49)
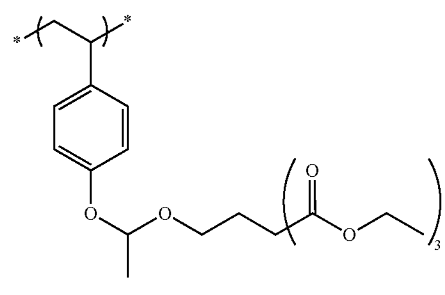
(VI-50)
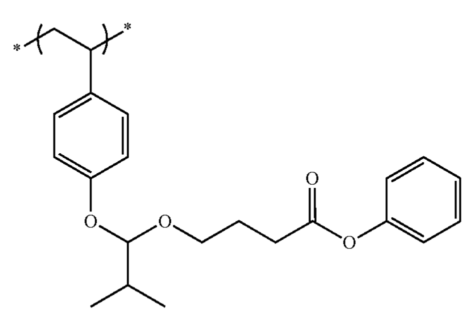

-continued
(VI-51)
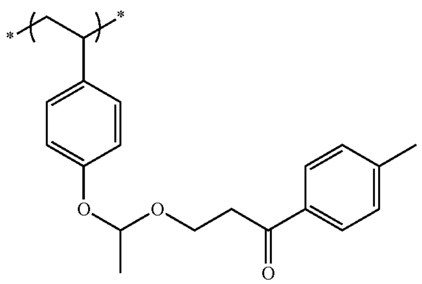
(VI-52)
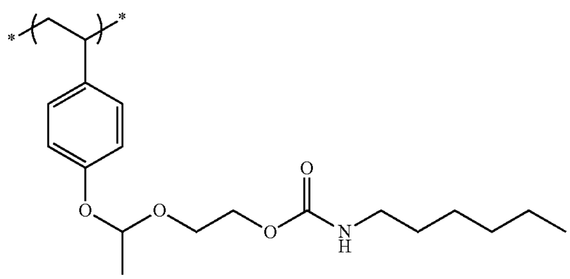
(VI-53)
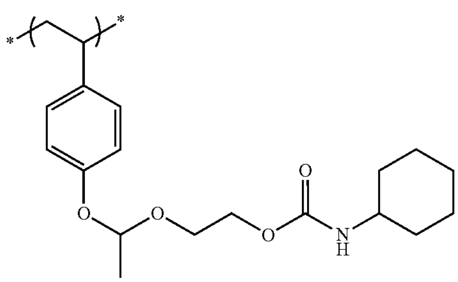
(VI-54)
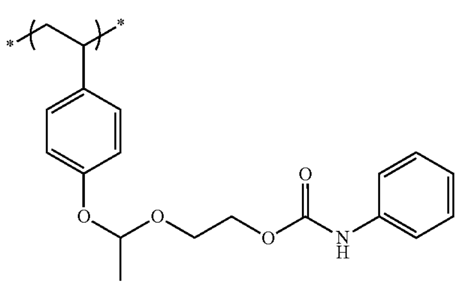
(VI-55)
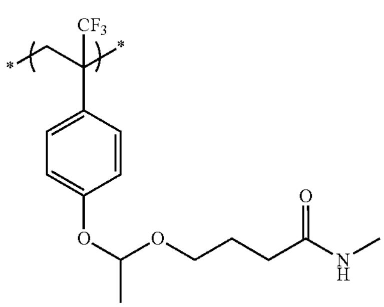
-continued
(VI-56)
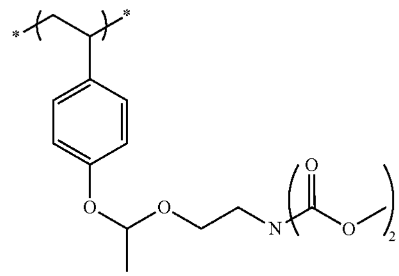
(VI-57)
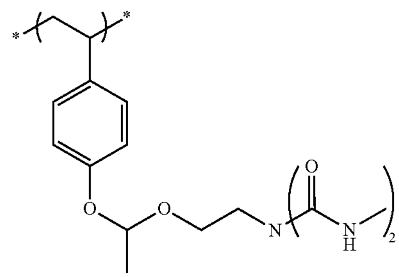
(VI-58)
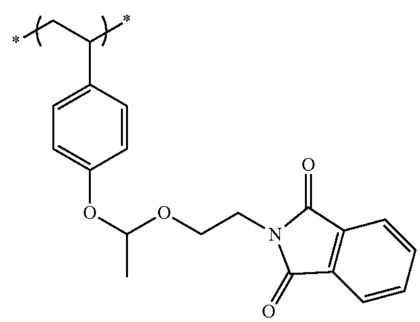
(VI-59)
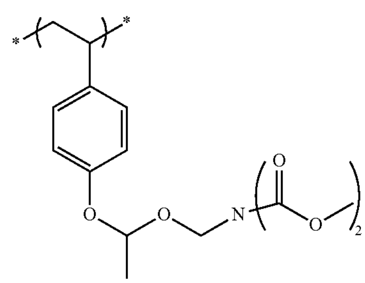
(VI-60)
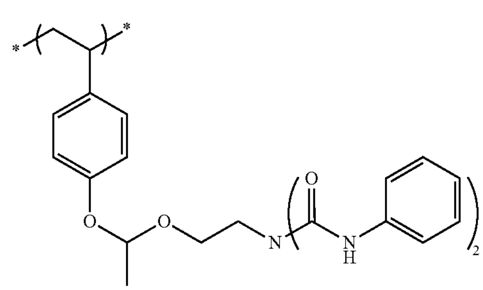

-continued
(VI-61)
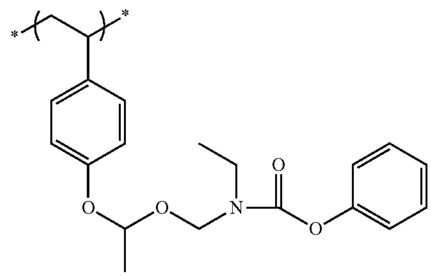
(VI-62)
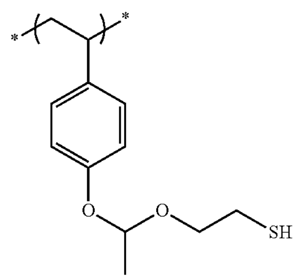
(VI-63)
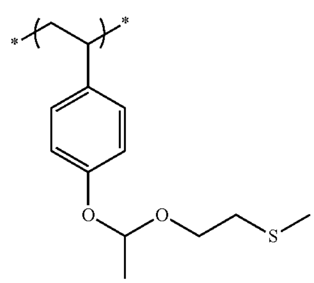
(VI-64)
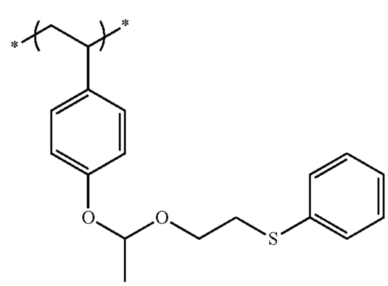
(VI-65)
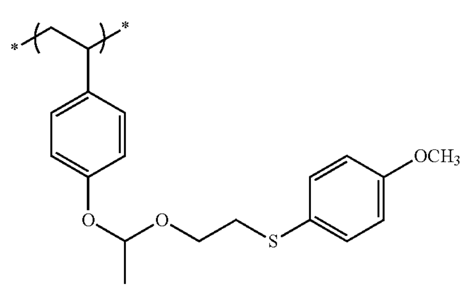
-continued
(VI-66)
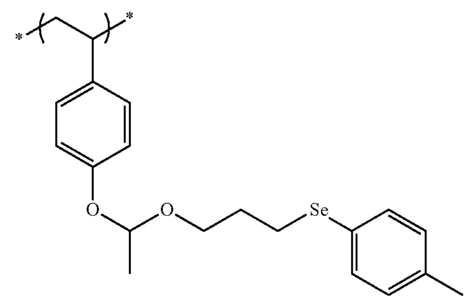
(VI-67)
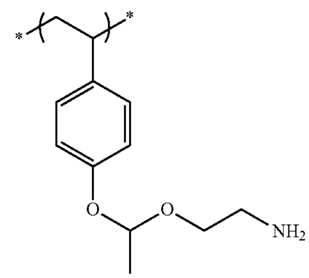
(VI-68)
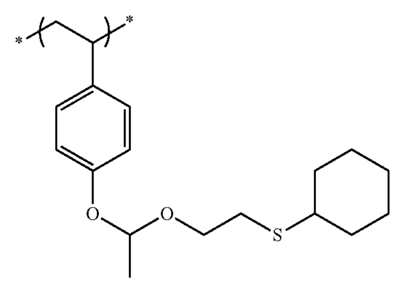
(VI-69)
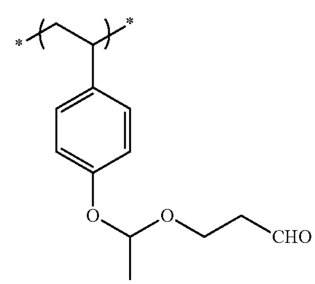
(VI-70)
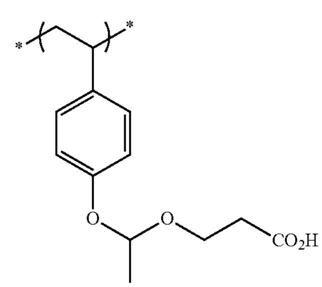

-continued
(VI-71)
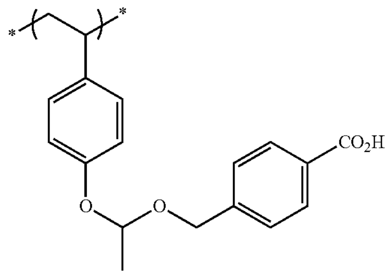
(VI-72)
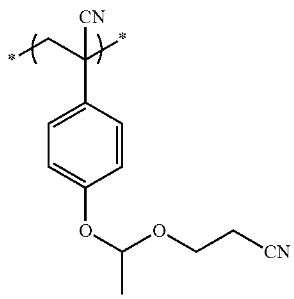
(VI-73)
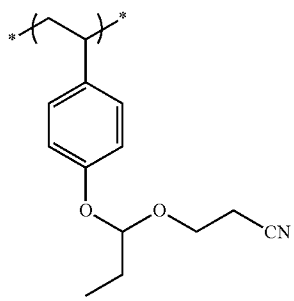
(VI-74)
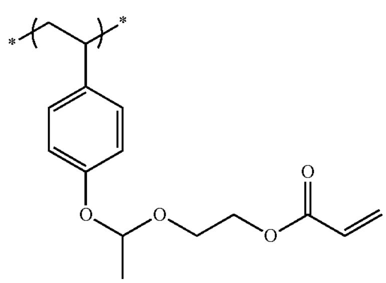
(VI-75)
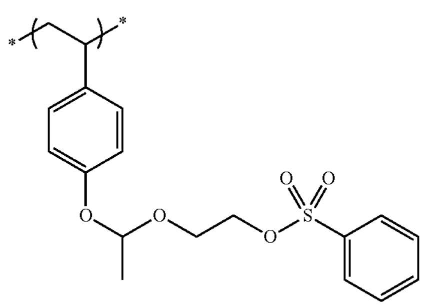
-continued
(VI-76)
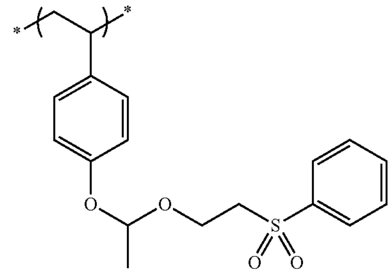
(VI-77)
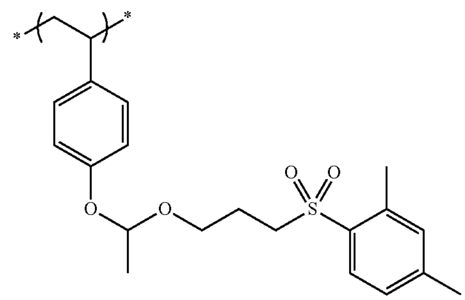
(VI-78)
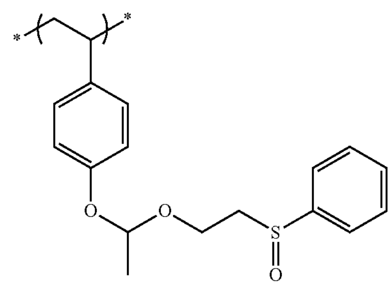
(VI-79)
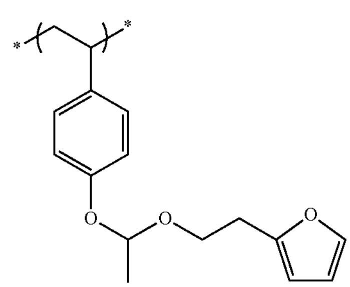
(VI-80)
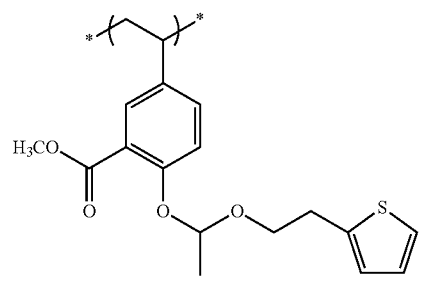

-continued
(VI-81)
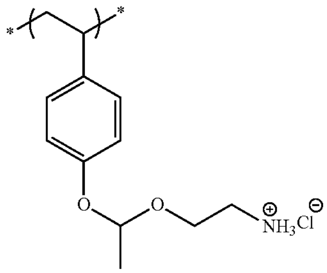
(VI-82)
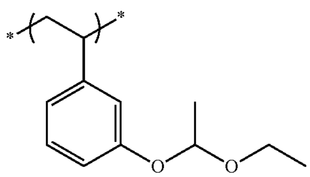
(VI-83)
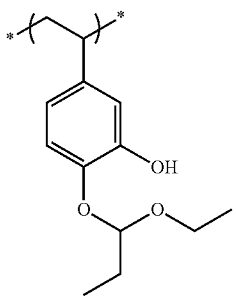
(VI-84)
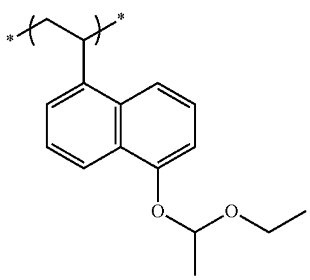
(VI-85)
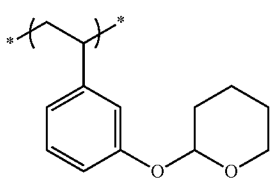
(VI-86)
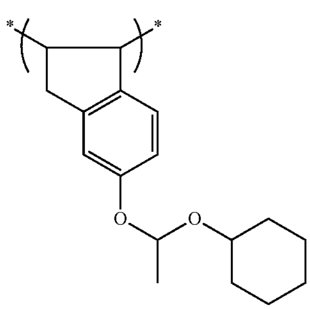
-continued
(VI-87)
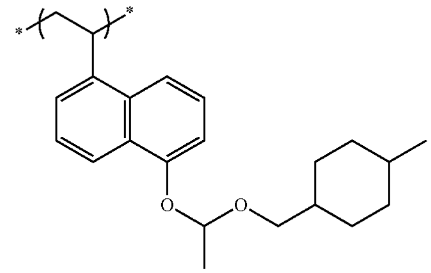
(VI-88)
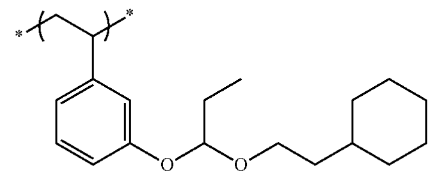
(VI-89)
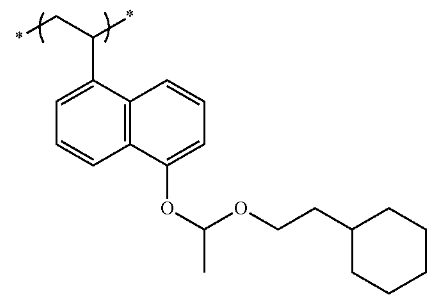
(VI-90)
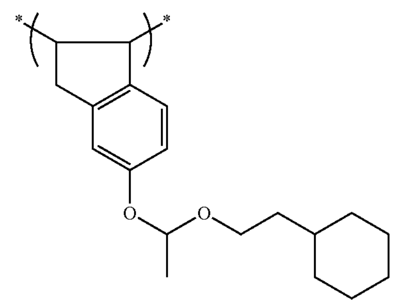
(VI-91)
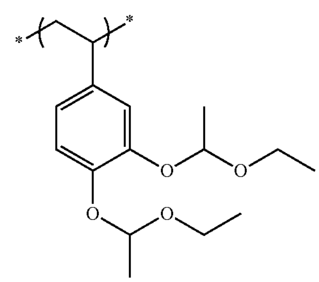
(VI-92)
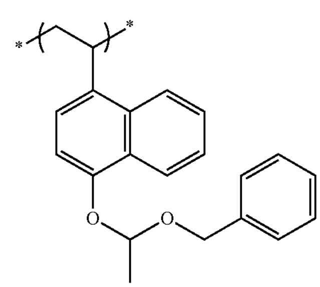

-continued
(VI-93)
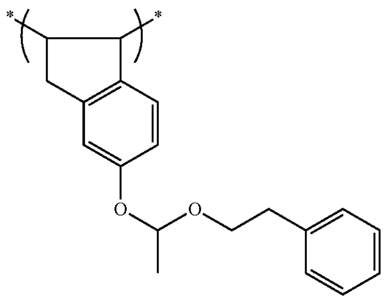
(VI-94)
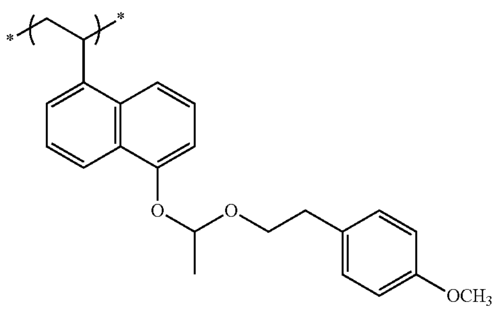
(VI-95)
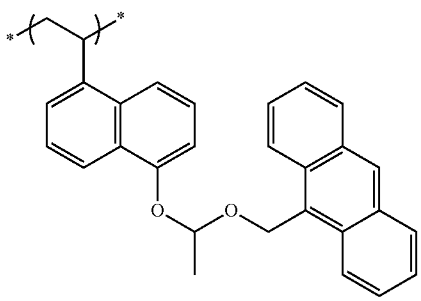
(VI-96)
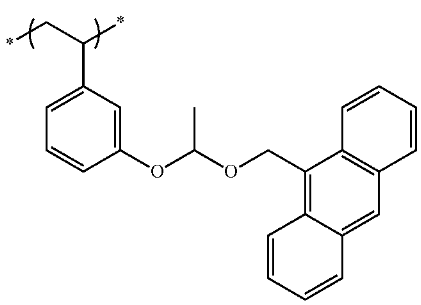
(VI-97)
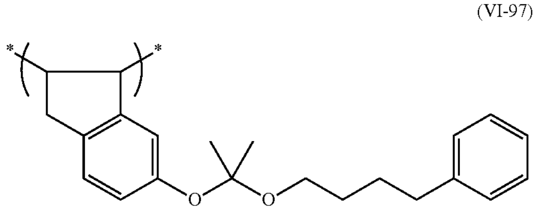
-continued
(VI-98)
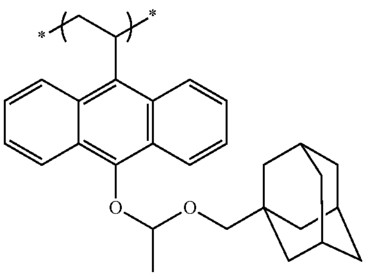
(VI-99)
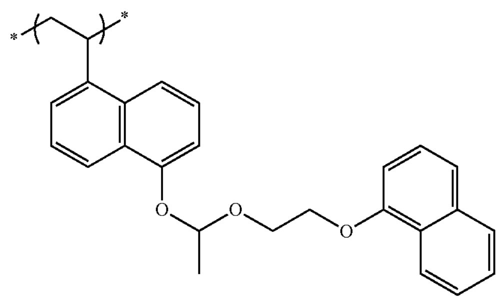
(VI-100)
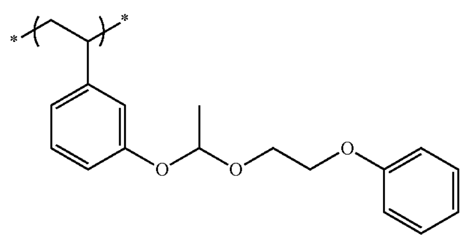
(VI-101)
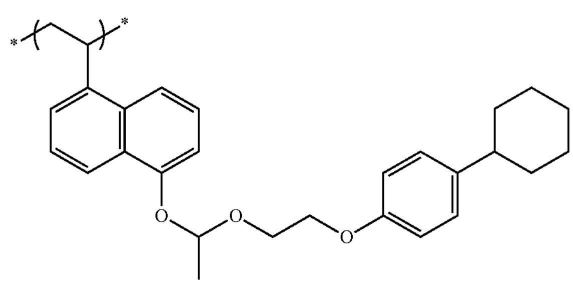
(VI-102)
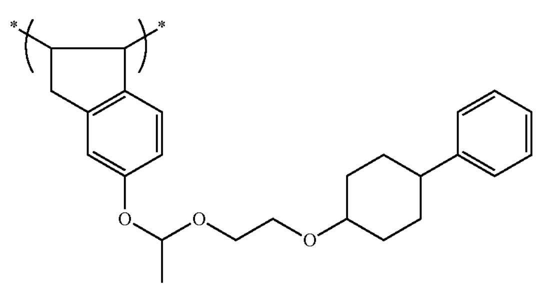

-continued
(VI-103)
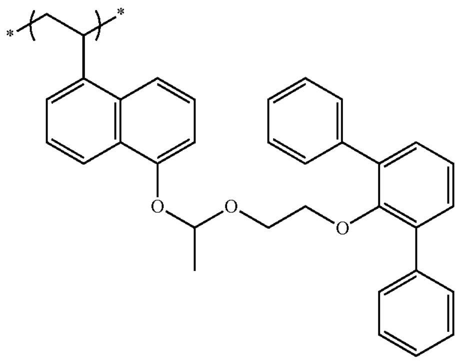
(VI-104)
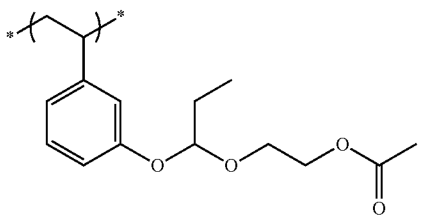
(VI-105)
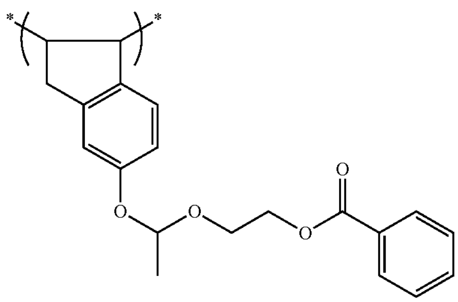
(VI-106)
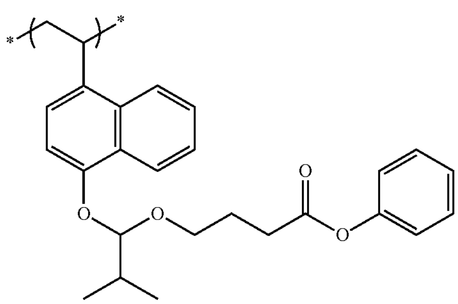
(VI-107)
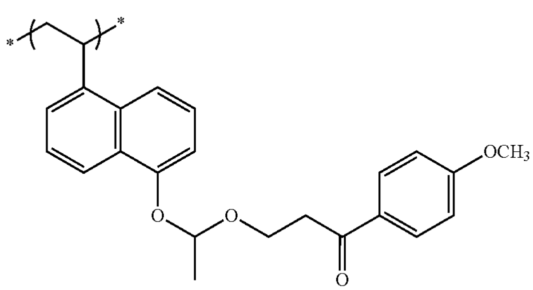
-continued
(VI-108)
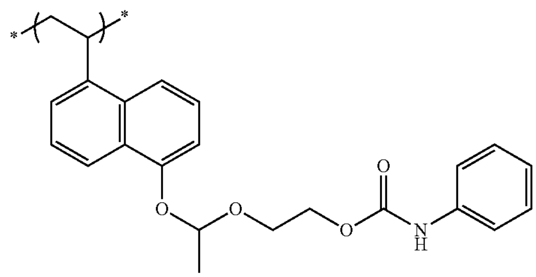
(VI-113)
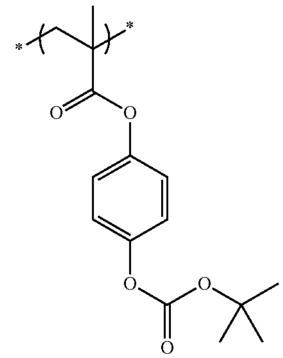
(VI-114)
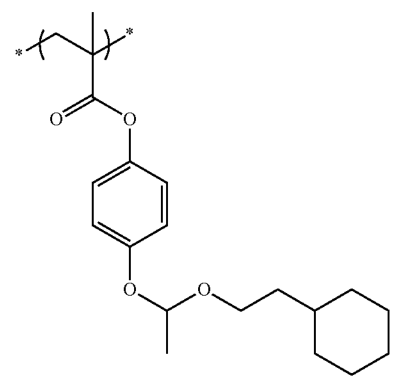
(VI-115)
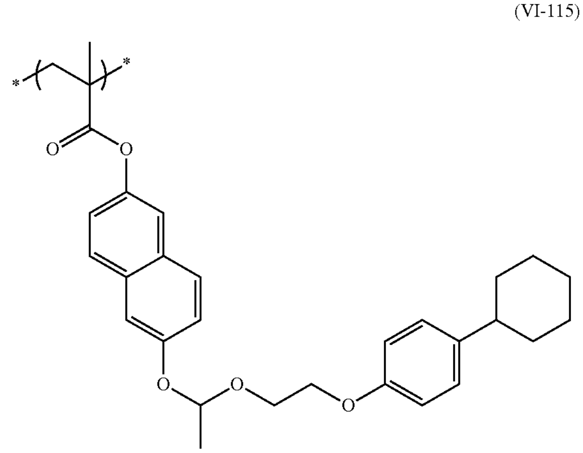

-continued (VI-116)

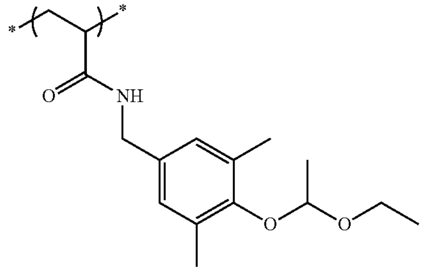

As for the repeating unit having an acid-decomposable group contained in the resin (A), one kind may be used, or two or more kinds may be used in combination.

In the resin (A) for use in the present invention, from the standpoint of enhancing the dissolution contrast by sufficiently reducing the solubility of the exposed area for an organic developer and maintaining adequate solubility of the unexposed area, the content of the repeating unit having an acid-decomposable group (preferably the repeating unit represented by formula (III)) (in the case of containing a plurality of kinds of repeating units, the total thereof) in the resin of the preferred resin embodiment (1) is preferably from 20 to 90 mol %, more preferably from 25 to 85 mol %, still more preferably from 30 to 80 mol %, based on all repeating units in the resin (A).

[Repeating Unit Having an Aromatic Group]

In the present invention, the resin (A) may contain a repeating unit having an aromatic group, and the repeating unit having an aromatic group may be a repeating unit having a phenolic aromatic group or a repeating unit having a non-phenolic aromatic group. The repeating unit having an aromatic group preferably has no acid-decomposable group.

The "repeating unit having a non-phenolic aromatic group" as used herein indicates an aromatic group-containing repeating unit having no phenolic hydroxyl group, not including an aromatic group-containing repeating unit having a phenolic hydroxyl group and an aromatic group-containing repeating unit having a group derived from a phenolic hydroxyl group (for example, a group where a phenolic hydroxyl group is protected by a group capable of decomposing and leaving by the action of an acid). Such a repeating unit is sometimes preferred in terms of, for example, solubility in a solvent contained in the resin composition or compatibility with an organic solvent developer used in the development (an appropriate development rate is achieved).

The aromatic group in the repeating unit having an aromatic group may have a substituent and is preferably an aryl group having a carbon number of 6 to 20, and examples thereof include a phenyl group, a naphthyl group, a biphenyl group and an anthracenyl group.

Examples of the substituent include a linear or branched alkyl group having a carbon number of 1 to 4, a cycloalkyl group having a carbon number of 3 to 10, an aryl group having a carbon number of 6 to 10, a halogen atom such as fluorine atom, a cyano group, an amino group, a nitro group, and a carboxyl group. Of these substituents, the linear or branched alkyl group having a carbon number of 1 to 4, the cycloalkyl group having a carbon number of 3 to 10, and the aryl group having a carbon number of 6 to 10 may further have a substituent, and examples of the further substituent include a halogen atom such as fluorine atom.

Particularly, in the case where the exposure is exposure to a KrF excimer laser, the aromatic group in the repeating unit having an aromatic group is preferably a naphthyl group, a biphenyl group, or a phenyl group substituted with a carboxyl group.

The repeating unit having an aromatic group is preferably a repeating unit represented by the following formula (IIB):

(IIB)

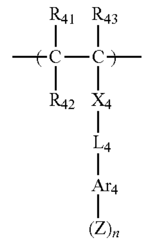

In the formula, each of $R_{41}$, $R_{42}$ and $R_{43}$ independently represents a hydrogen atom, an alkyl group, a halogen atom, a cyano group, or an alkoxycarbonyl group. $R_{42}$ and $Ar_4$ may combine to form a ring, and in this case, $R_{42}$ represents a single bond or an alkylene group.

$X_4$ represents a single bond, —COO—, or —CONR$_{64}$—, and $R_{64}$ represents a hydrogen atom or an alkyl group.

$L_4$ represents a single bond or an alkylene group.

$Ar_4$ represents a (n+1)-valent aromatic ring group and in the case of combining with $R_{42}$ to form a ring, represents a (n+2)-valent aromatic ring group.

Z represents a polar group.

n represents an integer of 0 to 4.

Specific examples of the alkyl group, cycloalkyl group, halogen atom and alkoxycarbonyl group of $R_{41}$, $R_{42}$ and $R_{43}$ in formula (IIB) and the substituent which these groups may have are the same as specific examples of respective groups in formula (VI).

Preferred examples of the monovalent aromatic group when n in the (n+1)-valent aromatic ring group as $Ar_4$ is 0 include an aryl group having a carbon number of 6 to 18, such as phenyl group, tolyl group, naphthyl group and anthracenyl group, and an aromatic ring group containing a heterocyclic ring such as thiophene, furan, pyrrole, benzothiophene, benzofuran, benzopyrrole, triazine, imidazole, benzimidazole, triazole, thiadiazole and thiazole.

Specific preferred examples of the (n+1)-valent aromatic ring group where n is an integer of 1 or more include groups formed by removing arbitrary n hydrogen atoms from the above-described specific examples of the monovalent aromatic ring group.

The (n+1)-valent aromatic ring group as $Ar_4$ may have a substituent different from the polar group as Z.

Examples of the substituent which the above-described alkyl group, cycloalkyl group, alkoxycarbonyl group, alkylene group and (n+1)-valent aromatic ring group may have include an alkyl group, an alkoxy group such as methoxy group, ethoxy group, hydroxyethoxy group, propoxy group, hydroxypropoxy group and butoxy group, and an aryl group such as phenyl group.

Examples of the alkyl group of $R_{64}$ in —CONR$_{64}$— ($R_{64}$ represents a hydrogen atom or an alkyl group) represented by $X_4$ are the same as those of the alkyl group of $R_{61}$ to $R_{63}$.

$X_4$ is preferably a single bond, —COO— or —CONH—, more preferably a single bond or —COO—.

The alkylene group in $L_4$ is preferably an alkylene group having a carbon number of 1 to 8, such as methylene group, ethylene group, propylene group, butylene group, hexylene group and octylene group, which may have a substituent.

$Ar_4$ is preferably an arylene group having a carbon number of 6 to 18, which may have a substituent, more preferably a phenylene group, a naphthylene group, or a biphenylene group.

Examples of the polar group of Z are the same as those of the polar group described above for the acid-decomposable group in [Repeating Unit Having Acid-Decomposable Group] which is preferably contained in the resin (A), and of these, a carboxyl group is preferred.

Specific examples of the repeating unit represented by formula (IIB) are illustrated below, but the present invention is not limited thereto. In the formulae, a represents an integer of 1 or 2.

(B-1)

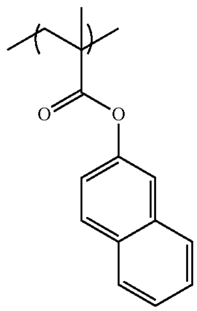

(B-2)

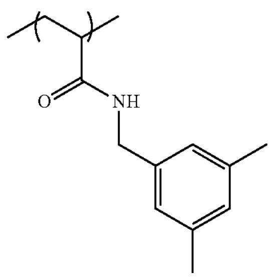

(B-3)

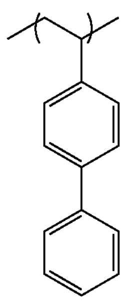

(B-4)

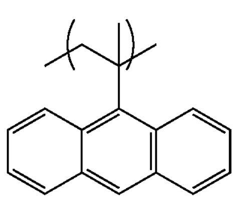

(B-5)

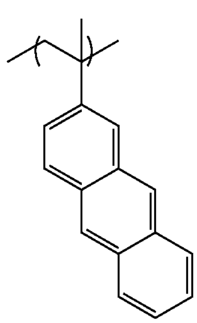

-continued (B-6)

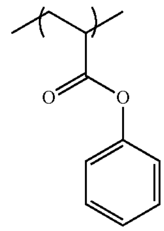

(B-7)

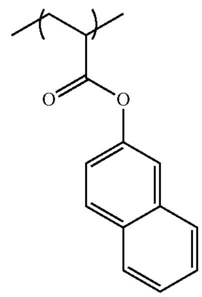

(B-8)

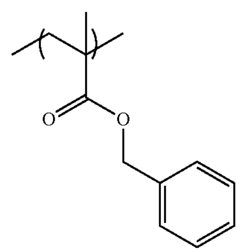

(B-9)

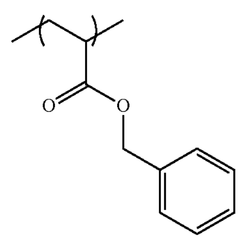

(B-10)

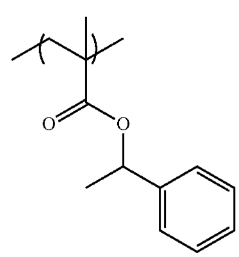

(B-11)

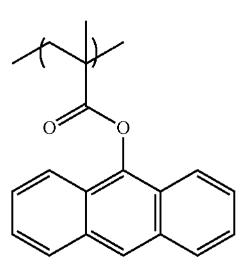

-continued
(B-12)
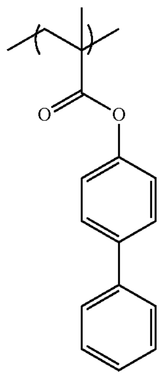
(B-13)
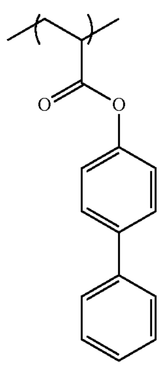
(B-14)
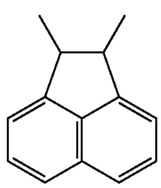
(B-15)
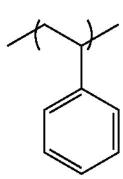
(B-16)
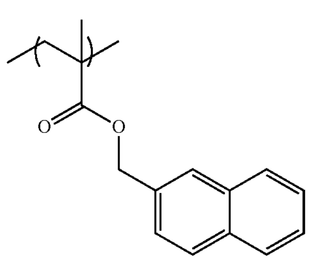
-continued
(B-17)
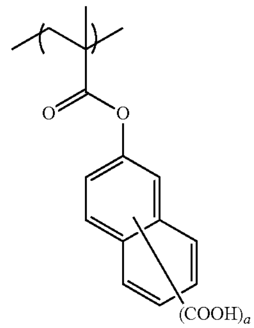
(B-18)
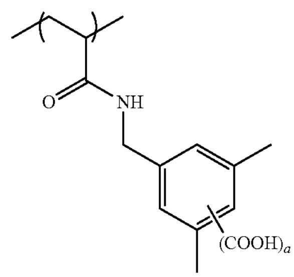
(B-19)
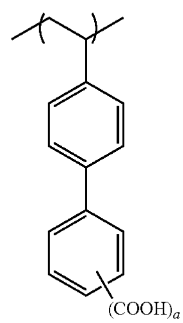
(B-20)
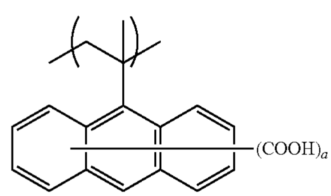
(B-21)
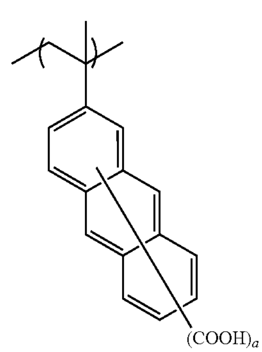

-continued
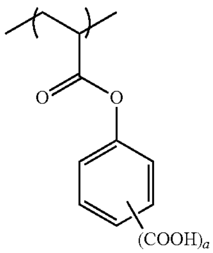
(B-22)
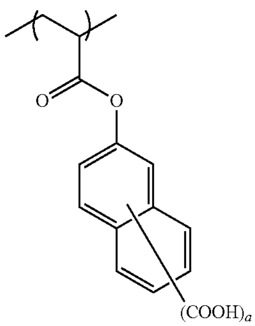
(B-23)
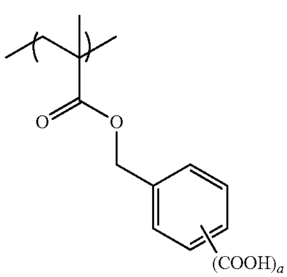
(B-24)
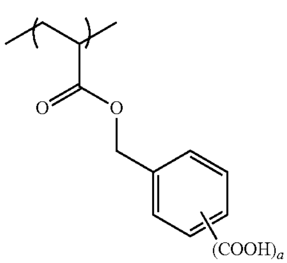
(B-25)
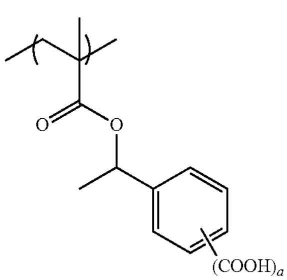
(B-26)
-continued
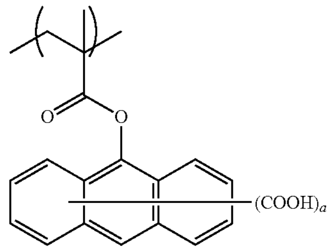
(B-27)
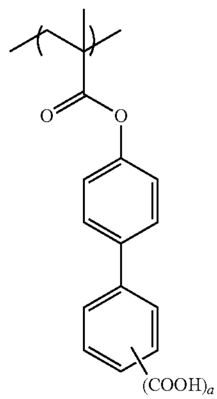
(B-28)
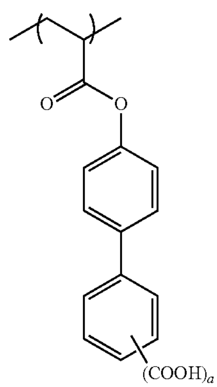
(B-29)
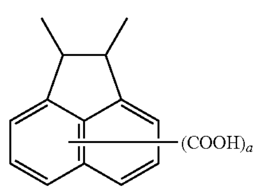
(B-30)
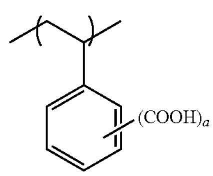
(B-31)

-continued
(B-32)
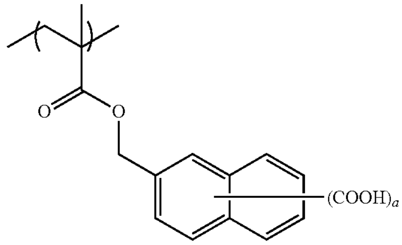
(B-33)
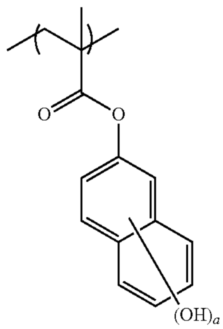
(B-34)
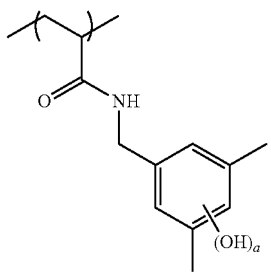
(B-35)
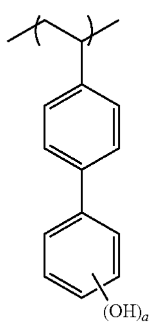
(B-36)
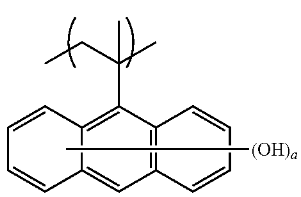
-continued
(B-37)
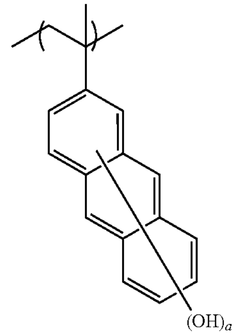
(B-38)
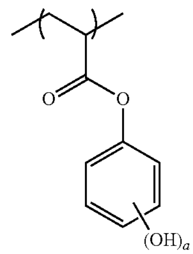
(B-39)
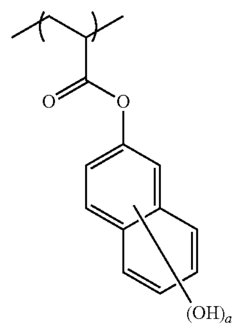
(B-40)
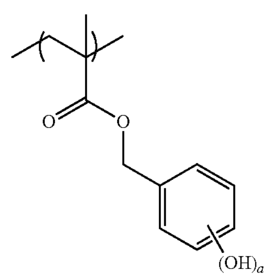
(B-41)
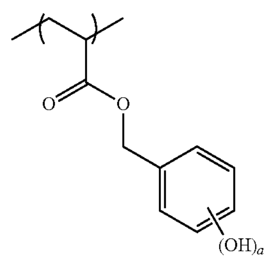

-continued (B-42)

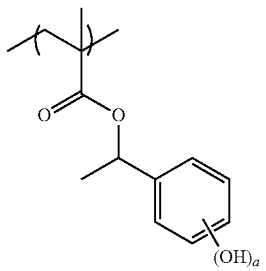

(B-43)

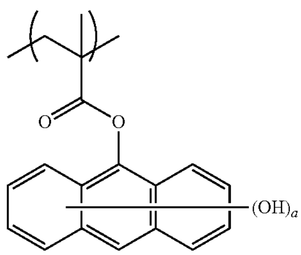

(B-44)

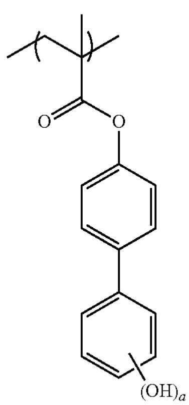

(B-45)

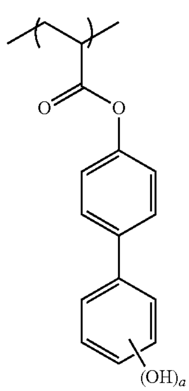

(B-46)

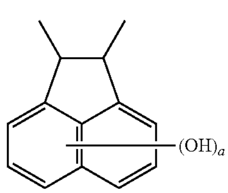

-continued (B-47)

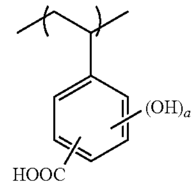

(B-48)

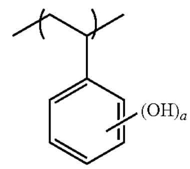

(B-49)

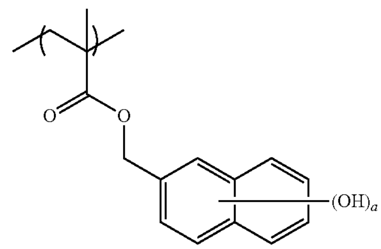

The resin (A) may contain two or more kinds of repeating units described above.

The content of the repeating unit having an aromatic group is preferably from 5 to 80 mol %, more preferably from 10 to 70 mol %, still more preferably from 20 to 60 mol %, based on all repeating units in the resin (A).

In the resin (A) for use in the present invention, from the standpoint of absorbing the exposure light to improve the pattern profile and imparting etching resistance, the content of the repeating unit having an aromatic group (preferably, the repeating unit represented by formula (IIB)) (in the case of containing a plurality of kinds of repeating units, the total thereof) is preferably from 10 to 60 mol %, more preferably from 15 to 50 mol %, still more preferably from 20 to 40 mol %, based on all repeating units in the resin (A).

[Preferred Resin Embodiment (2)]

In another embodiment of the present invention, the resin (A) is a resin of the preferred resin embodiment (2) described below.

The resin of the preferred resin embodiment (2) is preferably a resin containing typically a (meth)acrylate-based repeating unit. The content of the (meth)acrylate-based repeating unit is usually 50 mol % or more, preferably 75 mol % or more, based on all repeating units in the resin. A resin where all repeating units are composed of a (meth)acrylate-based repeating unit is more preferred.

The resin of the preferred resin embodiment (2) is more preferably a resin composed of at least one acid-decomposable group-containing repeating unit selected from the group consisting of a repeating unit represented by the following formula (AI) and the later-descried repeating unit represented by formula (AAI), and, if desired, at least one repeating unit selected from respective repeating units described later in [Other Repeating Units].

The resin (A) preferably contains a repeating unit having an acid-decomposable group, and the acid-decomposable group-containing repeating unit in the resin of the preferred resin embodiment (2) is preferably a repeating unit represented by the following formula (AI):

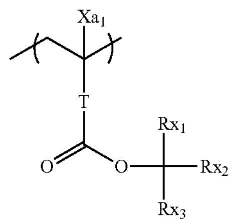

(AI)

In formula (AI), $Xa_1$ represents a hydrogen atom, a methyl group which may have a substituent, or a group represented by —$CH_2$—$R_9$. $R_9$ represents a hydroxyl group or a monovalent organic group. The monovalent organic group includes, for example, an alkyl group having a carbon number of 5 or less, and an acyl group having a carbon number of 5 or less, and is preferably an alkyl group having a carbon number of 3 or less, more preferably a methyl group. $Xa_1$ is preferably a hydrogen atom, a methyl group, a trifluoromethyl group, or a hydroxymethyl group.

T represents a single bond or a divalent linking group.

Each of $Rx_1$ to $Rx_3$ independently represents an alkyl group (linear or branched) or a cycloalkyl group (monocyclic or polycyclic).

Two members out of $Rx_1$ to $Rx_3$ may combine to form a cycloalkyl group (monocyclic or polycyclic).

Examples of the divalent linking group of T include an alkylene group, a —COO-Rt- group, and a —O-Rt- group. In the formulae, Rt represents an alkylene group or a cycloalkylene group.

T is preferably a single bond or a —COO-Rt- group, more preferably a single bond. Rt is preferably an alkylene group having a carbon number of 1 to 5, more preferably a —$CH_2$— group, —$(CH_2)_2$— group, or a —$(CH_2)_3$— group.

The alkyl group of $Rx_1$ to $Rx_3$ is preferably an alkyl group having a carbon number of 1 to 4, such as methyl group, ethyl group, n-propyl group, isopropyl group, n-butyl group, isobutyl group and tert-butyl group.

The cycloalkyl group of $Rx_1$ to $Rx_3$ is preferably a monocyclic cycloalkyl group such as cyclopentyl group and cyclohexyl group, or a polycyclic cycloalkyl group such as norbornyl group, tetracyclodecanyl group, tetracyclododecanyl group and adamantyl group.

The cycloalkyl group formed by combining two members out of $Rx_1$ to $Rx_3$ is preferably a monocyclic cycloalkyl group such as cyclopentyl group and cyclohexyl group, or a polycyclic cycloalkyl group such as norbornyl group, tetracyclodecanyl group, tetracyclododecanyl group and adamantyl group, more preferably a monocyclic cycloalkyl group having a carbon number of 5 to 6.

An embodiment where $Rx_1$ is a methyl group or an ethyl group and $Rx_2$ and $Rx_3$ are combined to form the above-described cycloalkyl group is also preferred.

Above all, each of $Rx_1$ to $Rx_3$ is independently, preferably a linear or branched alkyl group and is preferably a linear or branched alkyl group having a carbon number of 1 to 4, and examples thereof include a methyl group, an ethyl group, an n-propyl group, an isopropyl group, an n-butyl group, an isobutyl group, and a tert-butyl group.

In the case where each of $Rx_1$ to $Rx_3$ is independently a linear or branched alkyl group, $Rx_1$ is preferably a methyl group, an ethyl group, an n-propyl group or an n-butyl group, more preferably a methyl group or an ethyl group, still more preferably a methyl group. $Rx_2$ is preferably a methyl group, an ethyl group, an n-propyl group, an isopropyl group or an n-butyl group, more preferably a methyl group or an ethyl group, still more preferably a methyl group. $Rx_3$ is preferably a methyl group, an ethyl group, an n-propyl group, an isopropyl group, an n-butyl group, an isobutyl group or a tert-butyl group, more preferably a methyl group, an ethyl group, an isopropyl group or an isobutyl group, still more preferably a methyl group, an ethyl group or an isopropyl group.

In the case where T is a single bond and at the same time, each of $Rx_1$ to $Rx_3$ is independently a linear or branched alkyl group (in this case, two members out of $Rx_1$ to $Rx_3$ do not combine to form a cycloalkyl group), the pattern forming method can ensure that the roughness performance, the uniformity of local pattern dimension and the exposure latitude are more excellent and the reduction in film thickness of the pattern part formed by exposure, so-called film loss, is more suppressed.

Each of the groups above may have a substituent, and examples of the substituent include an alkyl group (having a carbon number of 1 to 4), a halogen atom, a hydroxyl group, an alkoxy group (having a carbon number of 1 to 4), a carboxyl group, and an alkoxycarbonyl group (having a carbon number of 2 to 6). The carbon number is preferably 8 or less. Above all, from the standpoint of more enhancing the dissolution contrast for an organic solvent-containing developer between before and after acid decomposition, the substituent is preferably a group free from a heteroatom such as oxygen atom, nitrogen atom and sulfur atom (for example, preferably not an alkyl group substituted with a hydroxyl group), more preferably a group composed of only a hydrogen atom and a carbon atom, still more preferably a linear or branched alkyl group or a cycloalkyl group.

Preferable specific examples of the acid-decomposable group-containing repeating unit are illustrated below, but the present invention is not limited thereto.

In specific examples, each of Rx and $Xa_1$ represents a hydrogen atom, $CH_3$, $CF_3$ or $CH_2OH$, and each of Rxa and Rxb represents an alkyl group having a carbon number of 1 to 4. Z represents a substituent, and when a plurality of Z's are present, each Z may be the same as or different from every other Z. p represents 0 or a positive integer. Specific examples and preferred examples of Z are the same as specific examples and preferred examples of the substituent which may be substituted on each of the groups such as $Rx_1$ to $Rx_3$.

1

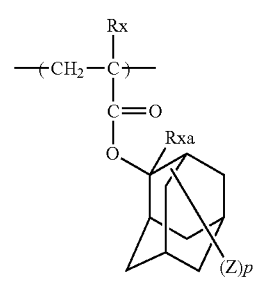

2

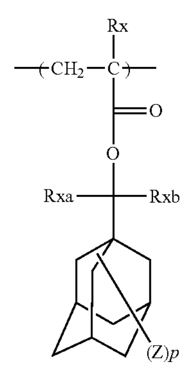

-continued
3
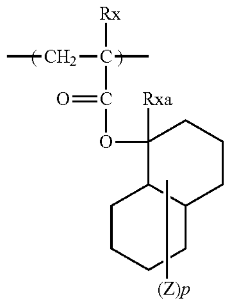
4
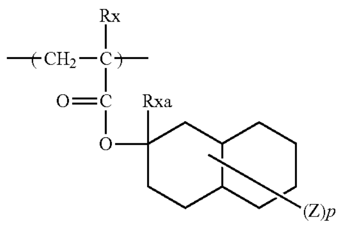
5
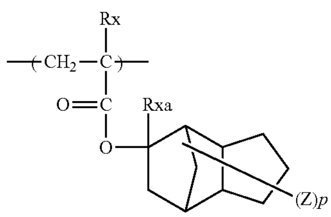
6
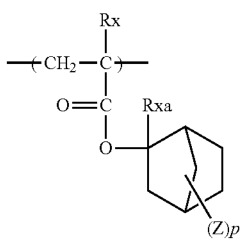
7
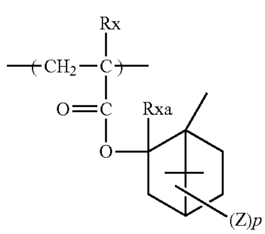
8
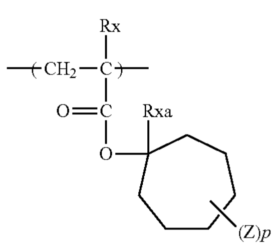
-continued
9
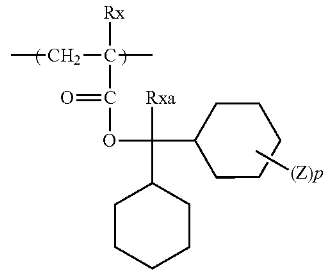
10
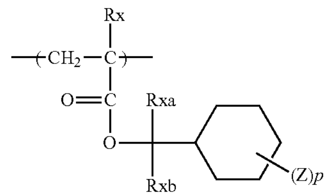
11
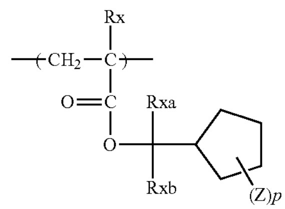
12
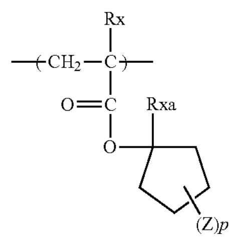
13
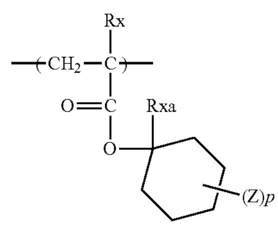
14
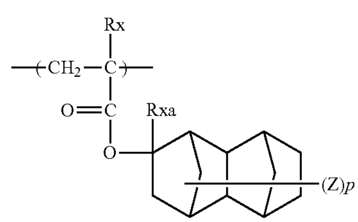
15
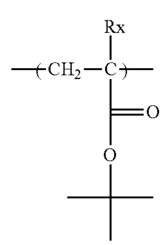

-continued
16
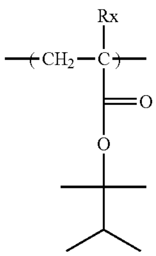
17
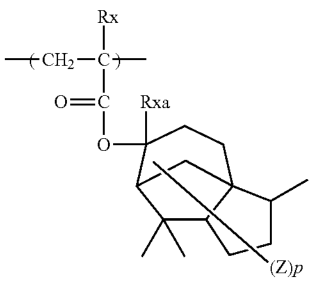
18
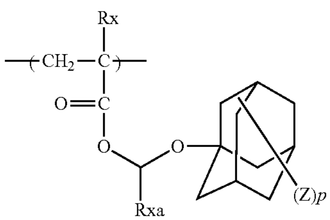
19
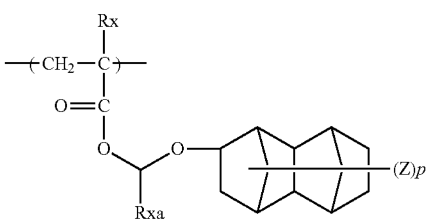
20
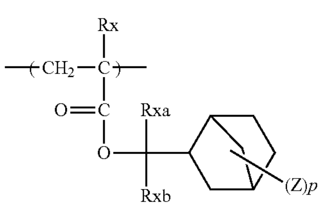
21
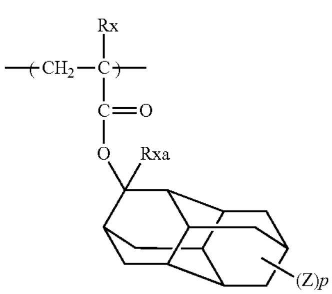
-continued
22
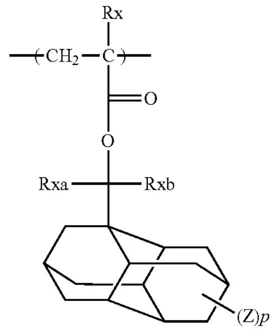
23
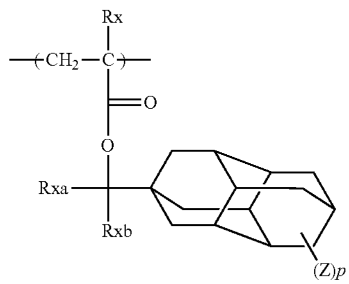
24
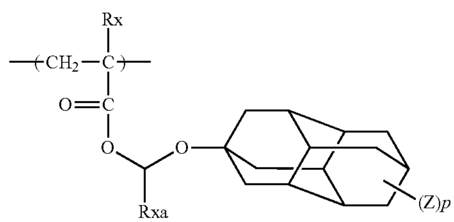
25
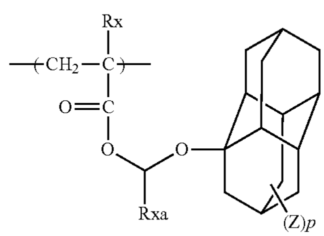
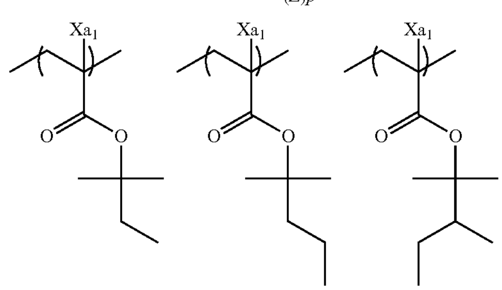
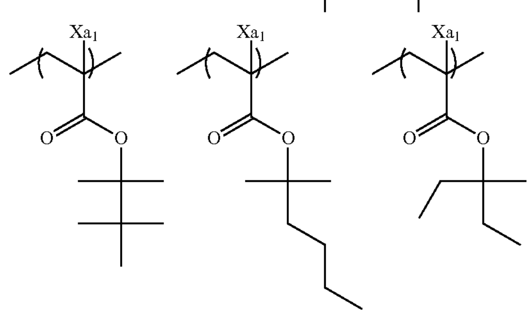

-continued
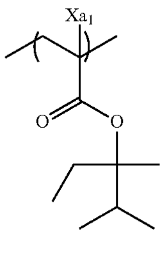
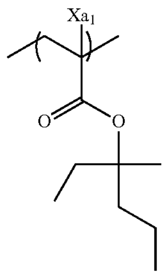
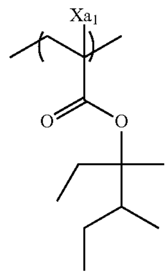
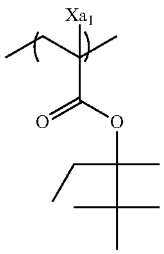
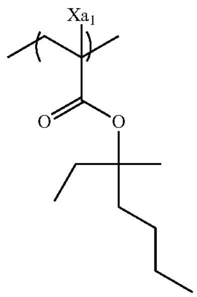
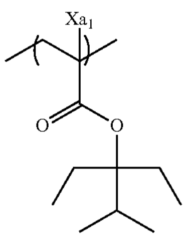
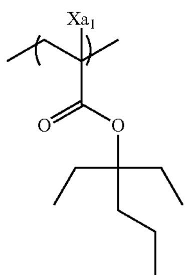
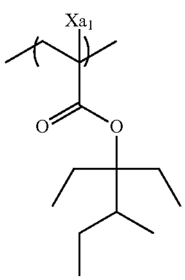
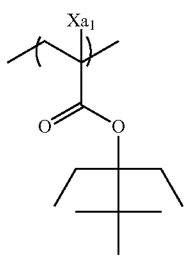
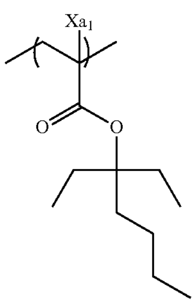
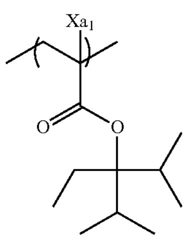
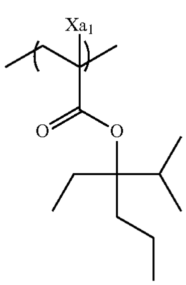
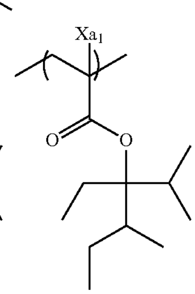
-continued
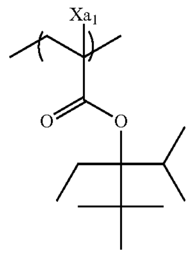
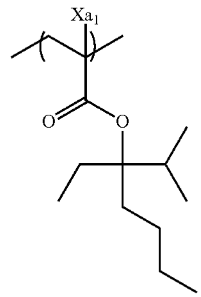
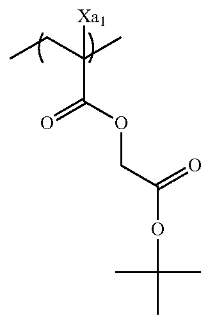
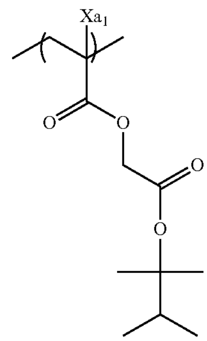
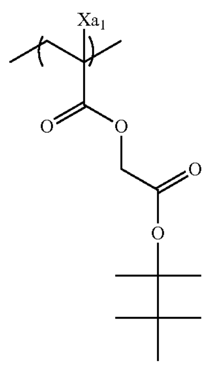
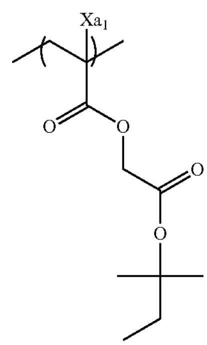
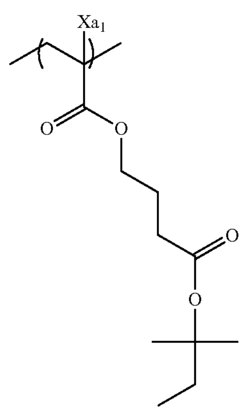
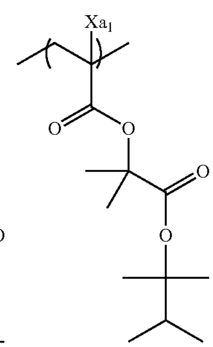
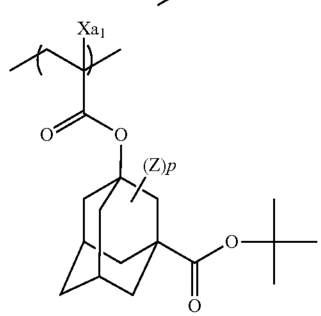

-continued
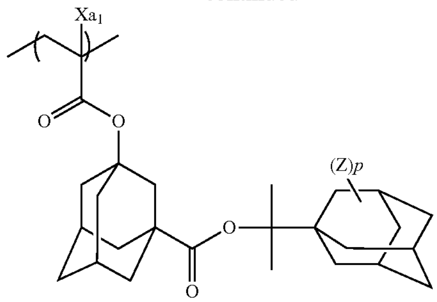
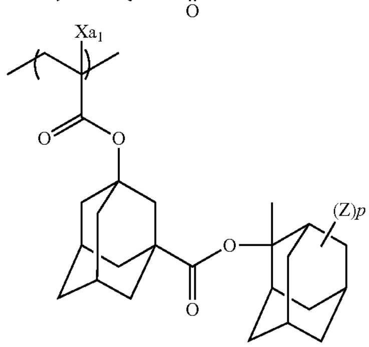
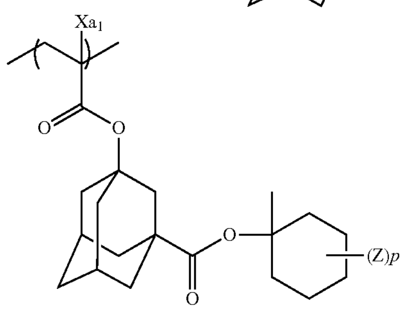
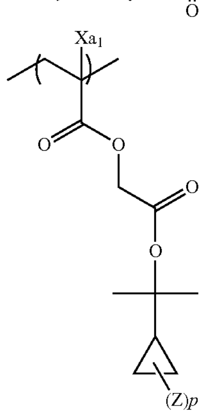
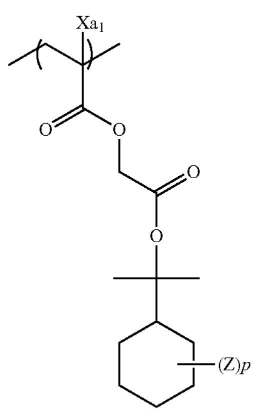
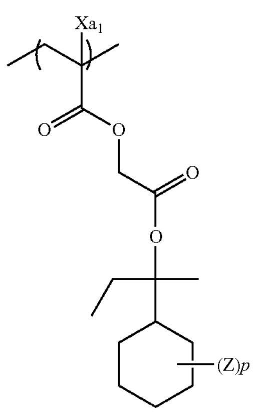
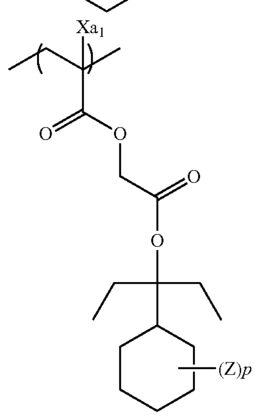
-continued
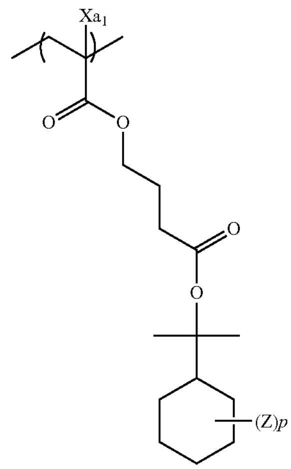
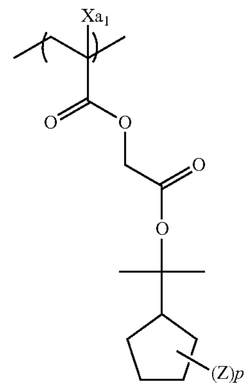
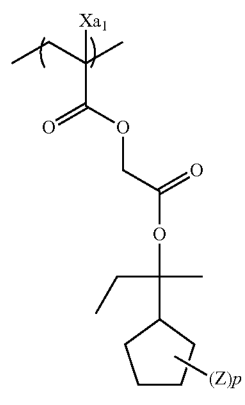
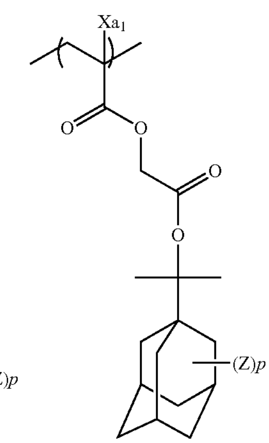
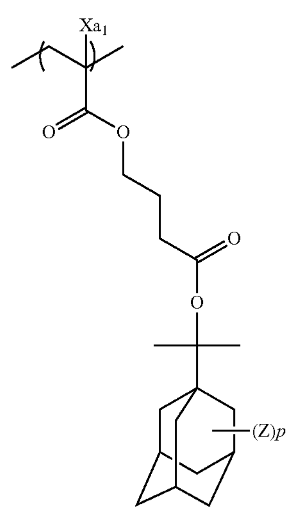
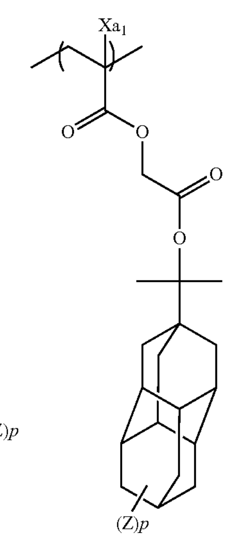

-continued
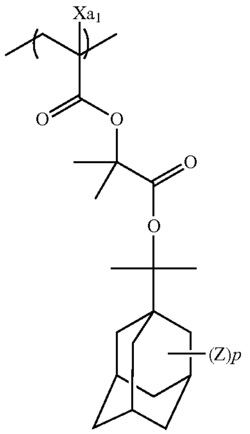
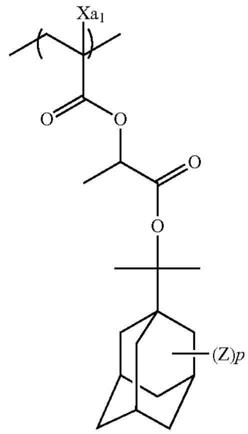
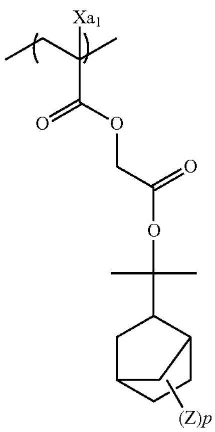
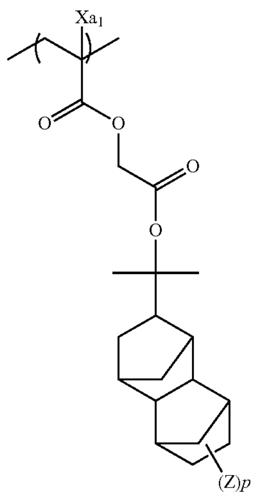
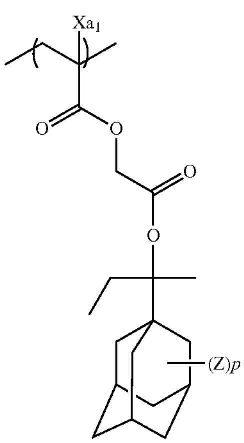
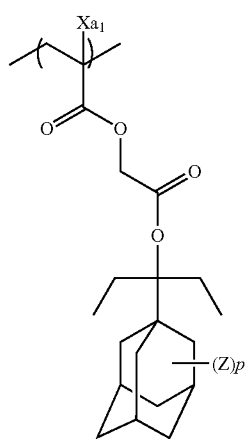
-continued
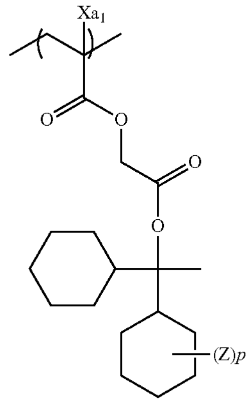
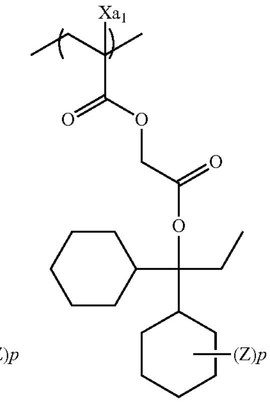
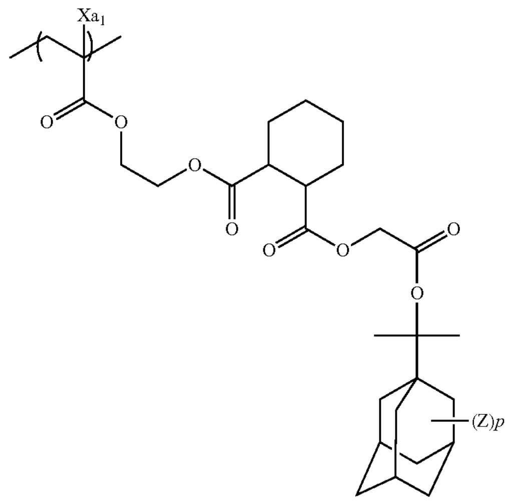
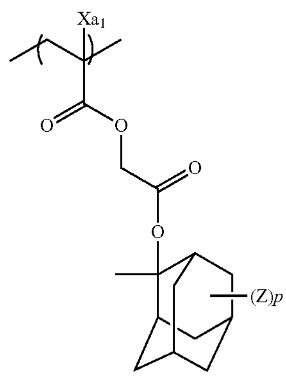
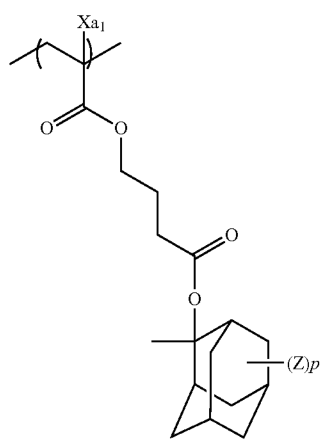

-continued

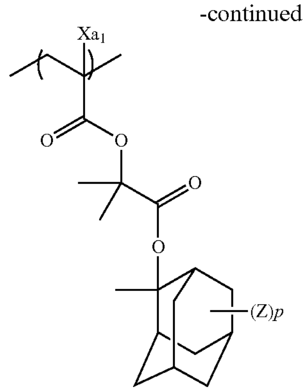

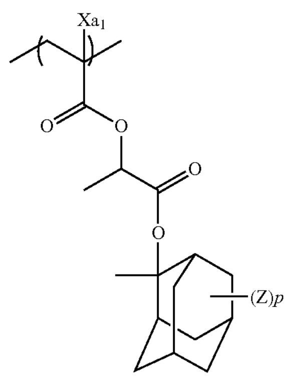

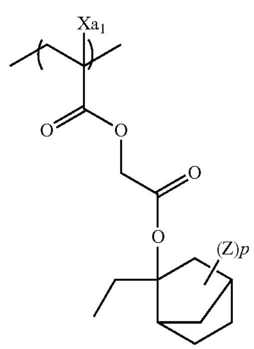

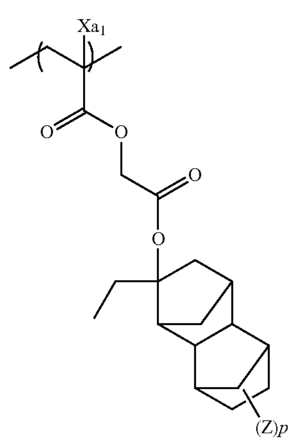

-continued

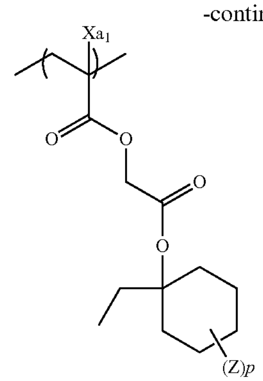

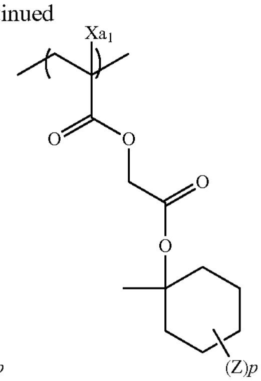

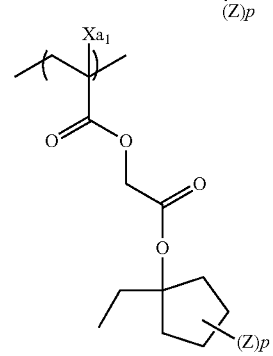

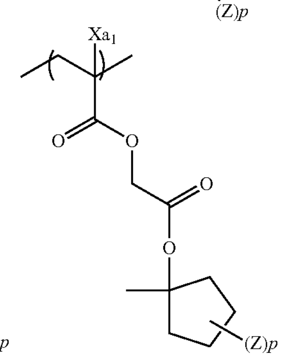

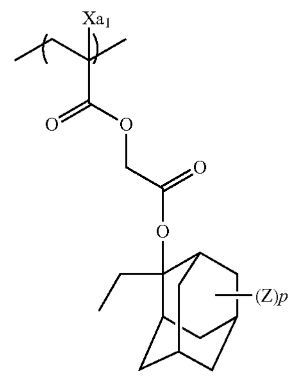

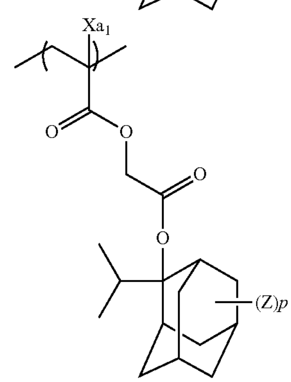

It is also preferred that the acid-decomposable group-containing repeating unit is a repeating unit capable of decomposing by the action of an acid to produce a carboxyl group, represented by the following formula (AAI), and thanks to this configuration, the pattern forming method can ensure that the roughness performance such as line width roughness, the uniformity of local pattern dimension and the exposure latitude are more excellent and the reduction in film thickness of the pattern part formed by development, so-called film loss, is more suppressed.

(AAI)

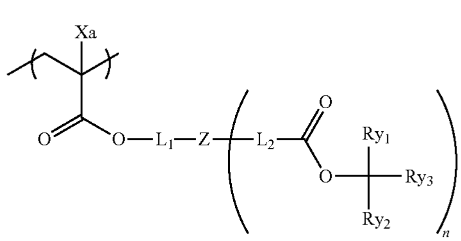

In the formula, Xa represents a hydrogen atom, an alkyl group, a cyano group or a halogen atom.

Each of $Ry_1$ to $Ry_a$ independently represents an alkyl group or a cycloalkyl group, and two members out of $Ry_1$ to $Ry_3$ may combine to form a ring.

Z represents a (n+1)-valent linking group having a polycyclic hydrocarbon structure which may have a heteroatom as a ring member.

Each of $L_1$ and $L_2$ independently represents a single bond or a divalent linking group.

n represents an integer of 1 to 3.

When n is 2 or 3, each $L_2$, each $Ry_1$, each $Ry_2$ and each $Ry_3$ may be the same as or different from every other $L_2$, $Ry_1$, $Ry_2$ and $Ry_3$, respectively.

The alkyl group of Xa may have a substituent, and examples of the substituent include a hydroxyl group and a halogen atom (preferably, fluorine atom).

The alkyl group of Xa is preferably an alkyl group having a carbon number of 1 to 4, and examples thereof include a methyl group, an ethyl group, a propyl group, a hydroxymethyl group, and a trifluoromethyl group, with a methyl group being preferred.

Xa is preferably a hydrogen atom or a methyl group.

The alkyl group of $Ry_1$ to $Ry_3$ may be chain or branched and is preferably an alkyl group having a carbon number of 1 to 4, such as methyl group, ethyl group, n-propyl group, isopropyl group, n-butyl group, isobutyl group and tert-butyl group.

The cycloalkyl group of $Ry_1$ to $Ry_3$ is preferably a monocyclic cycloalkyl group such as cyclopentyl group and cyclohexyl group, or a polycyclic cycloalkyl group such as norbornyl group, tetracyclodecanyl group, tetracyclododecanyl group and adamantyl group.

The ring formed by combining two members out of $Ry_1$ to $Ry_3$ is preferably a monocyclic hydrocarbon ring such as cyclopentane ring and cyclohexane ring, or a polycyclic hydrocarbon ring such as norbornane ring, tetracyclodecane ring, tetracyclododecane ring and adamantane ring, more preferably a monocyclic hydrocarbon ring having a carbon number of 5 to 6.

Each of $Ry_1$ to $Ry_3$ is independently preferably an alkyl group, more preferably a chain or branched alkyl group having a carbon number of 1 to 4. Also, the total of the carbon numbers of the chain or branched alkyl groups as $Ry_1$ to $Ry_3$ is preferably 5 or less.

Each of $Ry_1$ to $Ry_3$ may further have a substituent, and examples of the substituent include an alkyl group (having a carbon number of 1 to 4), a cycloalkyl group (having a carbon number of 3 to 8), a halogen atom, an alkoxy group (having a carbon number of 1 to 4), a carboxyl group, and an alkoxycarbonyl group (having a carbon number of 2 to 6). The carbon number is preferably 8 or less. Above all, from the standpoint of more enhancing the dissolution contrast for an organic solvent-containing developer between before and after acid decomposition, the substituent is preferably a group free from a heteroatom such as oxygen atom, nitrogen atom and sulfur atom (for example, preferably not an alkyl group substituted with a hydroxyl group), more preferably a group composed of only a hydrogen atom and a carbon atom, still more preferably a linear or branched alkyl group or a cycloalkyl group.

The linking group having a polycyclic hydrocarbon structure of Z includes a ring-assembly hydrocarbon ring group and a crosslinked cyclic hydrocarbon ring group, and these groups include a group obtained by removing arbitrary (n+1) hydrogen atoms from a ring-assembly hydrocarbon ring and a group obtained by removing arbitrary (n+1) hydrogen atoms from a crosslinked cyclic hydrocarbon ring, respectively.

Examples of the ring-assembly hydrocarbon ring group include a bicyclohexane ring group and a perhydronaphthalene ring group. Examples of the crosslinked cyclic hydrocarbon ring group include a bicyclic hydrocarbon ring group such as pinane ring group, bornane ring group, norpinane ring group, norbornane ring group and bicyclooctane ring group (e.g., bicyclo[2.2.2]octane ring group, bicyclo[3.2.1]octane ring group), a tricyclic hydrocarbon ring group such as homobledane ring group, adamantane ring group, tricyclo$[5.2.1.0^{2,6}]$decane ring group and tricyclo$[4.3.1.1^{2,5}]$undecane ring group, and a tetracyclic hydrocarbon ring group such as tetracyclo$[4.4.0.1^{2,5}.1^{7,10}]$dodecane ring group and perhydro-1,4-methano-5,8-methanonaphthalene ring group. The crosslinked cyclic hydrocarbon ring group also includes a condensed cyclic hydrocarbon ring group, for example, a condensed ring group obtained by fusing a plurality of 5- to 8-membered cycloalkane ring groups, such as perhydronaphthalene (decalin) ring group, perhydroanthracene ring group, perhydrophenathrene ring group, perhydroacenaphthene ring group, perhydrofluorene ring group, perhydroindene ring group and perhydrophenalene ring group.

Preferred examples of the crosslinked cyclic hydrocarbon ring group include a norbornane ring group, an adamantane ring group, a bicyclooctane ring group, and a tricycle$[5,2,1,0^{2,6}]$decane ring group. Of these crosslinked cyclic hydrocarbon ring groups, a norbornane ring group and an adamantane ring group are more preferred.

The linking group having a polycyclic hydrocarbon structure represented by Z may have a substituent. Examples of the substituent which may be substituted on Z include a substituent such as alkyl group, hydroxyl group, cyano group, keto group (=O), acyloxy group, —COR, —COOR, —CON$(R)_2$, —$SO_2$R, —$SO_3$R and —$SO_2N(R)_2$, wherein R represents a hydrogen atom, an alkyl group, a cycloalkyl group or an aryl group.

The alkyl group, alkylcarbonyl group, acyloxy group, —COR, —COOR, —CON$(R)_2$, —$SO_2$R, —$SO_3$R and —$SO_2N(R)_2$ as the substituent which Z may have may further have a substituent, and this substituent includes a halogen atom (preferably, fluorine atom).

In the linking group having a polycyclic hydrocarbon structure represented by Z, the carbon constituting the polycyclic ring (the carbon contributing to ring formation) may be carbonyl carbon. Also, as described above, the polycyclic ring may have, as a ring member, a heteroatom such as oxygen atom and sulfur atom.

Examples of the linking group represented by $L_1$ and $L_2$ include —COO—, —COO—, —CONH—, —NHCO—, —CO—, —O—, —S—, —SO—, —$SO_2$—, an alkylene group (preferably having a carbon number of 1 to 6), a cycloalkylene group (preferably having a carbon number of 3 to 10), an alkenylene group (preferably having a carbon number of 2 to 6), and a linking group formed by combining a plurality of these members, and a linking group having a total carbon number of 12 or less is preferred.

$L_1$ is preferably a single bond, an alkylene group, —COO—, —COO—, —CONH—, —NHCO—, -alkylene group-COO—, -alkylene group-OCO—, -alkylene group-CONH—, -alkylene group-NHCO—, —CO—, —O—, —$SO_2$—, or -alkylene group-O—, more preferably a single bond, an alkylene group, -alkylene group-COO—, or -alkylene group-O—.

$L_2$ is preferably a single bond, an alkylene group, —COO—, —COO—, —CONH—, —NHCO—, —COO-alkylene group-, —OCO-alkylene group-, —CONH-alkylene group-, —NHCO-alkylene group-, —CO—, —O—, —$SO_2$—, —O-alkylene group-, or —O-cycloalkylene group-, more preferably a single bond, an alkylene group, —COO-alkylene group-, —O-alkylene group-, or —O-cycloalkylene group-.

In the descriptions above, the bond "-" at the left end means to be bonded to the ester bond on the main chain side in $L_1$ and bonded to Z in $L_2$, and the bond "-" at the right end means to be bonded to Z in $L_1$ and bonded to the ester bond connected to the group represented by $(Ry_1)(Ry_2)(Ry_3)C$— in $L_2$.

Incidentally, $L_1$ and $L_2$ may be bonded to the same atom constituting the polycyclic ring in Z.

n is preferably 1 or 2, more preferably 1.

Specific examples of the repeating unit represented by formula (AAI) are illustrated below, but the present invention is not limited thereto. In specific examples, Xa represents a hydrogen atom, an alkyl group, a cyano group or a halogen atom.

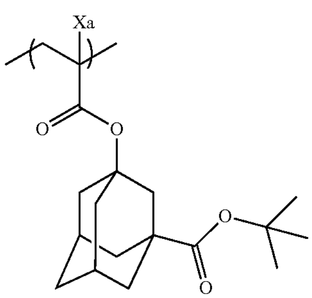

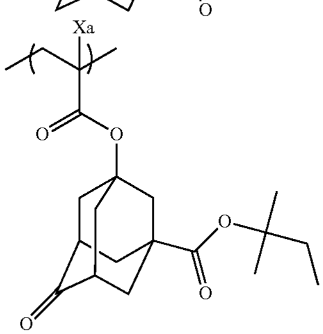

-continued

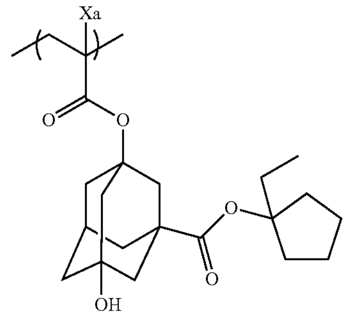

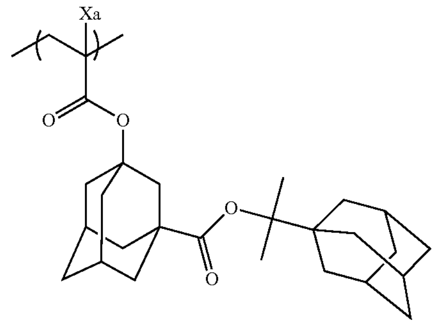

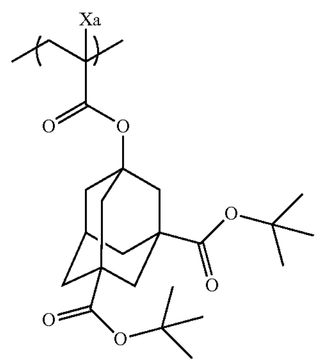

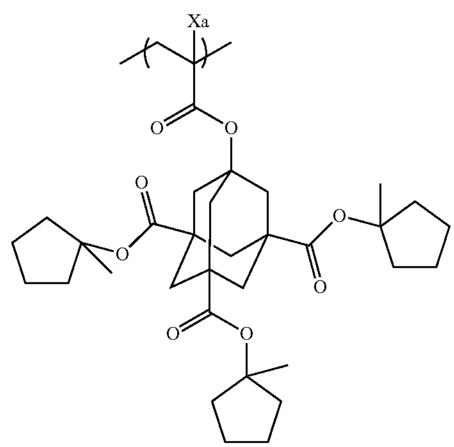

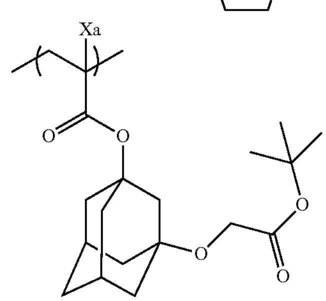

-continued
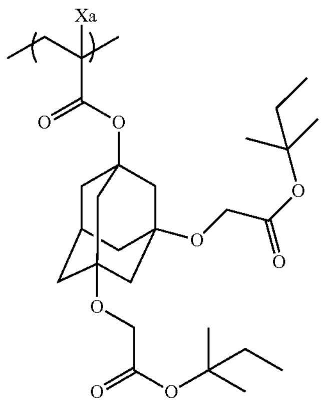
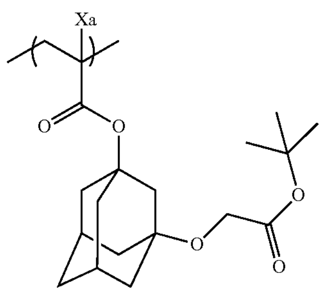
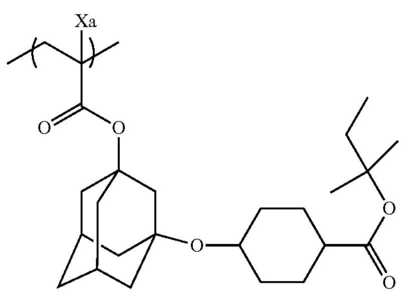
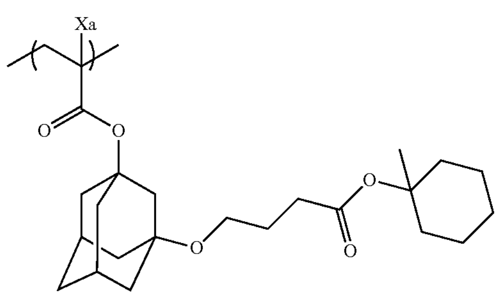
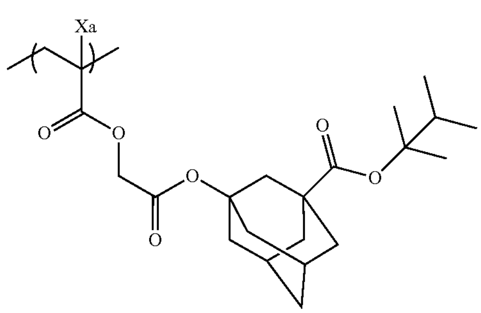
-continued
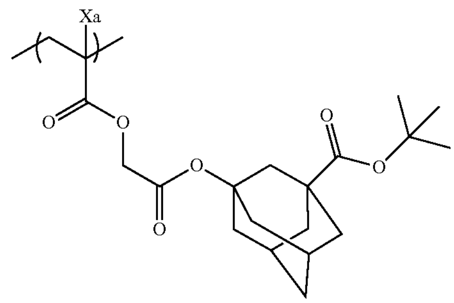
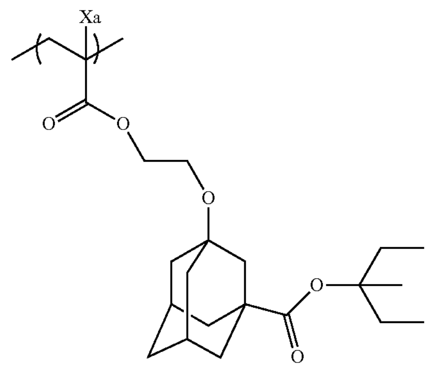
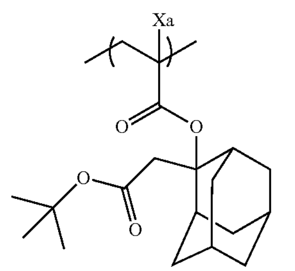
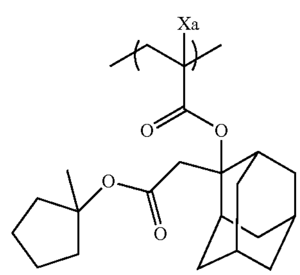
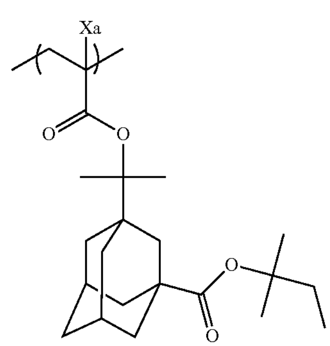

-continued
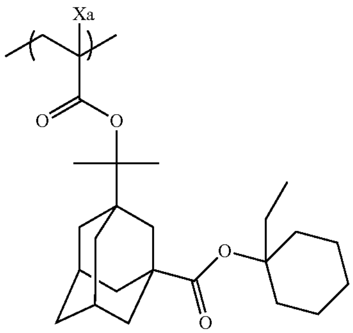
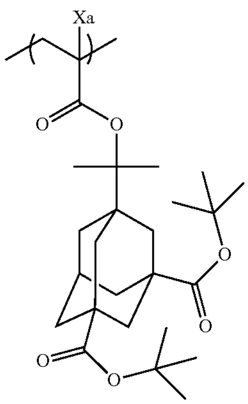
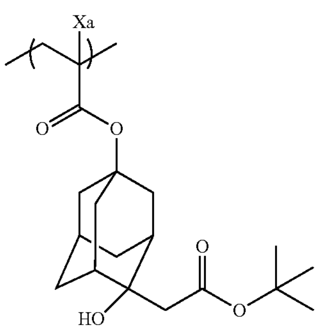
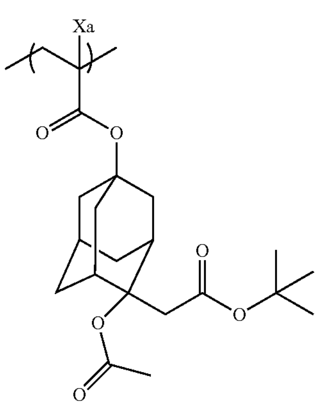
-continued
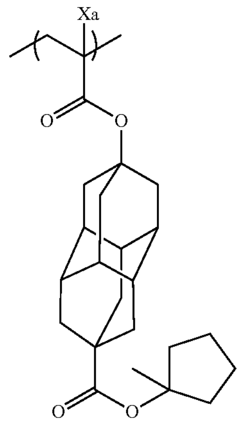
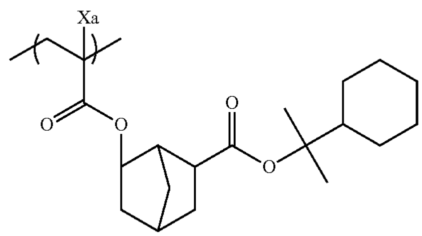
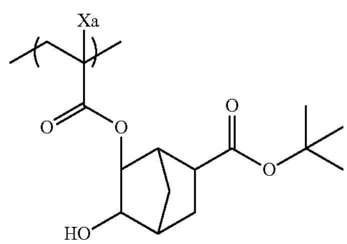
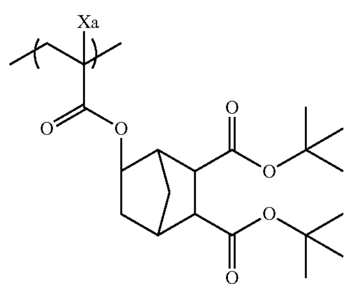
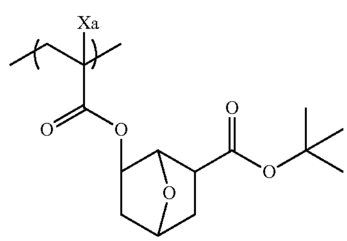
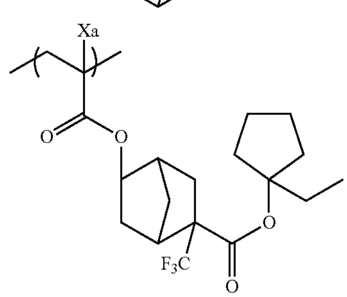

-continued
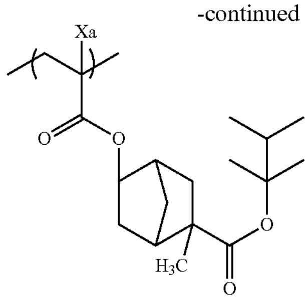
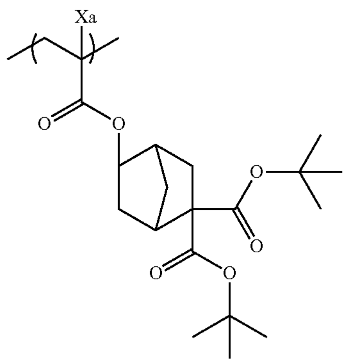
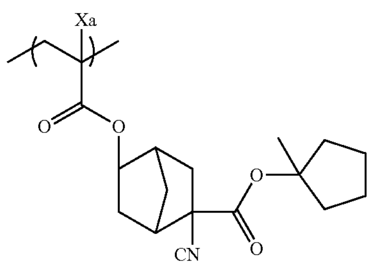
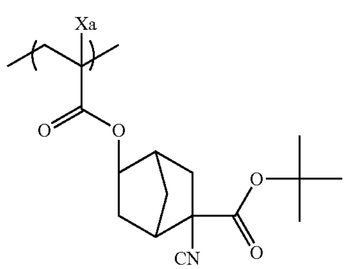
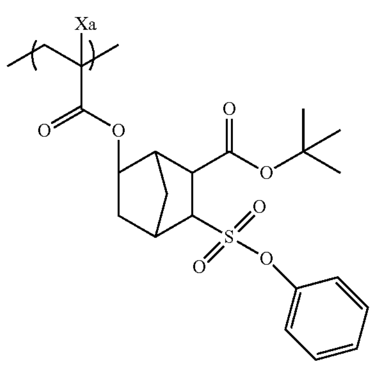
-continued
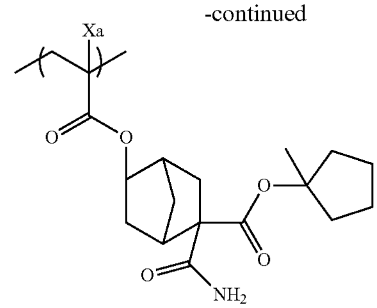
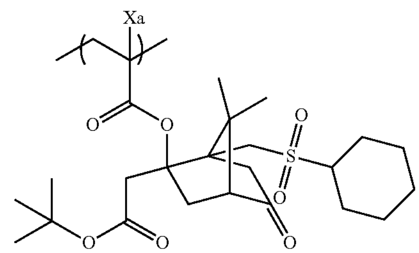
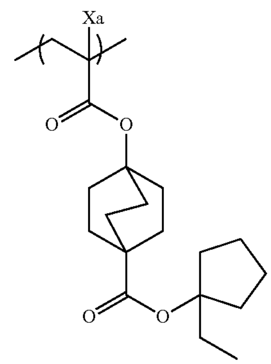
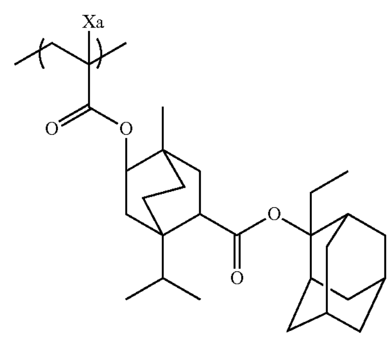
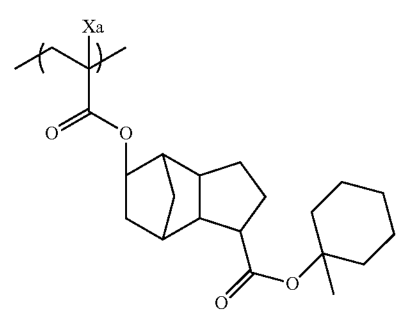

-continued

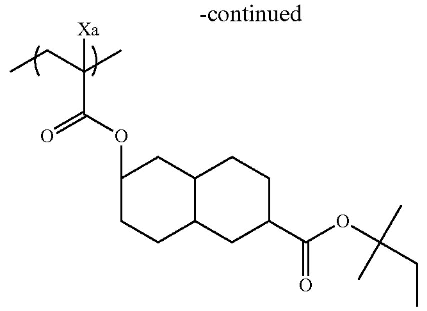

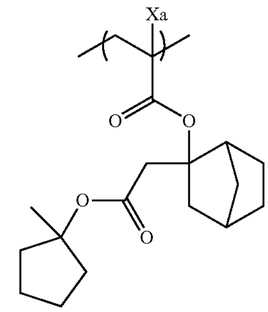

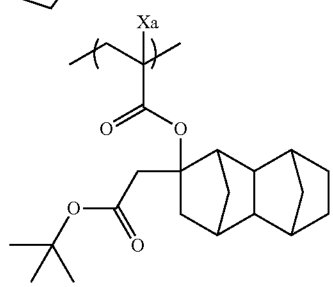

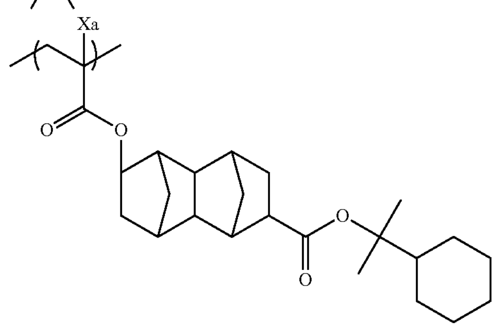

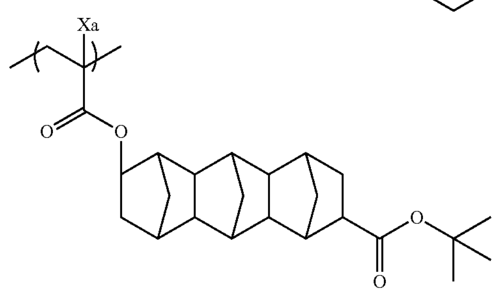

As for the acid-decomposable group-containing repeating unit in the resin (A) as the resin of the preferred resin embodiment (2), one kind may be used, or two or more kinds may be used in combination.

In the present invention, the resin (A) as the resin of the preferred resin embodiment (2) preferably contains the acid-decomposable group-containing repeating unit in which the molecular weight of the eliminated material produced by the decomposition of the group capable of decomposing by the action of an acid to produce a polar group (acid-decomposable group) (in the case of producing a plurality of kinds of eliminated materials, the weighted average value of molecular weights by molar fraction (hereinafter, sometimes referred to as a "molar average value")) is 140 or less, in an amount of (in the case of containing a plurality of kinds of repeating units, as the total thereof) of 50 mol % or more based on all repeating units in the resin. In the case of forming a negative image, the exposed area remains as a pattern and therefore, by letting the eliminated material have a small molecular weight, reduction in film thickness of the pattern part can be prevented.

In the present invention, the "eliminated material produced by the decomposition of an acid-decomposable group" indicates a material which corresponds to a group capable of decomposing and leaving by the action of an acid and is decomposed and eliminated by the action of an acid. For example, in the case of the later-described repeating unit (a) (in examples illustrated later, the upper leftmost repeating unit), the eliminated material indicates alkane ($H_2C{=}C(CH_3)_2$) produced by the decomposition of the tert-butyl moiety.

In the present invention, the molecular weight of the eliminated material produced by the decomposition of the acid-decomposable group (in the case of producing a plurality of kinds of eliminated materials, the molar average value) is preferably 100 or less from the standpoint of preventing reduction in film thickness of the pattern part.

The lower limit of the molecular weight of the eliminated material produced by the decomposition of the acid-decomposable group (in the case of producing a plurality of kinds of eliminated materials, the average value thereof) is not particularly limited, but from the standpoint of letting the acid-decomposable group exert its function, the lower limit is preferably 45 or more, more preferably 55 or more.

In the present invention, in the light of more reliably maintaining the film thickness of the pattern part that is the exposed area, the resin more preferably contains the acid-decomposable group-containing repeating unit in which the molecular weight of the eliminated material produced by the decomposition of the acid-decomposable group is 140 or less, in an amount (in the case of containing a plurality of kinds, as the total) of 60 mol % or more, still more preferably 65 mol % or more, yet still more preferably 70 mol % or more, based on all repeating units in the resin. The upper limit is not particularly limited but is preferably 90 mol % or less, more preferably 85 mol % or less.

Specific examples of the acid-decomposable group-containing repeating unit in which the molecular weight of the eliminated material produced by the decomposition of the acid-decomposable group is 140 or less, are illustrated below, but the present invention is not limited thereto.

In specific examples, $Xa_1$ represents a hydrogen atom, $CH_3$, $CF_3$ or $CH_2OH$.

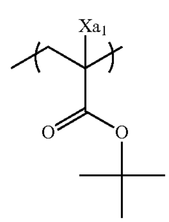

Repeating Unit (α)
Molecular weight
of eliminated material: 56

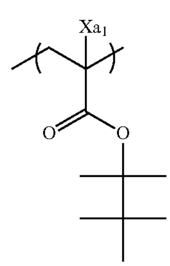

Molecular weight
of eliminated
material: 98

-continued

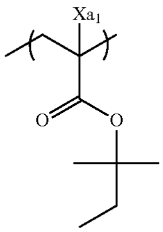

Molecular weight of eliminated material: 70

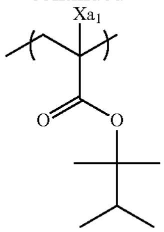

Molecular weight of eliminated material: 84

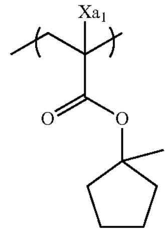

Molecular weight of eliminated material: 82

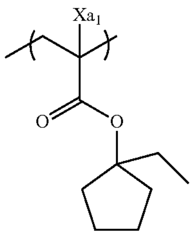

Molecular weight of eliminated material: 96

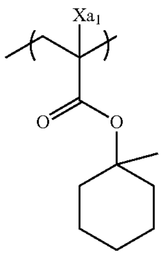

Molecular weight of eliminated material: 96

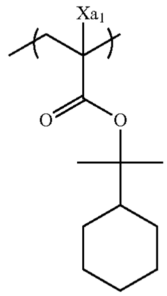

Molecular weight of eliminated material: 124

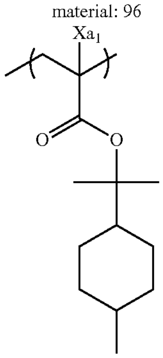

Molecular weight of eliminated material: 138

The content as the total of the acid-decomposable group-containing repeating unit in the resin (A) as the resin of the preferred resin embodiment (2) is preferably 20 mol % or more, more preferably 30 mol % or more, based on all repeating units in the resin (A).

Also, the content as the total of the repeating unit having an acid-decomposable group is preferably 90 mol % or less, more preferably 85 mol % or less, based on all repeating units in the resin (A).

In the case where the repeating unit having an acid-decomposable group is a repeating unit represented by formula (AI) and at the same time, particularly, each of $Rx_1$ to $Rx_3$ is independently a linear or branched alkyl group, the content of the repeating unit represented by formula (AI) is preferably 45 mol % or more, more preferably 50 mol % or more, still more preferably 55 mol % or more, based on all repeating units in the resin (A). The upper limit is, from the standpoint of forming a good pattern, preferably 90 mol % or less, more preferably 85 mol % or less. Within the ranges above, the pattern forming method can ensure that the roughness performance, the uniformity of local pattern dimension and the exposure latitude are more excellent and the reduction in film thickness of the pattern part formed by exposure, so-called film loss, is more suppressed.

[Other Repeating Units]

The resin (A) may further contain a repeating unit having a lactone structure. The repeating unit having a lactone structure is preferably a repeating unit represented by the following formula (AII):

(AII)

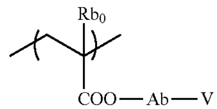

In formula (AII), $Rb_0$ represents a hydrogen atom, a halogen atom, or an alkyl group (preferably having a carbon number of 1 to 4) which may have a substituent.

Preferred examples of the substituent which the alkyl group of $Rb_0$ may have include a hydroxyl group and a halogen atom. The halogen atom of $Rb_0$ includes a fluorine atom, a chlorine atom, a bromine atom and an iodine atom. $Rb_0$ is preferably a hydrogen atom, a methyl group, a hydroxymethyl group or a trifluoromethyl group, more preferably a hydrogen atom or a methyl group.

Ab represents a single bond, an alkylene group, a divalent linking group having a monocyclic or polycyclic cycloalkyl structure, an ether bond, an ester bond, a carbonyl group, or a divalent linking group formed by a combination thereof. Ab is preferably a single bond or a divalent linking group represented by $-Ab_1-CO_2-$.

$Ab_1$ is a linear or branched alkylene group or a monocyclic or polycyclic cycloalkylene group and is preferably a methylene group, an ethylene group, a cyclohexylene group, an adamantylene group or a norbornylene group.

V represents a group having a lactone structure.

As the group having a lactone structure, any group may be used as long as it has a lactone structure, but a 5- to 7-membered ring lactone structure is preferred, and a 5- to 7-membered ring lactone structure to which another ring structure is fused to form a bicyclo or spiro structure is preferred. It is more preferred to contain a repeating unit having a lactone structure represented by any one of the following formulae (LC1-1) to (LC1-17). The lactone structure may be bonded directly to the main chain. Preferred lactone structures are (LC1-1), (LC1-4), (LC1-5), (LC1-6), (LC1-8), (LC1-13) and (LC1-14).

LC1-1

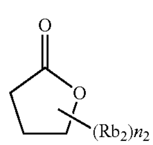

LC1-2

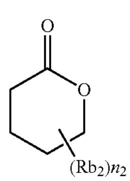

-continued

LC1-3

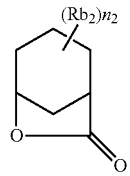

LC1-4

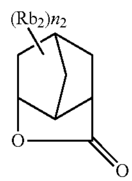

LC1-5

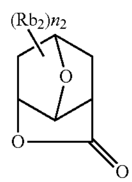

LC1-6

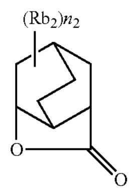

LC1-7

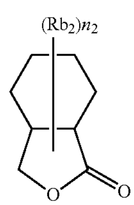

LC1-8

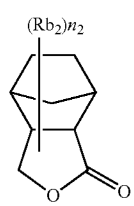

LC1-9

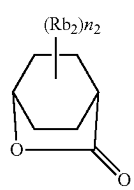

LC1-10

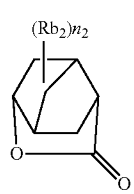

-continued

LC1-11

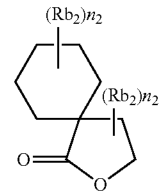

LC1-12

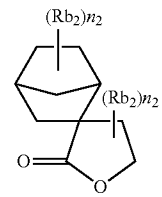

LC1-13

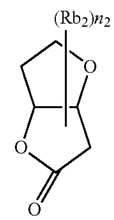

LC1-14

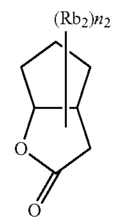

LC1-15

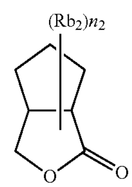

LC1-16

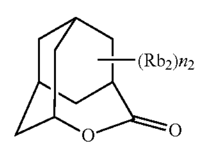

LC1-17

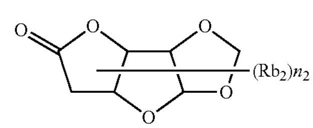

The lactone structure moiety may or may not have a substituent ($Rb_2$). Preferred examples of the substituent ($Rb_2$) include an alkyl group having a carbon number of 1 to 8, a monovalent cycloalkyl group having a carbon number of 4 to 7, an alkoxy group having a carbon number of 1 to 8, an alkoxycarbonyl group having a carbon number of 2 to 8, a carboxyl group, a halogen atom, a hydroxyl group, a cyano group, and an acid-decomposable group. Among these, an alkyl group having a carbon number of 1 to 4, a cyano group and an acid-decomposable group are more preferred. $n_2$ represents an integer of 0 to 4. When $n_2$ is 2 or more, each substituent ($Rb_2$) may be the same as or different from every other substituent ($Rb_2$) and also, the plurality of substituents ($Rb_2$) may combine with each other to form a ring.

The repeating unit having a lactone group usually has an optical isomer, and any optical isomer may be used. One optical isomer may be used alone, or a mixture of a plurality of optical isomers may be used. In the case of mainly using one optical isomer, the optical purity (ee) thereof is preferably 90% or more, more preferably 95% or more.

The resin (A) may or may not contain the repeating unit having a lactone structure, but in the case of containing the repeating unit having a lactone structure, the content of the repeating unit in the resin (A) is preferably from 0.5 to 80 mol %, more preferably from 1 to 75 mol %, still more preferably from 3 to 70 mol %, based on all repeating units. As for this repeating unit, one kind may be used, or two or more kinds may be used in combination. By virtue of using a specific lactone structure, the resolution of the pattern is enhanced and the rectangular profile is improved.

Specific examples of the repeating unit having a lactone structure in the resin (A) are illustrated below, but the present invention is not limited thereto. In the formulae, Rx represents H, $CH_3$, $CH_2OH$ or $CF_3$.

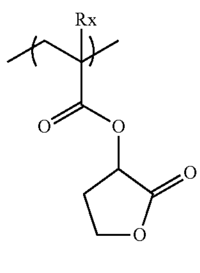

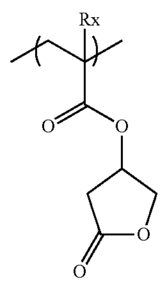

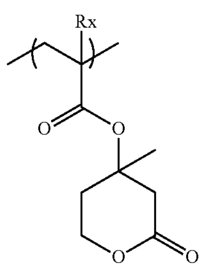

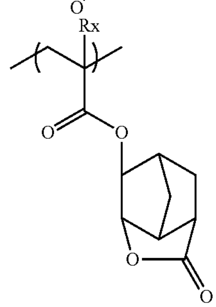

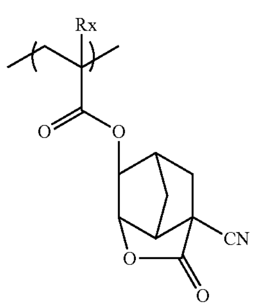

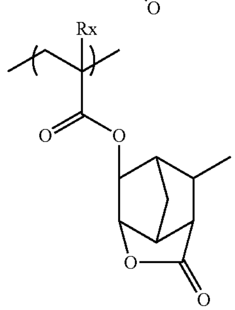

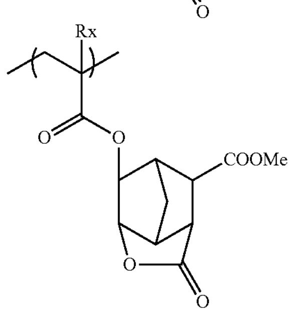

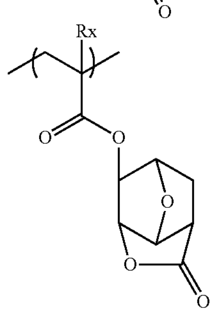

-continued

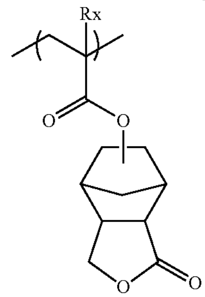

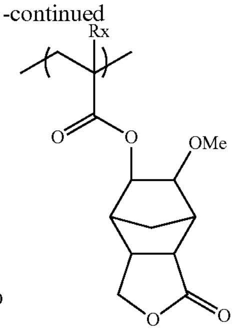

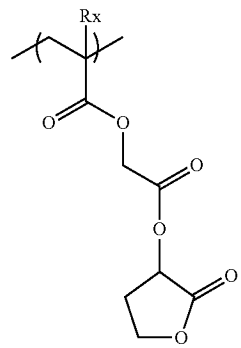

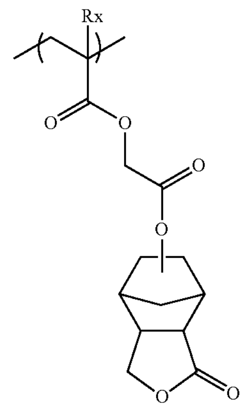

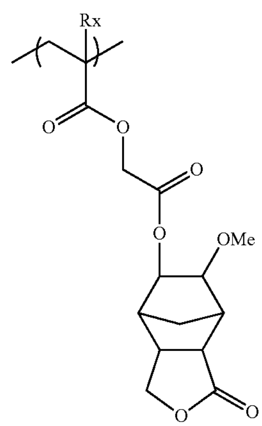

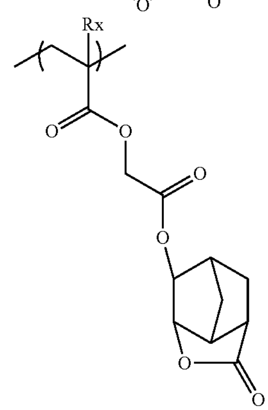

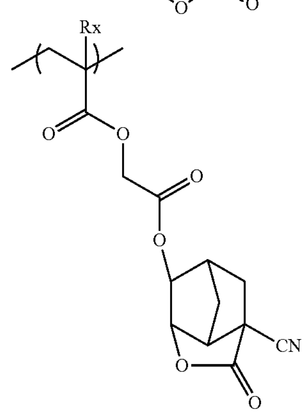

The resin (A) may contain a repeating unit having an acid group. The acid group includes a carboxyl group, a sulfonamide group, a sulfonylimide group, a bissulfonylimide group, and an aliphatic alcohol substituted with an electron-withdrawing group at the α-position (for example, hexafluoroisopropanol group), and it is more preferred to contain a repeating unit having a carboxyl group. By virtue of containing a repeating unit having an acid group, the resolution increases, for example, in the usage of forming contact holes. As for the repeating unit having an acid group, a repeating unit where the acid group is directly bonded to the main chain of the resin, such as repeating unit by an acrylic acid or a methacrylic acid, a repeating unit where the acid group is bonded to the main chain of the resin through a linking group, and a repeating unit where the acid group is introduced into the terminal of the polymer chain by using an acid group-containing polymerization initiator or chain transfer agent at the polymerization, all are preferred. The linking group may have a monocyclic or polycyclic, cyclic hydrocarbon structure. A repeating unit by an acrylic acid or a methacrylic acid is more preferred.

Specific examples of the repeating unit having an acid group are illustrated below, but the present invention is not limited thereto.

In specific examples, Rx represents H, $CH_3$, $CH_2OH$ or $CF_3$.

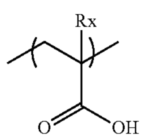

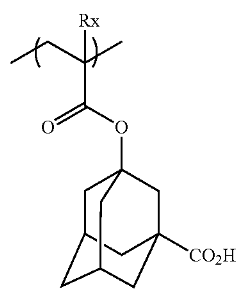

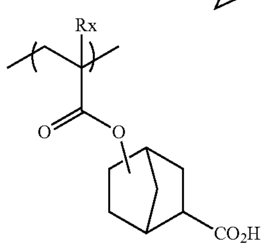

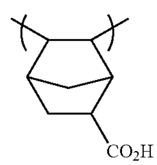

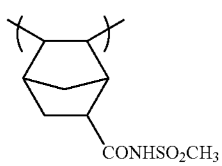

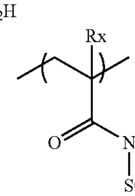

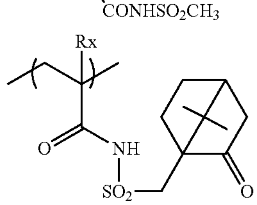

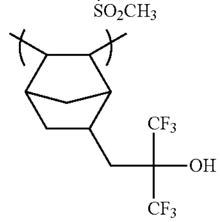

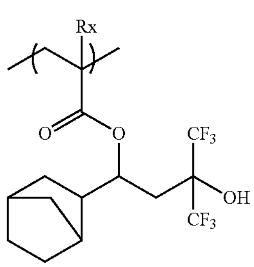

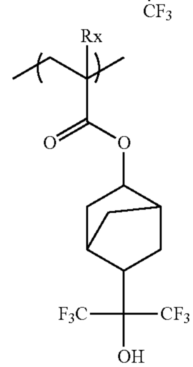

-continued

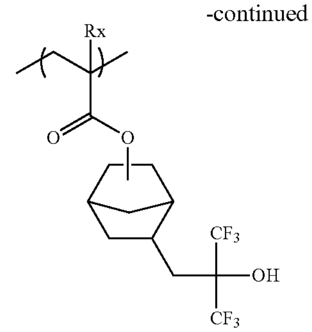

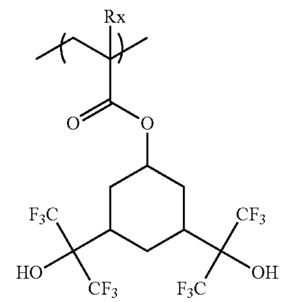

The resin (A) may or may not contain the repeating unit having an acid group, but in the case where the resin (A) contains the repeating unit having an acid group, the content of the repeating unit is preferably from 1 to 35 mol %, more preferably from 1 to 30 mol %, still more preferably from 3 to 25 mol %, based on all repeating units in the resin (A).

The resin (A) may further contain a repeating unit having a hydroxyl group or a cyano group, which is a repeating unit other than the above-described repeating units. Thanks to this repeating unit, adherence to substrate and affinity for developer can be enhanced. The repeating unit having a hydroxyl group or a cyano group is preferably a repeating unit having an alicyclic hydrocarbon structure substituted with a hydroxyl group or a cyano group and preferably has no acid-decomposable group. The alicyclic hydrocarbon structure in the alicyclic hydrocarbon structure substituted with a hydroxyl group or a cyano group is preferably an adamantyl group, a diamantyl group or a norbornane group, more preferably an adamantyl group. The alicyclic hydrocarbon structure is preferably substituted with a hydroxyl group, and it is more preferred to contain a repeating unit having an adamantyl group substituted with at least one hydroxyl group.

In particular, from the standpoint of controlling the diffusion of the acid generated, the resin (A) most preferably contains a repeating unit having a hydroxyadamantyl group or a dihydroxyadamantyl group.

The alicyclic hydrocarbon structure substituted with a hydroxyl group or a cyano group is preferably a partial structure represented by the following formulae (VIIa) to (VIId), more preferably a partial structure represented by the following formula (VIIa):

(VIIa)

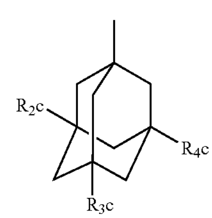

-continued (VIIb)

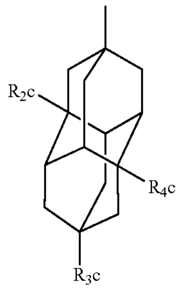

(VIIc)

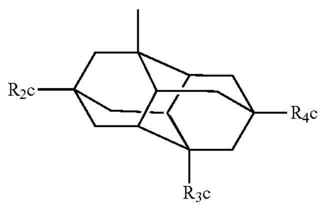

(VIId)

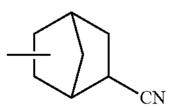

In formulae (VIIa) to (VIII), each of $R_2c$ to $R_4c$ independently represents a hydrogen atom, a hydroxyl group or a cyano group. However, at least one of $R_2c$ to $R_4c$ represents a hydroxyl group or a cyano group. A structure in which one or two members out of $R_2c$ to $R_4c$ are a hydroxyl group with the remaining being a hydrogen atom is preferred. In formula (VIIa), it is more preferred that two members out of $R_2c$ to $R_4c$ are a hydroxyl group and the remaining is a hydrogen atom.

The repeating unit having a partial structure represented by formulae (VIIa) to (VIId) includes repeating units represented by the following formulae (AIIa) to (AIId):

(AIIa)

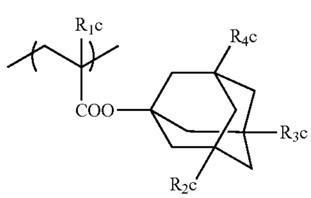

(AIIb)

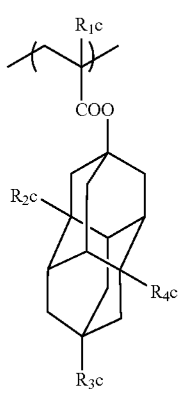

-continued (AIIc)

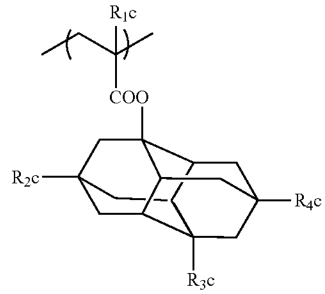

(AIId)

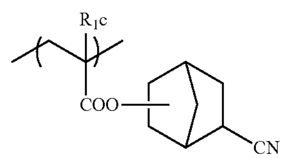

In formulae (AIIa) to (AIId), $R_1c$ represents a hydrogen atom, a methyl group, a trifluoromethyl group or a hydroxymethyl group.

$R_2c$ to $R_4c$ have the same meanings as $R_2c$ to $R_4c$ in formulae (VIIa) to (VIIc).

Specific examples of the repeating unit having a hydroxyl group or a cyano group are illustrated below, but the present invention is not limited thereto.

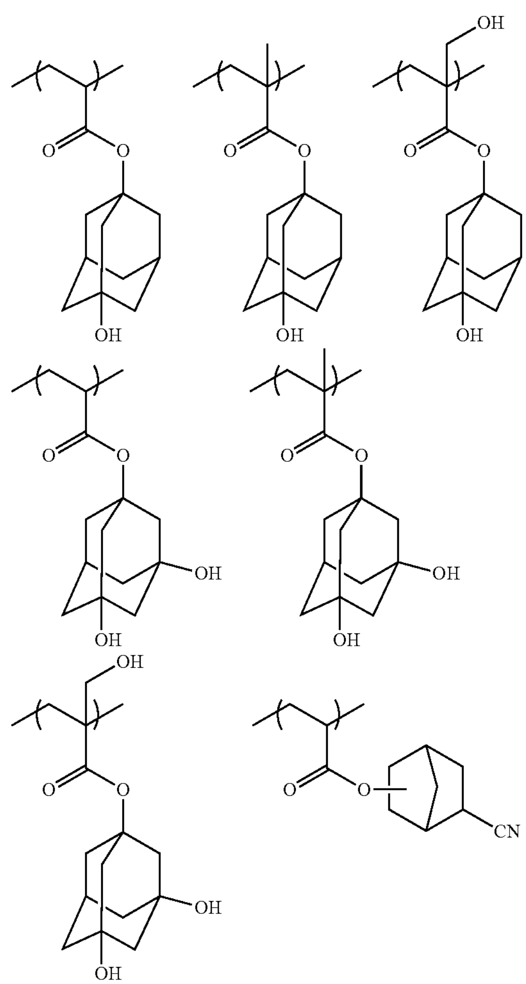

-continued

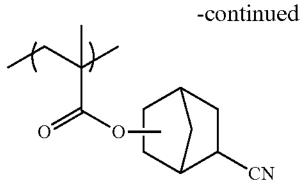

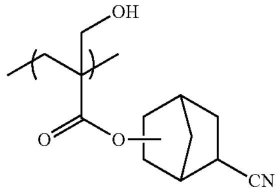

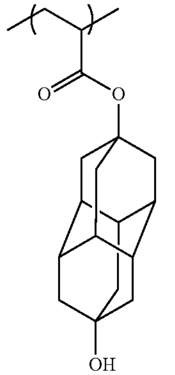

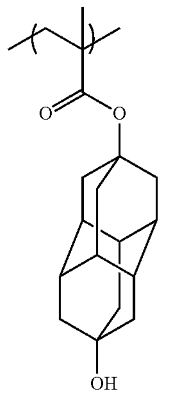

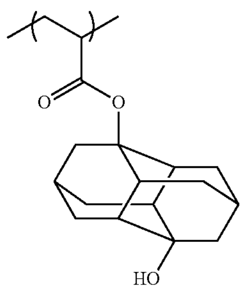

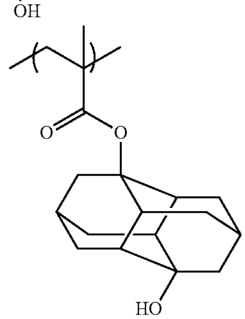

The resin (A) may or may not contain the repeating unit having a hydroxyl group or a cyano group, but in the case where the resin (A) contains the repeating unit having a hydroxyl group or a cyano group, the content of the repeating unit is preferably from 1 to 70 mol %, more preferably from 3 to 65 mol %, still more preferably from 5 to 60 mol %, based on all repeating units in the resin (A).

The resin (A) for use in the present invention may further contain a repeating unit having an alicyclic hydrocarbon structure free from a polar group (for example, the above-described acid group, a hydroxyl group or a cyano group) and not exhibiting acid decomposability. Thanks to this repeating unit, the solubility of the resin at the development using an organic solvent-containing developer can be appropriately adjusted. Such a repeating unit includes a repeating unit represented by formula (IV):

(IV)

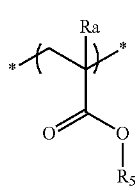

In formula (IV), $R_5$ represents a hydrocarbon group having at least one cyclic structure and having no polar group (such as hydroxyl group and cyano group).

Ra represents a hydrogen atom, an alkyl group, or a —$CH_2$—O—$Ra_2$ group, wherein $Ra_2$ represents a hydrogen atom, an alkyl group or an acyl group. Ra is preferably a hydrogen atom, a methyl group, a hydroxymethyl group or a trifluoromethyl group, more preferably a hydrogen atom or a methyl group.

The cyclic structure contained in $R_5$ may be a saturated ring or a partially saturated ring or may be an aromatic ring and includes a monocyclic hydrocarbon group and a polycyclic hydrocarbon group. Examples of the monocyclic hydrocarbon group include a cycloalkyl group having a carbon number of 3 to 12, such as cyclopentyl group, cyclohexyl group, cycloheptyl group and cyclooctyl group, and a cycloalkenyl group having a carbon number of 3 to 12, such as cyclohexenyl group. The monocyclic hydrocarbon group is preferably a monocyclic hydrocarbon group having a carbon number of 3 to 7, more preferably a cyclopentyl group or a cyclohexyl group.

The polycyclic hydrocarbon group includes a ring-assembly hydrocarbon group and a crosslinked cyclic hydrocarbon group. Examples of the ring-assembly hydrocarbon group include a bicyclohexyl group, a perhydronaphthalenyl group and a biphenyl group. Examples of the crosslinked cyclic hydrocarbon ring include a bicyclic hydrocarbon ring such as pinane ring, bornane ring, norpinane ring, norbornane ring and bicyclooctane ring (e.g., bicyclo[2.2.2]octane ring, bicyclo[3.2.1]octane ring), a tricyclic hydrocarbon ring such as homobledane ring, adamantane ring, tricyclo[5.2.1.$0^{2,6}$]decane ring and tricyclo[4.3.1.$1^{2,5}$]undecane ring, and a tetracyclic hydrocarbon ring such as tetracyclo[4.4.0.$1^{2,5}$.$1^{7,10}$]dodecane ring and perhydro-1,4-methano-5,8-methanonaphthalene ring. The crosslinked cyclic hydrocarbon ring also includes a condensed cyclic hydrocarbon ring, for example, a condensed ring formed by fusing a plurality of 5- to 8-membered cycloalkane rings, such as perhydronaphthalene (decalin) ring, perhydroanthracene ring, perhydrophenathrene ring, perhydroacenaphthene ring, perhydrofluorene ring, perhydroindene ring and perhydrophenalene ring.

Preferred examples of the crosslinked cyclic hydrocarbon ring include a norbornyl group, an adamantyl group, a bicyclooctanyl group, and a tricycle[5,2,1,$0^{2,6}$]decanyl group. Of these crosslinked cyclic hydrocarbon rings, a norbornyl group and an adamantyl group are more preferred.

These alicyclic hydrocarbon groups may have a substituent, and preferred examples of the substituent include a halogen atom, an alkyl group, a hydroxyl group with a hydrogen atom being substituted for, and an amino group with a hydrogen atom being substituted for. The halogen atom is preferably bromine atom, chlorine atom or fluorine atom, and the alkyl group is preferably methyl group, ethyl group, butyl group or tert-butyl group. This alkyl group may further have a substituent, and the substituent which may be further substituted on the alkyl group includes a halogen atom, an alkyl group, a hydroxyl group with a hydrogen atom being substituted for, and an amino group with a hydrogen atom being substituted for.

Examples of the substituent for hydrogen atom include an alkyl group, a cycloalkyl group, an aralkyl group, a substituted methyl group, a substituted ethyl group, an alkoxycarbonyl group, and an aralkyloxycarbonyl group. The alkyl group is preferably an alkyl group having a carbon number of 1 to 4; the substituted methyl group is preferably a methoxymethyl group, a methoxythiomethyl group, a benzyloxymethyl group, a tert-butoxymethyl group, or a 2-methoxyethoxymethyl group; the substituted ethyl group is preferably a 1-ethoxyethyl group or a 1-methyl-1-methoxyethyl group; the acyl group is preferably an aliphatic acyl group having a carbon number of 1 to 6, such as formyl group, acetyl group, propionyl group, butyryl group, isobutyryl group, valeryl group and pivaloyl group; and the alkoxycarbonyl group includes, for example, an alkoxycarbonyl group having a carbon number of 1 to 4.

The resin (A) may or may not contain the repeating unit having a polar group-free alicyclic hydrocarbon structure and not exhibiting acid decomposability, but in the case where the resin (A) contains the repeating unit having a polar group-free alicyclic hydrocarbon structure and not exhibiting acid decomposability, the content of the repeating unit is preferably from 1 to 40 mol %, more preferably from 1 to 20 mol %, based on all repeating units in the resin (A).

Specific examples of the repeating unit having a polar group-free alicyclic hydrocarbon structure and not exhibiting acid decomposability are illustrated below, but the present invention is not limited thereto. In the formulae, Ra represents H, $CH_3$, $CH_2OH$ or $CF_3$.

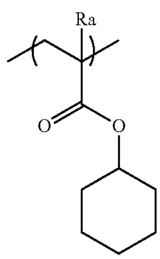
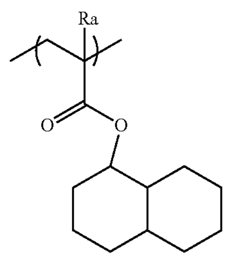
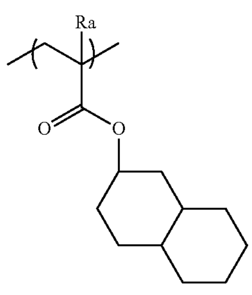
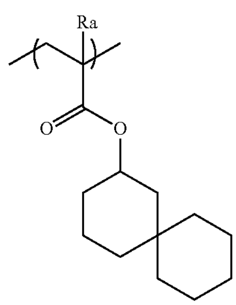
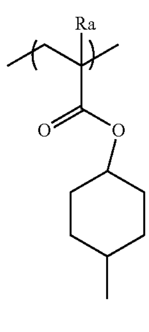
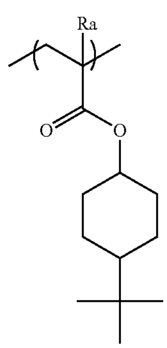
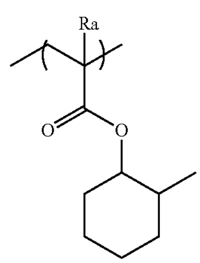
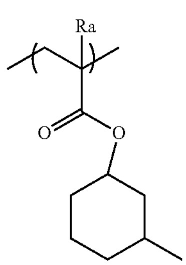
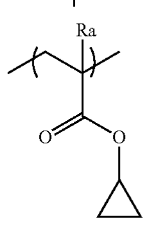
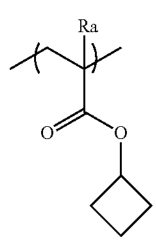

-continued

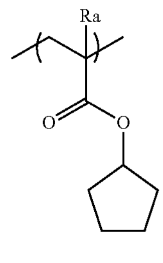
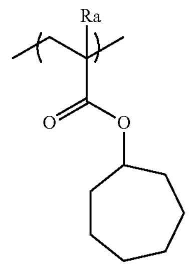
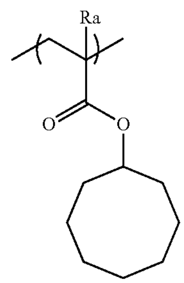
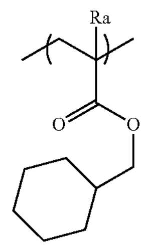
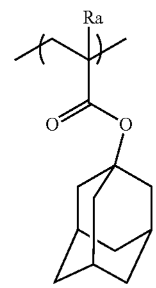
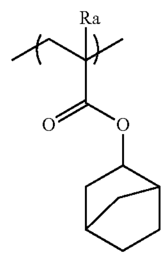
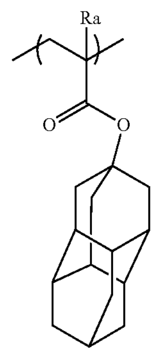
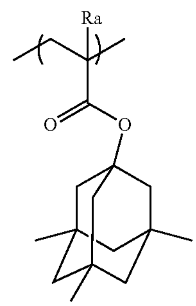
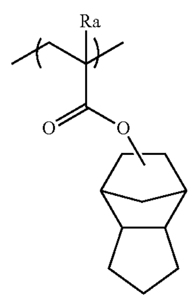
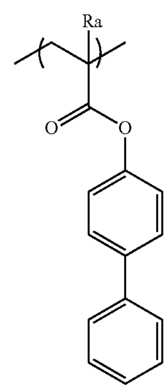
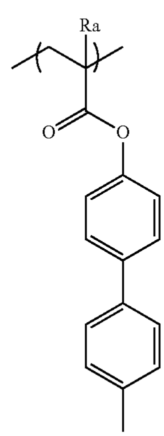
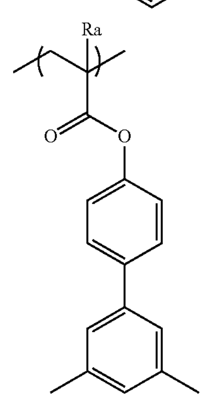

-continued

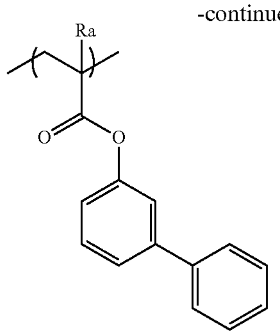

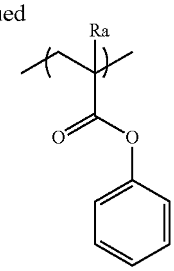

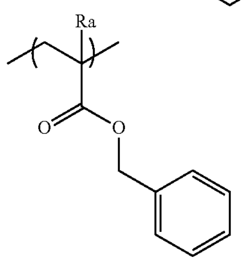

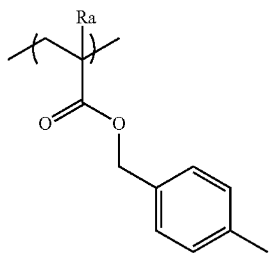

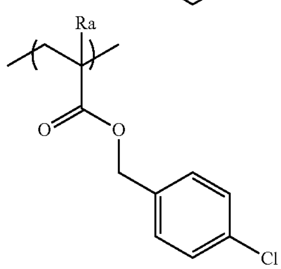

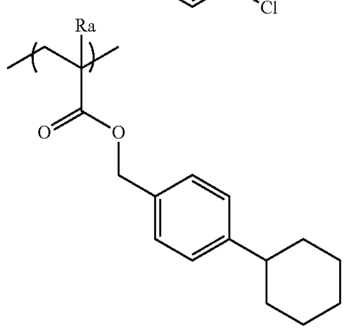

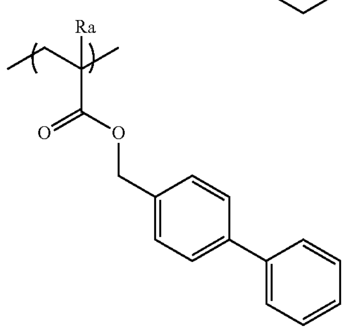

The resin (A) for use in the composition of the present invention may contain, in addition to the above-described repeating structural units, various repeating structural units for the purpose of controlling the dry etching resistance, aptitude for standard developer, adherence to substrate, resist profile and properties generally required of a resin composition, such as resolution, heat resistance and sensitivity.

Examples of such a repeating structural unit include, but are not limited to, repeating structural units corresponding to the monomers described below.

Thanks to such a repeating structural unit, the performance required of the resin for use in the composition of the present invention, particularly (1) solubility for coating solvent, (2) film-forming property (glass transition temperature), (3) alkali developability, (4) film loss (selection of hydrophilic, hydrophobic or alkali-soluble group), (5) adherence of unexposed area to substrate, (6) dry etching resistance, and the like, can be subtly controlled.

Examples of the monomer include a compound having one addition-polymerizable unsaturated bond selected from acrylic acid esters, methacrylic acid esters, acrylamides, methacrylamides, allyl compounds, vinyl ethers, vinyl esters, styrenes and crotonic acid esters.

Other monomers may be also copolymerized if the monomer is an addition-polymerizable unsaturated compound copolymerizable with the monomers corresponding to the above-described various repeating structural units.

In the resin (A) for use in the composition of the present invention, the molar ratio of respective repeating structural units contained is appropriately set to control the dry etching resistance of the composition, suitability for standard developer, adherence to substrate, resist profile and performances generally required of a resist, such as resolution, heat resistance and sensitivity.

However, in the pattern forming method of the present invention, as described above, the first resin in the first resin composition (I) is a resin containing a repeating unit having an aromatic ring, or the first resin composition (I) further contains an aromatic compound. The aromatic compound is described in detail later.

In the case where the first resin in the first resin composition (I) is a resin containing a repeating unit having an aromatic ring, the repeating unit having an aromatic ring includes, for example, a repeating unit represented by formula (VI), a repeating unit having an aromatic group, which are described above in [Preferred Resin Embodiment (1)], and a repeating unit where the cyclic structure contained in $R_5$ of formula (IV) is an aromatic ring.

In particular, when the exposure is exposure using a KrF excimer laser, the first resin is preferably a resin containing a repeating unit having a polycyclic aromatic group. Thanks to this configuration, the first resin can absorb the exposure light with no fail and therefore, the effect of standing wave due to reflection of exposure light from the substrate or the diffused reflection of exposure light due to the stepped portion of a stepped substrate can be unfailingly reduced, so that a pattern excellent in the cross-sectional profile can be obtained.

Examples of the repeating unit having an aromatic ring include a repeating unit where $Ar_6$ in formula (VI) is a divalent polycyclic aromatic group, a repeating unit where $Ar_4$ in formula (IIB) is a (n+1)-valent polycyclic aromatic group (in the case of combining with $R_{42}$ to form a ring, a (n+2)-valent polycyclic aromatic group), and a repeating unit where the cyclic structure contained in $R_5$ of formula (IV) is a polycyclic aromatic group.

The polycyclic aromatic group includes a group formed by bonding a plurality of benzene rings through a single bond, such as biphenyl group, a polycyclic condensed aromatic group such as naphthalene ring group and anthracene ring group, a divalent aromatic ring group as $Ar_6$ in formula (VI), and, out of specific examples of the aromatic group in the repeating unit having an aromatic group, those corresponding to a polycyclic aromatic group.

The polycyclic aromatic group is preferably a polycyclic aromatic group having a carbon number of 10 to 20, more preferably a polycyclic aromatic group having a carbon number of 10 to 15.

In the case where the first resin contains a repeating unit having an aromatic ring, the content of the repeating unit having an aromatic ring is preferably from 10 to 60 mol %, more preferably from 20 to 50 mol %, based on all repeating units in the first resin.

The form of the resin (A) for use in the present invention may be any of random type, block type, comb type and star type. The resin (A) can be synthesized, for example, by radical, cationic or anionic polymerization of unsaturated monomers corresponding to respective structures. It is also possible to obtain the target resin by polymerizing unsaturated monomers corresponding to precursors of respective structures and then performing a polymer reaction.

The resin (A) for use in the present invention can be synthesized by a conventional method (for example, radical polymerization). Examples of the general synthesis method include a batch polymerization method of dissolving monomer species and an initiator in a solvent and heating the solution, thereby effecting the polymerization, and a dropping polymerization method of adding dropwise a solution containing monomer species and an initiator to a heated solvent over 1 to 10 hours. A dropping polymerization method is preferred. Examples of the reaction solvent include tetrahydrofuran, 1,4-dioxane, ethers such as diisopropyl ether, ketones such as methyl ethyl ketone and methyl isobutyl ketone, an ester solvent such as ethyl acetate, an amide solvent such as dimethylformamide and dimethylacetamide, and the later-described solvent capable of dissolving the composition of the present invention, such as propylene glycol monomethyl ether acetate, propylene glycol monomethyl ether and cyclohexanone. The polymerization is more preferably performed using the same solvent as the solvent used in the resin composition for use in the present invention. By the use of the same solvent, production of particles during storage can be suppressed.

The polymerization reaction is preferably performed in an inert gas atmosphere such as nitrogen or argon. As for the polymerization initiator, the polymerization is started using a commercially available radical initiator (such as azo-based initiator and peroxide). The radical initiator is preferably an azo-based initiator, and an azo-based initiator having an ester group, a cyano group or a carboxyl group is preferred. Preferred examples of the initiator include azobisisobutyronitrile, azobisdimethylvaleronitrile and dimethyl 2,2'-azobis(2-methylpropionate). The initiator is added additionally or in parts, if desired. After the completion of reaction, the reaction product is poured in a solvent, and the desired polymer is collected by a powder, solid or other recovery methods. The concentration at the reaction is from 5 to 50 mass %, preferably from 10 to 30 mass %, and the reaction temperature is usually from 10 to 150° C., preferably from 30 to 120° C., more preferably from 60 to 100° C. (In this specification, mass ratio is equal to weight ratio.)

After the completion of reaction, the reaction solution is allowed to cool to room temperature and purified. The purification may be performed by a normal method, for example, a liquid-liquid extraction method of applying water washing or combining it with an appropriate solvent to remove residual monomers or oligomer components; a purification method in a solution sate, such as ultrafiltration of extracting and removing only polymers having a molecular weight not more than a specific molecular weight; a reprecipitation method of adding dropwise the resin solution in a poor solvent to solidify the resin in the poor solvent and thereby remove residual monomers and the like; and a purification method in a solid state, such as washing of the resin slurry with a poor solvent after separation of the slurry by filtration. For example, the resin is precipitated as a solid by contacting the reaction solution with a solvent in which the resin is sparingly soluble or insoluble (poor solvent) and which is in a volumetric amount of 10 times or less, preferably from 10 to 5 times, the reaction solution.

The solvent used at the operation of precipitation or reprecipitation from the polymer solution (precipitation or reprecipitation solvent) may be sufficient if it is a poor solvent for the polymer, and the solvent which can be used may be appropriately selected from a hydrocarbon, a halogenated hydrocarbon, a nitro compound, an ether, a ketone, an ester, a carbonate, an alcohol, a carboxylic acid, water, a mixed solvent containing such a solvent, and the like, according to the kind of the polymer.

The amount of the precipitation or reprecipitation solvent used may be appropriately selected by taking into consideration the efficiency, yield and the like, but in general, the amount used is from 100 to 10,000 parts by mass, preferably from 200 to 2,000 parts by mass, more preferably from 300 to 1,000 parts by mass, per 100 parts by mass of the polymer solution.

The temperature at the precipitation or reprecipitation may be appropriately selected by taking into consideration the efficiency or operability but is usually on the order of 0 to 50° C., preferably in the vicinity of room temperature (for example, approximately from 20 to 35° C.). The precipitation or reprecipitation operation may be performed using a commonly employed mixing vessel such as stirring tank by a known method such as batch system and continuous system.

The precipitated or reprecipitated polymer is usually subjected to commonly employed solid-liquid separation such as filtration and centrifugation, then dried and used. The filtration is performed using a solvent-resistant filter element preferably under pressure. The drying is performed under atmospheric pressure or reduced pressure (preferably under reduced pressure) at a temperature of approximately from 30 to 100° C., preferably at a temperature of approximately from 30 to 50° C.

Incidentally, after the resin is once precipitated and separated, the resin may be again dissolved in a solvent and then put into contact with a solvent in which the resin is sparingly soluble or insoluble. That is, there may be used a method comprising, after the completion of radical polymerization reaction, bringing the polymer into contact with a solvent in which the polymer is sparingly soluble or insoluble, to precipitate a resin (step a), separating the resin from the solution (step b), anew dissolving the resin in a solvent to prepare a resin solution A (step c), bringing the resin solution A into contact with a solvent in which the resin is sparingly soluble or insoluble and which is in a volumetric amount of less than 10 times (preferably 5 times or less) the resin solution A, to precipitate a solid resin (step d), and separating the precipitated resin (step e).

Also, for keeping the resin from aggregation or the like after preparation of the composition, as described, for example, in JP-A-2009-037108, a step of dissolving the synthesized resin in a solvent to make a solution, and heating the solution at approximately from 30 to 90° C. for approximately from 30 minutes to 4 hours may be added.

The weight average molecular weight of the resin (A) (especially the first resin) for use in the composition of the present invention is preferably from 1,000 to 200,000, more preferably from 2,000 to 100,000, still more preferably from 3,000 to 70,000, yet still more preferably from 5,000 to 50,000, in terms of polystyrene by the GPC method. When the weight average molecular weight is from 1,000 to 200,000, reduction in the heat resistance and dry etching resistance can be inhibited and at the same time, the film-forming property can be prevented from deterioration due to impaired developability or increased viscosity.

The polydispersity (molecular weight distribution) is usually from 1.0 to 3.0, preferably from 1.0 to 2.6, more preferably from 1.2 to 2.4, still more preferably from 1.4 to 2.2. When the molecular weight distribution satisfies the range above, the resolution and resist profile are excellent, the side wall of the resist pattern is smooth, and the roughness is improved.

In the resin composition (I) or (II) for use in the present invention, the content of the resin (A) in the entire composition is preferably from 30 to 99.9 mass %, more preferably from 60 to 99.8 mass %, based on the entire solid content.

In the present invention, as for the resin (A), one kind may be used or a plurality of kinds may be used in combination, in the resin solution (I) or (II).

The resin composition (I) or (II) for use in the present invention may further contain, together with the resin (A), an acid-decomposable resin (a resin capable of increasing the polarity by the action of an acid to decrease the solubility for an organic solvent-containing developer) other than the resin (A). The acid-decomposable resin other than the resin (A) is an acid-decomposable resin composed of the same repeating units as the repeating units which may be contained in the resin (A), and preferred ranges of the repeating units and contents thereof in the resin are the same as those described for the resin (A).

In the case of containing an acid-decomposable resin other than the resin (A), the content of the acid-decomposable resin in the composition according to the present invention may be sufficient if the total of the contents of the resin (A) and the acid-decomposable resin other than the resin (A) falls in the range above. The mass ratio between the resin (A) and the acid-decomposable resin other than the resin (A) may be appropriately adjusted as long as the effects of the present invention are successfully brought out, but the ratio [resin (A)/acid-decomposable resin other than resin (A)] is preferably from 99.9/0.1 to 10/90, more preferably from 99.9/0.1 to 60/40.

From the standpoint of offering high resolution and rectangular profile of the resist pattern and imparting etching resistance at dry etching, the resin composition (I) or (II) for use in the present invention preferably contains only the resin (A) as the acid-decomposable resin.

[2] Aromatic Compound

In the pattern forming method of the present invention, as described above, the first resin in the first resin composition (I) is a resin containing a repeating unit having an aromatic ring, or the first resin composition (I) further contains an aromatic compound. The aromatic compound in the case where the first resin composition (I) further contains an aromatic compound is described below.

The aromatic compound is a compound different from the first resin and may be a resin or a low molecular compound but is preferably a low molecular compound.

In the case where the aromatic compound is a resin, the resin is preferably a resin containing a repeating unit having an aromatic ring, and the description on the repeating unit having an aromatic ring is the same as that in the resin (A). Also, in the case where the aromatic compound is a resin, the resin does not have an acid-decomposable group.

In the case where the aromatic compound is a low molecular compound, the molecular weight of the aromatic compound is preferably 2,000 or less, more preferably 1,500 or less, still more preferably 900 or less. The low molecular compound as used in the present invention is not a so-called polymer or oligomer obtained by cleaving the unsaturated bond of a compound having an unsaturated bond (so-called polymerizable monomer) with use of an initiator and allowing chain-reaction growth of the bond, but a compound having a given molecular weight (a compound having substantially no molecular weight distribution). The molecular weight is usually 100 or more.

The aromatic compound is not particularly limited as long as it has an aromatic ring, but the aromatic compound is preferably a compound represented by any one of the following formulae (A1) to (A3):

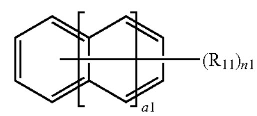

(A1)

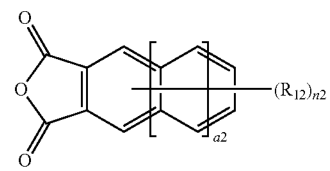

(A2)

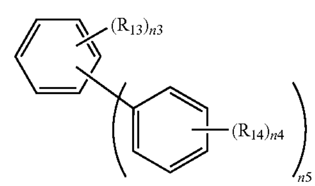

(A3)

In formulae (A1), (A2) and (A3), each of $R_{11}$, $R_{12}$, $R_{13}$ and $R_{14}$ independently represents a hydroxyl group, an alkyl group, an alkoxy group, an alkoxycarbonyl group, an alkylcarbonyl group, or a lactonyloxycarbonyl group.

a1 represents an integer of 0 to 2.

a2 represents an integer of 0 to 2.

n1 represents an integer of 0 to 10.

n2 represents an integer of 0 to 8.

n3 represents an integer represented by (6-n5).

n4 represents an integer of 0 to 5.

n5 represents an integer of 1 to 6.

In the case where n1 is an integer of 2 or more, each $R_{11}$ may be the same as or different from every other $R_{11}$, and $R_{11}$s may combine with each other to form a ring.

In the case where n2 is an integer of 2 or more, each $R_{12}$ may be the same as or different from every other $R_{12}$, and $R_{12}$s may combine with each other to form a ring.

In the case where n3 is an integer of 2 or more, each $R_{13}$ may be the same as or different from every other $R_{13}$, and $R_{13}$s may combine with each other to form a ring.

In the case where n4 or n5 is an integer of 2 or more, each $R_{14}$ may be the same as or different from every other $R_{14}$, and $R_{14}$s may combine with each other to form a ring.

The alkyl group of $R_{11}$, $R_{12}$, $R_{13}$ and $R_{14}$ is a linear or branched alkyl group preferably having a carbon number of 1 to 10, and preferred examples thereof include a methyl group, an ethyl group, an n-butyl group and a tert-butyl group.

The alkoxy group of $R_{11}$, $R_{12}$, $R_{13}$ and $R_{14}$ is a linear or branched alkoxy group preferably having a carbon number of 1 to 10, and preferred examples thereof include a methoxy group, an ethoxy group, an n-propoxy group and an n-butoxy group.

The alkoxycarbonyl group of $R_{11}$, $R_{12}$, $R_{13}$ and $R_{14}$ is a linear or branched alkoxycarbonyl group preferably having a carbon number of 2 to 11, and preferred examples thereof include a methoxycarbonyl group, an ethoxycarbonyl group and an n-butoxycarbonyl group.

Specific examples of the alkyl group in the alkylcarbonyl group of $R_{11}$, $R_{12}$, $R_{13}$ and $R_{14}$ are the same as those of the alkyl group described above of $R_{11}$, $R_{12}$, $R_{13}$ and $R_{14}$.

The lactonyl group in the lactonyloxycarbonyl group of $R_{11}$, $R_{12}$, $R_{13}$ and $R_{14}$ is preferably a 5- to 7-membered ring lactonyl group, more preferably a 5- or 6-membered ring lactonyl group.

Each of the ring formed by combining a plurality of $R_{11}$s with one another, the ring formed by combining a plurality of $R_{12}$s with one another, the ring formed by combining a plurality of $R_{13}$s with one another, and the ring formed by combining a plurality of $R_{14}$s with one another is preferably a 5- or 6-membered ring.

Each of the groups as $R_{11}$, $R_{12}$, $R_{13}$ and $R_{14}$, the ring formed by combining a plurality of $R_{11}$s with one another, the ring formed by combining a plurality of $R_{12}$s with one another, the ring formed by combining a plurality of $R_{13}$s with one another, and the ring formed by combining a plurality of $R_{14}$s with one another may further have a substituent, and examples of the substituent include a halogen atom (e.g., fluorine), a hydroxyl group, a carboxyl group, a cyano group, a nitro group, an alkoxy group, an alkoxyalkyl group, an alkoxycarbonyl group, and an alkoxycarbonyloxy group.

The alkoxy group includes, for example, a linear, branched or cyclic alkoxy group having a carbon number of 1 to 20, such as methoxy group, ethoxy group, n-propoxy group, i-propoxy group, n-butoxy group, 2-methylpropoxy group, 1-methylpropoxy group, tert-butoxy group, cyclopentyloxy group and cyclohexyloxy group.

The alkoxyalkyl group includes, for example, a linear, branched or cyclic alkoxyalkyl group having a carbon number of 2 to 21, such as methoxymethyl group, ethoxymethyl group, 1-methoxyethyl group, 2-methoxyethyl group, 1-ethoxyethyl group and 2-ethoxyethyl group.

The alkoxycarbonyl group includes, for example, a linear, branched or cyclic alkoxycarbonyl group having a carbon number of 2 to 21, such as methoxycarbonyl group, ethoxycarbonyl group, n-propoxycarbonyl group, i-propoxycarbonyl group, n-butoxycarbonyl group, 2-methylpropoxycarbonyl group, 1-methylpropoxycarbonyl group, tert-butoxycarbonyl group, cyclopentyloxycarbonyl group and cyclohexyloxycarbonyl group.

The alkoxycarbonyloxy group includes, for example, a linear, branched or cyclic alkoxycarbonyloxy group having a carbon number of 2 to 21, such as methoxycarbonyloxy group, ethoxycarbonyloxy group, n-propoxycarbonyloxy group, i-propoxycarbonyloxy group, n-butoxycarbonyloxy group, tert-butoxycarbonyloxy group, cyclopentyloxycarbonyloxy group and cyclohexyloxycarbonyloxy group.

n1 is preferably an integer of 0 to 5, more preferably an integer of 0 to 3, still more preferably 0 or 1.

n2 is preferably an integer of 0 to 5, more preferably an integer of 0 to 3, still more preferably 0 or 1.

n3 is preferably an integer of 0 to 3, more preferably 0 or 1.

n4 is preferably an integer of 0 to 3, more preferably 0 or 1.

n5 is preferably an integer of 1 to 3, more preferably 1 or 2.

In particular, when the exposure is exposure using a KrF excimer laser, the aromatic compound is preferably a polycyclic aromatic compound. The polycyclic aromatic compound can absorb the exposure light with no fail and therefore, the effect of standing wave due to reflection of exposure light from the substrate or the diffused reflection of exposure light due to the stepped portion of a stepped substrate can be unfailingly reduced, so that a pattern excellent in the cross-sectional profile can be obtained.

The polycyclic aromatic ring structure in the polycyclic aromatic compound includes a structure formed by connecting a plurality of benzene rings through a single bond, such as biphenyl ring, and a polycyclic condensed aromatic structure such as naphthalene ring and anthracene ring.

Accordingly, in the case where the exposure is exposure using a KrF excimer laser, al in formula (A1) or (A2) is preferably 1 or 2 and a2 is preferably 1 or 2.

In the case where the first resin composition (I) further contains an aromatic compound, the content of the aromatic compound is preferably from 0.1 to 0.4 mass %, more preferably from 0.15 to 0.3 mass %, based on the entire solid content of the first resin composition (I).

The aromatic compound may be a commercially available product or may be synthesized by a conventional method.

Specific examples of the aromatic compound are illustrated below, but the present invention is not limited thereto.

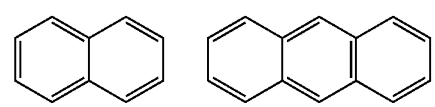

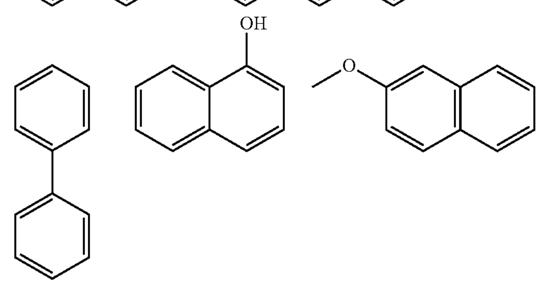

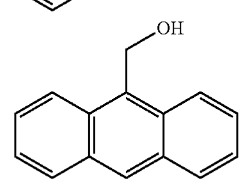

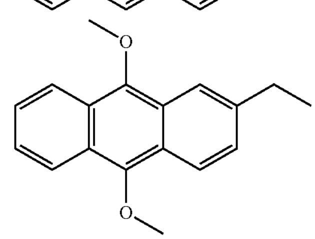

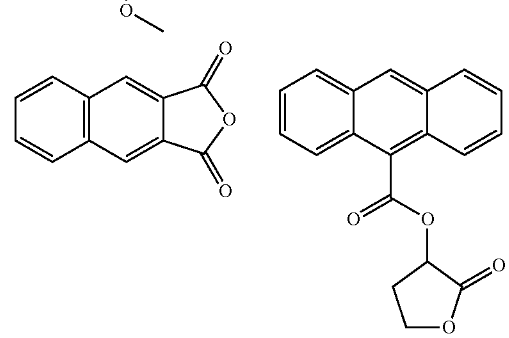

[3] (B) Compound Capable of Generating an Acid Upon Irradiation with an Actinic Ray or Radiation At least either one of the first resin composition (I) for forming a bottom anti-reflective coating and the second resin composition (II) for forming a resist film, which are used in the present invention, preferably contains (B) a compound capable of generating an acid upon irradiation with an actinic ray or radiation (hereinafter, sometimes referred to as an "acid generator").

The second resin composition (II) for use in the present invention preferably contains an acid generator, and it is more preferred that the second resin composition (II) contains the later-described basic compound together with the acid generator.

Even when, as described above, light is attenuated as the light runs on in the resist film and the light reaching the bottom side of the resist film (for example, the vicinity of the bottom of a stepped substrate in microfabrication such as application to ion implantation using a stepped substrate) becomes weak or even when, as described later, the first resin composition (I) does not contain an acid generator, by virtue of incorporating an acid generator into the second resin composition (II), the acid generator can be diffused from the resist film (upper layer) to the bottom anti-reflective layer (lower layer), and image resolution or pattern formation can be achieved. Particularly, in recent stepped substrates, there exists an ultrafine stepped substrate in which the distance between steps is far below the wavelength of exposure light. It is very difficult to resolve an image on such a stepped substrate only by relying on optical exposure, but, as described above, when diffusion of the generated acid is utilized, image resolution or pattern formation can be achieved beyond the optical limit.

However, the first resin composition (I) for use in the present invention preferably contains no acid generator and thanks to this configuration, the width of a trench formed in the lower layer can be more successfully controlled.

Also, in the case where the first resin composition (I) contains an acid generator, the later-described basic compound is incorporated together, whereby the diffusibility of the generated acid and in turn, the rectangularity can be controlled, and this is one preferred embodiment.

The (B) compound capable of generating an acid upon irradiation with an actinic ray or radiation is preferably a compound capable of generating an organic acid upon irradiation with an actinic ray or radiation.

The acid generator which can be used may be appropriately selected from a photo-initiator for cationic photopolymerization, a photo-initiator for radical photopolymerization, a photo-decoloring agent for dyes, a photo-discoloring agent, a known compound capable of generating an acid upon irradiation with an actinic ray or radiation, which is used for microresist or the like, and a mixture thereof.

Examples thereof include a diazonium salt, a phosphonium salt, a sulfonium salt, an iodonium salt, imidosulfonate, oxime sulfonate, diazodisulfone, disulfone and o-nitrobenzyl sulfonate.

Out of the acid generators, preferred compounds include compounds represented by the following formulae (ZI), (ZII) and (ZIII):

(ZI)

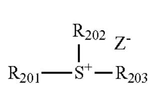

-continued (ZII)

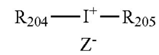

(ZIII)

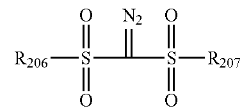

In formula (ZI), each of $R_{201}$, $R_{202}$ and $R_{203}$ independently represents an organic group.

The carbon number of the organic group as $R_{201}$, $R_{202}$ and $R_{203}$ is generally from 1 to 30, preferably from 1 to 20.

Two members out of $R_{201}$ to $R_{203}$ may combine to form a ring structure, and the ring may contain an oxygen atom, a sulfur atom, an ester bond, an amide bond or a carbonyl group. Examples of the group formed by combining two members out of $R_{201}$ to $R_{203}$ include an alkylene group (e.g., butylene group, pentylene group).

$Z^-$ represents a non-nucleophilic anion.

Examples of the non-nucleophilic anion as $Z^-$ include a sulfonate anion, a carboxylate anion, a sulfonylimide anion, a bis(alkylsulfonyl)imide anion and a tris(alkylsulfonyl)methyl anion.

The non-nucleophilic anion is an anion having an extremely low ability of causing a nucleophilic reaction and this anion can suppress the decomposition with aging due to intramolecular nucleophilic reaction. Thanks to this anion, the aging stability of the resist composition is improved.

Examples of the sulfonate anion include an aliphatic sulfonate anion, an aromatic sulfonate anion, and a camphorsulfonate anion.

Examples of the carboxylate anion include an aliphatic carboxylate anion, an aromatic carboxylate anion, and an aralkylcarboxylate anion.

The aliphatic moiety in the aliphatic sulfonate anion and aliphatic carboxylate may be an alkyl group or a cycloalkyl group but is preferably an alkyl group having a carbon number of 1 to 30 or a cycloalkyl group having a carbon number of 3 to 30, and examples thereof include a methyl group, an ethyl group, a propyl group, an isopropyl group, an n-butyl group, an isobutyl group, a sec-butyl group, a pentyl group, a neopentyl group, a hexyl group, a heptyl group, an octyl group, a nonyl group, a decyl group, an undecyl group, a dodecyl group, a tridecyl group, a tetradecyl group, a pentadecyl group, a hexadecyl group, a heptadecyl group, an octadecyl group, a nonadecyl group, an eicosyl group, a cyclopropyl group, a cyclopentyl group, a cyclohexyl group, an adamantyl group, a norbornyl group and a bornyl group.

The aromatic group in the aromatic sulfonate anion and aromatic carboxylate anion is preferably an aryl group having a carbon number of 6 to 14, and examples thereof include a phenyl group, a tolyl group and a naphthyl group.

The alkyl group, cycloalkyl group and aryl group in the aliphatic sulfonate anion and aromatic sulfonate anion may have a substituent. Examples of the substituent on the alkyl group, cycloalkyl group and aryl group in the aliphatic sulfonate anion and aromatic sulfonate anion include a nitro group, a halogen atom (e.g., fluorine atom, chlorine atom, bromine atom, iodine atom), a carboxyl group, a hydroxyl group, an amino group, a cyano group, an alkoxy group (preferably having a carbon number of 1 to 15), a cycloalkyl group (preferably having a carbon number of 3 to 15), an aryl group (preferably having a carbon number of 6 to 14), an alkoxycarbonyl group (preferably having a carbon number of 2 to 7), an acyl group (preferably having a carbon number of 2 to 12), an alkoxycarbonyloxy group (preferably having a carbon number of 2 to 7), an alkylthio group (preferably having a carbon number of 1 to 15), an alkylsulfonyl group (preferably having a carbon number of 1 to 15), an alkyliminosulfonyl group (preferably having a carbon number of 1 to 15), an aryloxysulfonyl group (preferably having a carbon number of 6 to 20), an alkylaryloxysulfonyl group (preferably having a carbon number of 7 to 20), a cycloalkylaryloxysulfonyl group (preferably having a carbon number of 10 to 20), an alkyloxyalkyloxy group (preferably having a carbon number of 5 to 20), and a cycloalkylalkyloxyalkyloxy group (preferably having a carbon number of 8 to 20). The aryl group and ring structure in each group may further have, as the substituent, an alkyl group (preferably having a carbon number of 1 to 15) or a cycloalkyl group (preferably having a carbon number of 3 to 15).

The aralkyl group in the aralkylcarboxylate anion is preferably an aralkyl group having a carbon number of 7 to 12, and examples thereof include a benzyl group, a phenethyl group, a naphthylmethyl group, a naphthylethyl group and a naphthylbutyl group.

The alkyl group, cycloalkyl group, aryl group and aralkyl group in the aliphatic carboxylate anion, aromatic carboxylate anion and aralkylcarboxylate anion may have a substituent. Examples of the substituent include the same halogen atom, alkyl group, cycloalkyl group, alkoxy group and alkylthio group as those in the aromatic sulfonate anion.

Examples of the sulfonylimide anion include saccharin anion.

The alkyl group in the bis(alkylsulfonyl)imide anion and tris(alkylsulfonyl)methide anion is preferably an alkyl group having a carbon number of 1 to 5, and examples thereof include a methyl group, an ethyl group, a propyl group, an isopropyl group, an n-butyl group, an isobutyl group, a sec-butyl group, a pentyl group and a neopentyl group. Examples of the substituent on such an alkyl group include a halogen atom, a halogen atom-substituted alkyl group, an alkoxy group, an alkylthio group, an alkyloxysulfonyl group, an aryloxysulfonyl group, and a cycloalkylaryloxysulfonyl group, with a fluorine atom-substituted alkyl group being preferred.

Other examples of the non-nucleophilic anion include fluorinated phosphorus (e.g., $PF_6^-$), fluorinated boron (e.g., $BF_4^-$), and fluorinated antimony (e.g., $SbF_6^-$).

The non-nucleophilic anion of $Z^-$ is preferably an aliphatic sulfonate anion substituted with a fluorine atom at least at the α-position of sulfonic acid, an aromatic sulfonate anion substituted with a fluorine atom or a fluorine atom-containing group, a bis(alkylsulfonyl)imide anion in which the alkyl group is substituted with a fluorine atom, or a tris(alkylsulfonyl)methide anion in which the alkyl group is substituted with a fluorine atom. The non-nucleophilic anion is more preferably a perfluoroaliphatic sulfonate anion having a carbon number of 4 to 8 or a benzenesulfonate anion having a fluorine atom, still more preferably nonafluorobutanesulfonate anion, perfluorooctanesulfonate anion, pentafluorobenzenesulfonate anion or 3,5-bis(trifluoromethyl)benzenesulfonate anion.

The acid generator may be a compound capable of generating a sulfonic acid represented by the following formula (BI). In the case where the acid generator is, for example, a compound represented by formula (ZI) or (ZII), the aromatic sulfonate anion may be an anion capable of producing an arylsulfonic acid represented by the following formula (BI):

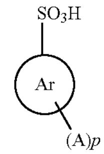

(BI)

In formula (BI), Ar represents an aromatic ring and may further have a substituent in addition to the sulfonic acid group and the A group.

p represents an integer of 0 or more.

A represents a group containing a hydrocarbon group.

When p is 2 or more, each A group may be the same as or different from every other A group.

Formula (BI) is described in detail below.

The aromatic ring represented by Ar is preferably an aromatic ring having a carbon number of 6 to 30, more preferably a benzene ring, a naphthalene ring or an anthracene ring, still more preferably a benzene ring.

Examples of the substituent which may be substituted on the aromatic ring in addition to the sulfonic acid group and the A group include a halogen atom (e.g., fluorine atom, chlorine atom, bromine atom, iodine atom), a hydroxyl group, a cyano group, a nitro group and a carboxyl group. In the case of having two or more substituents, at least two substituents may combine with each other to form a ring.

Examples of the group having a hydrocarbon group, represented by A, include an alkoxy group, an aryloxy group, an alkylthioxy group, an arylthioxy group, an alkoxycarbonyl group, an acetoxy group, a linear alkyl group, a branched alkyl group, an alkenyl group, an alkynyl group, an aryl group, and an acyl group.

The hydrocarbon group in the group containing a hydrocarbon group, represented by A, includes an acyclic hydrocarbon group and a cyclic aliphatic group. The carbon number of the hydrocarbon group is preferably 3 or more.

As for the A group, the carbon atom adjacent to Ar is preferably a tertiary or quaternary carbon atom.

Examples of the acyclic hydrocarbon group in the A group include an isopropyl group, a tert-butyl group, a tert-pentyl group, a neopentyl group, an s-butyl group, an isobutyl group, an isohexyl group, a 3,3-dimethylpentyl group, and a 2-ethylhexyl group. The upper limit of the carbon number of the acyclic hydrocarbon group is preferably 12 or less, more preferably 10 or less.

Examples of the cyclic aliphatic group in the A group include a cycloalkyl group, an adamantyl group, a norbornyl group, a bornyl group, a camphenyl group, a decahydronaphthyl group, a tricyclodecanyl group, a tetracyclodecanyl group, a camphoroyl group, a dicyclohexyl group, and a pinenyl group, each of which may have a substituent. The upper limit of the carbon number of the cyclic aliphatic group is preferably 15 or less, more preferably 12 or less.

In the case where the acyclic hydrocarbon group or cyclic aliphatic group has a substituent, examples of the substituent include a halogen atom, an alkoxy group, an aryloxy group, an alkylthioxy group, an arylthioxy group, an alkoxycarbonyl group, an acetoxy group, a linear alkyl group, a branched alkyl group, a cycloalkyl group, an alkenyl group, an alkynyl group, an aryl group, a hydroxy group, a carboxy group, a sulfonic acid group, a carbonyl group, and a cyano group.

p represents an integer of 0 or more, and the upper limit thereof is not particularly limited as long as it is a chemically possible number. From the standpoint of suppressing diffusion of the acid, p is usually from 0 to 5, preferably from 1 to 4, more preferably 2 or 3, and most preferably 3.

In view of suppressing diffusion of the acid, the A group is preferably substituted on at least one o-position, more preferably on two o-positions, with respect to the sulfonic acid group.

The acid generator is preferably a compound capable of generating an acid represented by the following formula (III) or (IV) upon irradiation with an actinic ray or radiation. The compound capable of generating an acid represented by the following formula (III) or (IV) has a cyclic organic group, so that the resolution and roughness performance can be more improved.

The non-nucleophilic anion described above can be an anion capable of generating an organic acid represented by the following formula (III) or (IV):

(III)

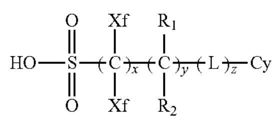

(IV)

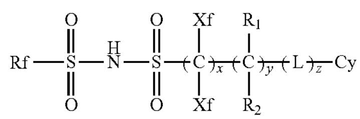

In the formulae, each Xf independently represents a fluorine atom or an alkyl group substituted with at least one fluorine atom.

Each of $R_1$ and $R_2$ independently represents a hydrogen atom, a fluorine atom or an alkyl group.

Each L independently represents a divalent linking group.

Cy represents a cyclic organic group.

Rf represents a fluorine atom-containing group.

x represents an integer of 1 to 20.

y represents an integer of 0 to 10.

z represents an integer of 0 to 10.

Xf represents a fluorine atom or an alkyl group substituted with at least one fluorine atom. The carbon number of the alkyl group is preferably from 1 to 10, more preferably from 1 to 4. Also, the alkyl group substituted with at least one fluorine atom is preferably a perfluoroalkyl group.

Xf is preferably a fluorine atom or a perfluoroalkyl group having a carbon number of 1 to 4. Specifically, Xf is preferably a fluorine atom, $CF_3$, $C_2F_5$, $C_3F_7$, $C_4F_9$, $C_5F_{11}$, $C_6F_{13}$, $C_7F_{15}$, $C_8F_{17}$, $CH_2CF_3$, $CH_2CH_2CF_3$, $CH_2C_2F_5$, $CH_2CH_2C_2F_5$, $CH_2C_3F_7$, $CH_2CH_2C_3F_7$, $CH_2C_4F_9$ or $CH_2CH_2C_4F_9$, more preferably a fluorine atom or $CF_3$, and it is still more preferred that both Xf are a fluorine atom.

Each of $R_1$ and $R_2$ independently represents a hydrogen atom, a fluorine atom or an alkyl group. The alkyl group may have a substituent (preferably fluorine atom) and is preferably an alkyl group having a carbon number of 1 to 4, more preferably a perfluoroalkyl group having a carbon number of 1 to 4. Specific examples of the alkyl group having a substituent of $R_1$ and $R_2$ include $CF_3$, $C_2F_5$, $C_3F_7$, $C_4F_9$, $C_5F_{11}$, $C_6F_{13}$, $C_7F_{15}$, $C_8F_{17}$, $CH_2CF_3$, $CH_2CH_2CF_3$, $CH_2C_2F_5$, $CH_2CH_2C_2F_5$, $CH_2C_3F_7$, $CH_2CH_2C_3F_7$, $CH_2C_4F_9$ and $CH_2CH_2C_4F_9$, with $CF_3$ being preferred.

L represents a divalent linking group. Examples of the divalent linking group include —COO—, —COO—, —CONH—, —NHCO—, —CO—, —O—, —S—, —SO—, —$SO_2$—, an alkylene group (preferably having a carbon number of 1 to 6), a cycloalkylene group (preferably having a carbon number of 3 to 10), an alkenylene group (preferably having a carbon number of 2 to 6), and a divalent linking group formed by combining a plurality of these members. Among these, —COO—, —COO—, —CONH—, —NHCO—, —CO—, —O—, —$SO_2$—, —COO-alkylene group-, —OCO-alkylene group-, —CONH-alkylene group- and —NHCO-alkylene group- are preferred, and —COO—, —CONH—, —$SO_2$—, —COO-alkylene group- and —OCO-alkylene group- are more preferred.

Cy represents a cyclic organic group. Examples of the cyclic organic group include an alicyclic group, an aryl group and a heterocyclic group The alicyclic group may be monocyclic or polycyclic. The monocyclic alicyclic group includes, for example, a monocyclic cycloalkyl group such as cyclopentyl group, cylohexyl group and cyclooctyl group. The polycyclic alicyclic group includes, for example, a polycyclic cycloalkyl group such as norbornyl group, tricyclodecanyl group, tetracyclodecanyl group, tetracyclododecanyl group and adamantyl group. Above all, an alicyclic group having a bulky structure with a carbon number of 7 or more, such as norbornyl group, tricyclodecanyl group, tetracyclodecanyl group, tetracyclododecanyl group and adamantyl group, is preferred from the standpoint of controlling in-film diffusion in the PEB (post-exposure baking) step and improving MEEF (Mask Error Enhancement Factor).

The aryl group may be monocyclic or polycyclic. Examples of the aryl group include a phenyl group, a naphthyl group, a phenanthryl group and an anthryl group. Among these, a naphthyl group having relatively low light absorbance at 193 nm is preferred.

The heterocyclic group may be monocyclic or polycyclic, but a polycyclic heterocyclic group can more suppress the diffusion of an acid. The heterocyclic group may have aromaticity or may not have aromaticity. Examples of the heterocyclic ring having aromaticity include a furan ring, a thiophene ring, a benzofuran ring, a benzothiophene ring, a dibenzofuran ring, a dibenzothiophene ring, and a pyridine ring. Examples of the heterocyclic ring not having aromaticity include a tetrahydropyran ring, a lactone ring and a decahydroisoquinoline ring. The heterocyclic ring in the heterocyclic group is preferably a furan ring, a thiophene ring, a pyridine ring or a decahydroisoquinoline ring. Examples of the lactone ring include lactone structures exemplified in the resin (A) above.

The above-described cyclic organic group may have a substituent, and examples of the substituent include an alkyl group (may be linear or branched, preferably having a carbon number of 1 to 12), a cycloalkyl group (may be monocyclic, polycyclic or spirocyclic, preferably having a carbon number of 3 to 20), an aryl group (preferably having a carbon number of 6 to 14), a hydroxyl group, an alkoxy group, an ester group, an amide group, a urethane group, a ureido group, a thioether group, a sulfonamido group and a sulfonic acid ester group. Incidentally, the carbon constituting the cyclic organic group (the carbon contributing to ring formation) may be carbonyl carbon.

x is preferably from 1 to 8, more preferably from 1 to 4, still more preferably 1. y is preferably from 0 to 4, more preferably 0. z is preferably from 0 to 8, more preferably from 0 to 4.

The fluorine atom-containing group represented by Rf includes, for example, an alkyl group having at least one fluorine atom, a cycloalkyl group having at least one fluorine atom, and an aryl group having at least one fluorine atom These alkyl group, cycloalkyl group and aryl group may be substituted with a fluorine atom or may be substituted with another fluorine atom-containing substituent. In the case where Rf is a cycloalkyl group having at least one fluorine atom or an aryl group having at least one fluorine atom, the another fluorine-containing substituent includes, for example, an alkyl group substituted with at least one fluorine atom.

Also, the alkyl group, cycloalkyl group and aryl group may be further substituted with a fluorine atom-free substituent. Examples of this substituent include those not containing a fluorine atom out of the substituents described above for Cy.

Examples of the alkyl group having at least one fluorine atom represented by Rf are the same as those described above as the alkyl group substituted with at least one fluorine atom represented by Xf. Examples of the cycloalkyl group having at least one fluorine atom represented by Rf include a perfluorocyclopentyl group and a perfluorocyclohexyl group. Examples of the aryl group having at least one fluorine atom represented by Rf include a perfluorophenyl group.

The organic group represented by $R_{201}$, $R_{202}$ and $R_{203}$ includes, for example, corresponding groups in the later-described compounds (ZI-1), (ZI-2), (ZI-3) and (ZI-4).

The compound may be a compound having a plurality of structures represented by formula (ZI). For example, the compound may be a compound having a structure where at least one of $R_{201}$ to $R_{203}$ in a compound represented by formula (ZI) is bonded to at least one of $R_{201}$ to $R_{203}$ in another compound represented by formula (ZI) through a single bond or a linking group.

Compounds (ZI-1), (ZI-2), (ZI-3) and (ZI-4) described below are more preferred as the component (ZI).

The compound (ZI-1) is an arylsulfonium compound where at least one of $R_{201}$ to $R_{203}$ in formula (ZI) is an aryl group, that is, a compound having an arylsulfonium as the cation.

In the arylsulfonium compound, all of $R_{201}$ to $R_{203}$ may be an aryl group, or a part of $R_{201}$ to $R_{203}$ may be an aryl group, with the remaining being an alkyl group or a cycloalkyl group.

Examples of the arylsulfonium compound include a triarylsulfonium compound, a diarylalkylsulfonium compound, an aryldialkylsulfonium compound, a diarylcycloalkylsulfonium compound, and an aryldicycloalkylsulfonium compound.

The aryl group in the arylsulfonium compound is preferably a phenyl group or a naphthyl group, more preferably a phenyl group. The aryl group may be an aryl group having a heterocyclic structure containing an oxygen atom, a nitrogen atom, a sulfur atom or the like. Examples of the heterocyclic structure include a pyrrole residue, a furan residue, a thiophene residue, an indole residue, a benzofuran residue and a benzothiophene residue. In the case where the arylsulfonium compound has two or more aryl groups, these two or more aryl groups may be the same or different.

The alkyl or cycloalkyl group which is contained, if desired, in the arylsulfonium compound is preferably a linear or branched alkyl group having a carbon number of 1 to 15 or a cycloalkyl group having a carbon number of 3 to 15, and examples thereof include a methyl group, an ethyl group, a propyl group, an n-butyl group, a sec-butyl group, a tert-butyl group, a cyclopropyl group, a cyclobutyl group, and a cyclohexyl group.

The aryl group, alkyl group and cycloalkyl group of $R_{201}$ to $R_{203}$ may have, as the substituent, an alkyl group (for example, having a carbon number of 1 to 15), a cycloalkyl group (for example, having a carbon number of 3 to 15), an aryl group (for example, having a carbon number of 6 to 14), an alkoxy group (for example, having a carbon number of 1 to 15), a halogen atom, a hydroxyl group or a phenylthio group. The substituent is preferably a linear or branched alkyl group having a carbon number of 1 to 12, a cycloalkyl group having a carbon number of 3 to 12, or a linear, branched or cyclic alkoxy group having a carbon number of 1 to 12, more preferably an alkyl group having a carbon number of 1 to 4, or an alkoxy group having a carbon number of 1 to 4. The substituent may be substituted on any one of three members $R_{201}$ to $R_{203}$ or may be substituted on all of these three members. In the case where $R_{201}$ to $R_{203}$ are an aryl group, the substituent is preferably substituted on the p-position of the aryl group.

The compound (ZI-2) is described below.

The compound (ZI-2) is a compound where each of $R_{201}$ to $R_{203}$ in formula (ZI) independently represents an aromatic ring-free organic group. The aromatic ring as used herein encompasses an aromatic ring containing a heteroatom.

The aromatic ring-free organic group as $R_{201}$ to $R_{203}$ has a carbon number of generally from 1 to 30, preferably from 1 to 20.

Each of $R_{201}$ to $R_{203}$ is independently, preferably an alkyl group, a cycloalkyl group, an allyl group or a vinyl group, more preferably a linear or branched 2-oxoalkyl group, a 2-oxocycloalkyl group or an alkoxycarbonylmethyl group, still more preferably a linear or branched 2-oxoalkyl group.

The alkyl group and cycloalkyl group of $R_{201}$ to $R_{203}$ are preferably a linear or branched alkyl group having a carbon number of 1 to 10 (e.g., methyl, ethyl, propyl, butyl, pentyl) and a cycloalkyl group having a carbon number of 3 to 10 (e.g., cyclopentyl, cyclohexyl, norbornyl). The alkyl group is more preferably a 2-oxoalkyl group or an alkoxycarbonylmethyl group. The cycloalkyl group is more preferably a 2-oxocycloalkyl group.

The 2-oxoalkyl group may be either linear or branched and is preferably a group having >C=O at the 2-position of the above-described alkyl group.

The 2-oxocycloalkyl group is preferably a group having >C=O at the 2-position of the above-described cycloalkyl group.

The alkoxy group in the alkoxycarbonylmethyl group is preferably an alkoxy group having a carbon number of 1 to 5 (e.g., methoxy group, ethoxy group, propoxy group, butoxy group, pentoxy group).

$R_{201}$ to $R_{203}$ may be further substituted with a halogen atom, an alkoxy group (for example, having a carbon number of 1 to 5), a hydroxyl group, a cyano group or a nitro group.

The compound (ZI-3) is described below.

The compound (ZI-3) is a compound represented by the following formula (ZI-3), and this is a compound having a phenacylsulfonium salt structure.

(ZI-3)

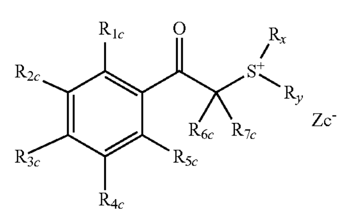

In formula (ZI-3), each of $R_{1c}$ to $R_{5c}$ independently represents a hydrogen atom, an alkyl group, a cycloalkyl group, an aryl group, an alkoxy group, an aryloxy group, an alkoxycarbonyl group, an alkylcarbonyloxy group, a cycloalkylcarbonyloxy group, a halogen atom, a hydroxyl group, a nitro group, an alkylthio group, or an arylthio group.

Each of $R_{6c}$ and $R_{7c}$ independently represents a hydrogen atom, an alkyl group, a cycloalkyl group, a halogen atom, a cyano group, or an aryl group.

Each of $R_x$ and $R_y$ independently represents an alkyl group, a cycloalkyl group, a 2-oxoalkyl group, a 2-oxocycloalkyl group, an alkoxycarbonylalkyl group, an allyl group, or a vinyl group.

Any two or more members out of $R_{1c}$ to $R_{5c}$, a pair of $R_{5c}$ and $R_{6c}$, a pair of $R_{6c}$ and $R_{7c}$, a pair of $R_{5c}$ and $R_x$, or a pair of $R_x$ and $R_y$ may combine together to form a ring structure. This ring structure may contain an oxygen atom, a sulfur atom, a ketone group, an ester bond or an amide bond.

The ring structure above includes an aromatic or non-aromatic hydrocarbon ring, an aromatic or non-aromatic heterocyclic ring, and a polycyclic condensed ring formed by combining two or more of these rings. The ring structure includes a 3- to 10-membered ring and is preferably a 4- to 8-membered ring, more preferably a 5- or 6-membered ring.

Examples of the group formed by combining any two or more members of $R_{1c}$ to $R_{5c}$, a pair of $R_{6c}$ and $R_{7c}$, or a pair of $R_x$ and $R_y$ include a butylene group and a pentylene group.

The group formed by combining a pair of $R_{5c}$ and $R_{6c}$ or a pair of $R_{5c}$ and $R_x$ is preferably a single bond or an alkylene group, and examples of the alkylene group include a methylene group and an ethylene group.

$Zc^-$ represents a non-nucleophilic anion, and examples thereof are the same as those of the non-nucleophilic anion of $Z^-$ in formula (ZI).

The alkyl group as $R_{1c}$ to $R_{7c}$ may be either linear or branched and is, for example, an alkyl group having a carbon number of 1 to 20, preferably a linear or branched alkyl group having a carbon number of 1 to 12 (such as methyl group, ethyl group, linear or branched propyl group, linear or branched butyl group, or linear or branched pentyl group). The cycloalkyl group includes, for example, a cycloalkyl group having a carbon number of 3 to 10 (e.g., cyclopentyl group, cyclohexyl group).

The aryl group as $R_{1c}$ to $R_{5c}$ is preferably an aryl group having a carbon number of 5 to 15, and examples thereof include a phenyl group and a naphthyl group.

The alkoxy group as $R_{1c}$ to $R_{5c}$ may be linear, branched or cyclic and is, for example, an alkoxy group having a carbon number of 1 to 10, preferably a linear or branched alkoxy group having a carbon number of 1 to 5 (such as methoxy group, ethoxy group, linear or branched propoxy group, linear or branched butoxy group, or linear or branched pentoxy group), or a cyclic alkoxy group having a carbon number of 3 to 10 (such as cyclopentyloxy group or cyclohexyloxy group).

Specific examples of the alkoxy group in the alkoxycarbonyl group as $R_{1c}$ to $R_{5c}$ are the same as specific examples of the alkoxy group of $R_{1c}$ to $R_{5c}$.

Specific examples of the alkyl group in the alkylcarbonyloxy group and alkylthio group as $R_{1c}$ to $R_{5c}$ are the same as specific examples of the alkyl group of $R_{1c}$ to $R_{5c}$.

Specific examples of the cycloalkyl group in the cycloalkylcarbonyloxy group as $R_{1c}$ to $R_{5c}$ are the same as specific examples of the cycloalkyl group of $R_{1c}$ to $R_{5c}$.

Specific examples of the aryl group in the aryloxy group and arylthio group as $R_{1c}$ to $R_{5c}$ are the same as specific examples of the aryl group of $R_{1c}$ to $R_{5c}$.

A compound where any one of $R_{1c}$ to $R_{5c}$ is a linear or branched alkyl group, a cycloalkyl group, or a linear, branched or cyclic alkoxy group is preferred, and a compound where the sum of carbon numbers of $R_{1c}$ to $R_{5c}$ is from 2 to 15 is more preferred. Thanks to such a compound, the solvent solubility is more enhanced and production of particles during storage can be suppressed.

The ring structure which may be formed by combining any two or more members of $R_{1c}$ to $R_{5c}$ with each other is preferably a 5- or 6-membered ring, more preferably a 6-membered ring (such as phenyl ring).

The ring structure which may be formed by combining $R_{5c}$ and $R_{6c}$ with each other includes a 4- or higher-membered ring (preferably a 5- or 6-membered ring) formed together with the carbonyl carbon atom and carbon atom in formula (I) by combining $R_{5c}$ and $R_{6c}$ with each other to constitute a single bond or an alkylene group (such as methylene group or ethylene group).

The aryl group as $R_{6c}$ and $R_{7c}$ is preferably an aryl group having a carbon number of 5 to 15, and examples thereof include a phenyl group and a naphthyl group.

An embodiment where both of $R_{6c}$ and $R_{7c}$ are an alkyl group is preferred, an embodiment where each of $R_{6c}$ and $R_{7c}$ is a linear or branched alkyl group having a carbon number of 1 to 4 is more preferred, and an embodiment where both are a methyl group is still more preferred.

In the case where $R_{6c}$ and $R_{7c}$ are combined to form a ring, the group formed by combining $R_{6c}$ and $R_{7c}$ is preferably an alkylene group having a carbon number of 2 to 10, and examples thereof include an ethylene group, a propylene group, a butylene group, a pentylene group and a hexylene group. Also, the ring formed by combining $R_{6c}$ and $R_{7c}$ may contain a heteroatom such as oxygen atom in the ring.

Examples of the alkyl group and cycloalkyl group as $R_x$ and $R_y$ are the same as those of the alkyl group and cycloalkyl group in $R_{1c}$ to $R_{7c}$.

Examples of the 2-oxoalkyl group and 2-oxocycloalkyl group as $R_x$ and $R_y$ include a group having >C=O at the 2-position of the alkyl group or cycloalkyl group as $R_{1c}$ to $R_{7c}$.

Examples of the alkoxy group in the alkoxycarbonylalkyl group as $R_x$ and $R_y$ are the same as those of the alkoxy group in $R_{1c}$ to $R_{5c}$. The alkyl group is, for example, an alkyl group having a carbon number of 1 to 12, preferably a linear alkyl group having a carbon number of 1 to 5 (such as methyl group or ethyl group).

The allyl group as $R_x$ and $R_y$ is not particularly limited but is preferably an unsubstituted allyl group or an allyl group substituted with a monocyclic or polycyclic cycloalkyl group (preferably a cycloalkyl group having a carbon number of 3 to 10).

The vinyl group as $R_x$ and $R_y$ is not particularly limited but is preferably an unsubstituted vinyl group or a vinyl group substituted with a monocyclic or polycyclic cycloalkyl group (preferably a cycloalkyl group having a carbon number of 3 to 10).

The ring structure which may be formed by combining $R_{5c}$ and $R_x$ with each other includes a 5- or higher-membered ring (preferably a 5-membered ring) formed together with the sulfur atom and carbonyl carbon atom in formula (I) by combining $R_{5c}$ and $R_x$ with each other to constitute a single bond or an alkylene group (such as methylene group or ethylene group).

The ring structure which may be formed by combining $R_x$ and $R_y$ with each other includes a 5- or 6-membered ring, preferably a 5-membered ring (that is, tetrahydrothiophene ring), formed by divalent $R_x$ and $R_y$ (for example, a methylene group, an ethylene group or a propylene group) together with the sulfur atom in formula (ZI-3).

Each of $R_x$ and $R_y$ is preferably an alkyl or cycloalkyl group having a carbon number of 4 or more, more preferably 6 or more, still more preferably 8 or more.

Each of $R_{1c}$ to $R_{7c}$, $R_x$ and $R_y$ may further have a substituent, and examples of such a substituent include a halogen atom (e.g., fluorine atom), a hydroxyl group, a carboxyl group, a cyano group, a nitro group, an alkyl group, a cycloalkyl group, an aryl group, an alkoxy group, an aryloxy group, an acyl group, an arylcarbonyl group, an alkoxyalkyl group, an aryloxyalkyl group, an alkoxycarbonyl group, an aryloxycarbonyl group, an alkoxycarbonyloxy group, and an aryloxycarbonyloxy group.

In formula (ZI-3), it is more preferred that each of $R_{1c}$, $R_{2c}$, $R_{4c}$ and $R_{5c}$ independently represents a hydrogen atom and $R_{1c}$ represents a group except for a hydrogen atom, that is, represents an alkyl group, a cycloalkyl group, an aryl group, an alkoxy group, an aryloxy group, an alkoxycarbonyl group, an alkylcarbonyloxy group, a cycloalkylcarbonyloxy group, a halogen atom, a hydroxyl group, a nitro group, an alkylthio group or an arylthio group.

Examples of the cation in the compound (ZI-2) or (ZI-3) for use in the present invention include cations described in paragraphs [0130] to [0134] of JP-A-2010-256842 and paragraphs [0136] to [0140] of JP-A-2011-76056.

The compound (ZI-4) is described below.

The compound (ZI-4) is represented by the following formula (ZI-4):

(ZI-4)

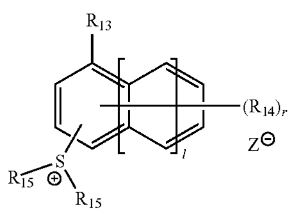

In formula (ZI-4), $R_{13}$ represents a hydrogen atom, a fluorine atom, a hydroxyl group, an alkyl group, a cycloalkyl group, an alkoxy group, an alkoxycarbonyl group, or a group having a cycloalkyl group. These groups may have a substituent.

$R_{14}$ represents, when a plurality of $R_{14}$s are present, each independently represents, a hydroxyl group, an alkyl group, a cycloalkyl group, an alkoxy group, an alkoxycarbonyl group, an alkylcarbonyl group, an alkylsulfonyl group, a cycloalkylsulfonyl group, or a group having a cycloalkyl group. These groups may have a substituent.

Each $R_{15}$ independently represents an alkyl group, a cycloalkyl group, or a naphthyl group. Two $R_{15}$s may combine with each other to form a ring. These groups may have a substituent.

l represents an integer of 0 to 2.

r represents an integer of 0 to 8.

$Z^-$ represents a non-nucleophilic anion, and examples thereof are the same as those of the nucleophilic anion of $Z^-$ in formula (ZI).

In formula (ZI-4), the alkyl group of $R_{13}$, $R_{14}$ and $R_{15}$ is a linear or branched alkyl group preferably having a carbon number of 1 to 10, and preferred examples thereof include a methyl group, an ethyl group, an n-butyl group and a tert-butyl group.

The cycloalkyl group of $R_{13}$, $R_{14}$ and $R_{15}$ includes a monocyclic or polycyclic cycloalkyl group (preferably a cycloalkyl group having a carbon number of 3 to 20) and is preferably cyclopropyl, cyclopentyl, cyclohexyl, cycloheptyl, or cyclooctyl, among others.

The alkoxy group of $R_{13}$ and $R_{14}$ is a linear or branched alkoxy group preferably having a carbon number of 1 to 10, and preferred examples thereof include a methoxy group, an ethoxy group, an n-propoxy group and an n-butoxy group.

The alkoxycarbonyl group of $R_{13}$ and $R_{14}$ is a linear or branched alkoxycarbonyl group preferably having a carbon number of 2 to 11, and preferred examples thereof include a methoxycarbonyl group, an ethoxycarbonyl group and an n-butoxycarbonyl group.

The group having a cycloalkyl group of $R_{13}$ and $R_{14}$ includes a monocyclic or polycyclic cycloalkyl group (preferably a cycloalkyl group having a carbon number of 3 to 20), and examples thereof include a monocyclic or polycyclic cycloalkyloxy group and an alkoxy group having a monocyclic or polycyclic cycloalkyl group. These groups may further have a substituent.

The monocyclic or polycyclic cycloalkyloxy group of $R_{13}$ and $R_{14}$ preferably has a total carbon number of 7 or more, more preferably a total carbon number of 7 to 15, and it is preferred to have a monocyclic cycloalkyl group. The monocyclic cycloalkyloxy group having a total carbon number of 7 or more indicates a monocyclic cycloalkyloxy group where a cycloalkyloxy group such as cyclopropyloxy group, cyclobutyloxy group, cyclopentyloxy group, cyclohexyloxy group, cycloheptyloxy group, cyclooctyloxy group and cyclododecanyloxy group arbitrarily has a substituent such as alkyl group (e.g., methyl group, ethyl group, propyl group, butyl group, pentyl group, hexyl group, heptyl group, octyl group, dodecyl group, 2-ethylhexyl group, isopropyl group, sec-butyl group, tert-butyl group, isoamyl group), hydroxyl group, halogen atom (e.g., fluorine, chlorine, bromine, iodine), nitro group, cyano group, amido group, sulfonamido group, alkoxy group (e.g., methoxy group, ethoxy group, hydroxyethoxy group, propoxy group, hydroxypropoxy group, butoxy group), alkoxycarbonyl group (e.g., methoxycarbonyl group, ethoxycarbonyl group), acyl group (e.g., formyl group, acetyl group, benzoyl group), acyloxy group (e.g., acetoxy group, butyryloxy group) and carboxy group and where the total carbon number inclusive of the carbon number of an arbitrary substituent on the cycloalkyl group is 7 or more.

Examples of the polycyclic cycloalkyloxy group having a total carbon number of 7 or more include a norbornyloxy group, a tricyclodecanyloxy group, a tetracyclodecanyloxy group, and an adamantyloxy group.

The alkoxy group having a monocyclic or polycyclic cycloalkyl group of $R_{13}$ and $R_{14}$ preferably has a total carbon number of 7 or more, more preferably a total carbon number of 7 to 15, and is preferably an alkoxy group having a monocyclic cycloalkyl group. The alkoxy group having a total carbon number of 7 or more and having a monocyclic cycloalkyl group indicates an alkoxy group where the above-described monocyclic cycloalkyl group which may have a substituent is substituted on an alkoxy group such as methoxy, ethoxy, propoxy, butoxy, pentyloxy, hexyloxy, heptoxy, octyloxy, dodecyloxy, 2-ethylhexyloxy, isopropoxy, sec-butoxy, tert-butoxy and isoamyloxy and where the total carbon number inclusive of the carbon number of the substituent is 7 or more. Examples thereof include a cyclohexylmethoxy group, a cyclopentylethoxy group, and a cyclohexylethoxy group, with a cyclohexylmethoxy group being preferred.

Examples of the alkoxy group having a total carbon number of 7 or more and having a polycyclic cycloalkyl group include a norbornylmethoxy group, a norbornylethoxy group, a tricyclodecanylmethoxy group, a tricyclodecanylethoxy group, a tetracyclodecanylmethoxy group, a tetracyclodecanylethoxy group, an adamantylmethoxy group, and an adamantylethoxy group, with a norbornylmethoxy group and a norbornylethoxy group being preferred.

Specific examples of the alkyl group in the alkylcarbonyl group of $R_{14}$ are the same as those of the alkyl group of $R_{13}$ to $R_{15}$.

The alkylsulfonyl or cycloalkylsulfonyl group of $R_{14}$ is a linear, branched or cyclic alkylsulfonyl group preferably having a carbon number of 1 to 10, and preferred examples thereof include a methanesulfonyl group, an ethanesulfonyl group, an n-propanesulfonyl group, an n-butanesulfonyl group, a cyclopentanesulfonyl group, and a cyclohexanesulfonyl group.

Examples of the substituent which each of the groups above may have include a halogen atom (e.g., fluorine atom), a hydroxyl group, a carboxyl group, a cyano group, a nitro group, an alkoxy group, an alkoxyalkyl group, an alkoxycarbonyl group, and an alkoxycarbonyloxy group.

Examples of the alkoxy group include a linear, branched or cyclic alkoxy group having a carbon number of 1 to 20, such as methoxy group, ethoxy group, n-propoxy group, i-propoxy group, n-butoxy group, 2-methylpropoxy group, 1-methylpropoxy group, tert-butoxy group, cyclopentyloxy group and cyclohexyloxy group.

Examples of the alkoxyalkyl group include a linear, branched or cyclic alkoxyalkyl group having a carbon number of 2 to 21, such as methoxymethyl group, ethoxymethyl group, 1-methoxyethyl group, 2-methoxyethyl group, 1-ethoxyethyl group and 2-ethoxyethyl group.

Examples of the alkoxycarbonyl group include a linear, branched or cyclic alkoxycarbonyl group having a carbon number of 2 to 21, such as methoxycarbonyl group, ethoxycarbonyl group, n-propoxycarbonyl group, i-propoxycarbonyl group, n-butoxycarbonyl group, 2-methylpropoxycarbonyl group, 1-methylpropoxycarbonyl group, tert-butoxycarbonyl group, cyclopentyloxycarbonyl group and cyclohexyloxycarbonyl group.

Examples of the alkoxycarbonyloxy group include a linear, branched or cyclic alkoxycarbonyloxy group having a carbon number of 2 to 21, such as methoxycarbonyloxy group, ethoxycarbonyloxy group, n-propoxycarbonyloxy group, i-propoxycarbonyloxy group, n-butoxycarbonyloxy group, tert-butoxycarbonyloxy group, cyclopentyloxycarbonyloxy group and cyclohexyloxycarbonyloxy group.

The ring structure which may be formed by combining two $R_{15}$s with each other includes a 5- or 6-membered ring, preferably a 5-membered ring (that is, tetrahydrothiophene ring), formed by two $R_{15}$s together with the sulfur atom in formula (ZI-4) and may be fused with an aryl group or a cycloalkyl group. The divalent $R_{15}$ may have a substituent, and examples of the substituent include a hydroxyl group, a carboxyl group, a cyano group, a nitro group, an alkyl group, a cycloalkyl group, an alkoxy group, an alkoxyalkyl group, an alkoxycarbonyl group, and an alkoxycarbonyloxy group. As for the substituent on the ring structure, a plurality of substituents may be present, and they may combine with each other to form a ring (for example, an aromatic or non-aromatic hydrocarbon ring, an aromatic or non-aromatic heterocyclic ring, or a polycyclic condensed ring formed by combining two or more of these rings).

In formula (ZI-4), $R_{15}$ is preferably, for example, a methyl group, an ethyl group, a naphthyl group, or a divalent group capable of forming a tetrahydrothiophene ring structure together with the sulfur atom when two $R_{15}$s are combined.

The substituent which may be substituted on $R_{13}$ and $R_{14}$ is preferably a hydroxyl group, an alkoxy group, an alkoxycarbonyl group, or a halogen atom (particularly fluorine atom).

l is preferably 0 or 1, more preferably 1.

r is preferably from 0 to 2.

Examples of the cation in the compound represented by formula (ZI-4) for use in the present invention include cations described in paragraphs [0121], [0123] and [0124] of JP-A-2010-256842 and paragraphs [0127], [0129] and [0130] of JP-A-2011-76056.

Formulae (ZIT) and (ZIII) are described below.

In formulae (ZIT) and (ZIII), each of $R_{204}$ to $R_{207}$ independently represents an aryl group, an alkyl group or a cycloalkyl group.

The aryl group of $R_{204}$ to $R_{207}$ is preferably a phenyl group or a naphthyl group, more preferably a phenyl group. The aryl group of $R_{204}$ to $R_{207}$ may be an aryl group having a heterocyclic structure containing an oxygen atom, a nitrogen atom, a sulfur atom or the like. Examples of the framework of the aryl group having a heterocyclic structure include pyrrole, furan, thiophene, indole, benzofuran, and benzothiophene.

The alkyl group and cycloalkyl group in $R_{204}$ to $R_{207}$ are preferably a linear or branched alkyl group having a carbon number of 1 to 10 (e.g., methyl group, ethyl group, propyl group, butyl group, pentyl group) and a cycloalkyl group having a carbon number of 3 to 10 (e.g., cyclopentyl group, cyclohexyl group, norbornyl group).

The aryl group, alkyl group and cycloalkyl group of $R_{204}$ to $R_{207}$ may have a substituent. Examples of the substituent which the aryl group, alkyl group and cycloalkyl group of $R_{204}$ to $R_{207}$ may have include an alkyl group (for example, having a carbon number of 1 to 15), a cycloalkyl group (for example, having a carbon number of 3 to 15), an aryl group (for example, having a carbon number of 6 to 15), an alkoxy group (for example, having a carbon number of 1 to 15), a halogen atom, a hydroxyl group, and a phenylthio group.

$Z^-$ represents a non-nucleophilic anion, and examples thereof are the same as those of the non-nucleophilic anion of $Z^-$ in formula (ZI).

Other examples of the acid generator include compounds represented by the following formulae (ZIV), (ZV) and (ZVI):

$$Ar_3—SO_2—SO_2—Ar_4 \qquad \text{(ZIV)}$$

(ZV)

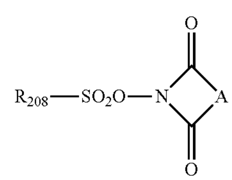

(ZVI)

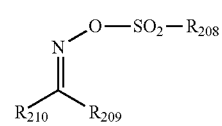

In formulae (ZIV) to (ZVI), each of $Ar_3$ and $Ar_4$ independently represents an aryl group.

Each of $R_{208}$, $R_{209}$ and $R_{210}$ independently represents an alkyl group, a cycloalkyl group, or an aryl group.

A represents an alkylene group, an alkenylene group, or an arylene group.

Specific examples of the aryl group of $Ar_3$, $Ar_4$, $R_{208}$, $R_{209}$ and $R_{210}$ are the same as specific examples of the aryl group of $R_{201}$, $R_{202}$ and $R_{203}$ in formula (ZI-1).

Specific examples of the alkyl group and cycloalkyl group of $R_{208}$, $R_{209}$ and $R_{210}$ are the same as specific examples of the alkyl group and cycloalkyl group of $R_{201}$, $R_{202}$ and $R_{203}$ in formula (ZI-2).

The alkylene group of A includes an alkylene group having a carbon number of 1 to 12 (e.g., methylene group, ethylene group, propylene group, isopropylene group, butylenes group, isobutylene group); the alkenylene group of A includes an alkenylene group having a carbon number of 2 to 12 (e.g., ethenylene group, propenylene group, butenylene group); and the arylene group of A includes an arylene group having a carbon number of 6 to 10 (e.g., phenylene group, tolylene group, naphthylene group).

Among the acid generators, more preferred are the compounds represented by formulae (ZI) to (ZIII).

Also, the acid generator is preferably a compound that generates an acid having one sulfonic acid group or imide group, more preferably a compound that generates a monovalent perfluoroalkanesulfonic acid, a compound that generates an aromatic sulfonic acid substituted with a monovalent fluorine atom or a fluorine atom-containing group, or a compound that generates an imide acid substituted with a monovalent fluorine atom or a fluorine atom-containing group, still more preferably a sulfonium salt of fluoro-substituted alkanesulfonic acid, fluorine-substituted benzenesulfonic acid, fluorine-substituted imide acid or fluorine-substituted methide acid. Among others, the acid generator which can be used is preferably a compound that generates a fluoro-substituted alkanesulfonic acid, a fluoro-substituted benzenesulfonic acid or a fluoro-substituted imide acid, where pKa of the acid generated is −1 or less, and in this case, the sensitivity is enhanced.

Among the acid generators, particularly preferred examples are illustrated below.

(z1)

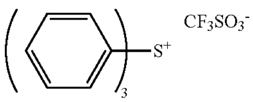

(z2)

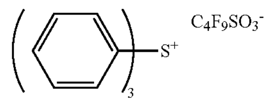

(z3)

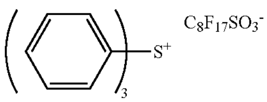

(z4)

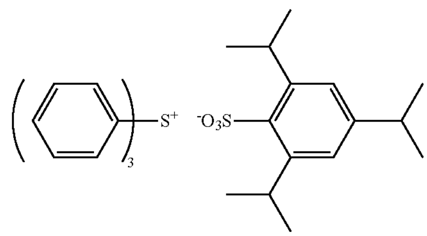

(z5)

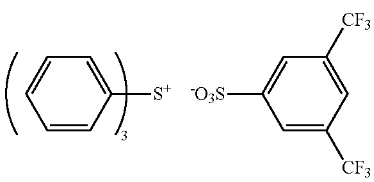

(z6)

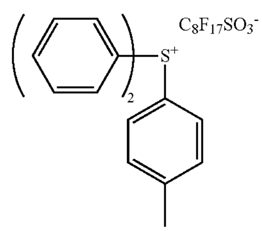

(z7)

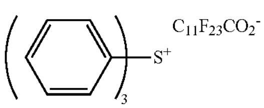

(z8)

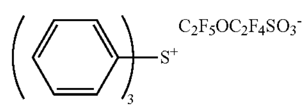

(z9)

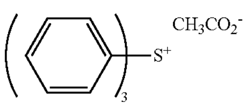

(z10)

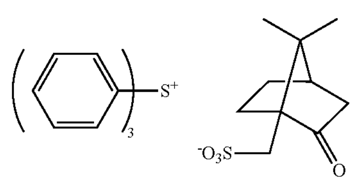

(z11)

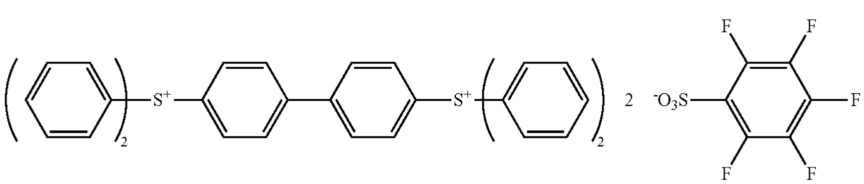

(z12)

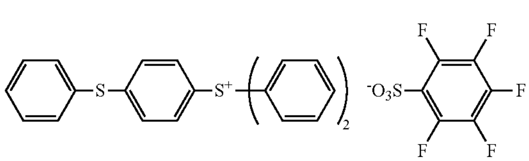

(z13)

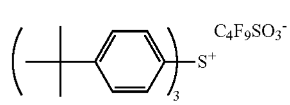

-continued
(z14)
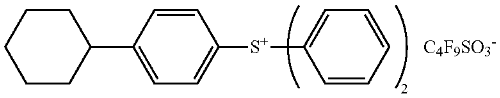
(z15)
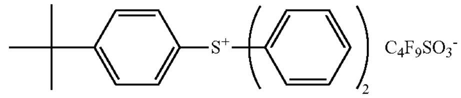
(z16)
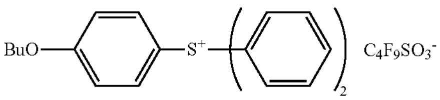
(z17)
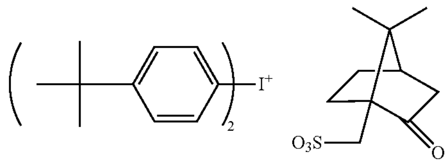
(z18)
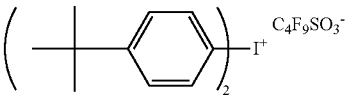
(z19)
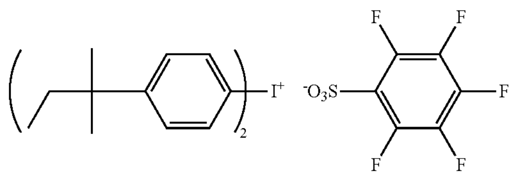
(z20)
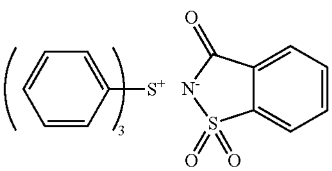
(z21)
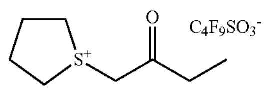
(z22)
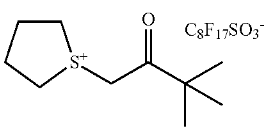
(z23)
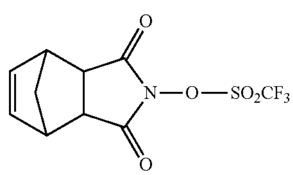
(z24)
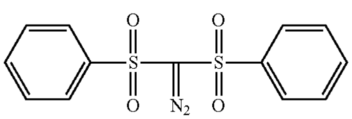
(z25)
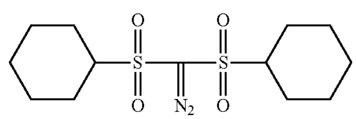
(z26)
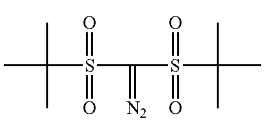
(z27)
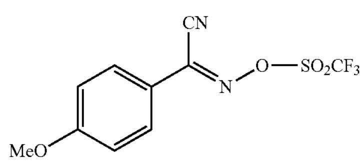
(z28)
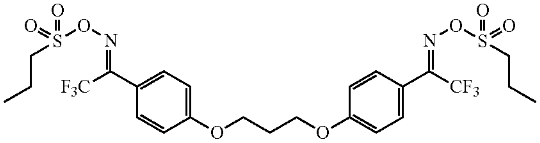
(z29)
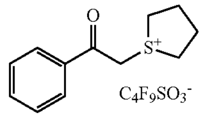
(z30)
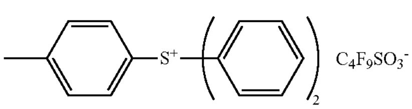
(z31)
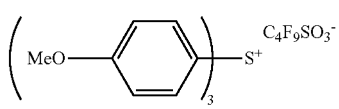

-continued
(z32)
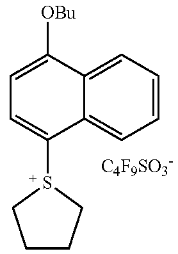
(z33)
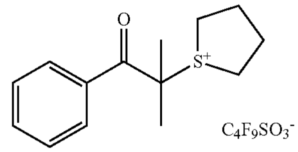
(z34)
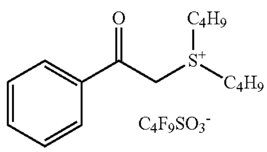
(z35)
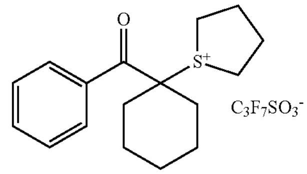
(z36)
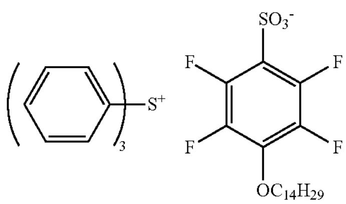
(z37)
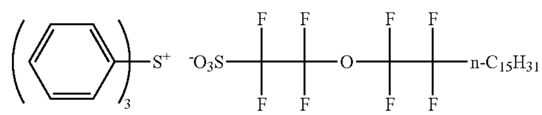
(z38)
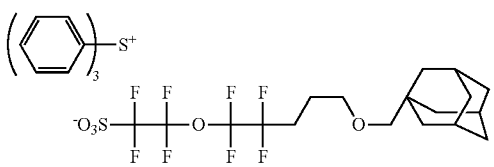
(z39)
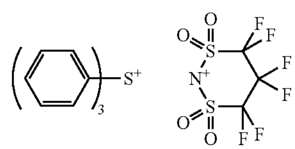
(z40)
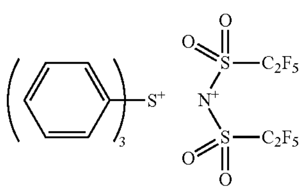
(z41)
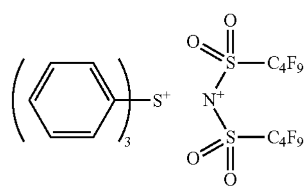
(z42)
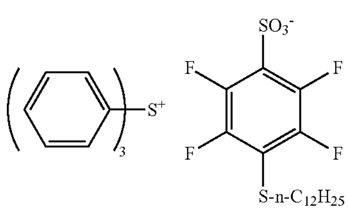
(z43)
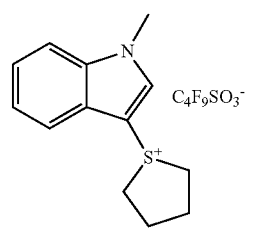
(z44)
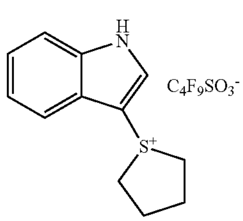
(z45)
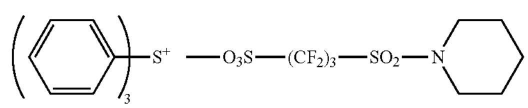
(z46)
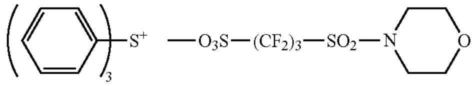
(z47)
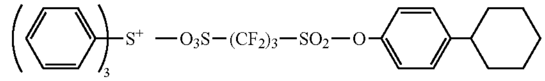

-continued
(z48)
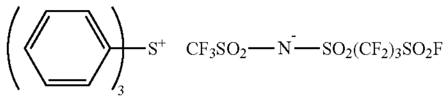
(z49)
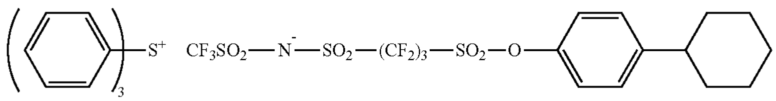
(z50)
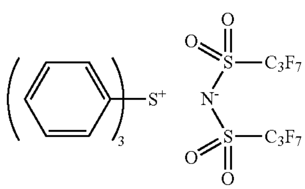
(z51)
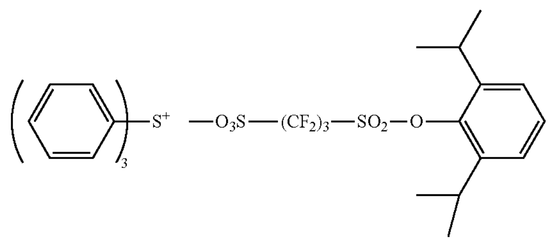
(z52)
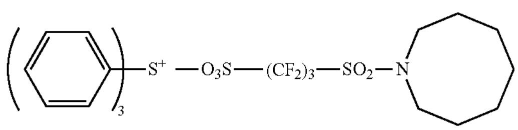
(z53)
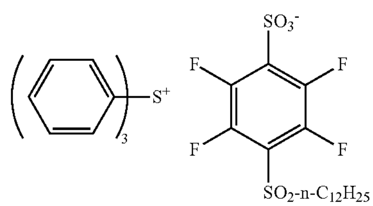
(z54)
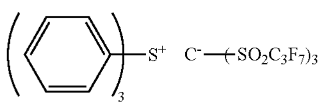
(z55)
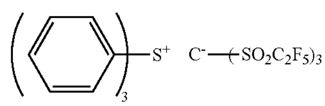
(z56)
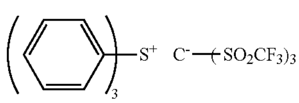
(z57)
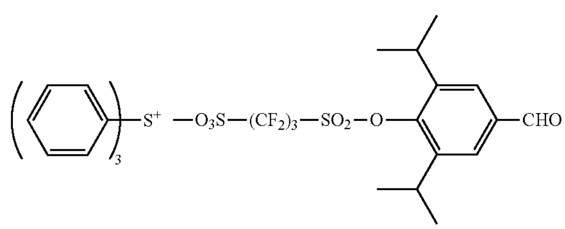
(z58)
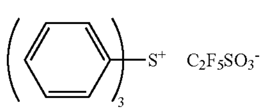
(z59)
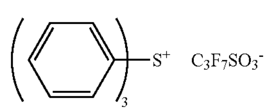
(z60)
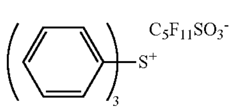
(z61)
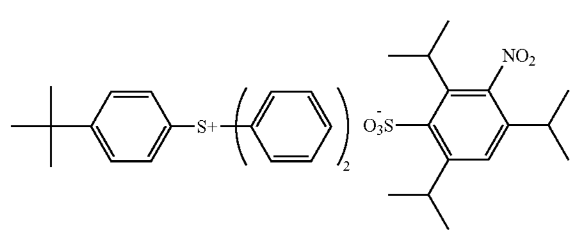

-continued
(z62)
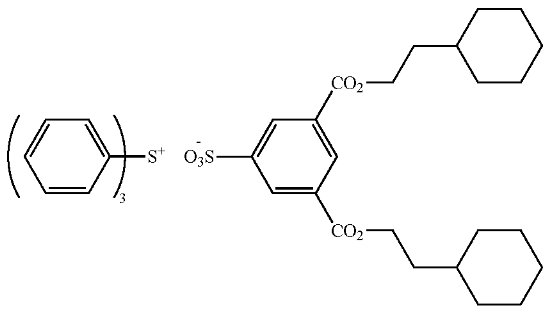
(z63)
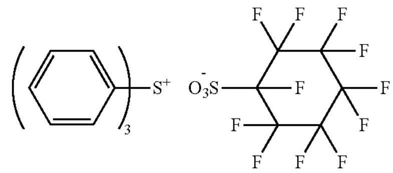
(z64)
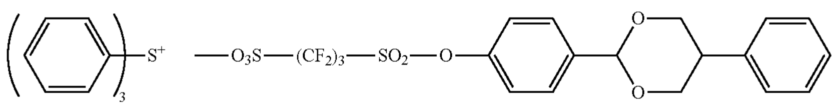
(z66)
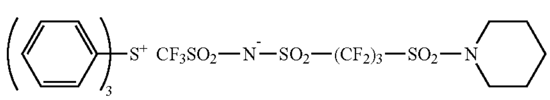
(z65)
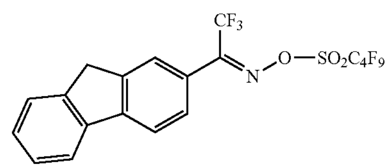
(z67)
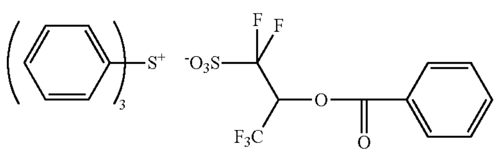
(z68)
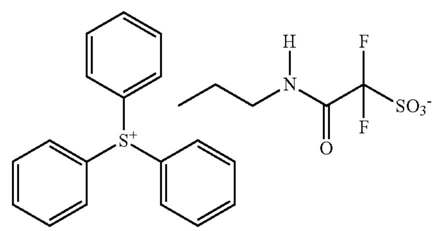
(z69)
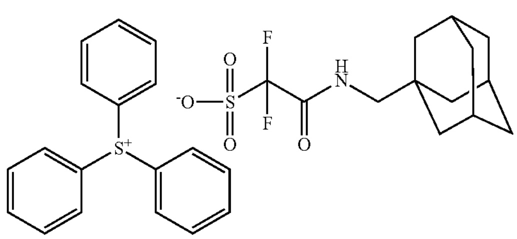
(z70)
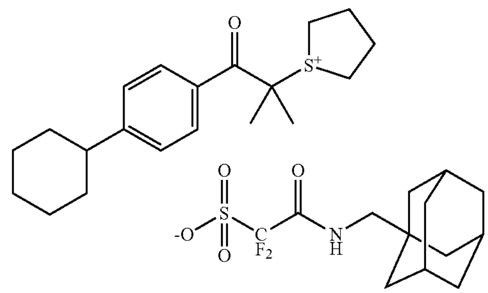
(z71)
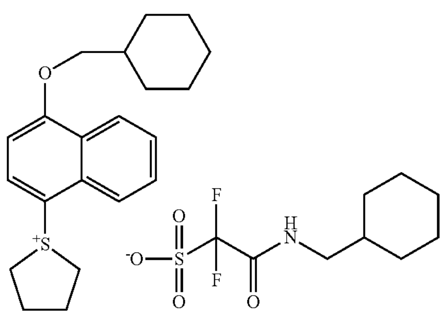
(z72)
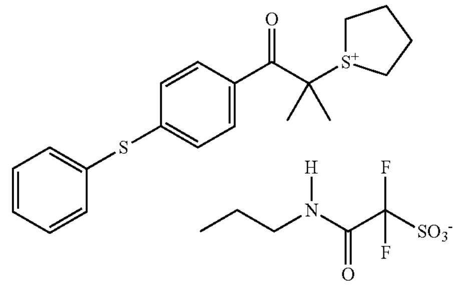

-continued
(z73)
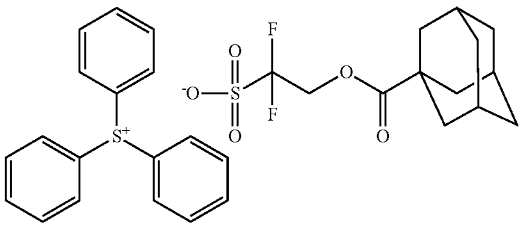
(z74)
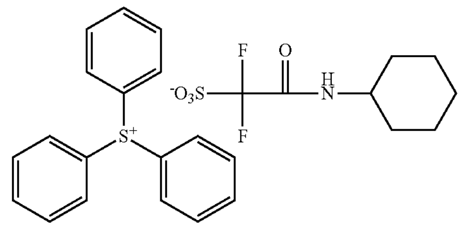
(z75)
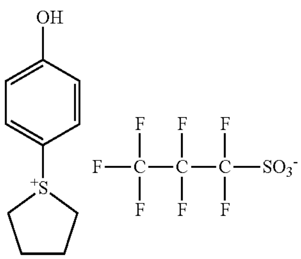
(z76)
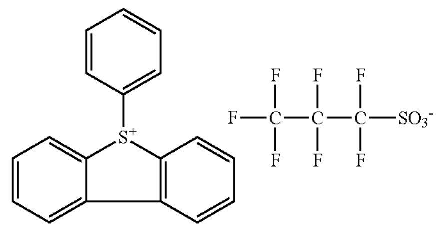
(z77)
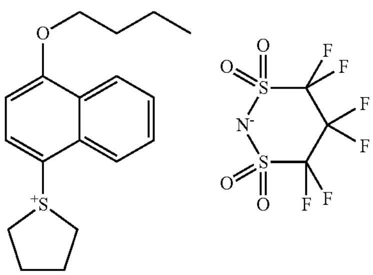
(z78)
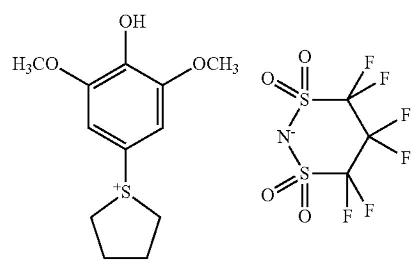
(z79)
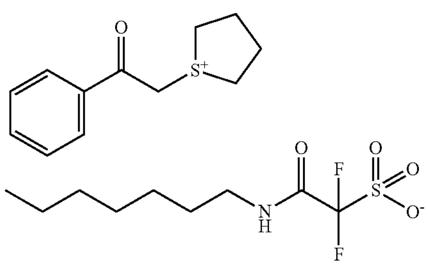
(z80)
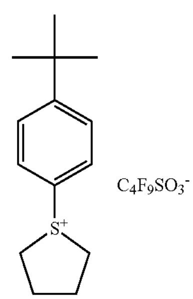
(z81)
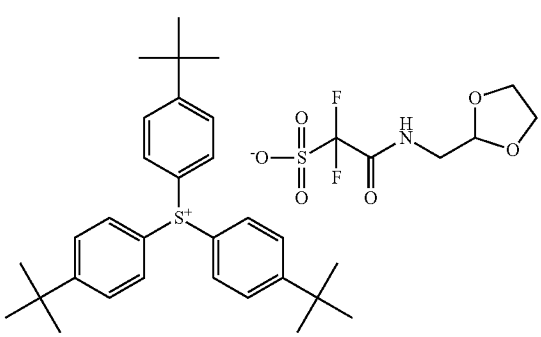
(z82)
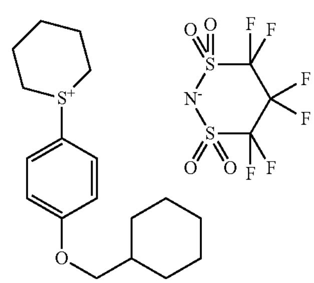

-continued
(z83)
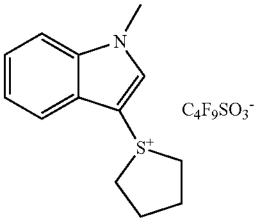
(z84)
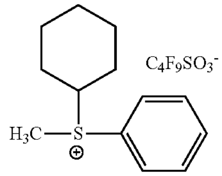
(z85)
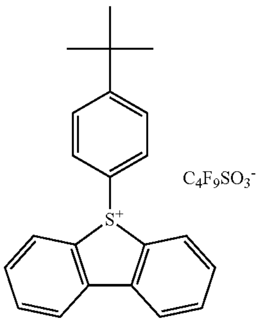
(z86)
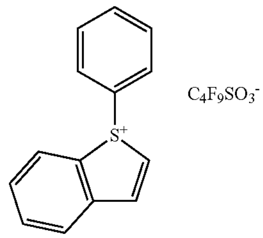
(z87)
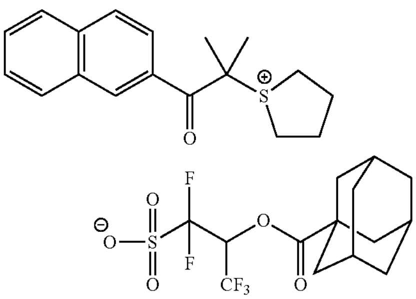
(z88)
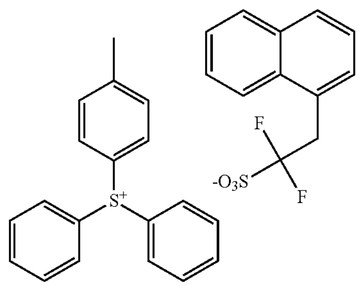
(z89)
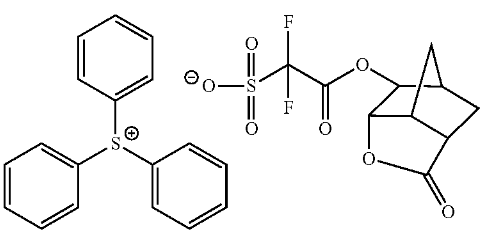
(z90)
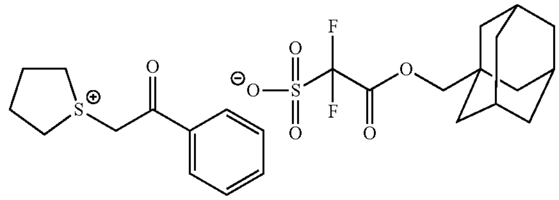
(z91)
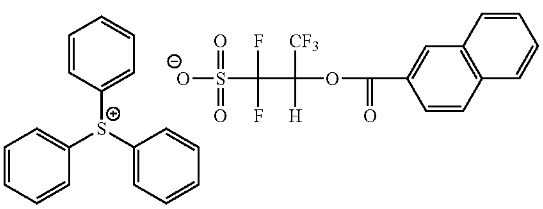
(z92)
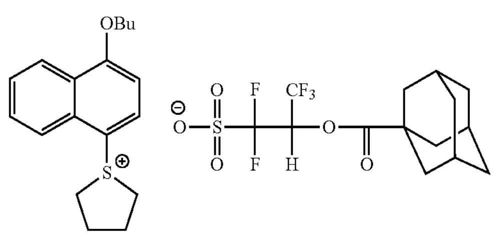
(z93)
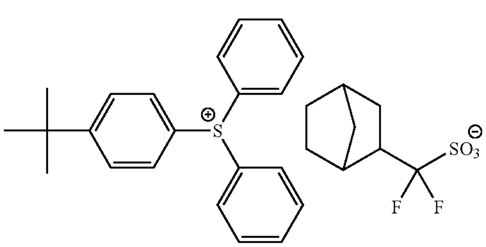
(z94)
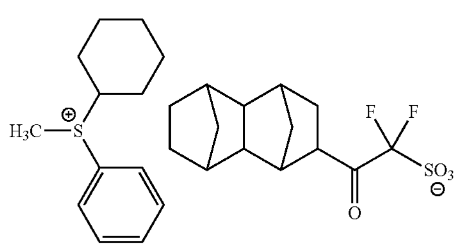

-continued (z95)

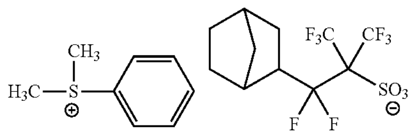

(z96)

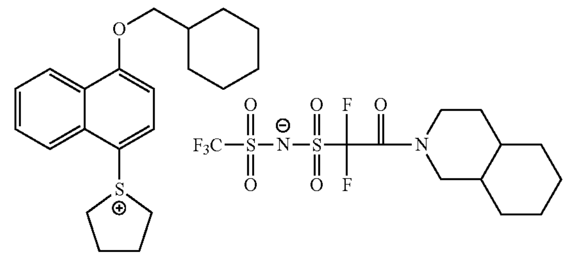

(z97)

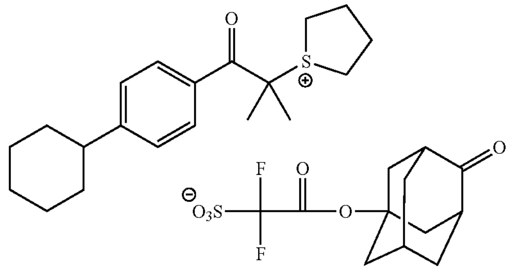

(z98)

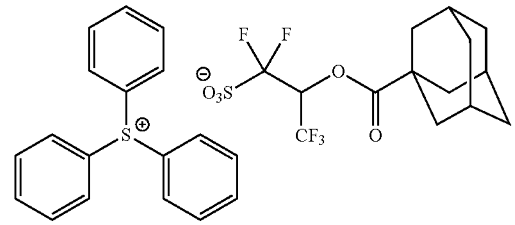

(z99)

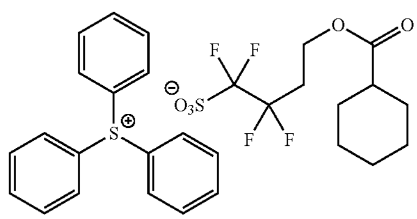

(z100)

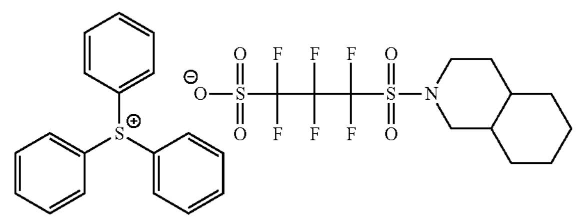

(z101)

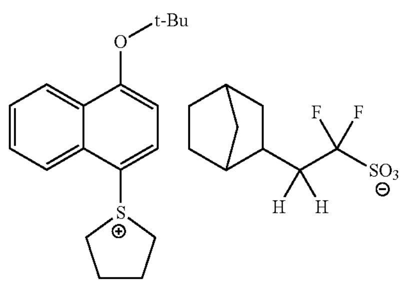

(z102)

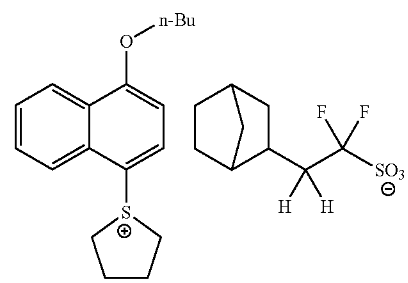

The acid generator can be synthesized by a known method, for example, can be synthesized in accordance with the method described in JP-A-2007-161707.

As for the acid generator, one kind may be used alone, or two or more kinds may be used in combination.

The content of the compound capable of generating an acid upon irradiation with an actinic ray or radiation, in the composition (I) or (II), is preferably from 0.1 to 30 mass %, more preferably from 0.5 to 25 mass %, still more preferably from 3 to 20 mass %, yet still more preferably from 3 to 15 mass %, based on the entire solid content of the resin composition (I) or (II).

Also, in the case where the acid generator is represented by formula (ZI-3) or (ZI-4), the content thereof is preferably from 5 to 35 mass %, more preferably from 8 to 30 mass %, still more preferably from 9 to 30 mass %, yet still more preferably from 9 to 25 mass %, based on the entire solid content of the composition (I) or (II).

[4] (C) Solvent

Examples of the solvent which can be used in the preparation of the resin composition (I) or (II) for use in the present invention include an organic solvent such as alkylene glycol monoalkyl ether carboxylate, alkylene glycol monoalkyl ether, alkyl lactate, alkyl alkoxypropionate, cyclic lactone (preferably having a carbon number of 4 to 10), monoketone compound (preferably having a carbon number of 4 to 10) which may contain a ring, alkylene carbonate, alkyl alkoxyacetate and alkyl pyruvate.

Specific examples of these solvents include those described in paragraphs [0441] to of U.S. Patent Application Publication No. 2008/0187860.

In the present invention, a mixed solvent prepared by mixing a solvent containing a hydroxyl group in the structure and a solvent not containing a hydroxyl group may be used as the organic solvent.

The solvent containing a hydroxyl group and the solvent not containing a hydroxyl group may be appropriately selected from the compounds exemplified above, but the solvent containing a hydroxyl group is preferably an alkylene glycol monoalkyl ether, an alkyl lactate or the like, more preferably propylene glycol monomethyl ether (PGME, another name: 1-methoxy-2-propanol) or ethyl lactate. The solvent not containing a hydroxyl group is preferably an alkylene glycol monoalkyl ether acetate, an alkyl alkoxypropionate, a monoketone compound which may contain a ring, a cyclic lactone, an alkyl acetate or the like, more preferably propylene glycol monomethyl ether acetate (PGMEA, another name: 1-methoxy-2-acetoxypropane), ethyl ethoxypropionate, 2-heptanone, γ-butyrolactone, cyclohexanone or butyl acetate, and most preferably propylene glycol monomethyl ether acetate, ethyl ethoxypropionate or 2-heptanone.

The mixing ratio (by mass) between the solvent containing a hydroxyl group and the solvent not containing a hydroxyl group is from 1/99 to 99/1, preferably from 10/90 to 90/10, more preferably from 20/80 to 60/40. A mixed solvent in which the solvent not containing a hydroxyl group accounts for 50 mass % or more is particularly preferred in view of coating uniformity.

The solvent preferably contains propylene glycol monomethyl ether acetate and is preferably a solvent containing propylene glycol monomethyl ether acetate alone or a mixed solvent of two or more kinds of solvents containing propylene glycol monomethyl ether acetate.

In the present invention, from the standpoint of preventing occurrence of intermixing at the interface between the first film and the second film, in one preferred embodiment, the solvent incorporated into the second resin composition (II) for forming the resist film is an alcohol not having an oxygen atom except for a hydroxyl group, an ester compound having a carbon number of 7 or more, or an ether compound not having an oxygen atom except for an ether bond.

Each of these specific solvents has appropriate polarity and therefore, while respective solid contents in the second resin composition (II) are dissolved, the bottom anti-reflective coating after film formation is not dissolved, so that occurrence of intermixing can be prevented.

It is particularly preferred that the solvent contained in the second resin composition (II) for forming the resist film is an alcohol not having an oxygen atom except for a hydroxyl group, an ester compound having a carbon number of 7 or more, or an ether compound not having an oxygen atom except for an ether bond, and the resin contained in the first resin composition (I) for forming the bottom anti-reflective coating is a resin composed of a (meth)acrylate-based repeating unit (preferably a resin where all repeating units are composed of a (meth)acrylate-based repeating unit).

The alcohol not having an oxygen atom except for a hydroxyl group is preferably a monohydric alcohol not having an oxygen atom except for a hydroxyl group. The carbon number of the alcohol not having an oxygen atom except for a hydroxyl group is preferably from 1 to 20, more preferably from 3 to 15, still more preferably from 4 to 12, yet still more preferably from 5 to 10. Specific examples of the alcohol include 4-methyl-2-pentanol.

The ester compound having a carbon number of 7 or more is preferably an ester compound having a carbon number of 7 or more and not having an oxygen atom other than one ester bond. The carbon number of the ester compound having a carbon number of 7 or more is preferably from 7 to 20, more preferably from 7 to 15, still more preferably from 7 to 12, yet still more preferably from 7 to 10. Specific examples of the ester include isobutyl isobutyrate.

Examples of the ether compound not having an oxygen atom other than an ether bond include a dialkyl ether and an alkylaryl ether. The carbon number of the ether compound not having an oxygen atom other than an ether bond is preferably from 3 to 20, more preferably from 4 to 15, still more preferably from 5 to 12.

Specific examples of the ether include diisoamyl ether.

Such a solvent preferably accounts for 30 mass % or more, more preferably 50 mass % or more, still more preferably 80 mass % or more, based on all solvents contained in the second resin composition (II).

[5] (D) Basic Compound

At least either one of the first resin composition (I) and the second resin composition (II) for use in the present invention preferably contains (D) a basic compound, and it is more preferred that the second resin composition (II) contains (D) a basic compound.

Even when the first resin composition (I) contains the above-described acid generator, the embodiment where (D) a basic compound is incorporated into the first resin composition (I) is one of preferred embodiments, because the diffusion of the generated acid can be prevented and the rectangularity can be controlled.

The basic compound is preferably a compound having a structure represented by the following formulae (A) to (E):

(A)

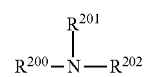

(B)

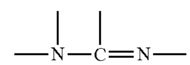

(C)

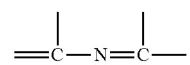

(D)

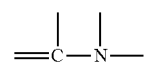

(E)

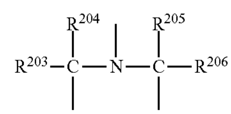

In formulae (A) and (E), each of $R^{200}$, $R^{201}$ and $R^{202}$, which may be the same or different, represents a hydrogen atom, an alkyl group (preferably having a carbon number of 1 to 20), a cycloalkyl group (preferably having a carbon number of 3 to 20) or an aryl group (having a carbon number of 6 to 20), and $R^{201}$ and $R^{202}$ may combine together to form a ring. Each of $R^{203}$, $R^{204}$, $R^{205}$ and $R^{206}$, which may be the same or different, represents an alkyl group having a carbon number of 1 to 20.

As for the alkyl group, the alkyl group having a substituent is preferably an aminoalkyl group having a carbon number of 1 to 20, a hydroxyalkyl group having a carbon number of 1 to 20, or a cyanoalkyl group having a carbon number of 1 to 20.

The alkyl group in formulae (A) and (E) is more preferably unsubstituted.

Preferred examples of the compound include guanidine, aminopyrrolidine, pyrazole, pyrazoline, piperazine, aminomorpholine, aminoalkylmorpholine, and piperidine. More preferred examples of the compound include a compound having an imidazole structure, a diazabicyclo structure, an onium hydroxide structure, an onium carboxylate structure, a trialkylamine structure, an aniline structure or a pyridine structure; an alkylamine derivative having a hydroxyl group and/or an ether bond; and an aniline derivative having a hydroxyl group and/or an ether bond.

Examples of the compound having an imidazole structure include imidazole, 2,4,5-triphenylimidazole, and benzimidazole. Examples of the compound having a diazabicyclo structure include 1,4-diazabicyclo[2,2,2]octane, 1,5-diazabicyclo[4,3,0]non-5-ene, and 1,8-diazabicyclo[5,4,0]undec-7-ene. Examples of the compound having an onium hydroxide structure include a triarylsulfonium hydroxide, a phenacylsulfonium hydroxide, and a sulfonium hydroxide having a 2-oxoalkyl group, specifically, triphenylsulfonium hydroxide, tris(tert-butylphenyl)sulfonium hydroxide, bis(tert-butylphenyl)iodonium hydroxide, phenacylthiophenium hydroxide and 2-oxopropylthiophenium hydroxide. The compound having an onium carboxylate structure is a compound where the anion moiety of the compound having an onium hydroxide structure becomes a carboxylate, and examples thereof include an acetate, an adamantane-1-carboxylate, and a perfluoroalkyl carboxylate. Examples of the compound having a trialkylamine structure include tri(n-butyl)amine and tri(n-octyl)amine. Examples of the compound having an aniline structure include 2,6-diisopropylaniline, N,N-dimethylaniline, N,N-dibutylaniline, and N,N-dihexylaniline. Examples of the alkylamine derivative having a hydroxyl group and/or an ether bond include ethanolamine, diethanolamine, triethanolamine, and tris(methoxyethoxyethyl)amine. Examples of the aniline derivative having a hydroxyl group and/or an ether bond include N,N-bis(hydroxyethyl)aniline.

Other preferred basic compounds include a phenoxy group-containing amine compound, a phenoxy group-containing ammonium salt compound, a sulfonic acid ester group-containing amine compound, and a sulfonic acid ester group-containing ammonium salt compound.

In the phenoxy group-containing amine compound, phenoxy group-containing ammonium salt compound, sulfonic acid ester group-containing amine compound and sulfonic acid ester group-containing ammonium salt compound, at least one alkyl group is preferably bonded to the nitrogen atom and also, the alkyl chain preferably contains an oxygen atom to form an oxyalkylene group. The number of oxyalkylene groups in the molecule is 1 or more, preferably from 3 to 9, more preferably from 4 to 6. Among oxyalkylene groups, those having a structure of $—CH_2CH_2O—$, $—CH(CH_3)CH_2O—$ or $—CH_2CH_2CH_2O—$ are preferred.

Specific examples of the phenoxy group-containing amine compound, phenoxy group-containing ammonium salt compound, sulfonic acid ester group-containing amine compound and sulfonic acid ester group-containing ammonium salt compound include, but are not limited to, Compounds (C1-1) to (C3-3) illustrated in paragraph [0066] of U.S. Patent Application Publication No. 2007/0224539.

A nitrogen-containing organic compound having a group capable of leaving by the action of an acid may be also used as a kind of the basic compound. Examples of this compound include a compound represented by the following formula (F). Incidentally, the compound represented by the following formula (F) exhibits an effective basicity in the system as a result of elimination of the group capable of leaving by the action of an acid.

(F)

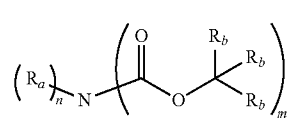

In formula (F), each Ra independently represents a hydrogen atom, an alkyl group, a cycloalkyl group, an aryl group, or an aralkyl group. Also, when n=2, two Ra's may be the same or different, and two Ra's may combine with each other to form a divalent heterocyclic hydrocarbon group (preferably having a carbon number of 20 or less) or a derivative thereof.

Each Rb independently represents a hydrogen atom, an alkyl group, a cycloalkyl group, an aryl group, or an aralkyl group, provided that in —C(Rb)(Rb)(Rb), when one or more Rb's are a hydrogen atom, at least one of remaining Rb's is a cyclopropyl group or a 1-alkoxyalkyl group.

At least two Rb's may combine to form an alicyclic hydrocarbon group, an aromatic hydrocarbon group, a heterocyclic hydrocarbon group, or a derivative thereof.

n represents an integer of 0 to 2, m represents an integer of 1 to 3, and n+m=3.

In formula (F), each of the alkyl group, cycloalkyl group, aryl group and aralkyl group represented by Ra and Rb may be substituted with a functional group such as hydroxyl group, cyano group, amino group, pyrrolidino group, piperidino group, morpholino group and oxo group, an alkoxy group, or a halogen atom.

Specific examples of the compound represented by formula (F) are illustrated below, but the present invention is not limited thereto.

(D-1)

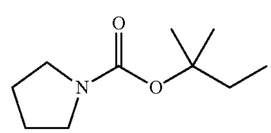

(D-2)

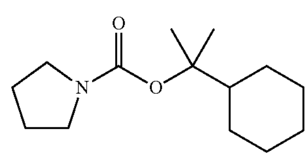

(D-3)

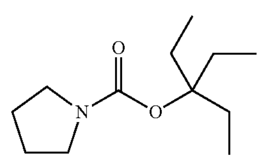

(D-4)

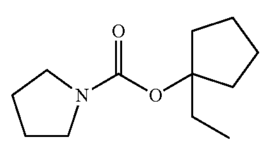

(D-5)

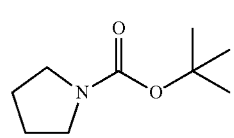

(D-6)

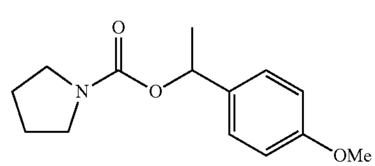

-continued
(D-7)
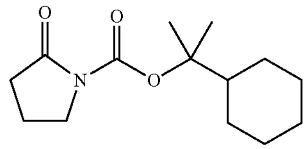
(D-8)
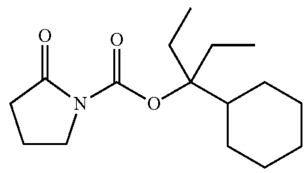
(D-9)
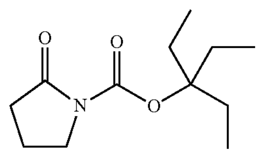
(D-10)
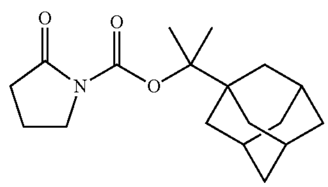
(D-11)
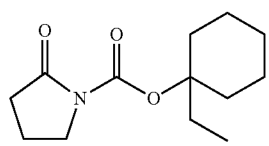
(D-12)
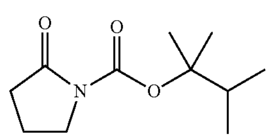
(D-13)
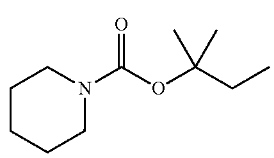
(D-14)
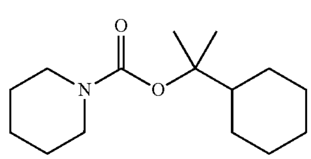
(D-15)
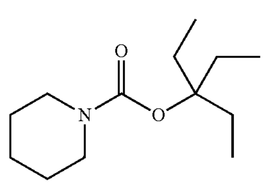
-continued
(D-16)
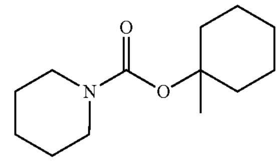
(D-17)
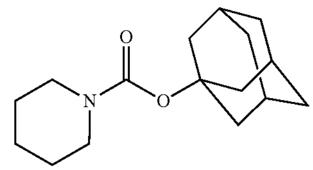
(D-18)
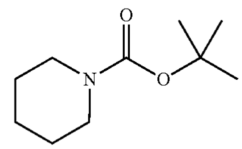
(D-19)
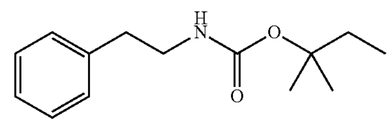
(D-20)
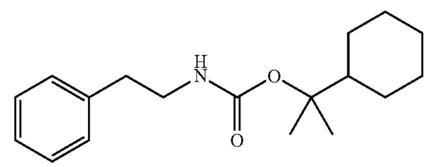
(D-21)
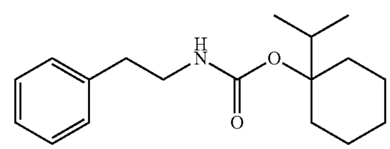
(D-22)
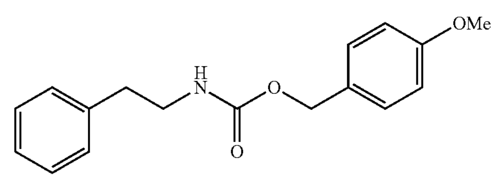
(D-23)
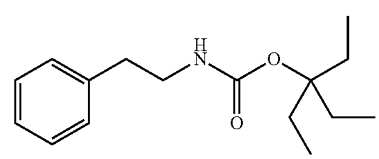
(D-24)
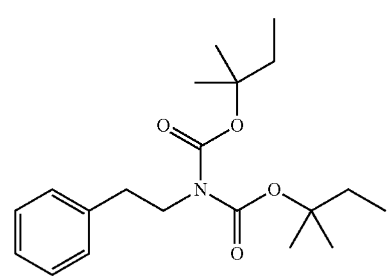

-continued
(D-25)
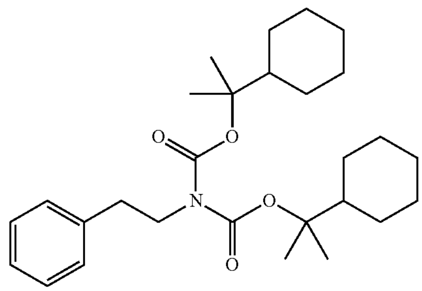
(D-26)
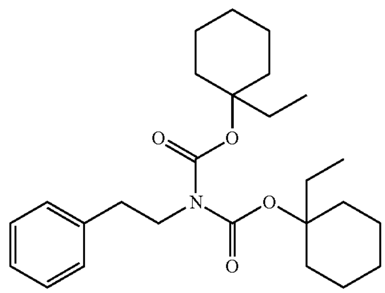
(D-27)
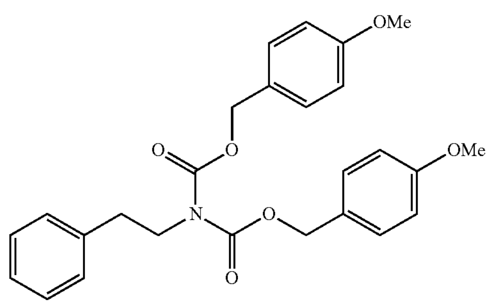
(D-28)
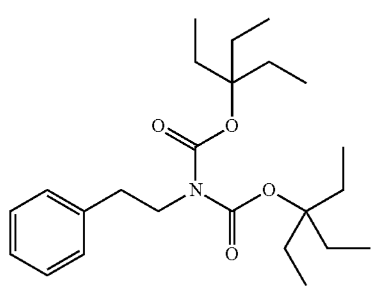
(D-29)
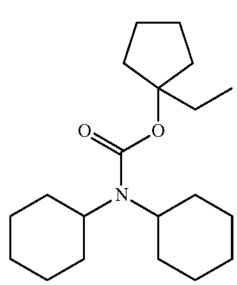
-continued
(D-30)
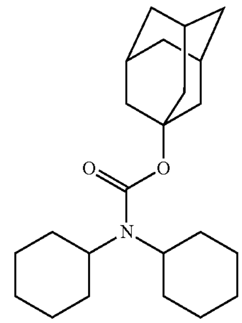
(D-31)
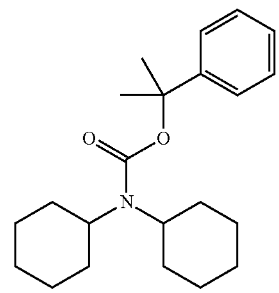
(D-32)
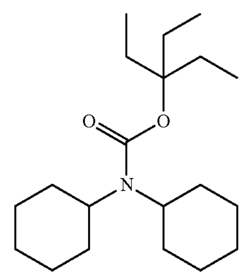
(D-33)
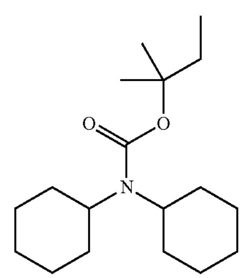
(D-34)
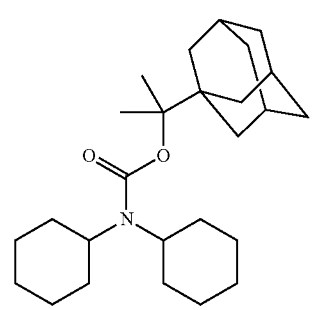

-continued
(D-35)
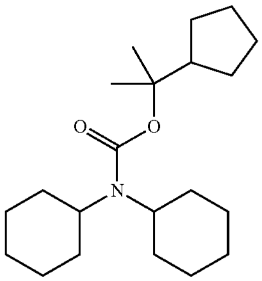
(D-36)
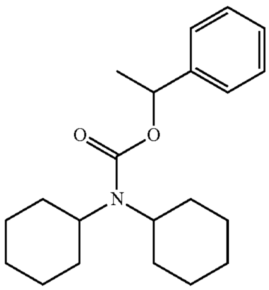
(D-37)
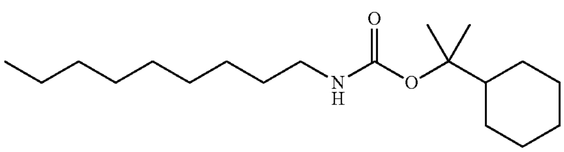
(D-38)
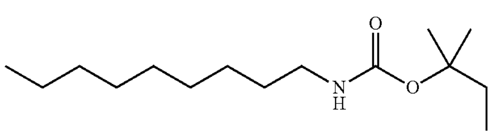
(D-39)
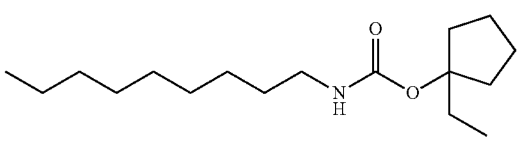
(D-40)
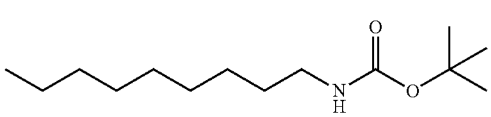
(D-41)
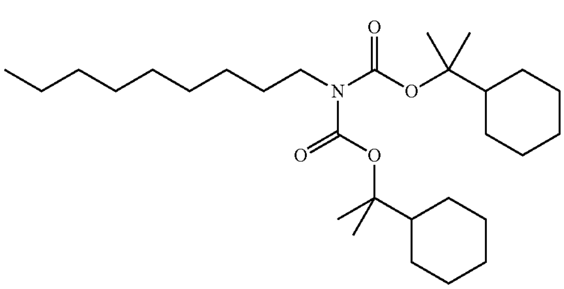
-continued
(D-42)
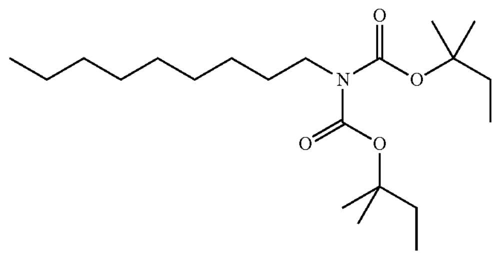
(D-43)
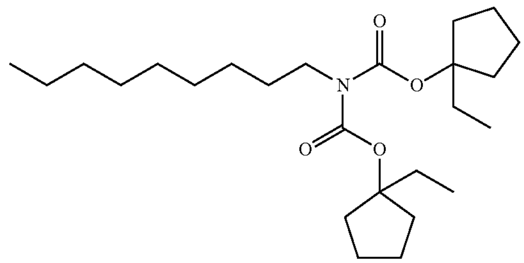
(D-44)
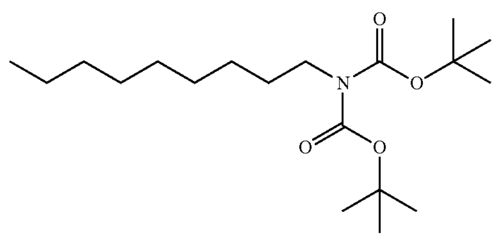
(D-45)
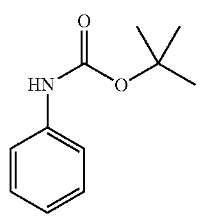
(D-46)
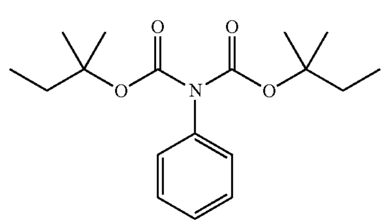
(D-47)
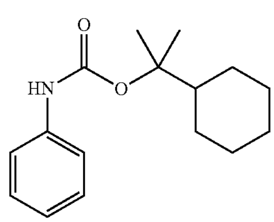

-continued (D-48)

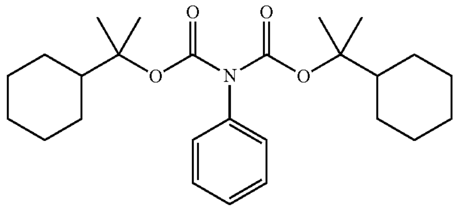

(D-49)

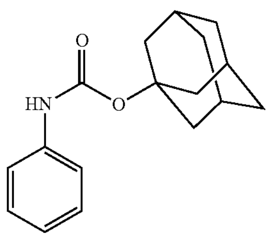

(D-50)

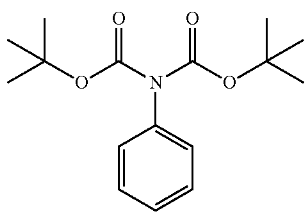

(D-51)

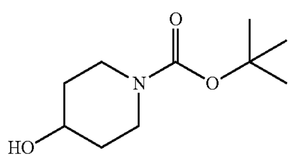

(D-52)

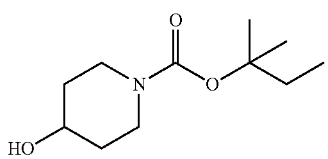

(D-53)

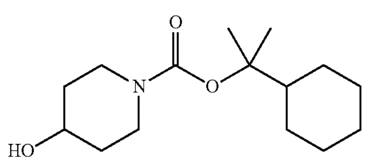

(D-54)

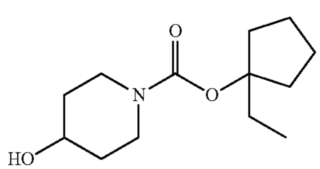

(D-55)

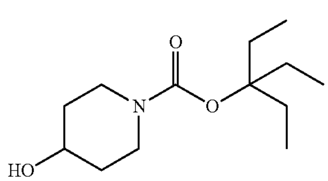

The compound represented by formula (F) can be synthesized based on, for example, JP-A-2009-199021.

The molecular weight of the basic compound (D) is preferably from 250 to 2,000, more preferably from 400 to 1,000. In view of, for example, more reduction in LWR or rectangularity of the pattern, the molecular weight of the basic compound is preferably 400 or more, more preferably 500 or more, still more preferably 600 or more.

One of these basic compounds (D) is used alone, or two or more thereof are used in combination.

In the present invention, the amount of the basic compound used is preferably from 0.001 to 20 mass %, more preferably from 0.01 to 10 mass %, based on the solid content of the resin composition (I) or (II).

The ratio between the acid generator and the basic compound used is preferably acid generator/basic compound (molar ratio)=from 2.5 to 300. That is, the molar ratio is preferably 2.5 or more in view of sensitivity and resolution and preferably 300 or less from the standpoint of suppressing the reduction in resolution due to thickening of the resist pattern with aging after exposure until heat treatment. The acid generator/basic compound (molar ratio) is more preferably from 5.0 to 200, still more preferably from 7.0 to 150.

Also, the composition may contain a basic compound or ammonium salt compound whose basicity decreases upon irradiation with an actinic ray or radiation (hereinafter, sometimes referred to as a “compound (D')”), as a kind of basic compound.

The compound (D') is preferably (D−1) a compound having a basic functional group or an ammonium group and a group capable of generating an acidic functional group upon irradiation with an actinic ray or radiation. That is, the compound (D') is preferably a basic compound having a basic functional group and a group capable of generating an acidic functional group upon irradiation with an actinic ray or radiation, or an ammonium salt compound having an ammonium group and a group capable of generating an acidic functional group upon irradiation with an actinic ray or radiation.

The compound which is generated due to decomposition of the compound (D') or (D−1) upon irradiation with an actinic ray or radiation and decreased in the basicity includes compounds represented by the following formulae (PA-I), (PA-II) and (PA-III), and from the standpoint that excellent effects can be attained in a high level in terms of all of LWR, uniformity of local pattern dimension and DOF, compounds represented by formulae (PA-II) and (PA-III) are preferred.

The compound represented by formula (PA-I) is described below.

$$Q\text{-}A_1\text{-}(X)_n\text{—}B\text{—}R \qquad \text{(PA-I)}$$

In formula (PA-I), $A_1$ represents a single bond or a divalent linking group.

Q represents —$SO_3H$ or —$CO_2H$. Q corresponds to an acidic functional group that is generated upon irradiation with an actinic ray or radiation.

X represents —$SO_2$— or —CO—.

n represents 0 or 1.

B represents a single bond, an oxygen atom or —N(Rx)-.

Rx represents a hydrogen atom or a monovalent organic group.

R represents a monovalent organic group having a basic functional group, or a monovalent organic group having an ammonium group.

The divalent linking group of $A_1$ is preferably a divalent linking group having a carbon number of 2 to 12, and examples thereof include an alkylene group and a phenylene group. An alkylene group having at least one fluorine atom is more preferred, and the carbon number thereof is preferably from 2 to 6, more preferably from 2 to 4. The alkylene chain may contain a linking group such as oxygen atom and sulfur atom. The alkylene group is preferably an alkylene group where from 30 to 100% by number of hydrogen atoms are substituted for by a fluorine atom, more preferably an alkylene group where the carbon atom bonded to the Q moiety has a fluorine atom, still more preferably a perfluoroalkylene group, yet still more preferably perfluoroethylene group, perfluoropropylene group or perfluorobutylene group.

The monovalent organic group in Rx is preferably a monovalent organic group having a carbon number of 4 to 30, and examples thereof include an alkyl group, a cycloalkyl group, an aryl group, an aralkyl group and an alkenyl group.

The alkyl group in Rx may have a substituent and is preferably a linear or branched alkyl group having a carbon number of 1 to 20, and the alkyl chain may contain an oxygen atom, a sulfur atom or a nitrogen atom.

Incidentally, the alkyl group having a substituent particularly includes a group where a cycloalkyl group is substituted on a linear or branched alkyl group (for example, an adamantylmethyl group, an adamantylethyl group, a cycohexylethyl group and a camphor residue).

The cycloalkyl group in Rx may have a substituent and is preferably a cycloalkyl group having a carbon number of 3 to 20, and the cycloalkyl group may contain an oxygen atom in the ring.

The aryl group in Rx may have a substituent and is preferably an aryl group having a carbon number of 6 to 14.

The aralkyl group in Rx may have a substituent and is preferably an aralkyl group having a carbon number of 7 to 20.

The alkenyl group in Rx may have a substituent and includes, for example, a group having a double bond at an arbitrary position of the alkyl group described as Rx.

Preferred examples of the partial structure of the basic functional group include a crown ether structure, a primary to tertiary amine structure, and a nitrogen-containing heterocyclic structure (e.g., pyridine, imidazole, pyrazine).

Preferred examples of the partial structure of the ammonium group include a primary to tertiary ammonium structure, a pyridinium structure, an imidazolinium structure and a pyrazinium structure.

The basic functional group is preferably a functional group having a nitrogen atom, more preferably a structure having a primary to tertiary amino group, or a nitrogen-containing heterocyclic structure. In these structures, from the standpoint of enhancing the basicity, it is preferred that all atoms adjacent to nitrogen atom contained in the structure are a carbon atom or a hydrogen atom. Also, in view of enhancing the basicity, an electron-withdrawing functional group (such as carbonyl group, sulfonyl group, cyano group and halogen atom) is preferably not bonded directly to the nitrogen atom.

The monovalent organic group in the monovalent organic group (group R) containing such a structure is preferably an organic group having a carbon number of 4 to 30, and examples thereof include an alkyl group, a cycloalkyl group, an aryl group, an aralkyl group and an alkenyl group. Each of these groups may have a substituent.

The alkyl group, cycloalkyl group, aryl group, aralkyl group and alkenyl group in the basic functional group- or ammonium group-containing alkyl, cycloalkyl, aryl, aralkyl and alkenyl groups of R are the same as the alkyl group, cycloalkyl group, aryl group, aralkyl group and alkenyl group described for Rx.

Examples of the substituent which each of the groups above may have include a halogen atom, a hydroxyl group, a nitro group, a cyano group, a carboxy group, a carbonyl group, a cycloalkyl group (preferably having a carbon number of 3 to 10), an aryl group (preferably having a carbon number of 6 to 14), an alkoxy group (preferably having a carbon number of 1 to 10), an acyl group (preferably having a carbon number of 2 to 20), an acyloxy group (preferably having a carbon number of 2 to 10), an alkoxycarbonyl group (preferably having a carbon number of 2 to 20), and an aminoacyl group (preferably having a carbon number of 2 to 20). The cyclic structure in the aryl group, cycloalkyl group and the like may further have an alkyl group (preferably having a carbon number of 1 to 20) as the substituent. The aminoacyl group may further have one or two alkyl groups (preferably having a carbon number of 1 to 20) as the substituent.

In the case where B is —N(Rx)-, R and Rx preferably combine together to form a ring. By virtue of forming a ring structure, the stability is enhanced and in turn, the composition using this compound is improved in the storage stability. The number of carbons constituting the ring is preferably from 4 to 20, and the ring may be monocyclic or polycyclic and may contain an oxygen atom, a sulfur atom or a nitrogen atom.

Examples of the monocyclic structure include a 4- to 8-membered ring containing a nitrogen atom. Examples of the polycyclic structure include a structure composed of a combination of two monocyclic structures or three or more monocyclic structures. The monocyclic structure and polycyclic structure may have a substituent, and preferred examples of the substituent include a halogen atom, a hydroxyl group, a cyano group, a carboxy group, a carbonyl group, a cycloalkyl group (preferably having a carbon number of 3 to 10), an aryl group (preferably having a carbon number of 6 to 14), an alkoxy group (preferably having a carbon number of 1 to 10), an acyl group (preferably having a carbon number of 2 to 15), an acyloxy group (preferably having a carbon number of 2 to 15), an alkoxycarbonyl group (preferably having a carbon number of 2 to 15), and an aminoacyl group (preferably having a carbon number of 2 to 20). The cyclic structure in the aryl group, cycloalkyl group and the like may further have an alkyl group (preferably having a carbon number of 1 to 15) as the substituent. The aminoacyl group may have one or two alkyl groups (preferably having a carbon number of 1 to 15) as the substituent.

Out of the compounds represented by formula (PA-I), a compound where the Q moiety is a sulfonic acid can be synthesized using a general sulfonamidation reaction. For example, this compound can be obtained by a method of selectively reacting one sulfonyl halide moiety of a bis-sulfonyl halide compound with an amine compound to form a sulfonamide bond and then hydrolyzing the other sulfonyl halide moiety, or a method of ring-opening a cyclic sulfonic anhydride through reaction with an amine compound. The compound represented by formula (PA-II) is described below.

$$Q_1\text{-}X_1\text{—NH—}X_2\text{-}Q_2 \qquad \text{(PA-II)}$$

In formula (PA-II), each of $Q_1$ and $Q_2$ independently represents a monovalent organic group, provided that either one of $Q_1$ and $Q_2$ has a basic functional group. It is also possible that $Q_1$ and $Q_2$ combine together to form a ring and the ring formed has a basic functional group.

Each of $X_1$ and $X_2$ independently represents —CO— or —$SO_2$—.

Here, —NH— corresponds to the acidic functional group generated upon irradiation with an actinic ray or radiation.

The monovalent organic group as $Q_1$ and $Q_2$ in formula (PA-II) is preferably a monovalent organic group having a carbon number of 1 to 40, and examples thereof include an alkyl group, a cycloalkyl group, an aryl group, an aralkyl group, and an alkenyl group.

The alkyl group in $Q_1$ and $Q_2$ may have a substituent and is preferably a linear or branched alkyl group having a carbon number of 1 to 30, and the alkyl chain may contain an oxygen atom, a sulfur atom or a nitrogen atom.

The cycloalkyl group in $Q_1$ and $Q_2$ may have a substituent and is preferably a cycloalkyl group having a carbon number of 3 to 20, and the cycloalkyl group may contain an oxygen atom or a nitrogen atom in the ring.

The aryl group in $Q_1$ and $Q_2$ may have a substituent and is preferably an aryl group having a carbon number of 6 to 14.

The aralkyl group in $Q_1$ and $Q_2$ may have a substituent and is preferably an aralkyl group having a carbon number of 7 to 20.

The alkenyl group in $Q_1$ and $Q_2$ may have a substituent and includes a group having a double bond at an arbitrary position of the alkyl group above.

Examples of the substituent which each of these groups may have include a halogen atom, a hydroxyl group, a nitro group, a cyano group, a carboxy group, a carbonyl group, a cycloalkyl group (preferably having a carbon number of 3 to 10), an aryl group (preferably having a carbon number of 6 to 14), an alkoxy group (preferably having a carbon number of 1 to 10), an acyl group (preferably having a carbon number of 2 to 20), an acyloxy group (preferably having a carbon number of 2 to 10), an alkoxycarbonyl group (preferably having a carbon number of 2 to 20), and an aminoacyl group (preferably having a carbon number of 2 to 10). The cyclic structure in the aryl group, cycloalkyl group and the like may further have an alkyl group (preferably having a carbon number of 1 to 10) as the substituent. The aminoacyl group may further have an alkyl group (preferably having a carbon number of 1 to 10) as the substituent. The alkyl group having a substituent includes, for example, a perfluoroalkyl group such as perfluoromethyl group, perfluoroethyl group, perfluoropropyl group and perfluorobutyl group.

Preferred partial structures of the basic functional group contained in at least either $Q_1$ or $Q_2$ are the same as those of the basic functional group contained in R of formula (PA-I).

The structure where $Q_1$ and $Q_2$ combine together to form a ring and the ring formed has a basic functional group includes, for example, a structure where the organic groups of $Q_1$ and $Q_2$ are bonded further through an alkylene group, an oxy group, an imino group or the like.

In formula (PA-II), at least either one of $X_1$ and $X_2$ is preferably —$SO_2$—.

The compound represented by formula (PA-III) is described below.

$$Q_1\text{-}X_1\text{—NH—}X_2\text{-}A_2\text{-}(X_3)_m\text{—B-}Q_3 \quad \text{(PA-III)}$$

In formula (PA-III), each of $Q_1$ and $Q_3$ independently represents a monovalent organic group, provided that either one of $Q_1$ and $Q_3$ has a basic functional group. It is also possible that $Q_1$ and $Q_3$ combine together to form a ring and the ring formed has a basic functional group.

Each of $X_1$, $X_2$ and $X_3$ independently represents —CO— or —$SO_2$—.

$A_2$ represents a divalent linking group.

B represents a single bond, an oxygen atom or —N(Qx)-.

Qx represents a hydrogen atom or a monovalent organic group.

In the case where B is —N(Qx)-, Q and Qx may combine to form a ring.

m represents 0 or 1.

Here, —NH— corresponds to the acidic functional group generated upon irradiation with an actinic ray or radiation.

$Q_1$ has the same meaning as $Q_1$ in formula (PA-II).

Examples of the organic group of $Q_3$ are the same as those of the organic group of $Q_1$ and $Q_2$ in formula (PA-II).

The structure where $Q_1$ and $Q_3$ combine to form a ring and the ring formed has a basic functional group includes, for example, a structure where the organic groups of $Q_1$ and $Q_3$ are bonded further through an alkylene group, an oxy group, an imino group or the like.

The divalent linking group in $A_2$ is preferably a divalent linking group having a carbon number of 1 to 8 and containing a fluorine atom, and examples thereof include a fluorine atom-containing alkylene group having a carbon number of 1 to 8, and a fluorine atom-containing phenylene group. A fluorine atom-containing alkylene group is more preferred, and the carbon number thereof is preferably from 2 to 6, more preferably from 2 to 4. The alkylene chain may contain a linking group such as oxygen atom and sulfur atom. The alkylene group is preferably an alkylene group where from 30 to 100% by number of hydrogen atoms are substituted for by a fluorine atom, more preferably a perfluoroalkylene group, still more preferably a perfluoroalkylene group having a carbon number of 2 to 4.

The monovalent organic group in Qx is preferably an organic group having a carbon number of 4 to 30, and examples thereof include an alkyl group, a cycloalkyl group, an aryl group, an aralkyl group and an alkenyl group. Examples of the alkyl group, cycloalkyl group, aryl group, aralkyl group and alkenyl group are the same as those for Rx in formula (PA-I).

In formula (PA-III), each of $X_1$, $X_2$ and $X_3$ is preferably —$SO_2$—.

The compound (D') is preferably a sulfonium salt compound of the compound represented by formula (PA-I), (PA-II) or (PA-III), or an iodonium salt compound of the compound represented by formula (PA-I), (PA-II) or (PA-III), more preferably a compound represented by the following formula (PA1) or (PA2):

(PA1)

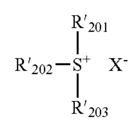

(PA2)

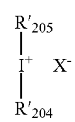

In formula (PA1), each of $R'_{201}$, $R'_{202}$ and $R'_{203}$ independently represents an organic group, and specific examples thereof are the same as those for $R_{201}$, $R_{202}$ and $R_{203}$ of formula ZI in the component (B).

$X^-$ represents a sulfonate or carboxylate anion resulting from elimination of a hydrogen atom in the —$SO_3H$ moiety or —COOH moiety of the compound represented by formula (PA-I), or an anion resulting from elimination of a hydrogen atom in the —NH— moiety of the compound represented by formula (PA-II) or (PA-III).

In formula (PA2), each of $R'_{204}$ and $R'_{205}$ independently represents an aryl group, an alkyl group or a cycloalkyl group, and specific examples thereof are the same as those for $R_{204}$ and $R_{205}$ of formula ZII in the component (B).

$X^-$ represents a sulfonate or carboxylate anion resulting from elimination of a hydrogen atom in the —$SO_3H$ moiety or —COOH moiety of the compound represented by formula (PA-I), or an anion resulting from elimination of a hydrogen atom in the —NH— moiety of the compound represented by formula (PA-II) or (PA-III).

The compound (D') decomposes upon irradiation with an actinic ray or radiation to generate, for example, a compound represented by formula (PA-I), (PA-II) or (PA-III).

The compound represented by formula (PA-I) is a compound having a sulfonic or carboxylic acid group together with a basic functional group or an ammonium group and thereby being reduced in or deprived of the basicity or changed from basic to acidic as compared with the compound (D').

The compound represented by formula (PA-II) or (PA-III) is a compound having an organic sulfonylimino or organic carbonylimino group together with a basic functional group and thereby being reduced in or deprived of the basicity or changed from basic to acidic as compared with the compound (D').

In the present invention, the expression "reduced in the basicity upon irradiation with an actinic ray or radiation" means that the acceptor property for a proton (an acid generated upon irradiation with an actinic ray or radiation) of the compound (D') is decreased by the irradiation with an actinic ray or radiation. The expression "the acceptor property is decreased" means that when an equilibrium reaction of producing a noncovalent bond complex as a proton adduct from a basic functional group-containing compound and a proton takes place or when an equilibrium reaction of exchanging the counter cation of an ammonium group-containing compound with a proton takes place, the equilibrium constant in the chemical equilibrium decreases.

In this way, the compound (D') whose basicity decreases upon irradiation with an actinic ray or radiation is contained in the resist film, so that in the unexposed area, the acceptor property of the compound (D') can be sufficiently brought out and an unintended reaction between an acid diffused from the exposed area or the like and the resin (A) can be inhibited, whereas in the exposed area, the acceptor property of the compound (D') can decrease and the intended reaction of an acid with the resin (A) can occur unfailingly. Such an operation mechanism is considered to contribute to obtaining a pattern excellent in terms of line width variation (LWR), uniformity of local pattern dimension, focus latitude (DOF) and pattern profile.

Incidentally, the basicity can be confirmed by measuring the pH, or a calculated value can be computed using a commercially available software.

Specific examples of the compound (D') capable of generating a compound represented by formula (PA-I) upon irradiation with an actinic ray or radiation are illustrated below, but the present invention is not limited thereto.

(PA-1)

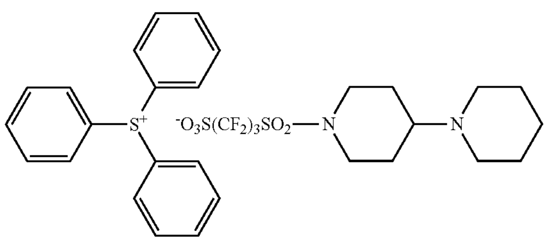

(PA-2)

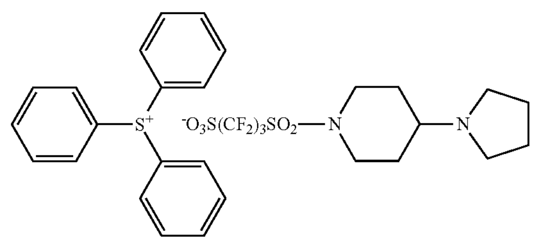

(PA-3)

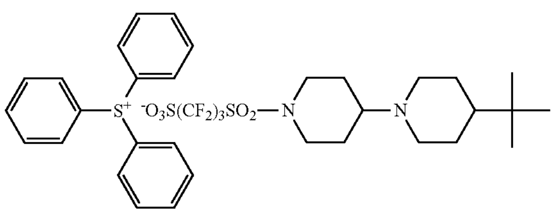

(PA-4)

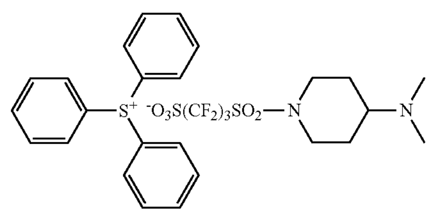

(PA-5)

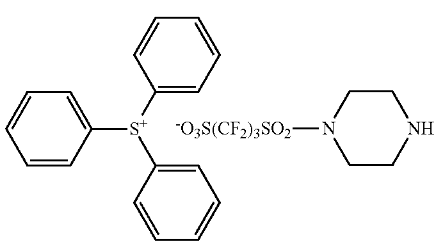

(PA-6)

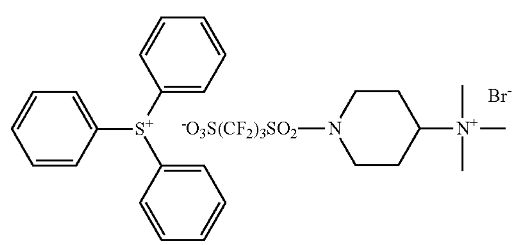

(PA-7)

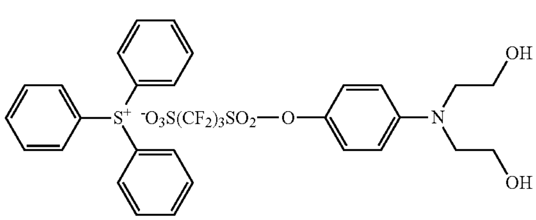

(PA-8)

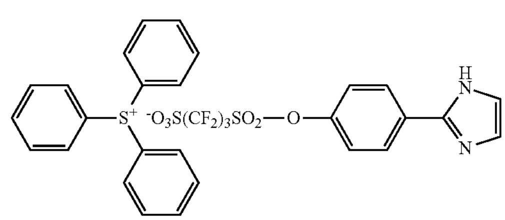

-continued
(PA-9)
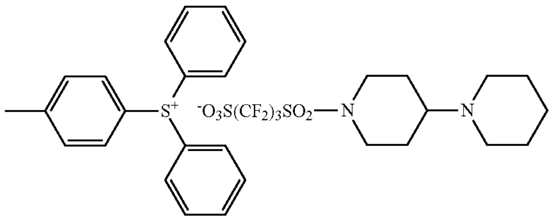
(PA-10)
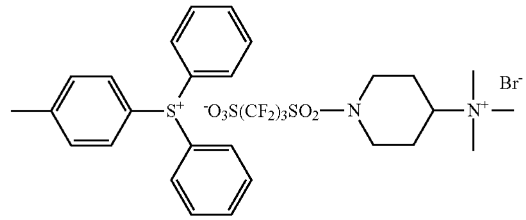
(PA-11)
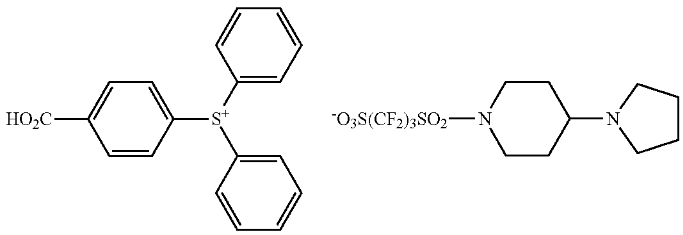
(PA-12)
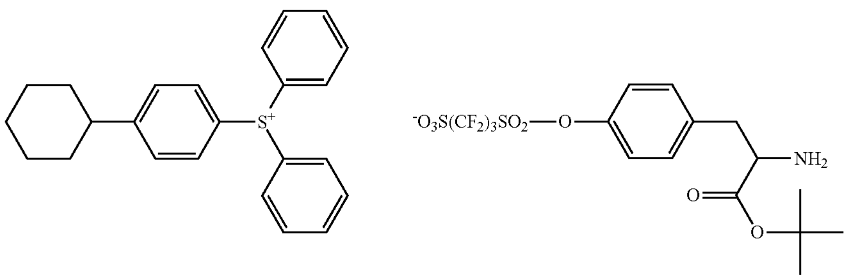
(PA-13)
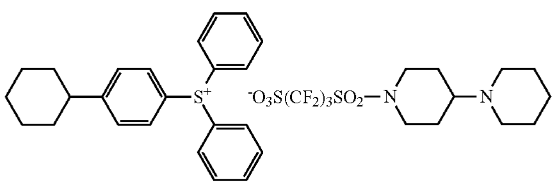
(PA-14)
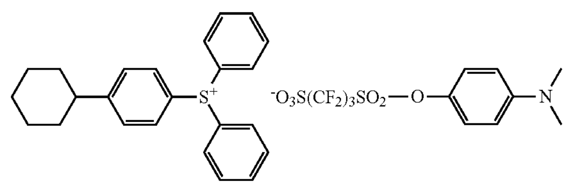
(PA-15)
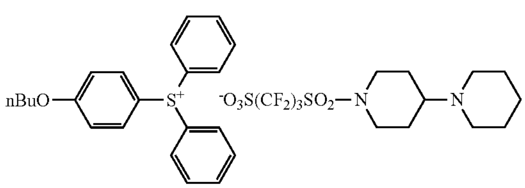
(PA-16)
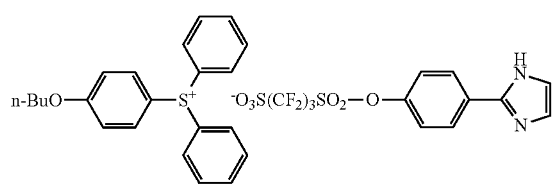
(PA-17)
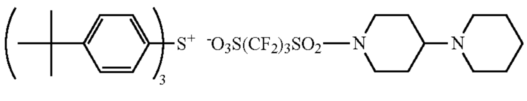
(PA-18)
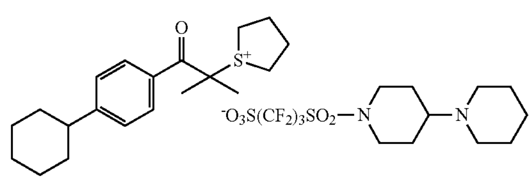
(PA-19)
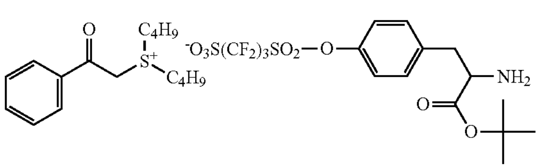
(PA-20)
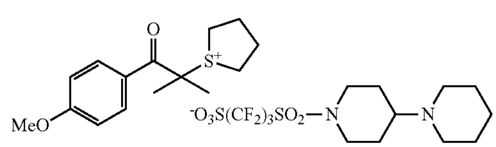

-continued
(PA-21)
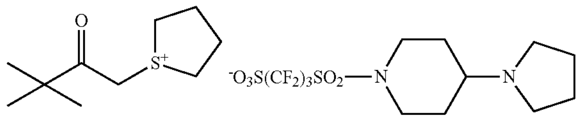
(PA-22)
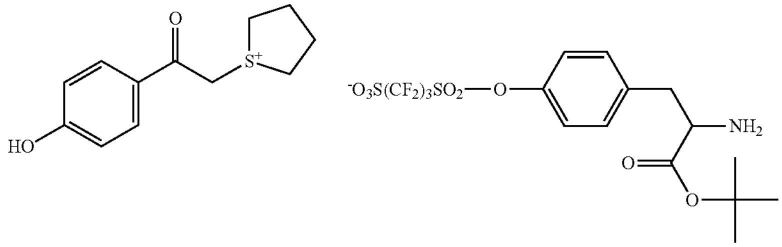
(PA-23)
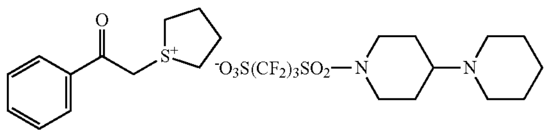
(PA-24)
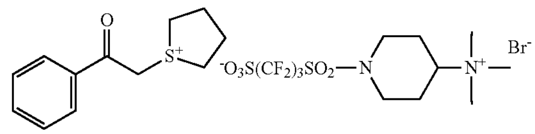
(PA-25)
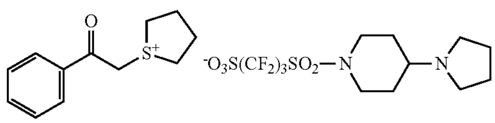
(PA-26)
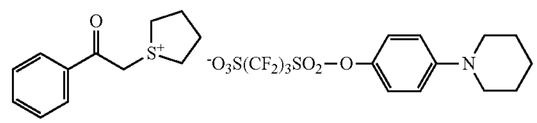
(PA-27)
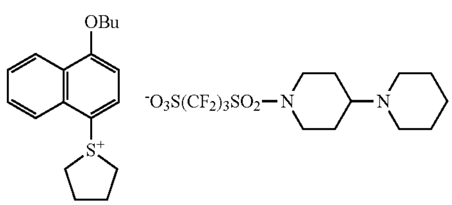
(PA-28)
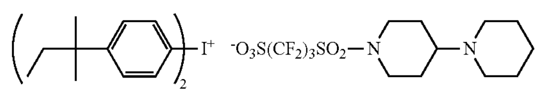
(PA-29)
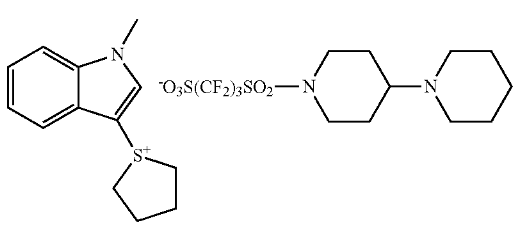
(PA-30)
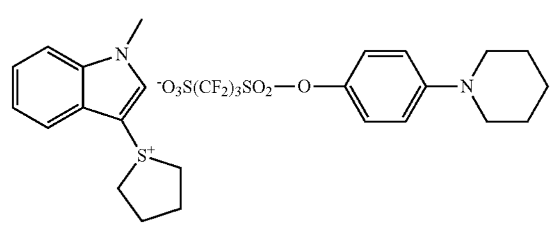
(PA-31)
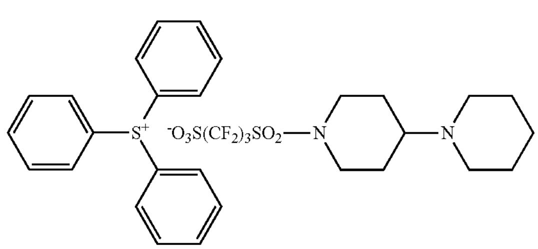
(PA-32)
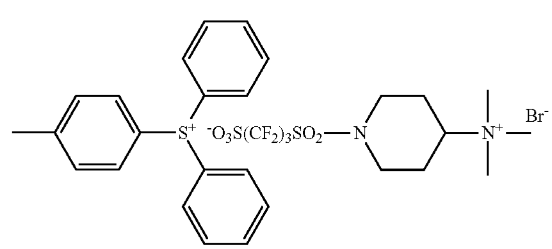

-continued
(PA-33)
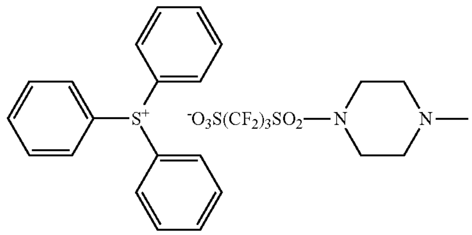
(PA-34)
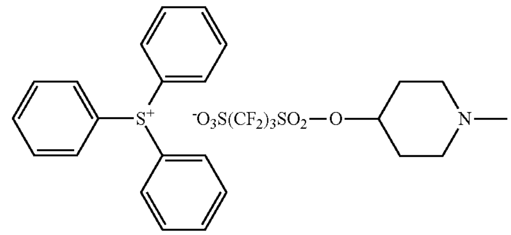
(PA-35)
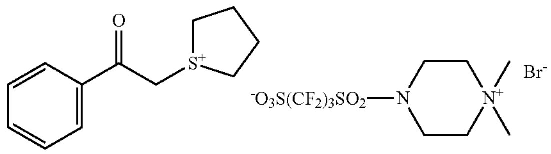
(PA-36)
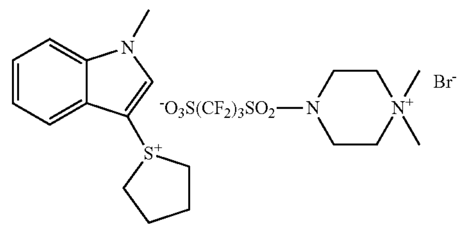
(PA-37)
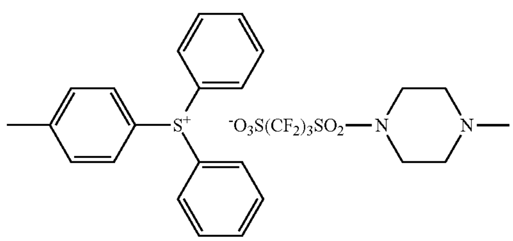
(PA-38)
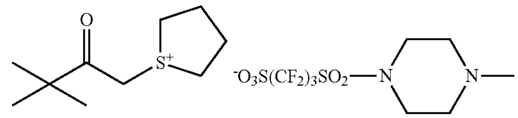
(PA-39)
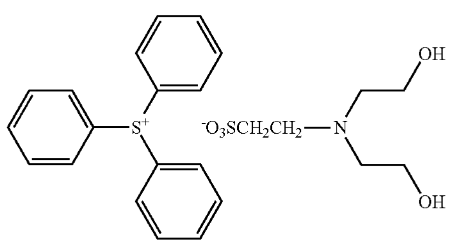
(PA-40)
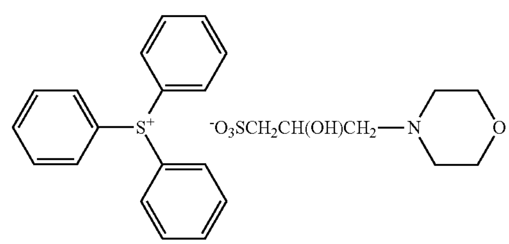
(PA-41)
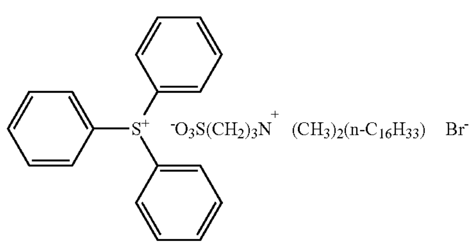
(PA-42)
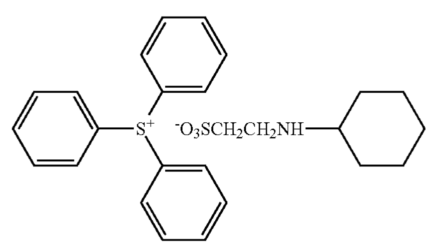
(PA-43)
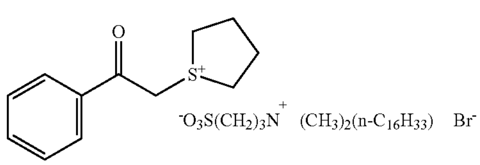
(PA-44)
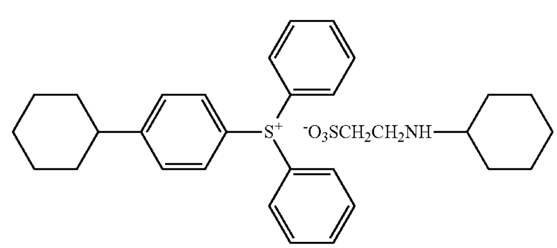

-continued
(PA-45)
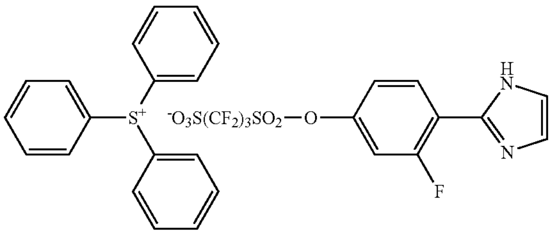
(PA-46)
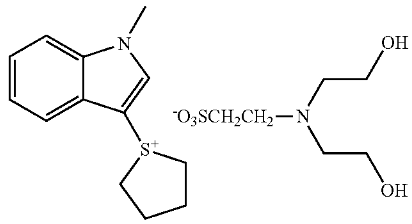
(PA-47)
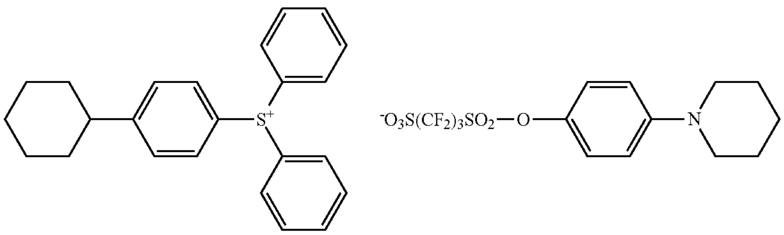
(PA-48)
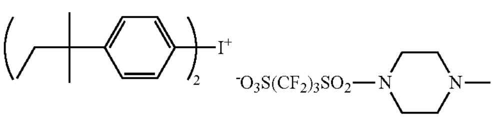
(PA-49)
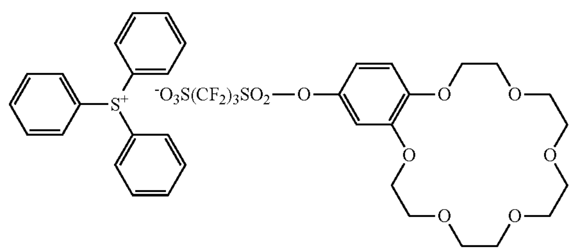
(PA-50)
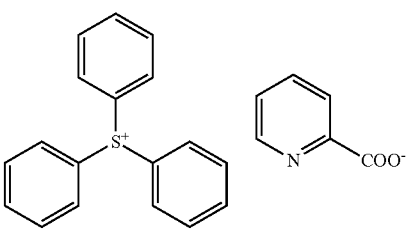
(PA-51)
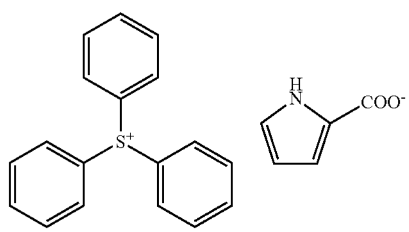
(PA-52)
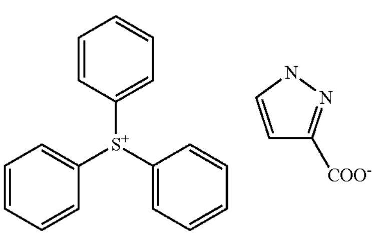
(PA-53)
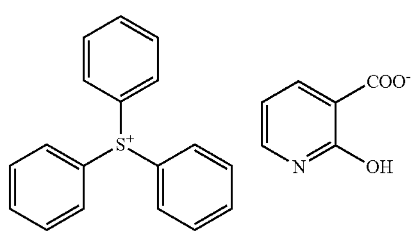
(PA-54)
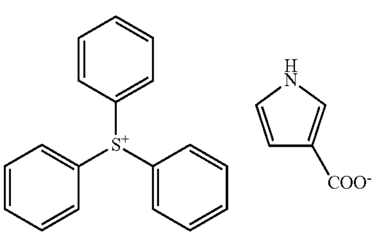
(PA-55)
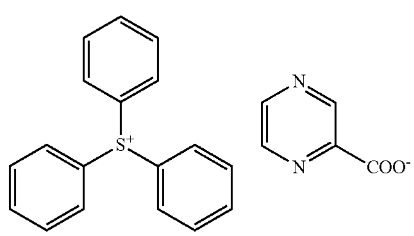

-continued (PA-56)

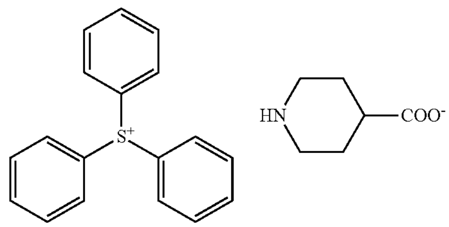

(PA-57)

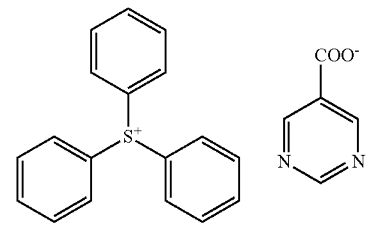

(PA-58)

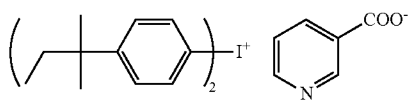

(PA-59)

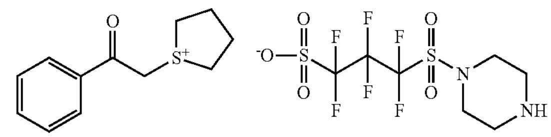

(PA-60)

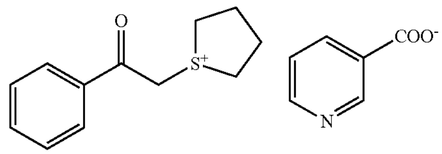

These compounds can be easily synthesized from a compound represented by formula (PA-I) or a lithium, sodium or potassium salt thereof and a hydroxide, bromide, chloride or the like of iodonium or sulfonium, by utilizing the salt exchange method described in JP-T-11-501909 (the term "JP-T" as used herein means a "published Japanese translation of a PCT patent application") or JP-A-2003-246786. The synthesis may be also performed in accordance with the synthesis method described in JP-A-7-333851.

Specific examples of the compound (D') capable of generating a compound represented by formula (PA-II) or (PA-III) upon irradiation with an actinic ray or radiation are illustrated below, but the present invention is not limited thereto.

(PA-61)

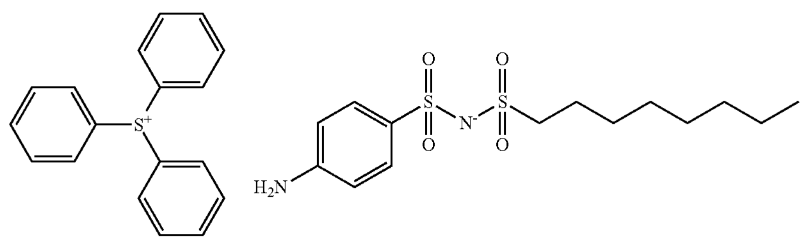

(PA-62)

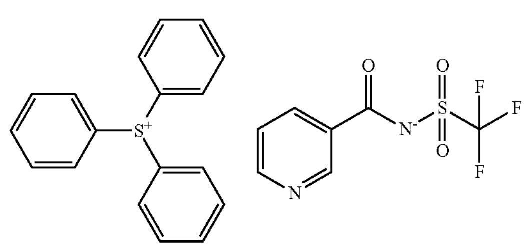

(PA-63)

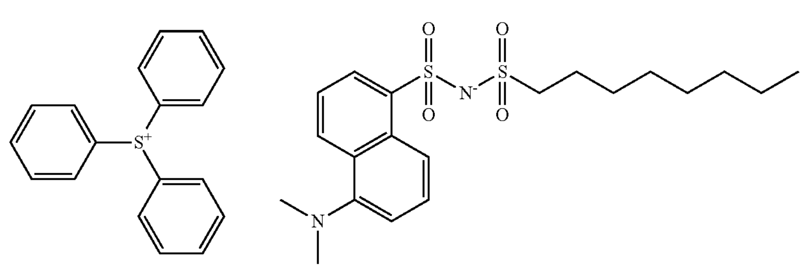

-continued
(PA-64)
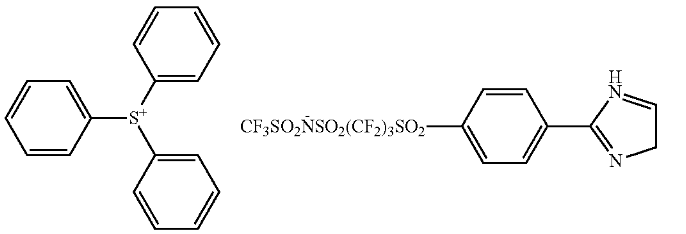
(PA-65)
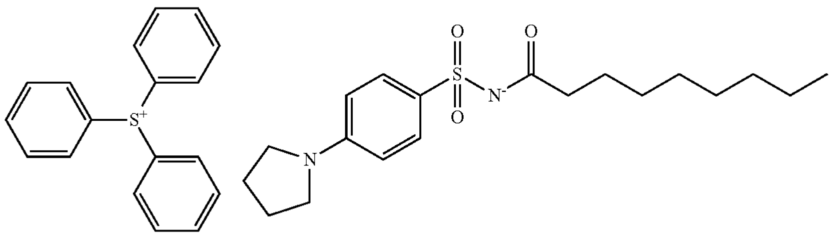
(PA-66)
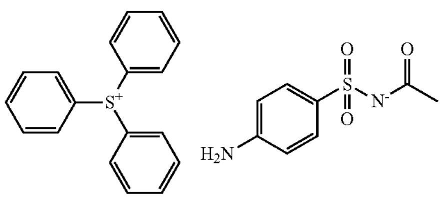
(PA-67)
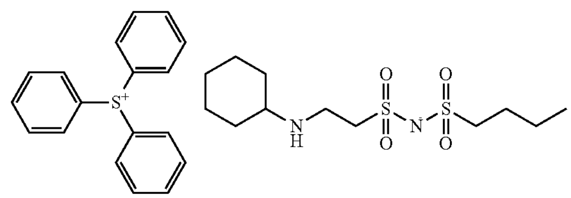
(PA-68)
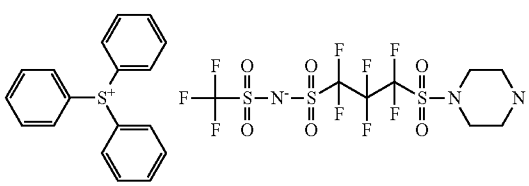
(PA-69)
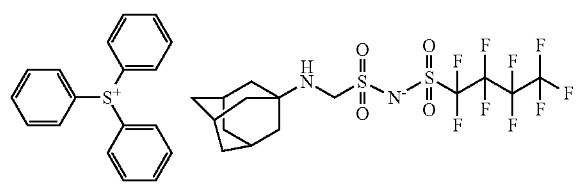
(PA-70)
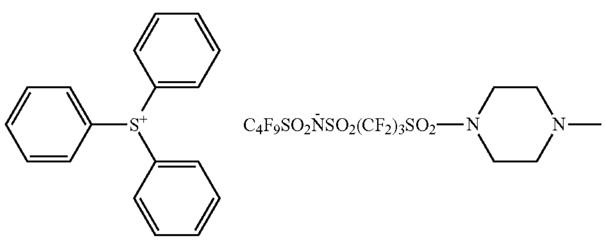
(PA-71)
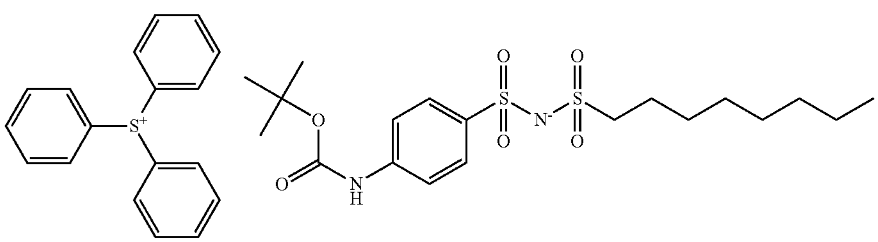
(PA-72)
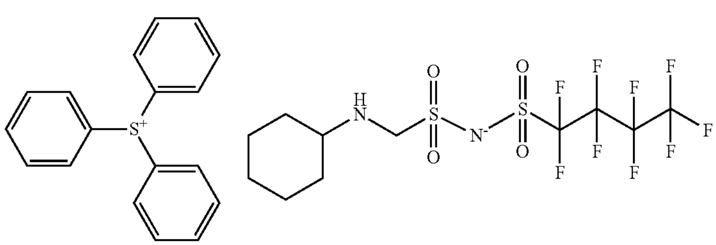

-continued
(PA-73)
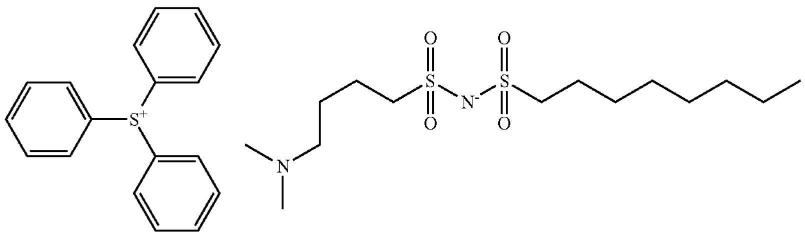
(PA-74)
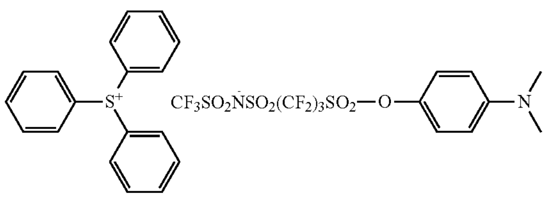
(PA-75)
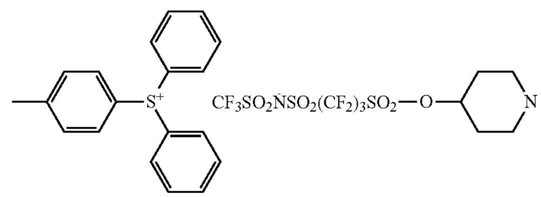
(PA-76)
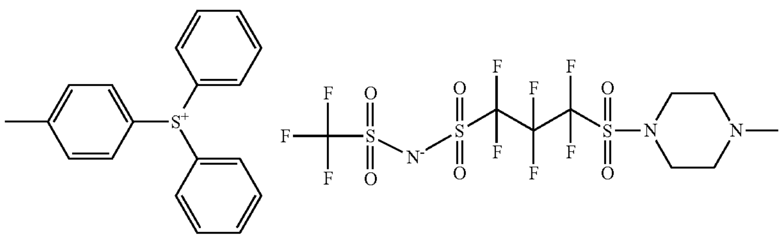
(PA-77)
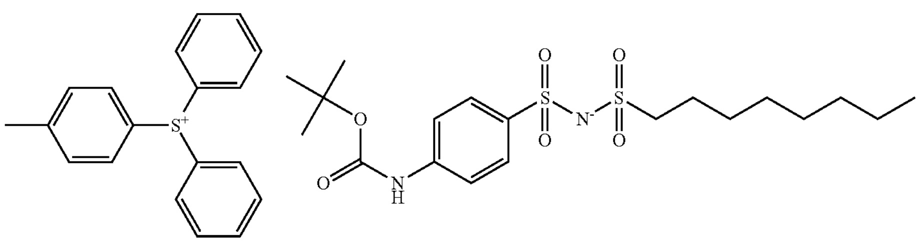
(PA-78)
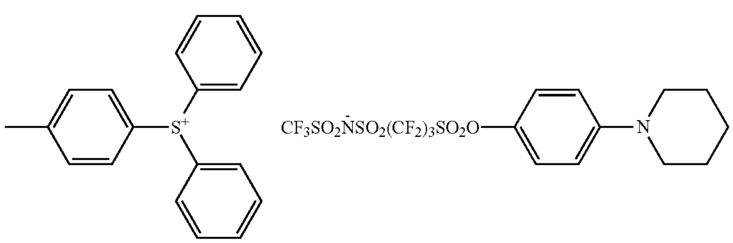
(PA-79)
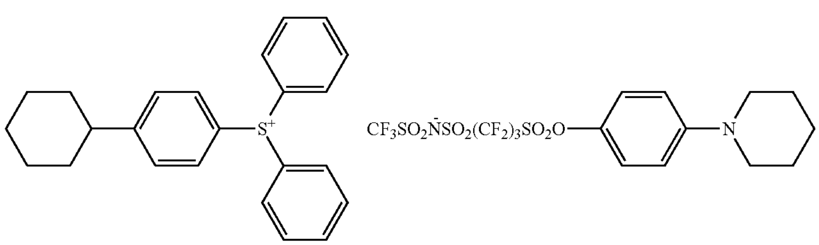

-continued
(PA-80)
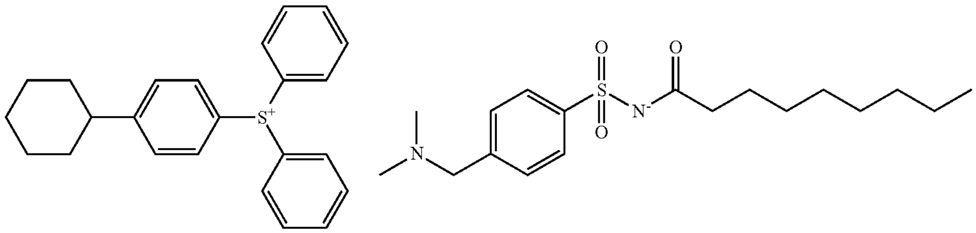
(PA-81)
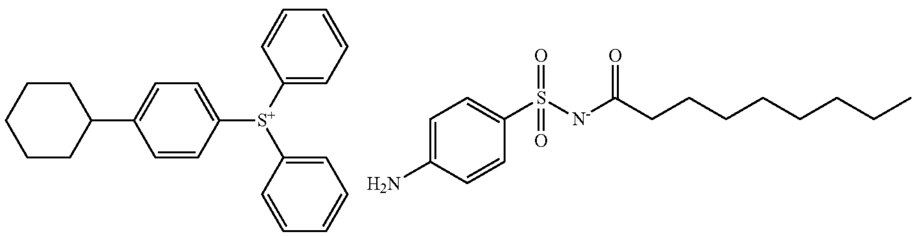
(PA-82)
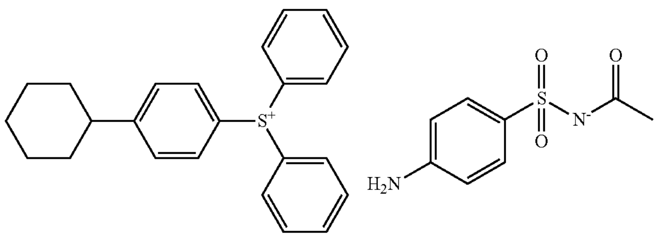
(PA-83)
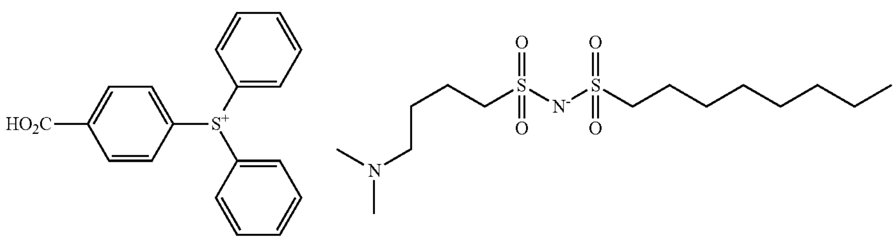
(PA-84)
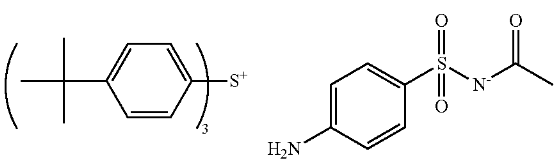
(PA-85)
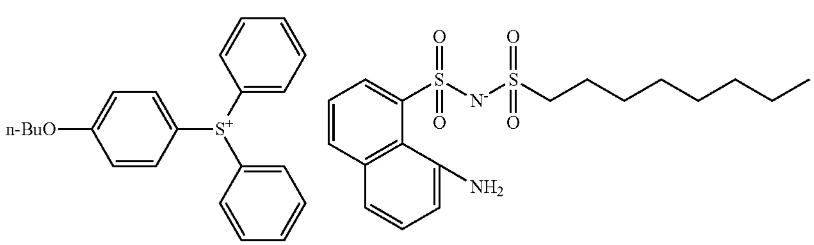
(PA-86)
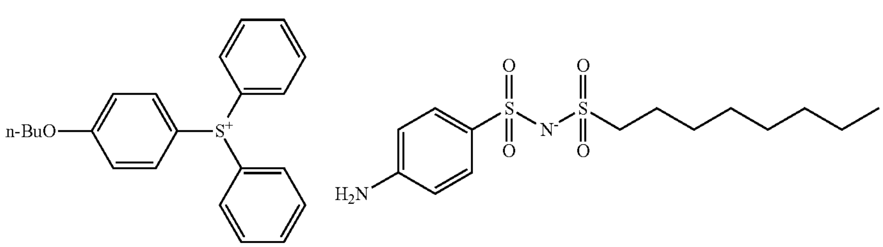

-continued
(PA-87)
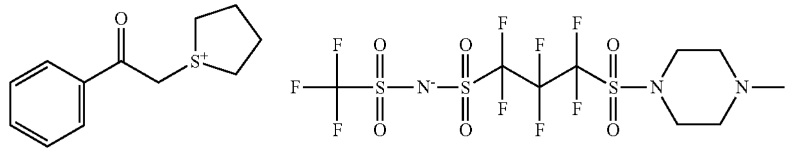
(PA-88)
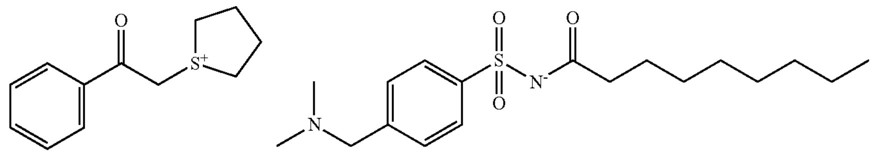
(PA-89)
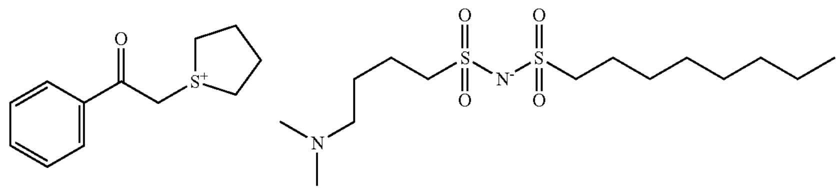
(PA-90)
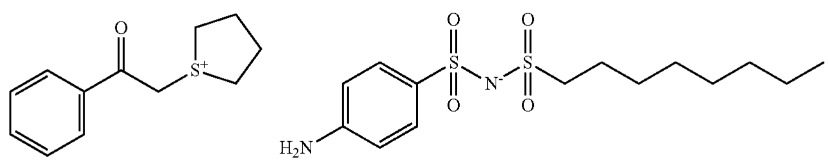
(PA-91)
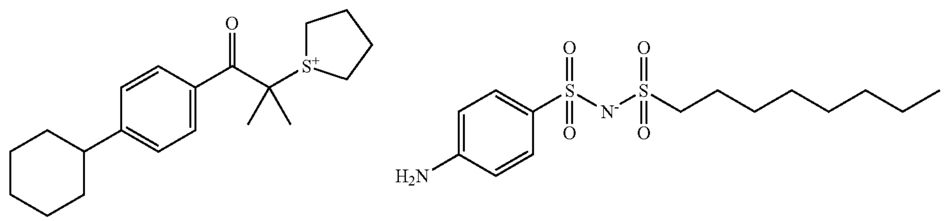
(PA-92)
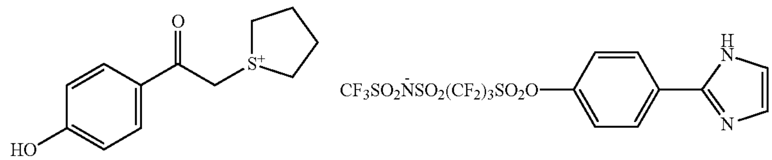
(PA-93)
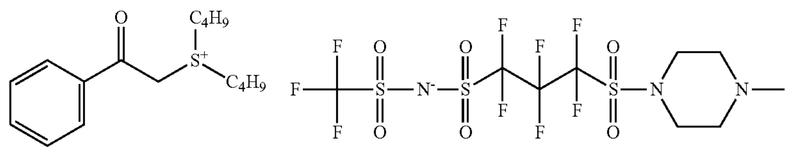
(PA-94)
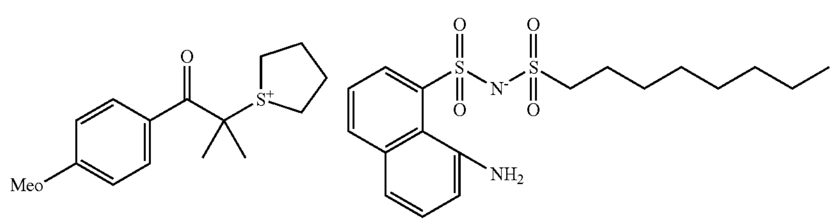
(PA-95)
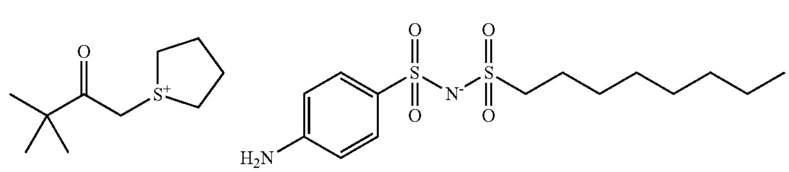

-continued
(PA-96)
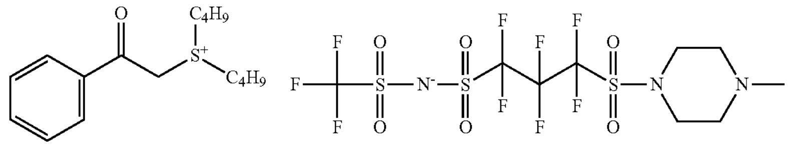
(PA-97)
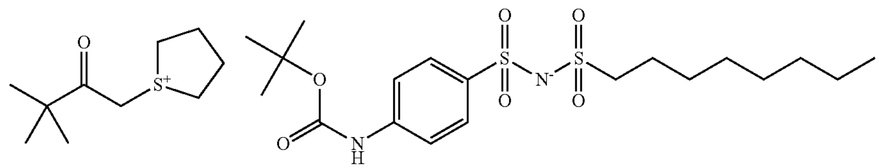
(PA-98)
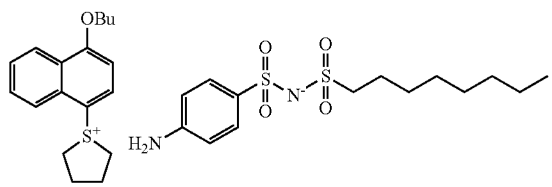
(PA-99)
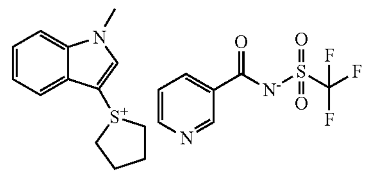
(PA-100)
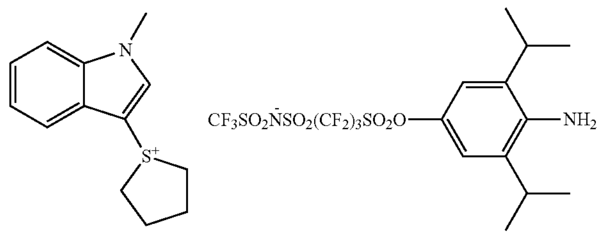
(PA-101)
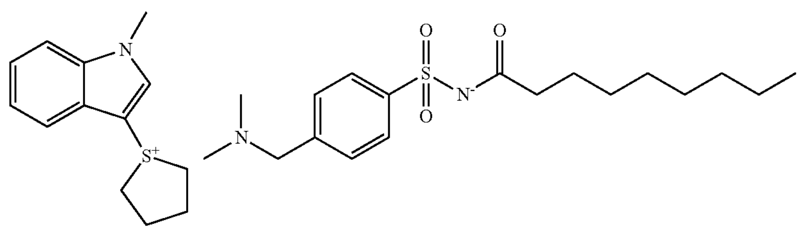
(PA-102)
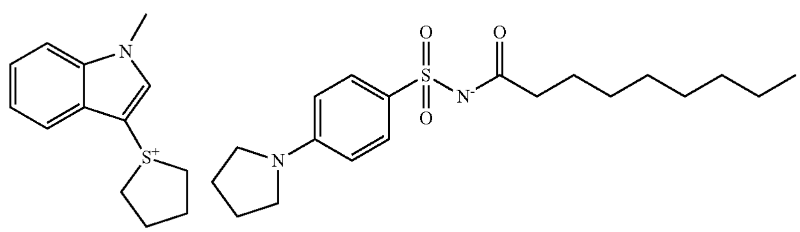
(PA-103)
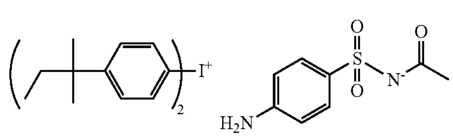
(PA-104)
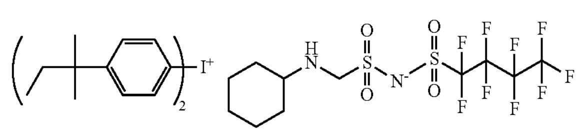
(PA-105)
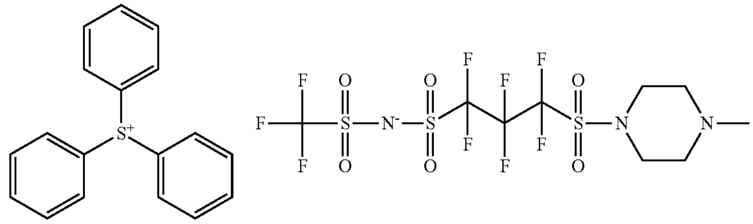

-continued
(PA-106)
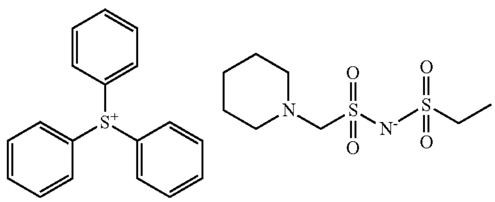
(PA-107)
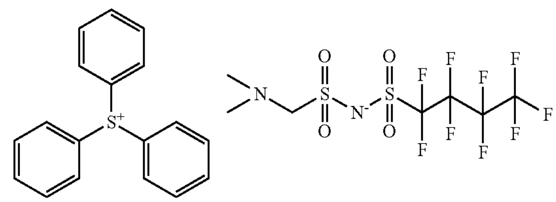
(PA-108)
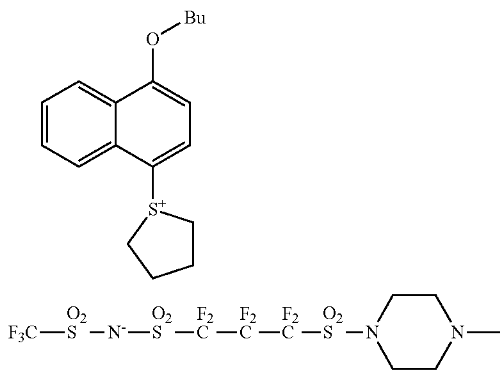
(PA-109)
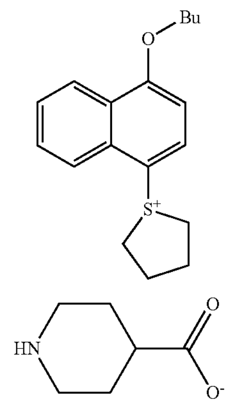
(PA-110)
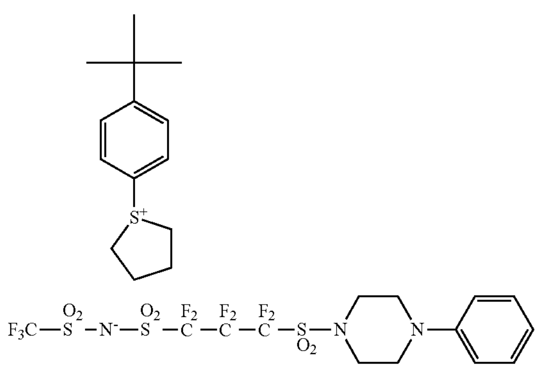
(PA-111)
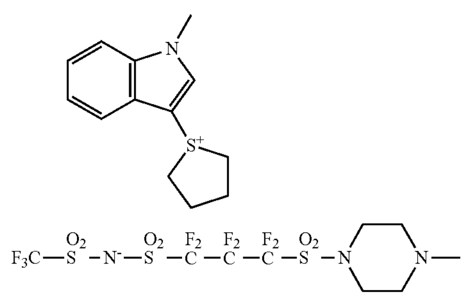
(PA-112)
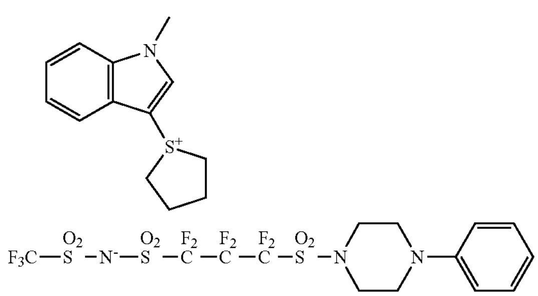
(PA-113)
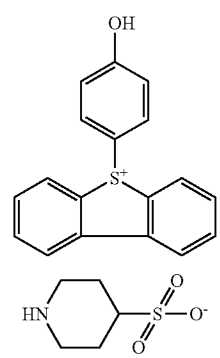

-continued
(PA-114)
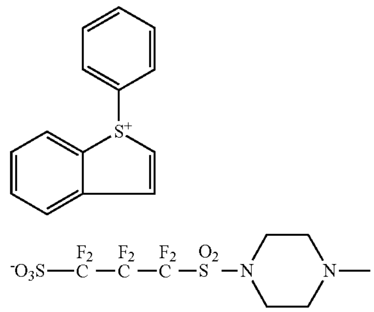
(PA-115)
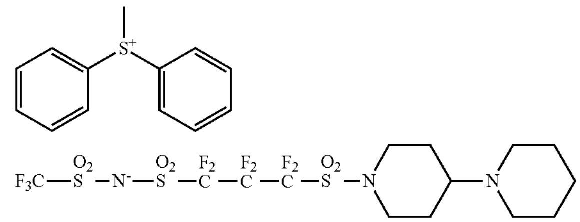
(PA-116)
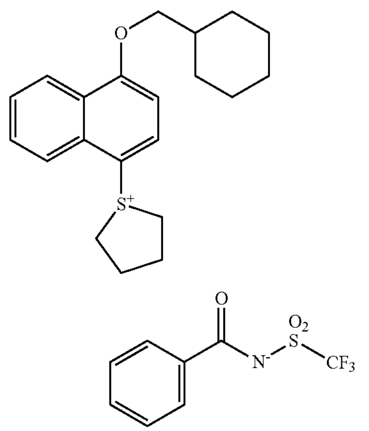
(PA-117)
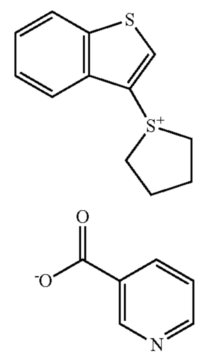
(PA-118)
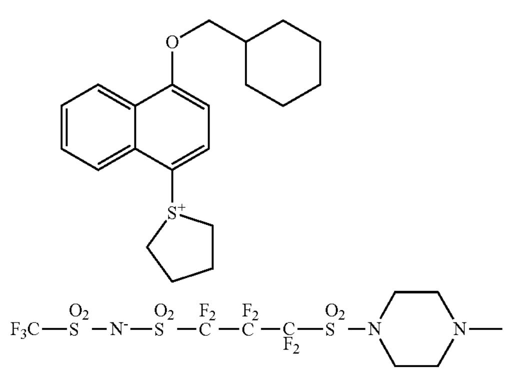
(PA-119)
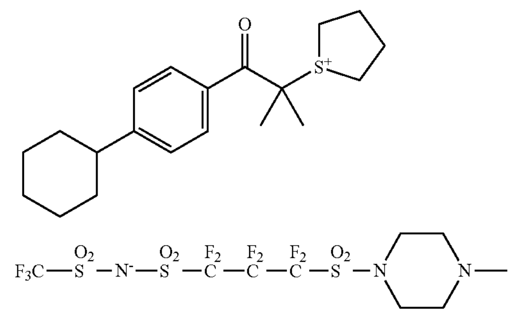
(PA-120)
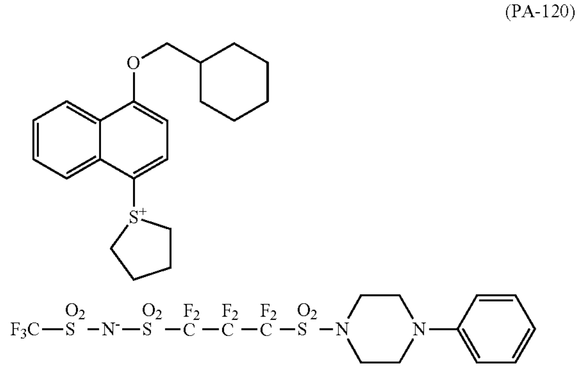
(PA-121)
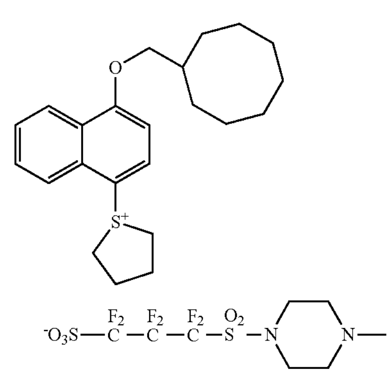

-continued
(PA-122)
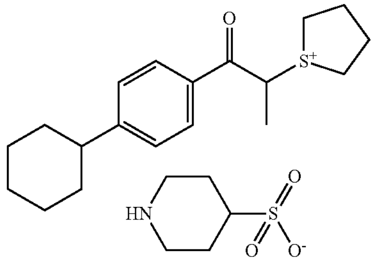
(PA-123)
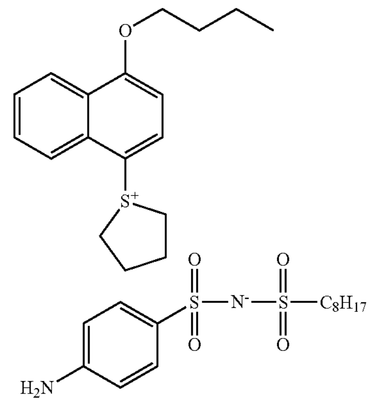
(PA-124)
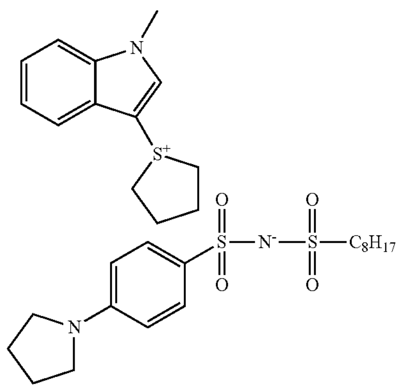
(PA-125)
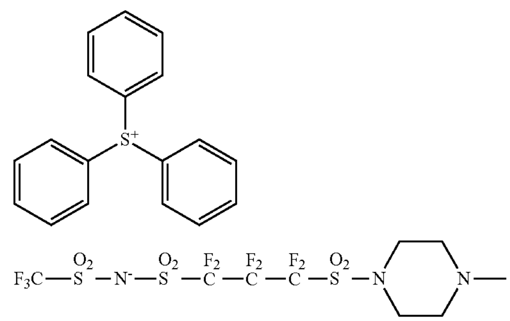
(PA-126)
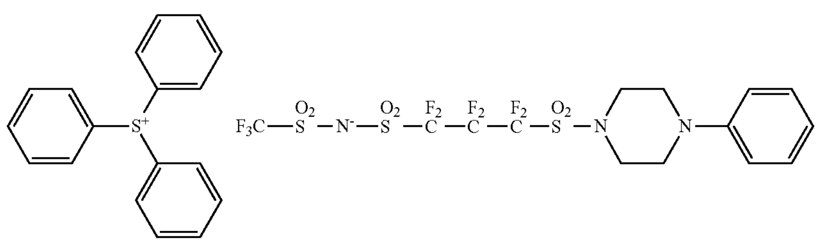
(PA-127)
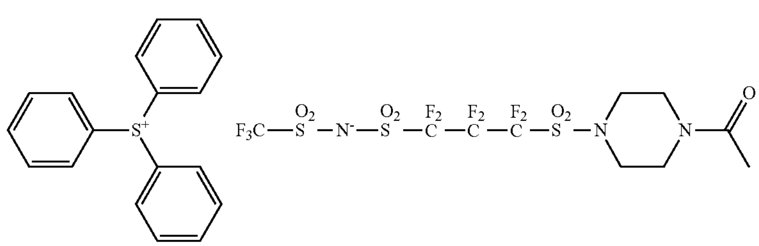
(PA-128)
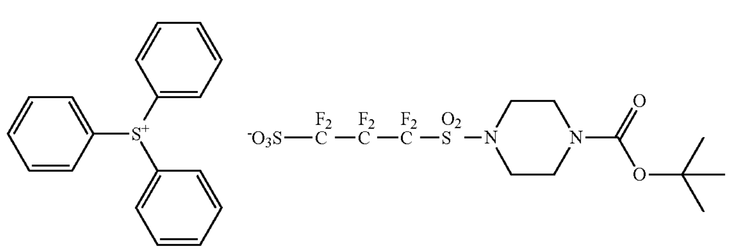

-continued
(PA-129)
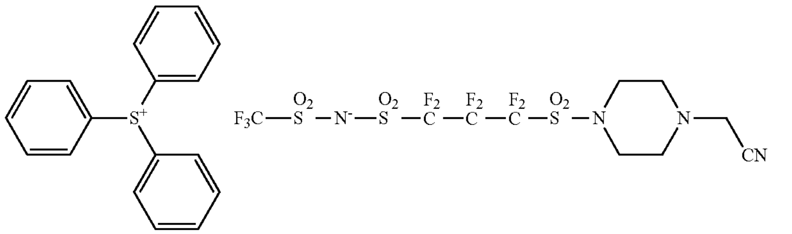
(PA-130)
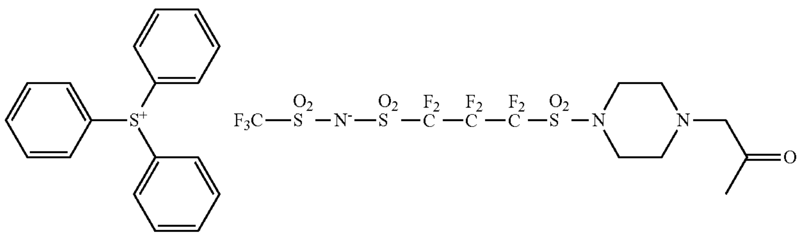
(PA-131)
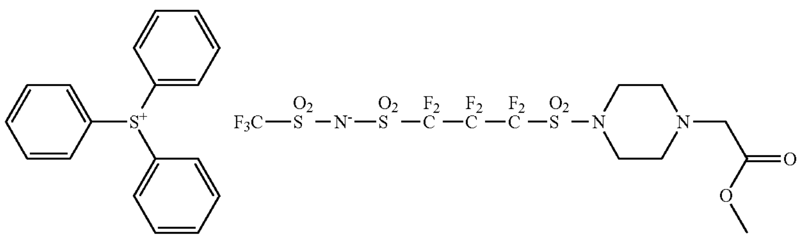
(PA-132)
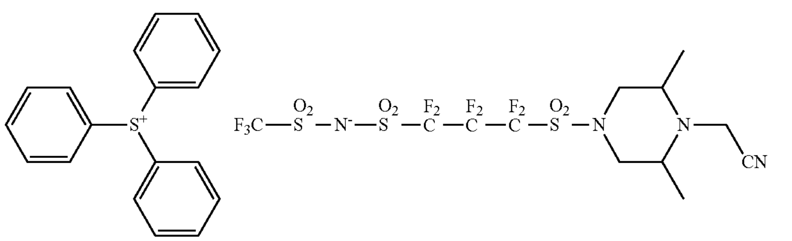
(PA-133)
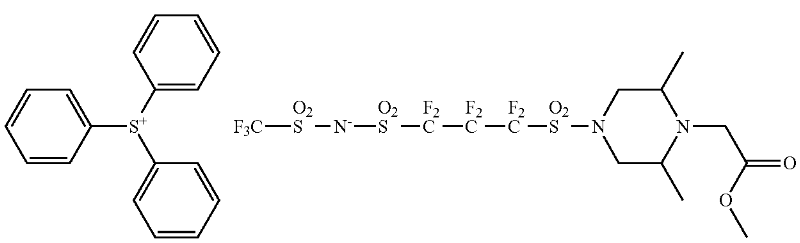
(PA-134)
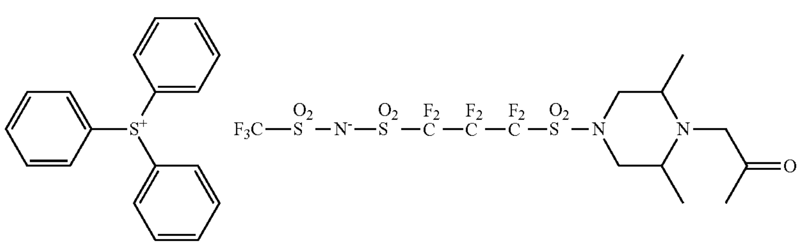

-continued
(PA-135)
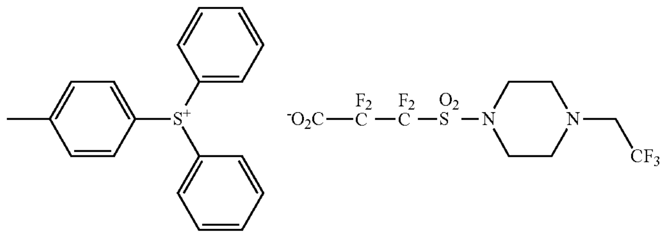
(PA-136)
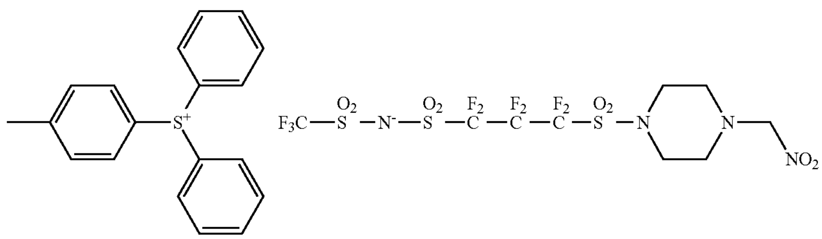
(PA-137)
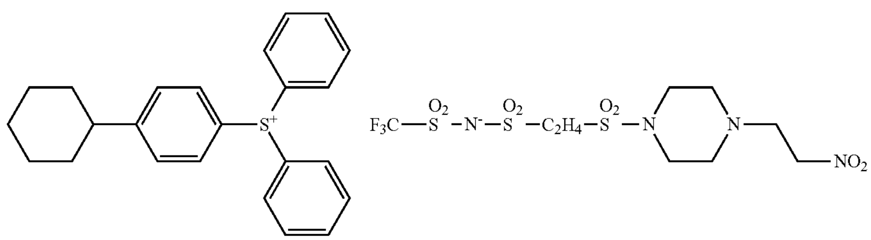
(PA-138)
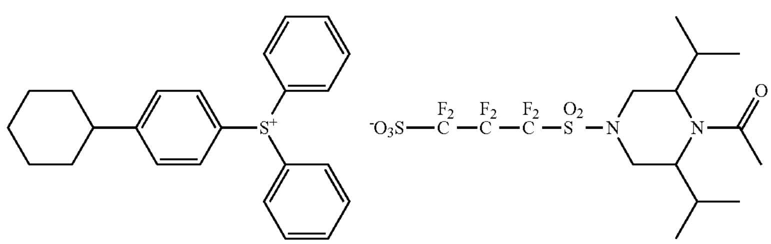
(PA-139)
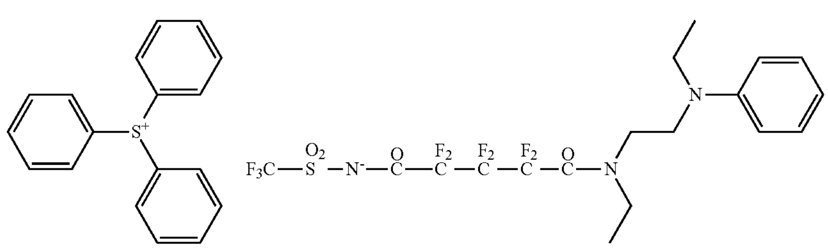
(PA-140)
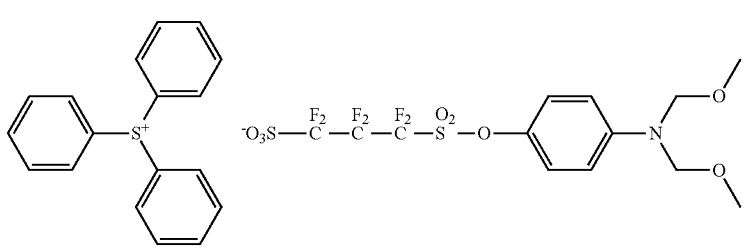

-continued
(PA-141)
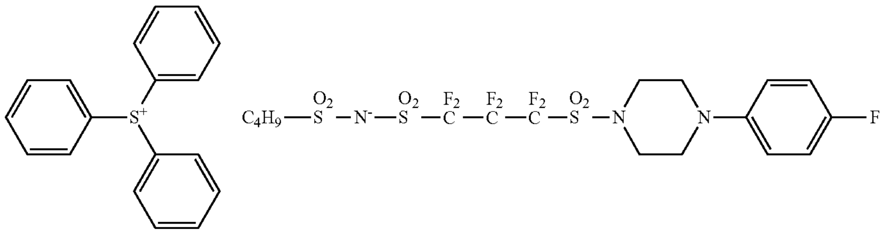
(PA-142)
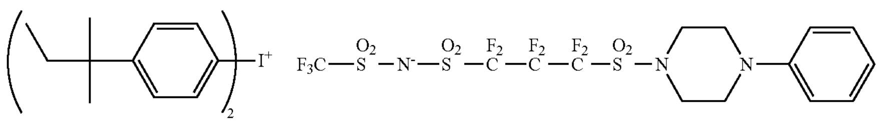
(PA-143)
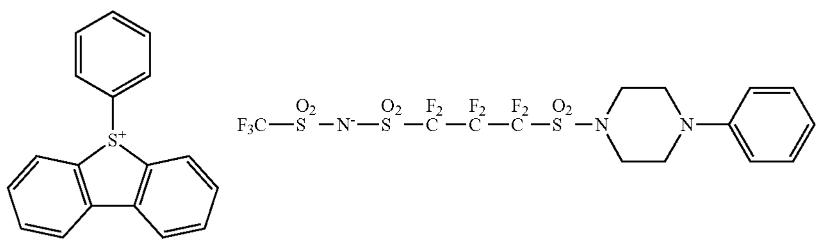
(PA-144)
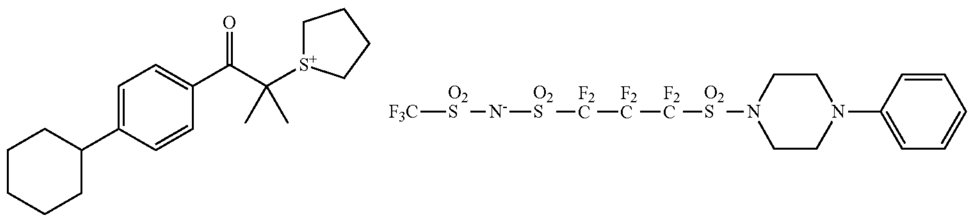
(PA-145)
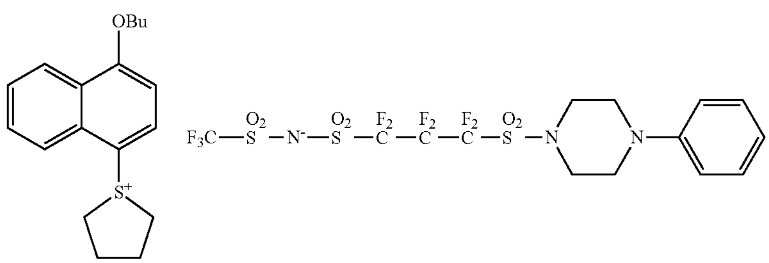
(PA-146)
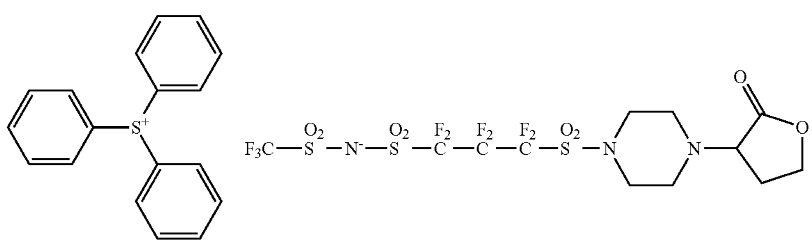
(PA-147)
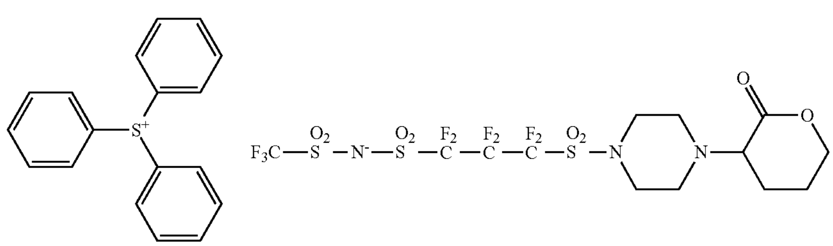

-continued (PA-148)

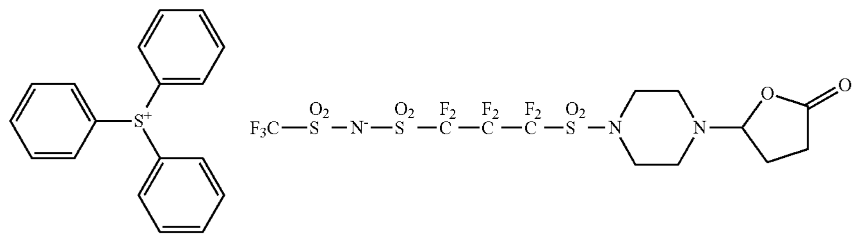

These compounds can be easily synthesized using a general sulfonic acid esterification reaction or sulfonamidation reaction. For example, the compound may be obtained by a method of selectively reacting one sulfonyl halide moiety of a bis-sulfonyl halide compound with an amine, alcohol or the like containing a partial structure represented by formula (PA-II) or (PA-III) to form a sulfonamide bond or a sulfonic acid ester bond and then hydrolyzing the other sulfonyl halide moiety, or a method of ring-opening a cyclic sulfonic anhydride by an amine or alcohol containing a partial structure represented by formula (PA-II). The amine or alcohol containing a partial structure represented by formula (PA-II) or (PA-III) can be synthesized by reacting an amine or an alcohol with an anhydride (e.g., $(R'O_2C)_2O$, $(R^1SO_2)_2O$) or an acid chloride compound (e.g., $R'O_2CCl$, $R'SO_2Cl$) (R' is, for example, a methyl group, an n-octyl group, or a trifluoromethyl group) under basic conditions.

In particular, the synthesis of the compound (D') may be performed in accordance with synthesis examples and the like in JP-A-2006-330098 and JP-A-2011-100105.

The molecular weight of the compound (D') is preferably from 500 to 1,000.

The content of the compound (D') for use in the present invention is preferably from 0.1 to 20 mass %, more preferably from 0.1 to 10 mass %, based on the solid content of the composition (I) or (II).

[6] (E) Hydrophobic Resin

The resin composition (I) or (II) (above all, the resin composition (II)) for use in the present invention may contain a hydrophobic resin having at least either a fluorine atom or a silicon atom particularly when the composition is applied to immersion exposure (hereinafter, sometimes referred to as "hydrophobic resin (E)" or simply as "resin (E)"). The hydrophobic resin (E) is unevenly distributed to the film surface layer and when the immersion medium is water, the static/dynamic contact angle of the resist film surface for water as well as the followability of immersion liquid can be enhanced.

The hydrophobic resin (E) is preferably designed to be unevenly distributed to the interface as described above but unlike a surfactant, need not have necessarily a hydrophilic group in the molecule and may not contribute to uniform mixing of polar/nonpolar substances.

The hydrophobic resin (E) typically contains a fluorine atom and/or a silicon atom. The fluorine atom and/or silicon atom in the hydrophobic resin (E) may be contained in the main chain of the resin or may be contained in the side chain.

In the case where the hydrophobic resin (E) contains a fluorine atom, the resin preferably contains, as the fluorine atom-containing partial structure, a fluorine atom-containing alkyl group, a fluorine atom-containing cycloalkyl group or a fluorine atom-containing aryl group.

The fluorine atom-containing alkyl group (preferably having a carbon number of 1 to 10, more preferably a carbon number of 1 to 4) is a linear or branched alkyl group with at least one hydrogen atom being substituted for by a fluorine atom and may further have a substituent other than fluorine atom.

The fluorine atom-containing cycloalkyl group is a monocyclic or polycyclic cycloalkyl group with at least one hydrogen atom being substituted for by a fluorine atom and may further have a substituent other than fluorine atom.

The fluorine atom-containing aryl group is an aryl group such as phenyl group or naphthyl group with at least one hydrogen atom being substituted for by a fluorine atom and may further have a substituent other than fluorine atom.

The hydrophobic resin (E) may contain a silicon atom. The resin preferably has, as the silicon atom-containing partial structure, an alkylsilyl structure (preferably a trialkylsilyl group) or a cyclic siloxane structure.

In the case where the hydrophobic resin (E) contains a fluorine atom, the fluorine atom content is preferably from 5 to 80 mass %, more preferably from 10 to 80 mass %, based on the weight average molecular weight of the hydrophobic resin (E). Also, the fluorine atom-containing repeating unit preferably accounts for 10 to 100 mol %, more preferably from 30 to 100 mol %, based on all repeating units contained in the hydrophobic resin (E).

In the case where the hydrophobic resin (E) contains a silicon atom, the silicon atom content is preferably from 2 to 50 mass %, more preferably from 2 to 30 mass %, based on the weight average molecular weight of the hydrophobic resin (E). Also, the silicon atom-containing repeating unit preferably accounts for 10 to 100 mol %, more preferably from 20 to 100 mol %, based on all repeating units contained in the hydrophobic resin (E).

The weight average molecular weight of the hydrophobic resin (E) is preferably from 1,000 to 100,000, more preferably from 1,000 to 50,000, still more preferably from 2,000 to 15,000, in terms of standard polystyrene.

As for the hydrophobic resin (E), one kind may be used, or a plurality of kinds may be used in combination.

In the case where the resin composition (I) or (II) contains (E) a hydrophobic resin, the content of the hydrophobic resin (E) in each composition is preferably from 0.01 to 20 mass %, more preferably from 0.05 to 10 mass %, still more preferably from 0.1 to 8 mass %, yet still more preferably from 0.1 to 5 mass %, based on the entire solid content of the composition.

In the hydrophobic resin (E), similarly to the resin (A), it is of course preferred that the content of impurities such as metal is small, but the content of residual monomers or oligomer components is also preferably from 0.01 to 5 mass %, more preferably from 0.01 to 3 mass %, still more preferably from 0.05 to 1 mass %. Thanks to the content in this range, a resin composition free from in-liquid extraneous substances and change with aging of sensitivity and the like can be obtained. Furthermore, in view of resolution, resist profile, side wall of resist pattern, roughness and the like, the molecular weight distribution (Mw/Mn, sometimes referred to as "polydispersity") is preferably from 1 to 5, more preferably from 1 to 3, still more preferably from 1 to 2.

As the hydrophobic resin (E), various commercially available products may be used, or the resin may be synthesized by a conventional method (for example, radical polymerization). Examples of the general synthesis method include a batch polymerization method of dissolving monomer species and an initiator in a solvent and heating the solution, thereby effecting the polymerization, and a dropping polymerization method of adding dropwise a solution containing monomer species and an initiator to a heated solvent over 1 to 10 hours. A dropping polymerization method is preferred.

The reaction solvent, the polymerization initiator, the reaction conditions (e.g., temperature, concentration) and the purification method after reaction are the same as those described for the resin (A), but in the synthesis of the hydrophobic resin (E), the concentration at the reaction is preferably from 30 to 50 mass %.

Specific examples of the hydrophobic resin (E) are illustrated below. Also, the molar ratio of repeating units (corresponding to repeating units starting from the left), weight average molecular weight and polydispersity of each resin are shown in the Tables later.

(HR-1)

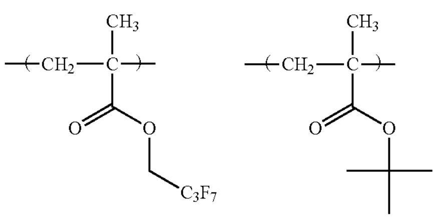

(HR-2)

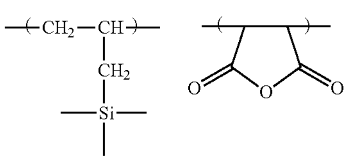

(HR-3)

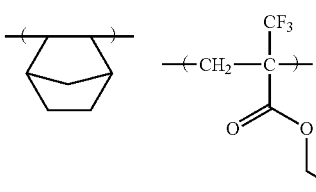

(HR-4)

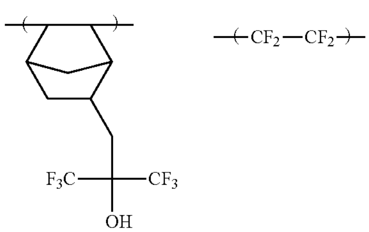

(HR-5)

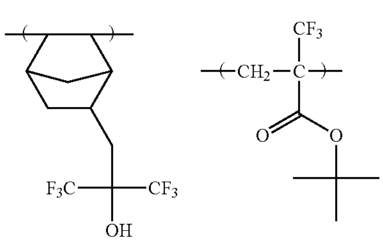

-continued (HR-6)

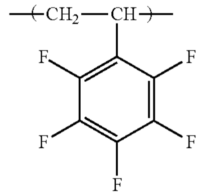

(HR-7)

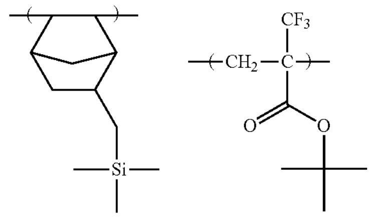

(HR-8)

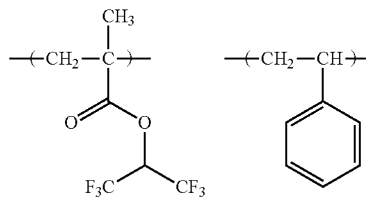

(HR-9)

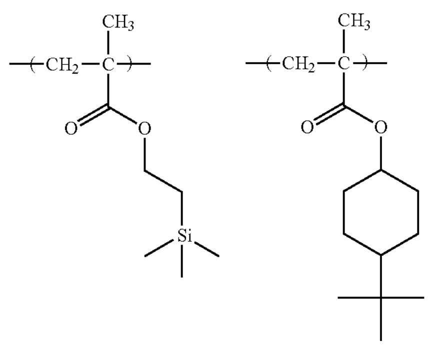

(HR-10)

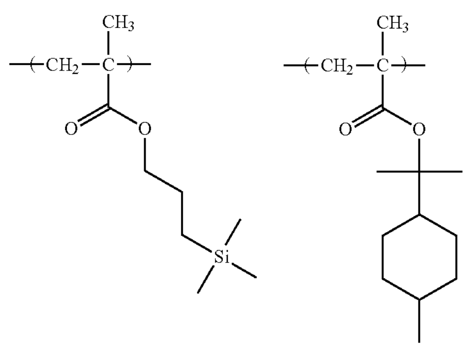

(HR-11)

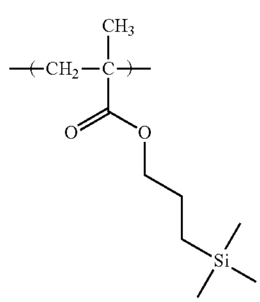

-continued
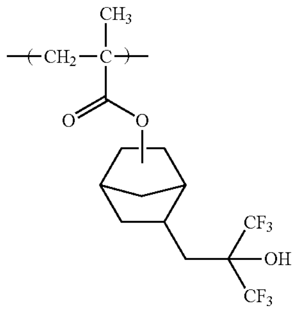
(HR-12)
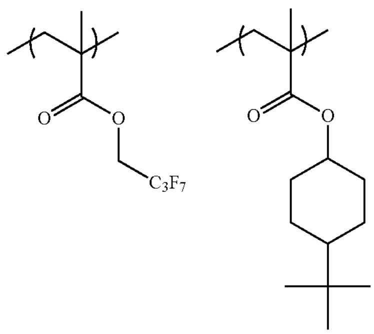
(HR-13)
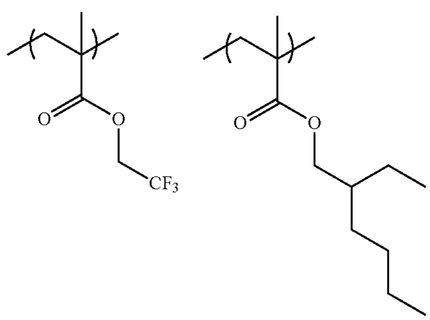
(HR-14)
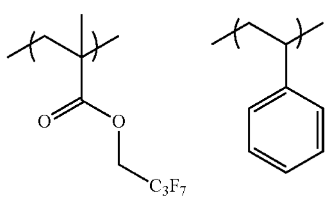
(HR-15)
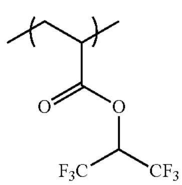
(HR-16)
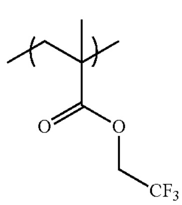
-continued
(HR-17)
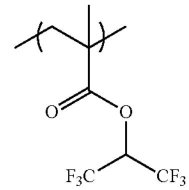
(HR-18)
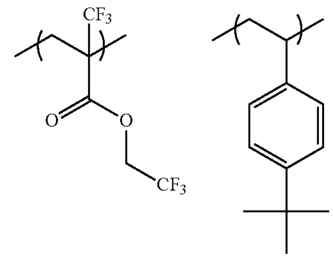
(HR-19)
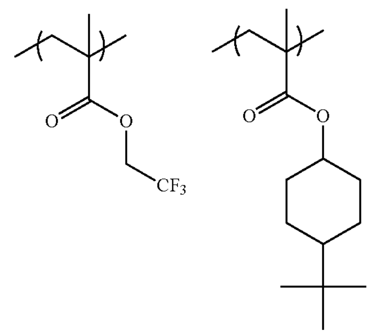
(HR-20)
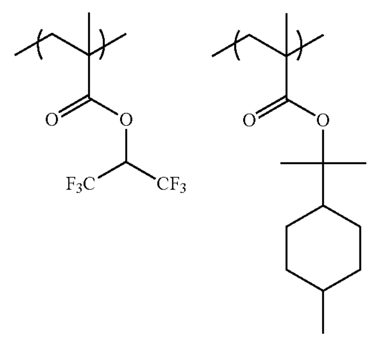
(HR-21)
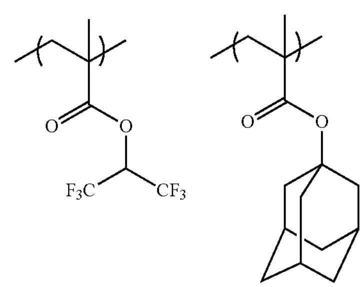
(HR-22)
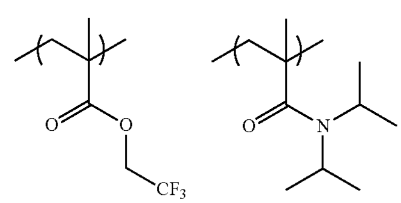

-continued
(HR-23)
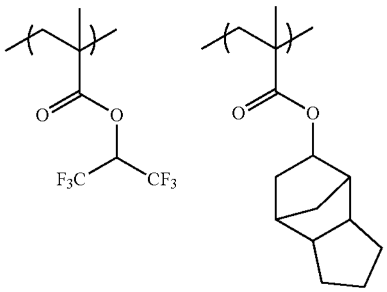
(HR-24)
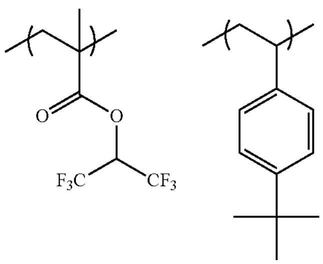
(HR-25)
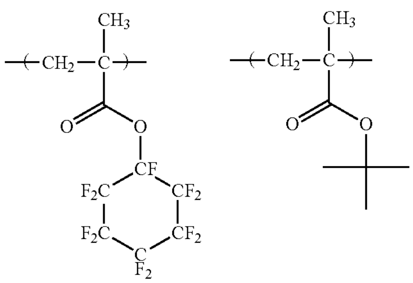
(HR-26)
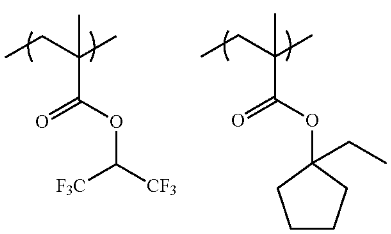
(HR-27)
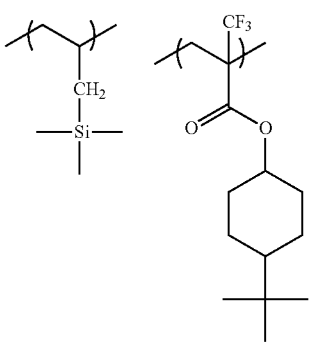
(HR-28)
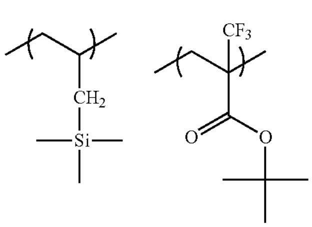
-continued
(HR-29)
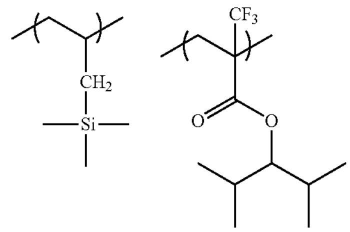
(HR-30)
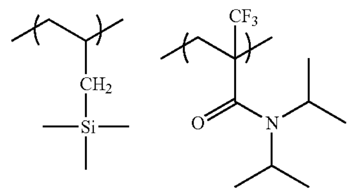
(HR-31)
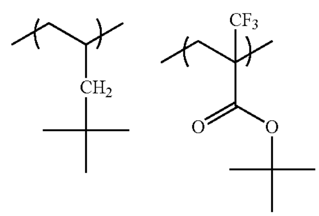
(HR-32)
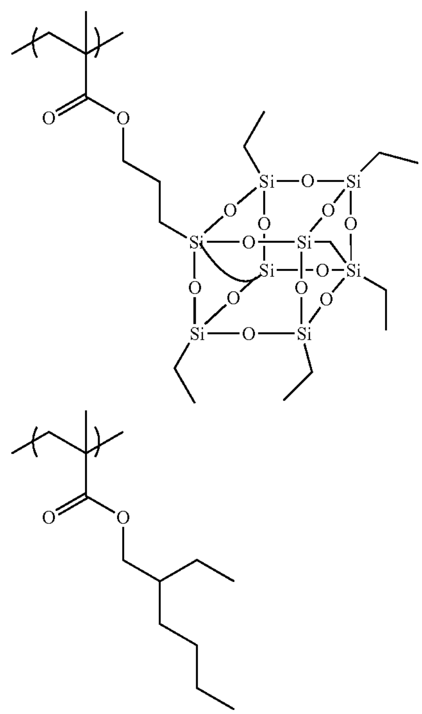
(HR-33)
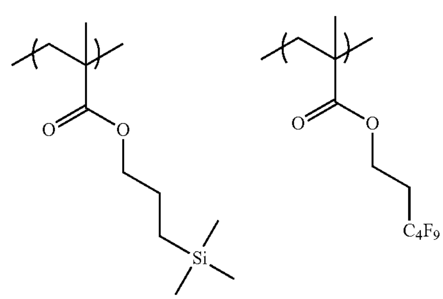

-continued
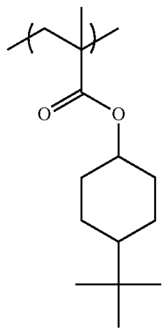
(HR-34)
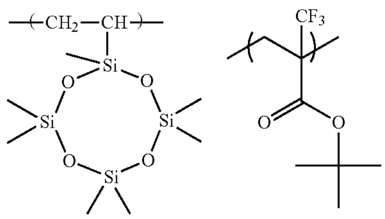
(HR-35)
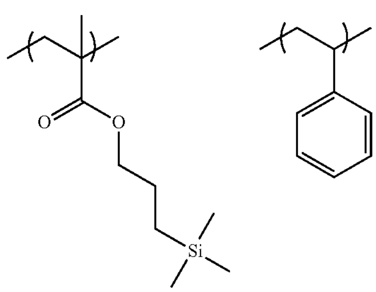
(HR-36)
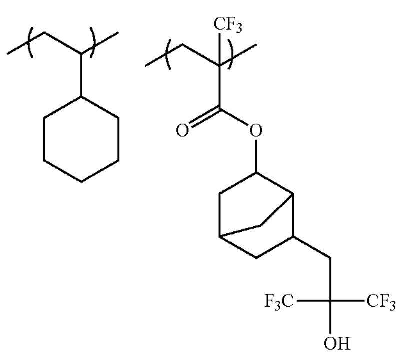
(HR-37)
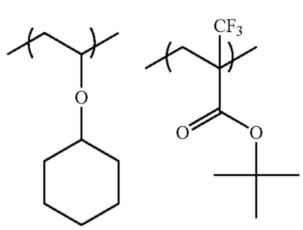
-continued
(HR-38)
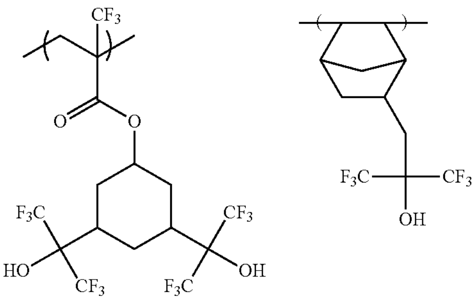
(HR-39)
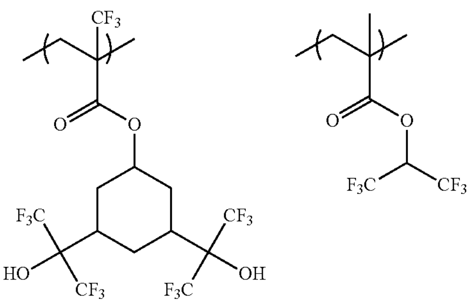
(HR-40)
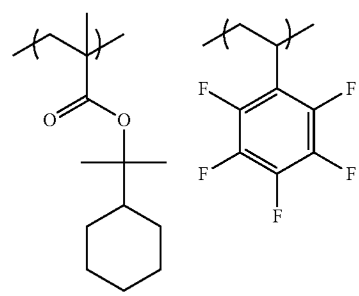
(HR-41)
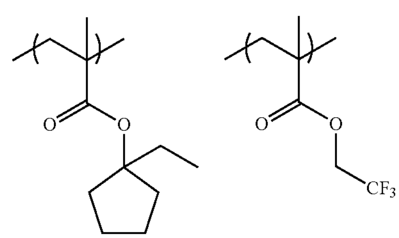
(HR-42)
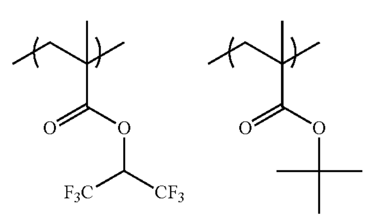

-continued
(HR-43)
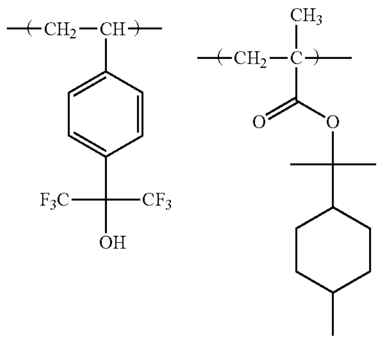
(HR-44)
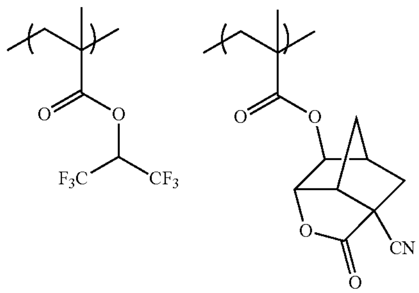
(HR-45)
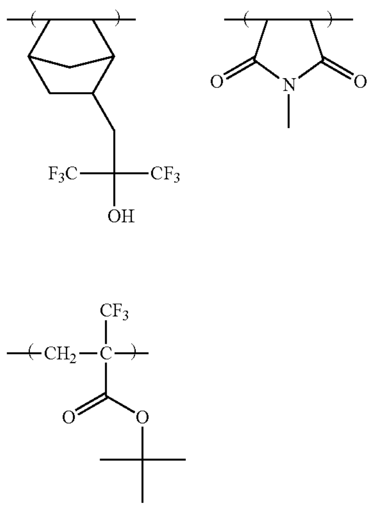
(HR-46)
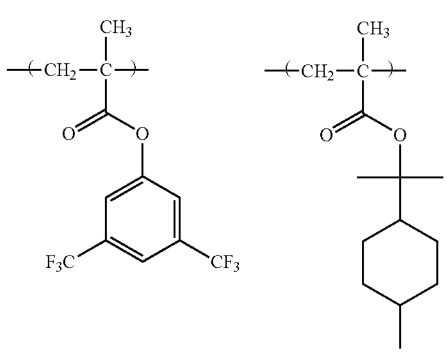
-continued
(HR-47)
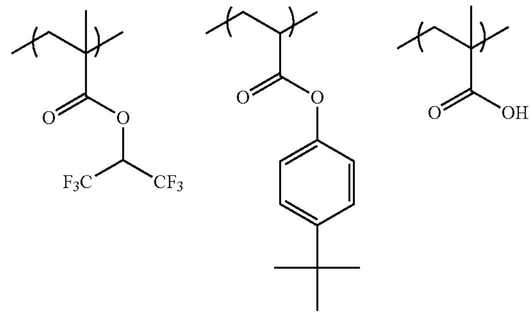
(HR-48)
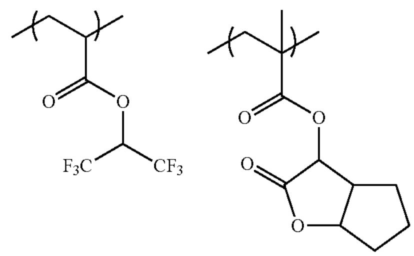
(HR-49)
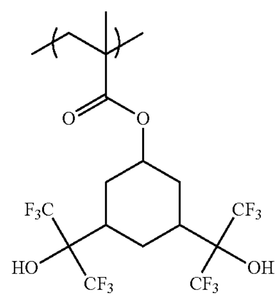
(HR-50)
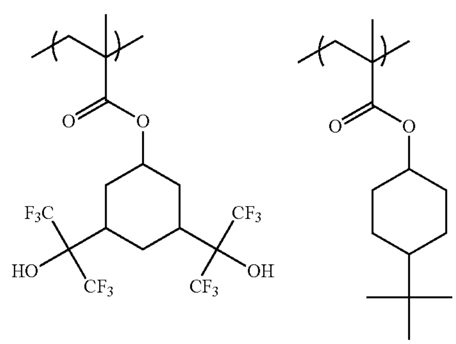
(HR-51)
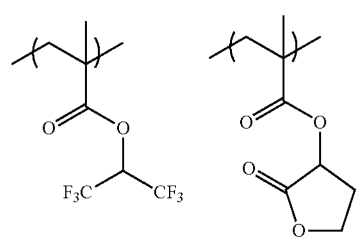

-continued
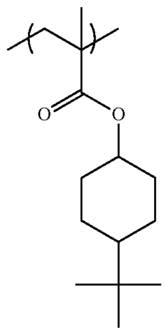
(HR-52)
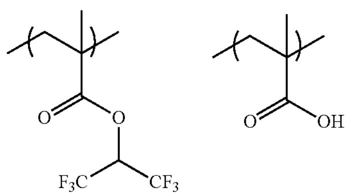
(HR-53)
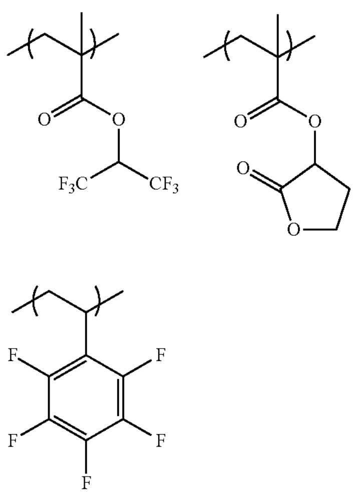
(HR-54)
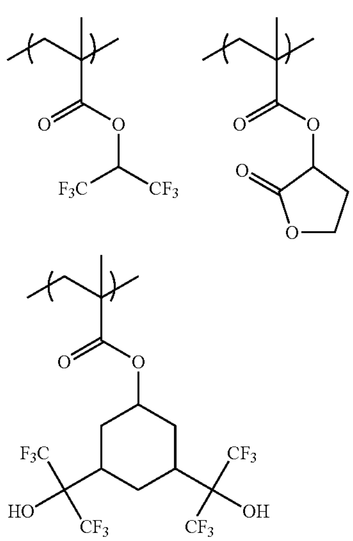
-continued
(HR-55)
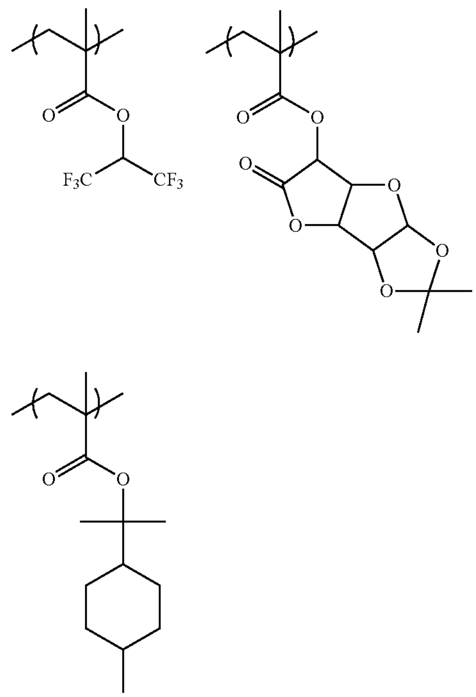
(HR-56)
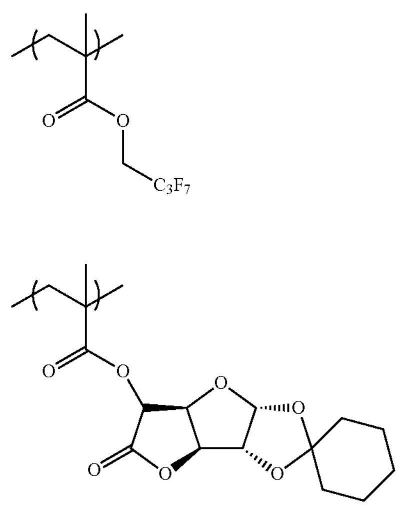
(HR-57)
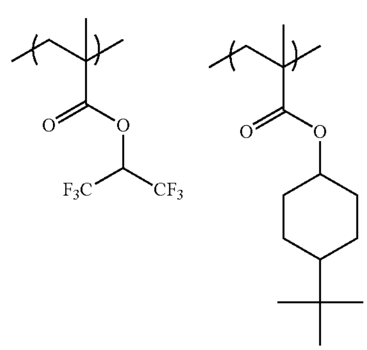

-continued
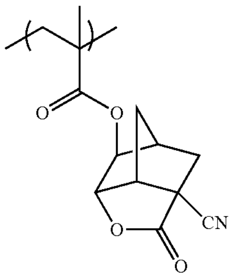
(HR-58)
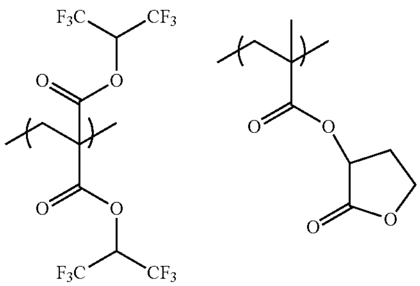
(HR-59)
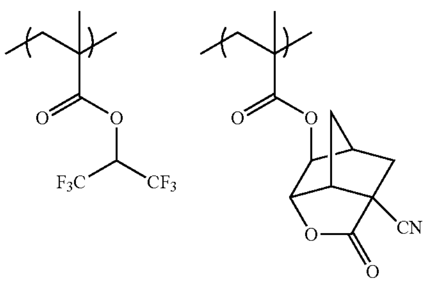
(HR-60)
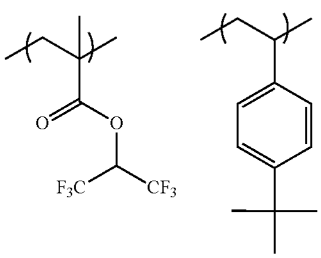
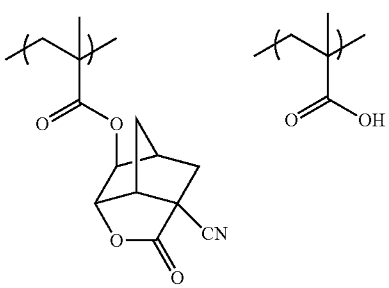
-continued
(HR-61)
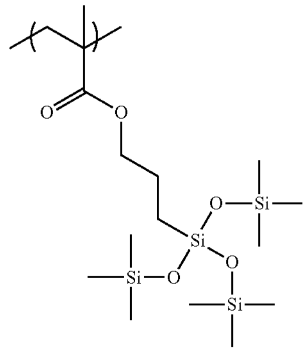
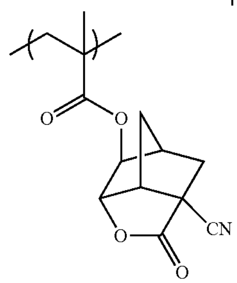
(HR-62)
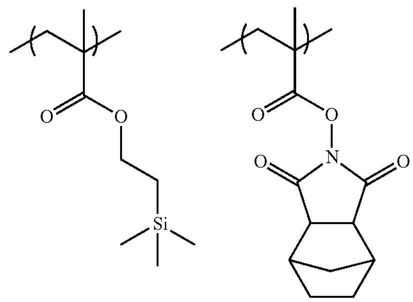
(HR-63)
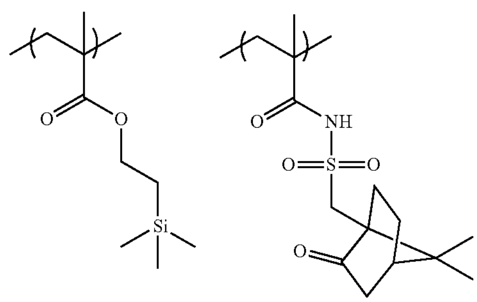
(HR-64)
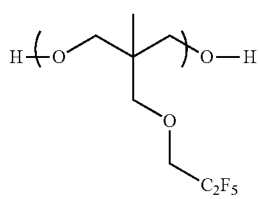
(HR-65)
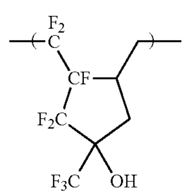

-continued
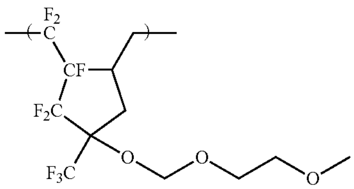
(HR-66)
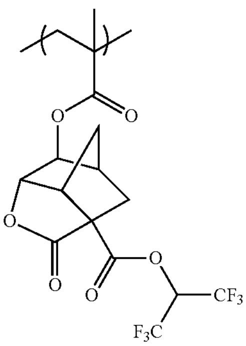
(HR-67)
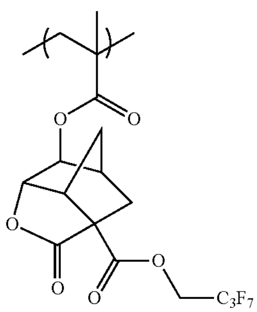
(HR-68)
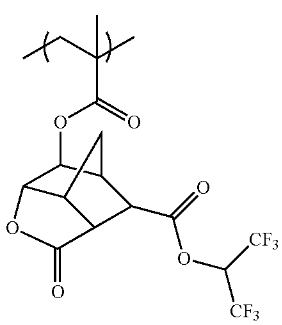
(HR-69)
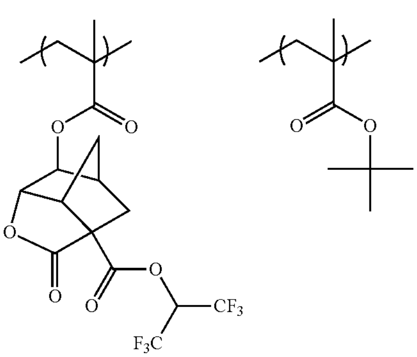
-continued
(HR-70)
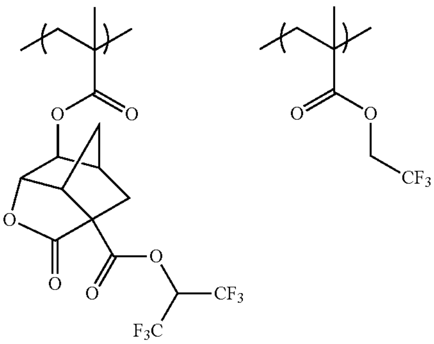
(HR-71)
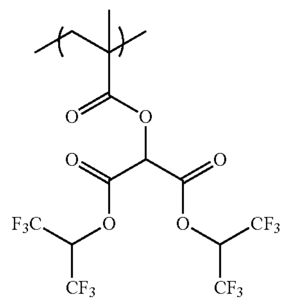
(HR-72)
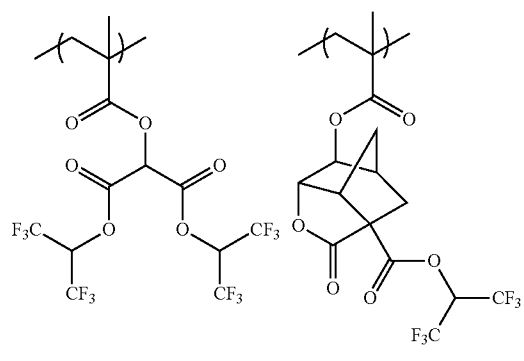
(HR-73)
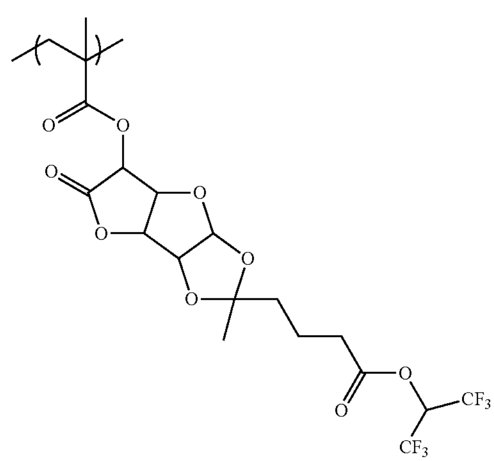

-continued
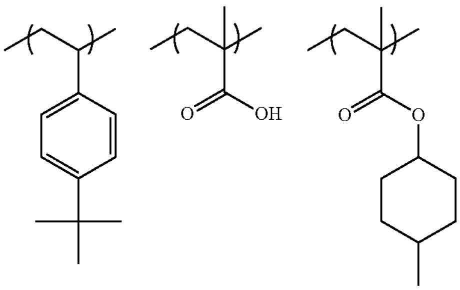
(HR-74)
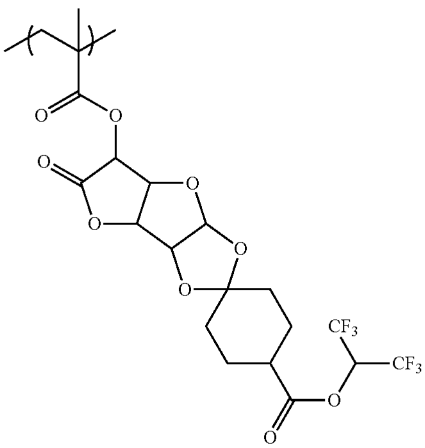
(HR-75)
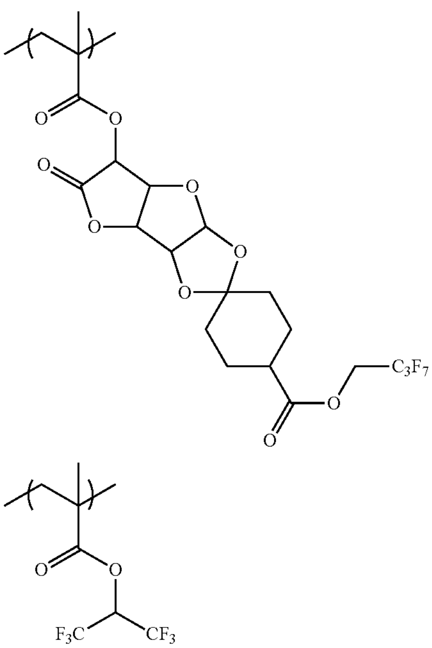
-continued
(HR-76)
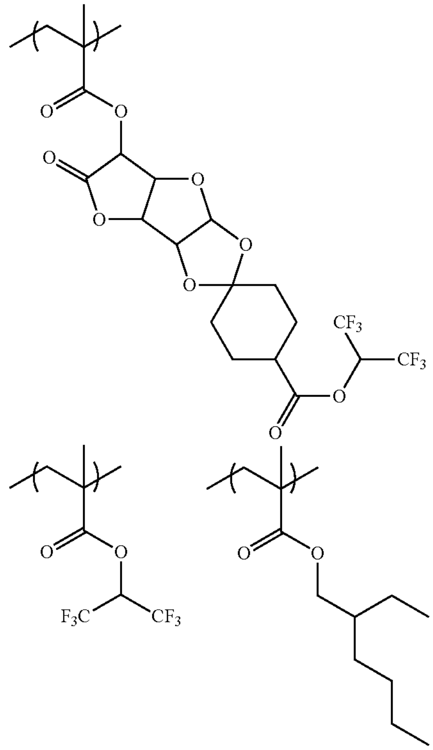
(HR-77)
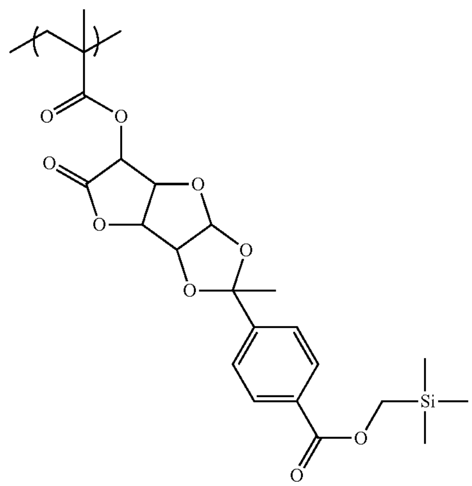
(HR-78)
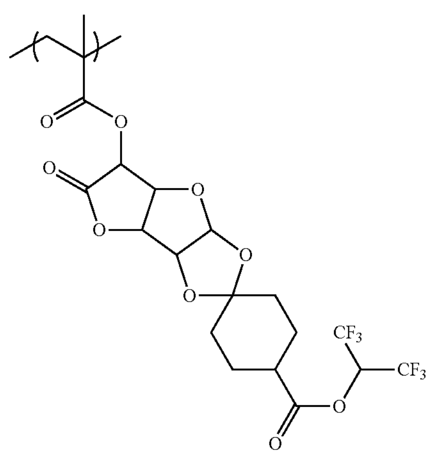

-continued
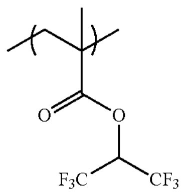
(HR-79)
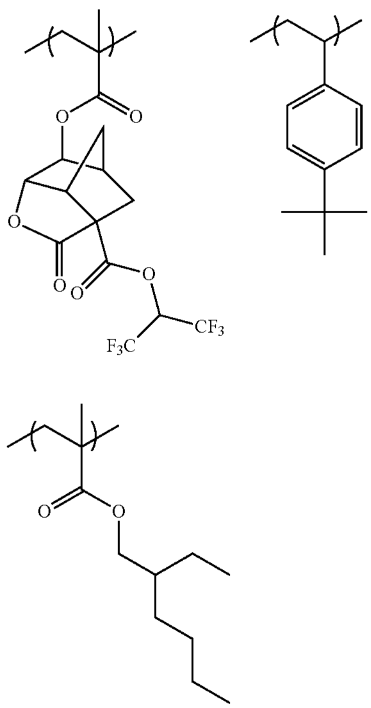
(HR-80)
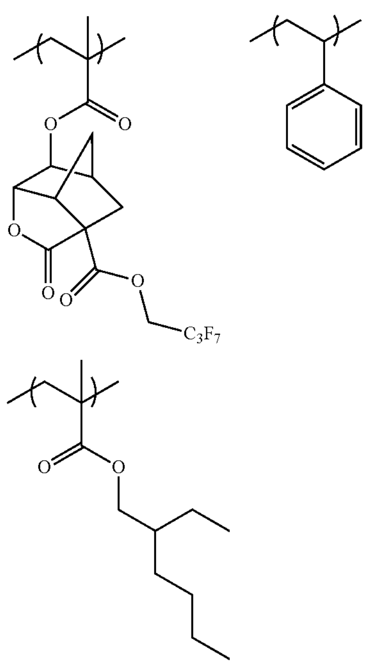
-continued
(HR-81)
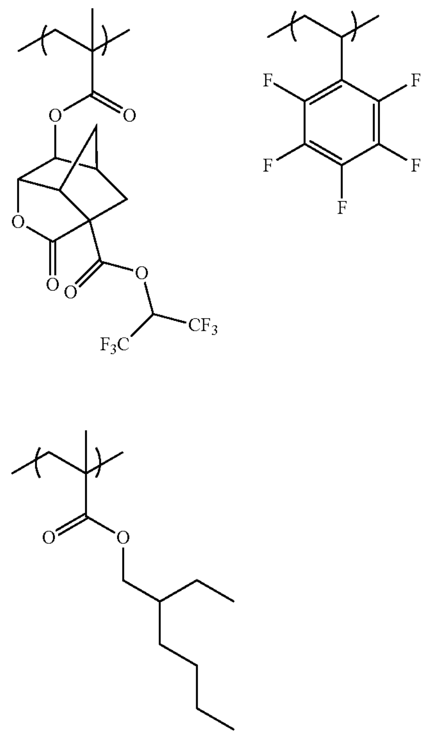
(HR-82)
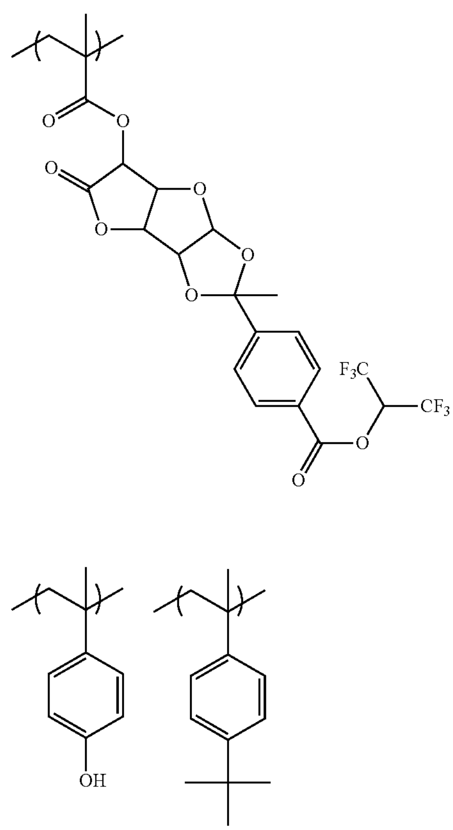

-continued
(HR-83)
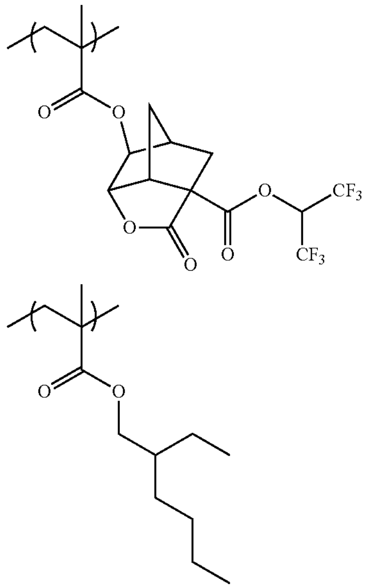
(HR-84)
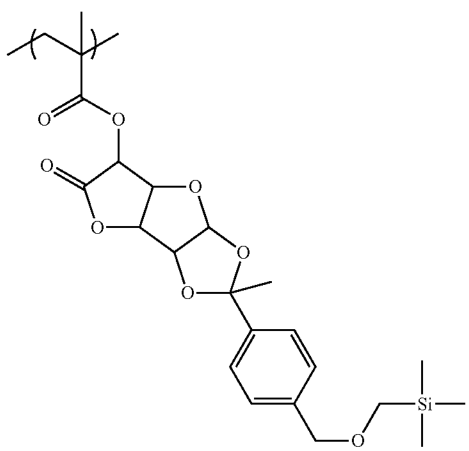
(HR-85)
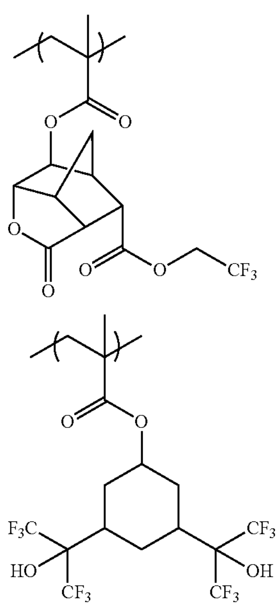
-continued
(HR-86)
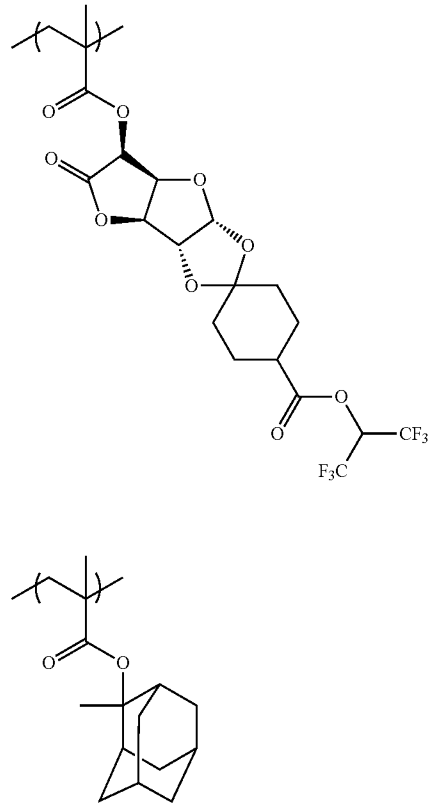
(HR-87)
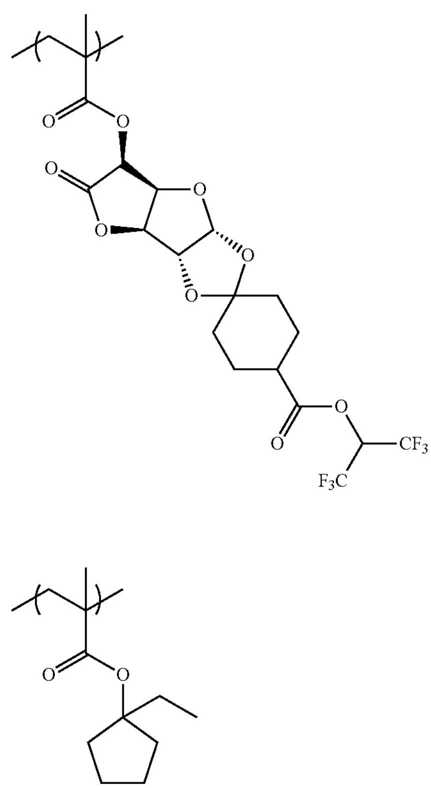

-continued
(HR-88)
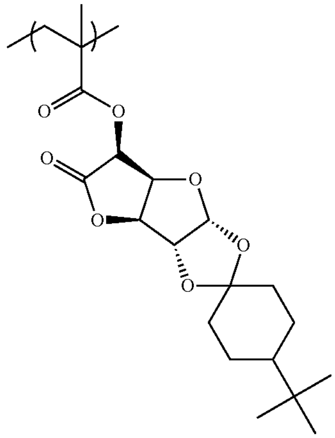
(HR-89)
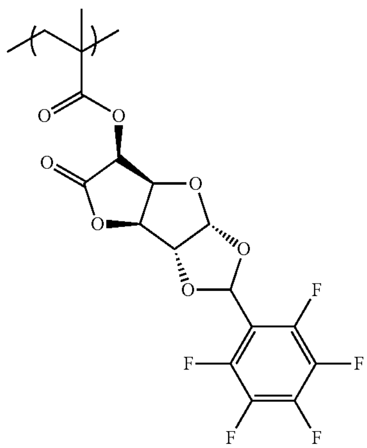
(HR-90)
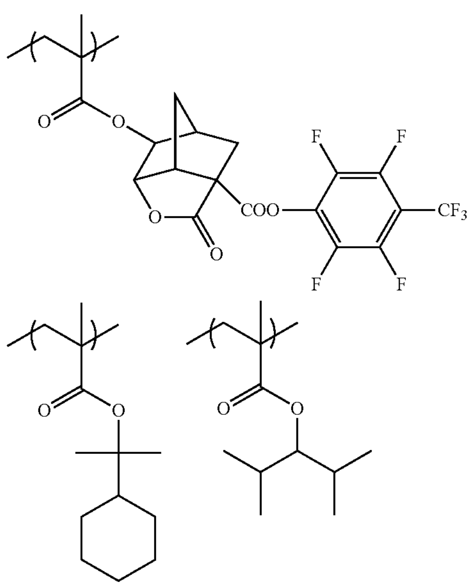
TABLE 1
| Resin | Composition | Mw | Mw/Mn |
|---|---|---|---|
| HR-1 | 50/50 | 4900 | 1.4 |
| HR-2 | 50/50 | 5100 | 1.6 |
| HR-3 | 50/50 | 4800 | 1.5 |
| HR-4 | 50/50 | 5300 | 1.6 |
| HR-5 | 50/50 | 4500 | 1.4 |
| HR-6 | 100 | 5500 | 1.6 |
| HR-7 | 50/50 | 5800 | 1.9 |
| HR-8 | 50/50 | 4200 | 1.3 |
| HR-9 | 50/50 | 5500 | 1.8 |
| HR-10 | 40/60 | 7500 | 1.6 |
| HR-11 | 70/30 | 6600 | 1.8 |
| HR-12 | 40/60 | 3900 | 1.3 |
| HR-13 | 50/50 | 9500 | 1.8 |
| HR-14 | 50/50 | 5300 | 1.6 |
| HR-15 | 100 | 6200 | 1.2 |
| HR-16 | 100 | 5600 | 1.6 |
| HR-17 | 100 | 4400 | 1.3 |
| HR-18 | 50/50 | 4300 | 1.3 |
| HR-19 | 50/50 | 6500 | 1.6 |
| HR-20 | 30/70 | 6500 | 1.5 |
| HR-21 | 50/50 | 6000 | 1.6 |
| HR-22 | 50/50 | 3000 | 1.2 |
| HR-23 | 50/50 | 5000 | 1.5 |
| HR-24 | 50/50 | 4500 | 1.4 |
| HR-25 | 30/70 | 5000 | 1.4 |
| HR-26 | 50/50 | 5500 | 1.6 |
| HR-27 | 50/50 | 3500 | 1.3 |
| HR-28 | 50/50 | 6200 | 1.4 |
| HR-29 | 50/50 | 6500 | 1.6 |
| HR-30 | 50/50 | 6500 | 1.6 |
| HR-31 | 50/50 | 4500 | 1.4 |
| HR-32 | 30/70 | 5000 | 1.6 |
| HR-33 | 30/30/40 | 6500 | 1.8 |
| HR-34 | 50/50 | 4000 | 1.3 |
| HR-35 | 50/50 | 6500 | 1.7 |
| HR-36 | 50/50 | 6000 | 1.5 |
| HR-37 | 50/50 | 5000 | 1.6 |
| HR-38 | 50/50 | 4000 | 1.4 |
| HR-39 | 20/80 | 6000 | 1.4 |
| HR-40 | 50/50 | 7000 | 1.4 |
| HR-41 | 50/50 | 6500 | 1.6 |
| HR-42 | 50/50 | 5200 | 1.6 |
| HR-43 | 50/50 | 6000 | 1.4 |
| HR-44 | 70/30 | 5500 | 1.6 |
| HR-45 | 50/20/30 | 4200 | 1.4 |
| HR-46 | 30/70 | 7500 | 1.6 |
| HR-47 | 40/58/2 | 4300 | 1.4 |
| HR-48 | 50/50 | 6800 | 1.6 |
| HR-49 | 100 | 6500 | 1.5 |
| HR-50 | 50/50 | 6600 | 1.6 |
| HR-51 | 30/20/50 | 6800 | 1.7 |
| HR-52 | 95/5 | 5900 | 1.6 |
| HR-53 | 40/30/30 | 4500 | 1.3 |
| HR-54 | 50/30/20 | 6500 | 1.8 |
| HR-55 | 30/40/30 | 7000 | 1.5 |
| HR-56 | 60/40 | 5500 | 1.7 |
| HR-57 | 40/40/20 | 4000 | 1.3 |
| HR-58 | 60/40 | 3800 | 1.4 |
| HR-59 | 80/20 | 7400 | 1.6 |
| HR-60 | 40/40/15/5 | 4800 | 1.5 |
| HR-61 | 60/40 | 5600 | 1.5 |
| HR-62 | 50/50 | 5900 | 2.1 |
| HR-63 | 80/20 | 7000 | 1.7 |
| HR-64 | 100 | 5500 | 1.8 |
| HR-65 | 50/50 | 9500 | 1.9 |
TABLE 2
| Resin | Composition | Mw | Mw/Mn |
|---|---|---|---|
| HR-66 | 100 | 6000 | 1.5 |
| HR-67 | 100 | 6000 | 1.4 |
| HR-68 | 100 | 9000 | 1.5 |
| HR-69 | 60/40 | 8000 | 1.3 |
| HR-70 | 80/20 | 5000 | 1.4 |
| HR-71 | 100 | 9500 | 1.5 |
| HR-72 | 40/60 | 8000 | 1.4 |

TABLE 2-continued

| Resin | Composition | Mw | Mw/Mn |
|---|---|---|---|
| HR-73 | 55/30/5/10 | 8000 | 1.3 |
| HR-74 | 100 | 13000 | 1.4 |
| HR-75 | 70/30 | 8000 | 1.3 |
| HR-76 | 50/40/10 | 9500 | 1.5 |
| HR-77 | 100 | 9000 | 1.6 |
| HR-78 | 80/20 | 3500 | 1.4 |
| HR-79 | 90/8/2 | 13000 | 1.5 |
| HR-80 | 85/10/5 | 5000 | 1.5 |
| HR-81 | 80/18/2 | 6000 | 1.5 |
| HR-82 | 50/20/30 | 5000 | 1.3 |
| HR-83 | 90/10 | 8000 | 1.4 |
| HR-84 | 100 | 9000 | 1.6 |
| HR-85 | 80/20 | 15000 | 1.6 |
| HR-86 | 70/30 | 4000 | 1.42 |
| HR-87 | 60/40 | 8000 | 1.32 |
| HR-88 | 100 | 3800 | 1.29 |
| HR-89 | 100 | 6300 | 1.35 |
| HR-90 | 50/40/10 | 8500 | 1.51 |

[7] (F) Surfactant

The resin composition (I) or (II) for use in the present invention may or may not further contain a surfactant, but in the case of containing a surfactant, it is preferred to contain any one of fluorine-containing and/or silicon-containing surfactants (a fluorine-containing surfactant, a silicon-containing surfactant and a surfactant containing both a fluorine atom and a silicon atom), or two or more thereof.

By containing a surfactant, the resin composition (I) or (II) for use in the present invention can give a resist pattern improved in the sensitivity, resolution and adherence and reduced in the development defect when using an exposure light source with a wavelength of 250 nm or less, particularly 220 nm or less.

Examples of the fluorine-containing and/or silicon-containing surfactants include surfactants described in paragraph [0276] of U.S. Patent Application Publication No. 2008/0248425, such as EFtop EF301 and EF303 (produced by Shin-Akita Kasei K.K.); Florad FC430, 431 and 4430 (produced by Sumitomo 3M Inc.); Megaface F171, F173, F176, F189, F113, F110, F177, F120 and R08 (produced by Dainippon Ink & Chemicals, Inc.); Surflon S-382, SC101, 102, 103, 104, 105 and 106 and KH-20 (produced by Asahi Glass Co., Ltd.); Troysol S-366 (produced by Troy Chemical); GF-300 and GF-150 (produced by Toagosei Chemical Industry Co., Ltd.); Surflon S-393 (produced by Seimi Chemical Co., Ltd.); EFtop EF121, EF122A, EF122B, RF122C, EF125M, EF135M, EF351, EF352, EF801, EF802 and EF601 (produced by JEMCO Inc.); PF636, PF656, PF6320 and PF6520 (produced by OMNOVA); and FTX-204G, 208G, 218G, 230G, 204D, 208D, 212D, 218D and 222D (produced by NEOS Co., Ltd.). In addition, polysiloxane polymer KP-341 (produced by Shin-Etsu Chemical Co., Ltd.) may be also used as the silicon-containing surfactant.

Other than those known surfactants, a surfactant using a polymer having a fluoro-aliphatic group derived from a fluoro-aliphatic compound which is produced by a telomerization process (also called a telomer process) or an oligomerization process (also called an oligomer process), may be used. The fluoro-aliphatic compound can be synthesized by the method described in JP-A-2002-90991.

Examples of the surfactant coming under the surfactant above include Megaface F178, F-470, F-473, F-475, F-476 and F-472 (produced by Dainippon Ink & Chemicals, Inc.); a copolymer of a $C_6F_{13}$ group-containing acrylate (or methacrylate) with a (poly(oxyalkylene)) acrylate (or methacrylate); and a copolymer of a $C_3F_7$ group-containing acrylate (or methacrylate) with a (poly(oxyethylene)) acrylate (or methacrylate) and a (poly(oxypropylene)) acrylate (or methacrylate).

In the present invention, surfactants other than the fluorine-containing and/or silicon-containing surfactants, described in paragraph [0280] of U.S. Patent Application Publication No. 2008/0248425, may be also used.

One of these surfactants may be used alone, or some of them may be used in combination.

The resin composition (I) or (II) for use in the present invention may or may not contain a surfactant, but in the case where the resin composition (I) or (II) contains a surfactant, the amount of the surfactant used is preferably from 0.0001 to 2 mass %, more preferably from 0.0005 to 1 mass %, based on the entire amount of the resin composition (I) or (II) (excluding the solvent).

[8] (G) Other Additives

The resin composition (I) or (II) for use in the present invention may or may not contain an onium carboxylate. Examples of the onium carboxylate include those described in paragraphs [0605] to [0606] of U.S. Patent Application Publication No. 2008/0187860.

Such an onium carboxylate can be synthesized by reacting a sulfonium hydroxide, iodonium hydroxide or ammonium hydroxide and a carboxylic acid with silver oxide in an appropriate solvent.

In the case where the resin composition (I) or (II) contains an onium carboxylate, the content thereof is generally from 0.1 to 20 mass %, preferably from 0.5 to 10 mass %, more preferably from 1 to 7 mass %, based on the entire solid content of the composition (I) or (II).

The resin composition (I) or (II) for use in the present invention may further contain, for example, a dye, a plasticizer, a photosensitizer, a light absorber, an alkali-soluble resin, a dissolution inhibitor, and a compound for accelerating dissolution in a developer (for example, a phenol compound having a molecular weight of 1,000 or less, or a carboxyl group-containing alicyclic or aliphatic compound), if desired.

The phenol compound having a molecular weight of 1,000 or less can be easily synthesized by one skilled in the art by referring to the method described, for example, in JP-A-4-122938, JP-A-2-28531, U.S. Pat. No. 4,916,210 or European Patent 219294.

Specific examples of the carboxyl group-containing alicyclic or aliphatic compound include, but are not limited to, a carboxylic acid derivative having a steroid structure, such as cholic acid, deoxycholic acid and lithocholic acid, an adamantanecarboxylic acid derivative, an adamantanedicarboxylic acid, a cyclohexanecarboxylic acid, and a cyclohexanedicarboxylic acid.

In the foregoing pages, although the resin composition for use in the present invention is described, the content of the crosslinking agent selected from the group consisting of a crosslinking agent capable of crosslinking the first resin by the action of an acid to form a crosslinked product and a crosslinking agent capable of crosslinking to another crosslinking agent by the action of an acid to form a crosslinked product, is preferably 1 mass % or less based on the entire solid content of the first resin composition (I).

It is more preferred that the first resin composition (I) does not contain a crosslinking agent selected from the group consisting of a crosslinking agent capable of crosslinking the first resin by the action of an acid to form a crosslinked product and a crosslinking agent capable of crosslinking to another crosslinking agent by the action of an acid to form a crosslinked product By employing these embodiments, generation of a bridge defect can be more reduced.

The solid content concentration of each of the resin compositions (I) and (II) for use in the present invention is usually from 1.0 to 15 mass %, preferably from 1.5 to 13 mass %, more preferably from 2.0 to 12 mass %. By setting the solid content concentration to the range above, the resist solution can be uniformly coated on a substrate and furthermore, a resist pattern having high resolution, a rectangular profile and excellent etching resistance can be formed. The reason therefor is not clearly known, but it is considered that by virtue of setting the solid content concentration to 10 mass % or less, preferably 5.7 mass % or less, aggregation of materials, particularly a photoacid generator, in the resist solution is inhibited, as a result, a uniform resist film can be formed.

The solid content concentration is a weight percentage of the weight of resist components excluding the solvent, based on the total weight of the resin composition.

Each of the resin compositions (I) and (II) for use in the present invention is used by dissolving the components above in a predetermined organic solvent, preferably in the above-described mixed solvent, filtering the solution through a filter, and coating it on a predetermined support (substrate). The filter used for filtration is preferably a polytetrafluoroethylene-, polyethylene- or nylon-made filter having a pore size of 0.1 μm or less, more preferably 0.05 μm or less, still more preferably 0.03 μm or less. In the filtration through a filter, as described, for example, in JP-A-2002-62667, circulating filtration may be performed, or the filtration may be performed by connecting a plurality of kinds of filters in series or in parallel. Also, the composition may be filtered a plurality of times. Furthermore, a deaeration treatment or the like may be applied to the composition before and after filtration through a filter.

[9] Pattern Forming Method

The pattern forming method (negative pattern forming method) of the present invention comprises:

(i) a step of forming a bottom anti-reflective coating on a substrate by using a first resin composition (I), (ii) a step of forming a resist film on the bottom anti-reflective coating by using a second resin composition (II), (iii) a step of exposing a multi-layered film having the bottom anti-reflective coating and the resist film, and (iv) a step of developing the bottom anti-reflective coating and the resist film in the exposed multi-layered film by using an organic solvent-containing developer to form a negative pattern.

In the pattern forming method of the present invention, from the standpoint of enhancing the resolution, each of the bottom anti-reflective coating and the resist film preferably has a film thickness of 30 to 250 nm, more preferably from 30 to 200 nm. Such a film thickness can be obtained by setting the solid content concentration in each composition to an appropriate range, thereby imparting an appropriate viscosity and enhancing the coatability and film-forming property.

In the pattern forming method of the present invention, the exposure step (iii) may be performed a plurality of times.

The exposure in the step (iii) may be immersion exposure.

In the pattern forming method of the present invention, the step of forming a film on a substrate by using each of the resin compositions (I) and (II), the step of exposing the multi-layered film, and the development step can be performed by generally known methods.

In the pattern forming method of the present invention, the heating step may be performed a plurality of times.

In the present invention, it is preferred to further contain a heating step at least either before the exposure step (iii) or after the exposure step (iii) but before the development step (iv).

It is more preferred to contain a pre-baking step (PB) after the film formation step (i) of the first film but before the film formation step (ii) of the second film.

It is also preferred to contain a pre-baking step (PB) after the film formation of the second film but before the exposure step (iii).

Furthermore, it is also preferred to contain a post-exposure baking step (PEB) after the exposure step (iii) but before the development step (iv).

As for the heating temperature, both PB and PEB are preferably performed at 70 to 150° C., more preferably at 80 to 140° C.

The heating time is preferably from 30 to 300 seconds, more preferably from 30 to 180 seconds, still more preferably from 30 to 90 seconds.

The heating can be performed using a device attached to an ordinary exposure/developing machine or may be performed using a hot plate or the like.

Thanks to baking, the reaction in the exposed area is accelerated, and the sensitivity and pattern profile are improved.

The light source wavelength of the exposure apparatus for use in the present invention is not limited, and the light source includes, for example, near infrared light, visible light, ultraviolet light, far ultraviolet light, extreme-ultraviolet light, X-ray and electron beam but is preferably far ultraviolet light at a wavelength of 250 nm or less, more preferably 220 nm or less, still more preferably from 1 to 200 nm. Specific examples thereof include a KrF excimer laser (248 nm), an ArF excimer laser (193 nm), an $F_2$ excimer laser (157 nm), an X-ray, an EUV (13 nm) and an electron beam. A KrF excimer laser, an ArF excimer laser, an EUV and an electron beam are preferred, and a KrF excimer laser and an ArF excimer laser are more preferred.

In the present invention, the substrate on which the film is formed is not particularly limited, and an inorganic substrate such as silicon, SiN, $SiO_2$ and SiN, a coating-type inorganic substrate such as SOG, or a substrate generally used in the process of producing a semiconductor such as IC or producing a liquid crystal device or a circuit board such as thermal head or in the lithography of other photo-fabrication processes can be used.

For example, in microfabrication such as application to ion plantation, the pattern forming method of the present invention may use a stepped substrate as the substrate.

The stepped substrate is a substrate where at least one stepped shape is formed on a substrate.

The thickness of the multi-layered film formed on the stepped substrate means the height from the bottom on the stepped substrate to the top of the multi-layered film formed.

The height from the bottom of the stepped substrate to the top of the stepped shape is preferably smaller than the thickness of the multi-layered film and is, for example, less than 200 nm.

For example, in the case of microfabrication such as application to ion implantation, a substrate obtained by patterning fins or gates on a flat substrate can be used as the stepped substrate. The thickness of the multi-layered film formed by coating the resin compositions (I) and (II) on such a stepped substrate having patterned thereon fins or gates means not a height from the top of the fin or gate to the top of the multi-layered film formed but, as described above, a height from the bottom on the stepped substrate to the top of the multi-layered film formed.

As for the size (e.g., width, length, height), interval, structure, configuration and the like of fins and gates, those described, for example, in "Saisentan FinFET Process/Shuseki-ka Gijutsu (Advanced FinFET Process/Integration Technology)" of *Journal of IEICE*, Vol. 91, No. 1, pp. 25-29 (2008), and "Fin-Type Double-Gate Metal-Oxide-Semiconductor Field-Effect Transistors Fabricated by Orientation-Dependent Etching and Electron Beam Lithography" of *Jpn. J. Appl. Phys.*, Vol. 42 (2003), pp. 4142-4146, Part 1, No. 6B, June 2003, may be appropriately applied.

In the pattern forming method of the present invention, as for the developer in the step of performing development by using an organic solvent-containing developer (hereinafter, sometimes referred to as an "organic developer"), a polar solvent such as ketone-based solvent, ester-based solvent, alcohol-based solvent, amide-based solvent and ether-based solvent, or a hydrocarbon-based solvent can be used.

Examples of the ketone-based solvent include 1-octanone, 2-octanone, 1-nonanone, 2-nonanone, acetone, 2-heptanone (methyl amyl ketone), 4-heptanone, 1-hexanone, 2-hexanone, diisobutyl ketone, cyclohexanone, methylcyclohexanone, phenylacetone, methyl ethyl ketone, methyl isobutyl ketone, acetyl acetone, acetonyl acetone, ionone, diacetonyl alcohol, acetyl carbinol, acetophenone, methyl naphthyl ketone, isophorone, and propylene carbonate.

Examples of the ester-based solvent include methyl acetate, butyl acetate, ethyl acetate, isopropyl acetate, pentyl acetate, isopentyl acetate, amyl acetate, propylene glycol monomethyl ether acetate, ethylene glycol monoethyl ether acetate, diethylene glycol monobutyl ether acetate, diethylene glycol monoethyl ether acetate, ethyl-3-ethoxypropionate, 3-methoxybutyl acetate, 3-methyl-3-methoxybutyl acetate, methyl formate, ethyl formate, butyl formate, propyl formate, ethyl lactate, butyl lactate, and propyl lactate.

Examples of the alcohol-based solvent include an alcohol such as methyl alcohol, ethyl alcohol, n-propyl alcohol, isopropyl alcohol, n-butyl alcohol, sec-butyl alcohol, tert-butyl alcohol, isobutyl alcohol, n-hexyl alcohol, n-heptyl alcohol, n-octyl alcohol and n-decanol; a glycol-based solvent such as ethylene glycol, diethylene glycol and triethylene glycol; and a glycol ether-based solvent such as ethylene glycol monomethyl ether, propylene glycol monomethyl ether, ethylene glycol monoethyl ether, propylene glycol monoethyl ether, diethylene glycol monomethyl ether, triethylene glycol monoethyl ether and methoxymethyl butanol.

Examples of the ether-based solvent include, in addition to the glycol ether-based solvents above, dioxane and tetrahydrofuran.

Examples of the amide-based solvent which can be used include N-methyl-2-pyrrolidone, N,N-dimethylacetamide, N,N-dimethylformamide, hexamethylphosphoric triamide and 1,3-dimethyl-2-imidazolidinone.

Examples of the hydrocarbon-based solvent include an aromatic hydrocarbon-based solvent such as toluene and xylene, and an aliphatic hydrocarbon-based solvent such as pentane, hexane, octane and decane.

A plurality of these solvents may be mixed, or the solvent may be used by mixing it with a solvent other than those described above or with water. However, in order to sufficiently bring out the effects of the present invention, the water content ratio in the entire developer is preferably less than 10 mass %, and it is more preferred to contain substantially no water.

That is, the amount of the organic solvent used in the organic developer is preferably from 90 to 100 mass %, more preferably from 95 to 100 mass %, based on the entire amount of the developer.

In particular, the organic developer is preferably a developer containing at least one kind of an organic solvent selected from the group consisting of a ketone-based solvent, an ester-based solvent, an alcohol-based solvent, an amide-based solvent and an ether-based solvent.

The vapor pressure at 20° C. of the organic developer is preferably 5 kPa or less, more preferably 3 kPa or less, still more preferably 2 kPa or less. By setting the vapor pressure of the organic developer to 5 kPa or less, evaporation of the developer on a substrate or in a development cup is suppressed and the temperature uniformity in the wafer plane is enhanced, as a result, the dimensional uniformity in the wafer plane is improved.

Specific examples of the solvent having a vapor pressure of 5 kPa or less include a ketone-based solvent such as 1-octanone, 2-octanone, 1-nonanone, 2-nonanone, 2-heptanone (methyl amyl ketone), 4-heptanone, 2-hexanone, diisobutyl ketone, cyclohexanone, methylcyclohexanone, phenylacetone and methyl isobutyl ketone; an ester-based solvent such as butyl acetate, pentyl acetate, isopentyl acetate, amyl acetate, propylene glycol monomethyl ether acetate, ethylene glycol monoethyl ether acetate, diethylene glycol monobutyl ether acetate, diethylene glycol monoethyl ether acetate, ethyl-3-ethoxypropionate, 3-methoxybutyl acetate, 3-methyl-3-methoxybutyl acetate, butyl formate, propyl formate, ethyl lactate, butyl lactate and propyl lactate; an alcohol-based solvent such as n-propyl alcohol, isopropyl alcohol, n-butyl alcohol, sec-butyl alcohol, tert-butyl alcohol, isobutyl alcohol, n-hexyl alcohol, n-heptyl alcohol, n-octyl alcohol and n-decanol; a glycol-based solvent such as ethylene glycol, diethylene glycol and triethylene glycol; a glycol ether-based solvent such as ethylene glycol monomethyl ether, propylene glycol monomethyl ether, ethylene glycol monoethyl ether, propylene glycol monoethyl ether, diethylene glycol monomethyl ether, triethylene glycol monoethyl ether and methoxymethylbutanol; an ether-based solvent such as tetrahydrofuran; an amide-based solvent such as N-methyl-2-pyrrolidone, N,N-dimethylacetamide and N,N-dimethylformamide; an aromatic hydrocarbon-based solvent such as toluene and xylene; and an aliphatic hydrocarbon-based solvent such as octane and decane.

Specific examples of the solvent having a vapor pressure of 2 kPa or less that is a particularly preferred range include a ketone-based solvent such as 1-octanone, 2-octanone, 1-nonanone, 2-nonanone, 4-heptanone, 2-hexanone, diisobutyl ketone, cyclohexanone, methylcyclohexanone and phenylacetone; an ester-based solvent such as butyl acetate, amyl acetate, propylene glycol monomethyl ether acetate, ethylene glycol monoethyl ether acetate, diethylene glycol monobutyl ether acetate, diethylene glycol monoethyl ether acetate, ethyl-3-ethoxypropionate, 3-methoxybutyl acetate, 3-methyl-3-methoxybutyl acetate, ethyl lactate, butyl lactate and propyl lactate; an alcohol-based solvent such as n-butyl alcohol, sec-butyl alcohol, tert-butyl alcohol, isobutyl alcohol, n-hexyl alcohol, n-heptyl alcohol, n-octyl alcohol and n-decanol; a glycol-based solvent such as ethylene glycol, diethylene glycol and triethylene glycol; a glycol ether-based solvent such as ethylene glycol monomethyl ether, propylene glycol monomethyl ether, ethylene glycol monoethyl ether, propylene glycol monoethyl ether, diethylene glycol monomethyl ether, triethylene glycol monoethyl ether and methoxymethylbutanol; an amide-based solvent such as N-methyl-2-pyrrolidone, N,N-dimethylacetamide and N,N-dimethylformamide; an aromatic hydrocarbon-based solvent such as xylene; and an aliphatic hydrocarbon-based solvent such as octane and decane.

In the organic developer, an appropriate amount of a surfactant may be added, if desired.

The surfactant is not particularly limited but, for example, ionic or nonionic fluorine-containing and/or silicon-containing surfactants can be used. Examples of such fluorine-containing and/or silicon-containing surfactants include surfactants described in JP-A-62-36663, JP-A-61-226746, JP-A-61-226745, JP-A-62-170950, JP-A-63-34540, JP-A-7-230165, JP-A-8-62834, JP-A-9-54432, JP-A-9-5988 and U.S. Pat. Nos. 5,405,720, 5,360,692, 5,529,881, 5,296,330, 5,436,098, 5,576,143, 5,294,511 and 5,824,451. A nonionic surfactant is preferred. The nonionic surfactant is not particularly limited, but use of a fluorine-containing surfactant or a silicon-containing surfactant is more preferred.

The amount of the surfactant used is usually from 0.001 to 5 mass %, preferably from 0.005 to 2 mass %, more preferably from 0.01 to 0.5 mass %, based on the entire amount of the developer.

As regards the developing method, for example, a method of dipping the substrate in a bath filled with the developer for a fixed time (dipping method), a method of raising the developer on the substrate surface by the effect of a surface tension and keeping it still for a fixed time, thereby performing development (puddle method), a method of spraying the developer on the substrate surface (spraying method), and a method of continuously ejecting the developer on the substrate spinning at a constant speed while scanning the developer ejecting nozzle at a constant rate (dynamic dispense method) may be applied.

In the case where the above-described various developing methods include a step of ejecting the developer toward the resist film from a development nozzle of a developing apparatus, the ejection pressure of the developer ejected (the flow velocity per unit area of the developer ejected) is preferably 2 $mL/sec/mm^2$ or less, more preferably 1.5 $mL/sec/mm^2$ or less, still more preferably 1 $mL/sec/mm^2$ or less. The flow velocity has no particular lower limit but in view of throughput, is preferably 0.2 $mL/sec/mm^2$ or more.

By setting the ejection pressure of the ejected developer to the range above, pattern defects attributable to the resist scum after development can be greatly reduced.

Details of this mechanism are not clearly known, but it is considered that thanks to the ejection pressure in the above-described range, the pressure imposed on the resist film by the developer becomes small and the resist film•resist pattern is kept from inadvertent chipping or collapse.

Here, the ejection pressure ($mL/sec/mm^2$) of the developer is a value at the outlet of a development nozzle in a developing apparatus.

Examples of the method for adjusting the ejection pressure of the developer include a method of adjusting the ejection pressure by a pump or the like, and a method of supplying the developer from a pressurized tank and adjusting the pressure to change the ejection pressure.

After the step of performing development by using an organic solvent-containing developer, a step of stopping the development by replacing the solvent with another solvent may be practiced.

It is preferred to provide a step of rinsing the film with a rinsing solution after the step of performing development by using an organic solvent-containing developer.

The rinsing solution used in the rinsing step after the step of performing development by using an organic solvent-containing developer is not particularly limited as long as it does not dissolve the resist pattern, and a solution containing a general organic solvent may be used. As for the rinsing solution, a rinsing solution containing at least one kind of an organic solvent selected from the group consisting of a hydrocarbon-based solvent, a ketone-based solvent, an ester-based solvent, an alcohol-based solvent, an amide-based solvent and an ether-based solvent is preferably used.

Specific examples of the hydrocarbon-based solvent, ketone-based solvent, ester-based solvent, alcohol-based solvent, amide-based solvent and ether-based solvent are the same as those described above for the organic solvent-containing developer.

After the step of performing development by using an organic solvent-containing developer, more preferably, a step of rinsing the film by using a rinsing solution containing at least one kind of an organic solvent selected from the group consisting of a ketone-based solvent, an ester-based solvent, an alcohol-based solvent and an amide-based solvent is preformed; still more preferably, a step of rinsing the film by using a rinsing solution containing an alcohol-based solvent or an ester-based solvent is performed; yet still more preferably, a step of rinsing the film by using a rinsing solution containing a monohydric alcohol is performed; and most preferably, a step of rinsing the film by using a rinsing solution containing a monohydric alcohol having a carbon number of 5 or more is performed.

The monohydric alcohol used in the rinsing step includes a linear, branched or cyclic monohydric alcohol, and specific examples of the monohydric alcohol which can be used include 1-butanol, 2-butanol, 3-methyl-1-butanol, tert-butyl alcohol, 1-pentanol, 2-pentanol, 1-hexanol, 4-methyl-2-pentanol, 1-heptanol, 1-octanol, 2-hexanol, cyclopentanol, 2-heptanol, 2-octanol, 3-hexanol, 3-heptanol, 3-octanol and 4-octanol. As for the particularly preferred monohydric alcohol having a carbon number of 5 or more, 1-hexanol, 2-hexanol, 4-methyl-2-pentanol, 1-pentanol, 3-methyl-1-butanol and the like can be used.

A plurality of these components may be mixed, or the solvent may be used by mixing it with an organic solvent other than those described above.

The water content ratio in the rinsing solution is preferably 10 mass % or less, more preferably 5 mass % or less, still more preferably 3 mass % or less. By setting the water content ratio to 10 mass % or less, good development characteristics can be obtained.

The vapor pressure at 20° C. of the rinsing solution used after the step of performing development by using an organic solvent-containing developer is preferably from 0.05 to 5 kPa, more preferably from 0.1 to 5 kPa, and most preferably from 0.12 to 3 kPa. By setting the vapor pressure of the rinsing solution to the range from 0.05 to 5 kPa, the temperature uniformity in the wafer plane is enhanced and moreover, swelling due to permeation of the rinsing solution is suppressed, as a result, the dimensional uniformity in the wafer plane is improved.

The rinsing solution may be also used after adding thereto an appropriate amount of a surfactant.

In the rinsing step, the wafer after development using an organic solvent-containing developer is rinsed using the above-described organic solvent-containing rinsing solution. The method for rinsing treatment is not particularly limited, but examples of the method which can be applied include a method of continuously ejecting the rinsing solution on the substrate spinning at a constant speed (spin coating method), a method of dipping the substrate in a bath filled with the rinsing solution for a fixed time (dipping method), and a method of spraying the rinsing solution on the substrate surface (spraying method). Above all, it is preferred to perform the rinsing treatment by the spin coating method and after the rinsing, remove the rinsing solution from the substrate surface by spinning the substrate at a rotational speed of 2,000 to 4,000 rpm. It is also preferred to include a heating step (Post Bake) after the rinsing step. The developer and rinsing solution remaining between patterns as well as in the inside of the pattern are removed by the baking. The heating step after the rinsing step is performed at usually from 40 to 160° C., preferably from 70 to 95° C., for usually from 10 seconds to 3 minutes, preferably from 30 to 90 seconds.

In the case where the pattern forming method of the present invention further includes a step of developing the film by using an alkali developer, examples of the alkali developer which can be used include an alkaline aqueous solution of inorganic alkalis such as sodium hydroxide, potassium hydroxide, sodium carbonate, sodium silicate, sodium metasilicate and aqueous ammonia, primary amines such as ethylamine and n-propylamine, secondary amines such as diethylamine and di-n-butylamine, tertiary amines such as triethylamine and methyldiethylamine, alcohol amines such as dimethylethanolamine and triethanolamine, quaternary ammonium salts such as tetramethylammonium hydroxide and tetraethylammonium hydroxide, or cyclic amines such as pyrrole and piperidine.

The alkaline aqueous solution above may be also used after adding thereto alcohols and a surfactant each in an appropriate amount.

The alkali concentration of the alkali developer is usually from 0.1 to 20 mass %.

The pH of the alkali developer is usually from 10.0 to 15.0.

In particular, an aqueous 2.38 mass % tetramethylammonium hydroxide solution is preferred.

As the rinsing solution in the rinsing treatment performed after the alkali development, pure water is used, and the pure water may be also used after adding thereto an appropriate amount of a surfactant.

After the development treatment or rinsing treatment, a treatment of removing the developer or rinsing solution adhering on the pattern by a supercritical fluid may be performed.

The present invention also relates to a method for manufacturing an electronic device, comprising the pattern forming method of the present invention, and an electronic device manufactured by this manufacturing method.

The electronic device of the present invention is suitably mounted on electric electronic equipment (such as home electronic device, OA•media-related device, optical device and communication device).

EXAMPLES

The present invention is described in greater detail below by referring to Examples, but the present invention should not be construed as being limited to these Examples.

Synthesis Example 1

Synthesis of Resin (Pol-1)

In a nitrogen stream, 15.6 parts by mass of cyclohexanone was charged into a three-neck flask and heated at 70° C. Subsequently, a mixed solution containing a monomer (4.8 parts by mass) corresponding to unit-14 shown below, a monomer (27.5 parts by mass) corresponding to unit-28 shown below, a monomer (1.1 parts by mass) corresponding to unit-17 shown below, 0.92 parts by mass of dimethyl 2,2'-azobisisobutyrate [V-601, produced by Wako Pure Chemical Industries, Ltd.], and cyclohexanone (62.3 parts by mass) was added dropwise to the flask over 6 hours. After the completion of dropwise addition, the reaction was further allowed to proceed at 70° C. for 2 hours. The reaction solution was left standing to cool, reprecipitated in a large amount of methanol/water (6/4 by mass) and filtered, and the obtained solid was vacuum-dried to obtain 27.5 parts by mass of Resin (pol-1). The weight average molecular weight of Resin (pol-1) obtained was 18,300, the polydispersity (Mw/Mn) was 1.8, and the compositional ratio as measured by $^{13}$C-NMR was 20/70/10.

Resins (Pol-2) to (Pol-24) were synthesized by the same operation as in Synthesis Example 1.

With respect to Resins (Pol-1) to (Pol-24), the repeating unit (unit), the compositional ratio (molar ratio), the weight average molecular weight (Mw) and the polydispersity are shown in Tables 3 to 6 below. The numerals in the compositional ratio correspond to repeating units starting from the left.

TABLE 3

| Resin No | Unit 1 | Unit 2 | Unit 3 | Unit 4 | Compositional Ratio | Mw | Polydispersity |
|---|---|---|---|---|---|---|---|
| Pol-01 | 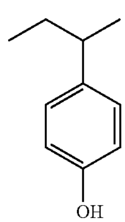 unit-14 | 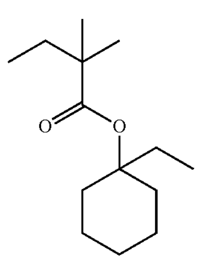 [SMILES: CCC1(OC(=O)C(C)(C)CC)CCCCC1] unit-28 | 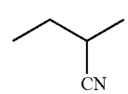 unit-17 | — | 20/70/10 | 18300 | 1.8 |

TABLE 3-continued
| Resin No | Unit 1 | Unit 2 | Unit 3 | Unit 4 | Com-posi-tional Ratio | Mw | Poly-disper-sity |
|---|---|---|---|---|---|---|---|
| Pol-02 | 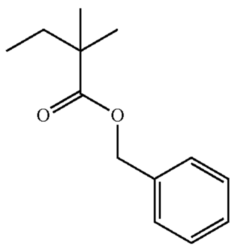 unit-7 | 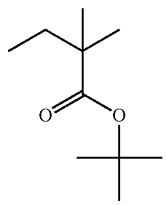 unit-23 | 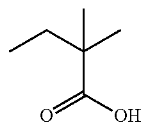 unit-16 | — | 40/40/20 | 24800 | 1.7 |
| Pol-03 | 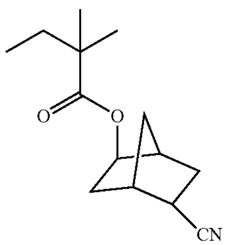 [SMILES: CCC(C)(C)C(=O)OC1CC2CC1CC2C#N] unit-4 | 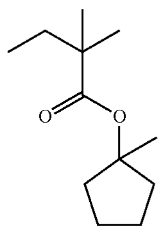 unit-26 | 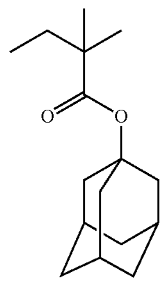 [SMILES: CCC(C)(C)C(=O)OC12CC3CC(CC(C3)C1)C2] unit-10 | 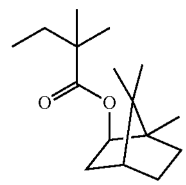 [SMILES: CCC(C)(C)C(=O)OC1CC2CCC1(C)C2(C)C] unit-9 | 30/60/5/5 | 27300 | 1.7 |
| Pol-04 | 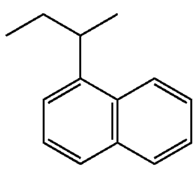 unit-13 | 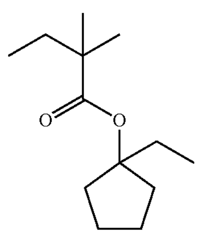 unit-27 | 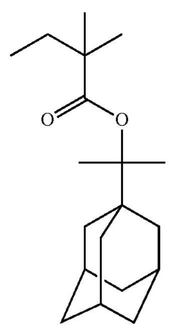 [SMILES: CCC(C)(C)C(=O)OC(C)(C)C12CC3CC(CC(C3)C1)C2] unit-29 | 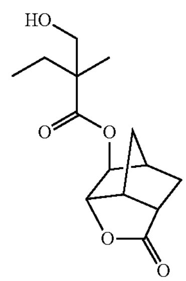 [SMILES: CCC(C)(CO)C(=O)OC1C2CC3C(=O)OC1C3C2] unit-11 | 40/30/10/20 | 16400 | 1.6 |
| Pol-05 | 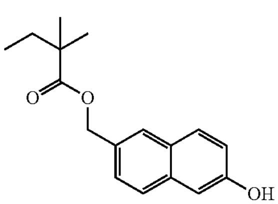 [SMILES: CCC(C)(C)C(=O)OCc1ccc2cc(O)ccc2c1] unit-19 | 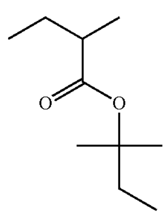 unit-24 | 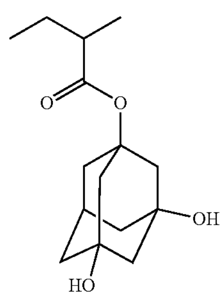 [SMILES: CCC(C)C(=O)OC12CC3CC(O)(CC(O)(C3)C1)C2] unit-6 | — | 50/40/10 | 13100 | 1.7 |

TABLE 3-continued
| Resin No | Unit 1 | Unit 2 | Unit 3 | Unit 4 | Compositional Ratio | Mw | Polydispersity |
|---|---|---|---|---|---|---|---|
| Pol-06 | 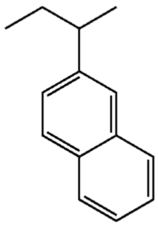 unit-18 | 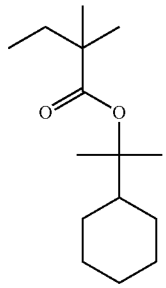 [SMILES: CCC(C)(C)C(=O)OC(C)(C)C1CCCCC1] unit-25 | 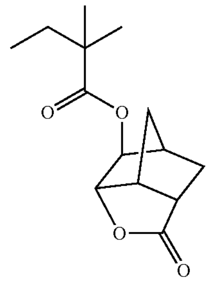 [SMILES: CCC(C)(C)C(=O)OC1C2CC3C(=O)OC1C3C2] unit-1 | — | 40/40/20 | 21600 | 1.7 |
| Pol-07 | 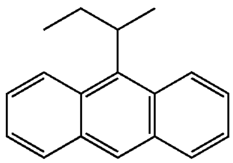 [SMILES: CCC(C)c1c2ccccc2cc2ccccc12] unit-20 | 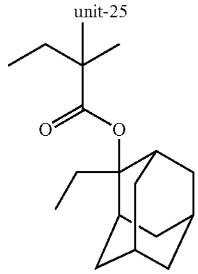 unit-30 | 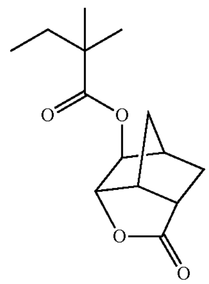 [SMILES: CCC(C)(C)C(=O)OC1C2CC3C(=O)OC1C3C2] unit-1 | — | 30/60/10 | 9800 | 1.6 |
TABLE 4
| Resin No | Unit 1 | Unit 2 | Unit 3 | Unit 4 | Compositional Ratio | Mw | Polydispersity |
|---|---|---|---|---|---|---|---|
| Pol-08 | 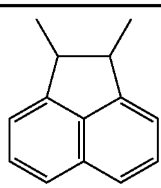 unit-21 | 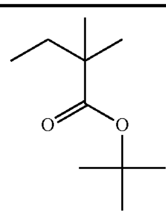 unit-23 | 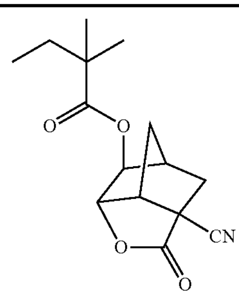 unit-2 | 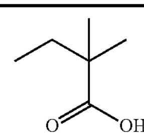 unit-16 | 30/40/20/10 | 13800 | 1.7 |
| Pol-09 | 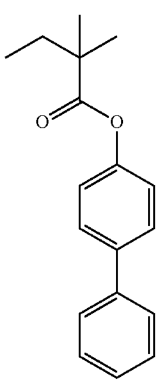 [SMILES: CCC(C)(C)C(=O)Oc1ccc(-c2ccccc2)cc1] unit-22 | 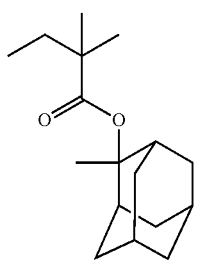 [SMILES: CCC(C)(C)C(=O)OC1(C)C2CC3CC(C2)CC1C3] unit-31 | 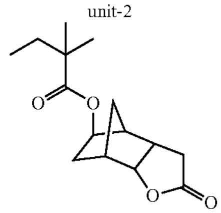 unit-3 | — | 40/50/10 | 17700 | 1.7 |

TABLE 4-continued
| Resin No | Unit 1 | Unit 2 | Unit 3 | Unit 4 | Com-posi-tional Ratio | Mw | Poly-disper-sity |
|---|---|---|---|---|---|---|---|
| Pol-10 | 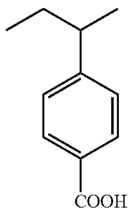 unit-15 | 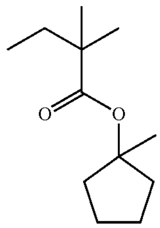 unit-26 | — | — | 40/60 | 11300 | 1.6 |
| Pol-11 | 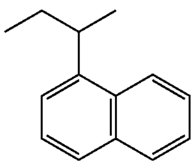 unit-13 | 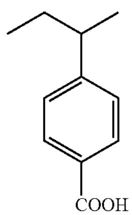 unit-15 | 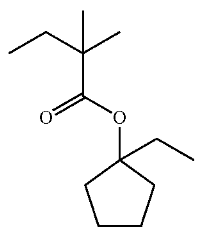 unit-27 | — | 30/10/60 | 15900 | 1.7 |
| Pol-12 | 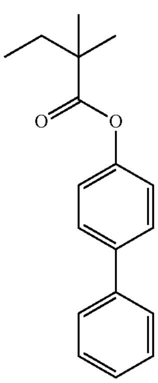 [SMILES: CCC(C)(C)C(=O)Oc1ccc(-c2ccccc2)cc1] unit-22 | 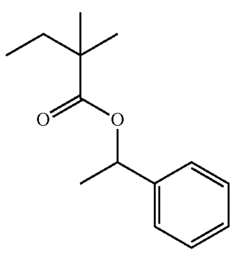 [SMILES: CCC(C)(C)C(=O)OC(C)c1ccccc1] unit-8 | 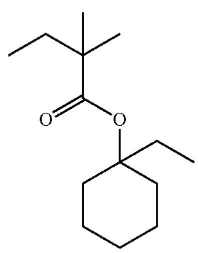 [SMILES: CCC1(OC(=O)C(C)(C)CC)CCCCC1] unit-28 | 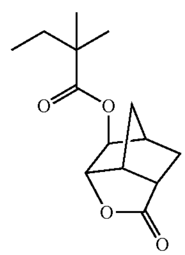 [SMILES: CCC(C)(C)C(=O)OC1C2CC3C(=O)OC1C3C2] unit-1 | 45/10/40/5 | 17900 | 1.7 |
| Po1-13 | 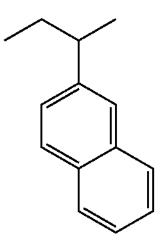 unit-18 | 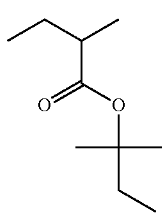 unit-24 | 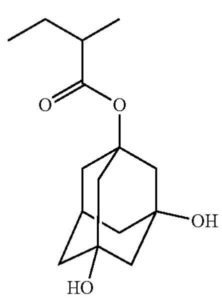 [SMILES: CCC(C)C(=O)OC12CC3CC(O)(CC(O)(C3)C1)C2] unit-6 | — | 40/40/20 | 11300 | 1.6 |

TABLE 5
| Resin No | Unit 1 | Unit 2 | Unit 3 | Unit 4 | Composi-tional Ratio | Mw | Poly-disper-sity |
|---|---|---|---|---|---|---|---|
| Pol-14 | 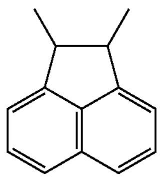 unit-21 | 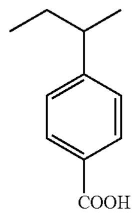 unit-15 | 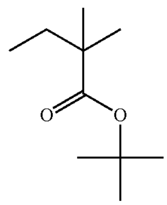 unit-23 | 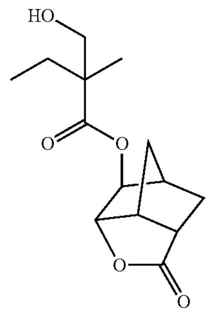 [SMILES: CCC(C)(CO)C(=O)OC1C2CC3C(=O)OC1C3C2] unit-11 | 30/30/35/5 | 19500 | 1.7 |
| Pol-15 | 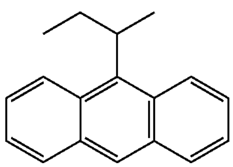 [SMILES: CCC(C)c1c2ccccc2cc2ccccc12] unit-20 | 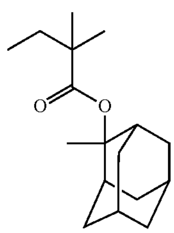 [SMILES: CCC(C)(C)C(=O)OC1(C)C2CC3CC(C2)CC1C3] unit-31 | 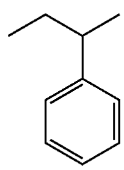 unit-12 | 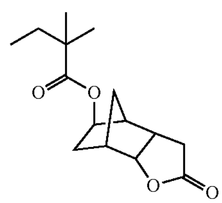 [SMILES: CCC(C)(C)C(=O)OC1CC2CC1C1CC(=O)OC21] unit-3 | 30/50/5/15 | 14400 | 1.7 |
| Pol-16 | 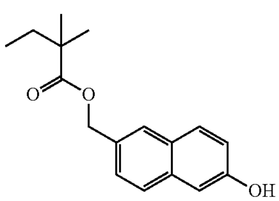 [SMILES: CCC(C)(C)C(=O)OCc1ccc2cc(O)ccc2c1] unit-19 | 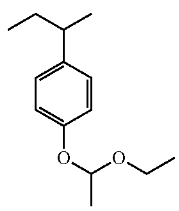 [SMILES: CCOC(C)Oc1ccc(C(C)CC)cc1] unit-32 | 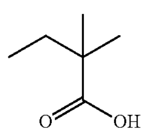 unit-16 | 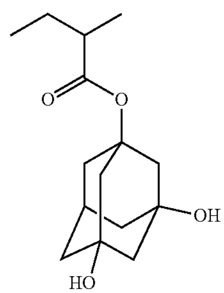 [SMILES: CCC(C)C(=O)OC12CC3CC(O)(CC(O)(C3)C1)C2] unit-6 | 40/30/10/20 | 18900 | 1.7 |
| Pol-17 | 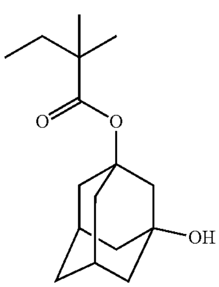 [SMILES: CCC(C)(C)C(=O)OC12CC3CC(CC(O)(C3)C1)C2] unit-5 | 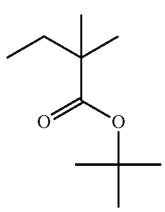 unit-23 | 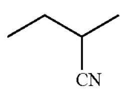 unit-17 | 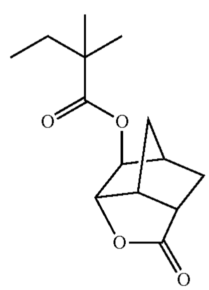 [SMILES: CCC(C)(C)C(=O)OC1C2CC3C(=O)OC1C3C2] unit-1 | 30/50/10/10 | 13100 | 1.7 |

TABLE 6
| Resin No | Unit 1 | Unit 2 | Unit 3 | Unit 4 | Composi-tional Ratio | Mw | Poly-disper-sity |
|---|---|---|---|---|---|---|---|
| Pol-18 | 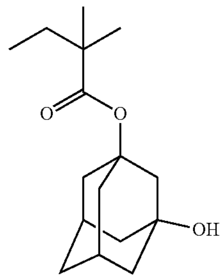 [SMILES: CCC(C)(C)C(=O)OC12CC3CC(CC(O)(C3)C1)C2] unit-5 | 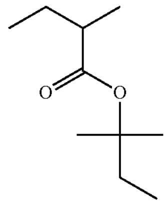 unit-24 | 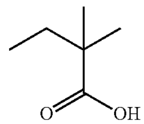 unit-16 | — | 30/60/10 | 26300 | 1.7 |
| Pol-19 | 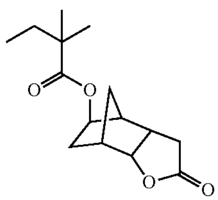 [SMILES: CCC(C)(C)C(=O)OC1CC2CC1C1CC(=O)OC21] unit-3 | 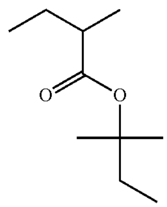 unit-24 | — | — | 40/60 | 10500 | 1.7 |
| Pol-20 | 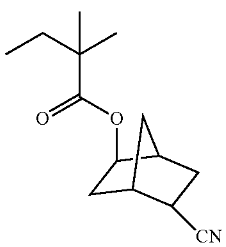 [SMILES: CCC(C)(C)C(=O)OC1CC2CC1CC2C#N] unit-4 | 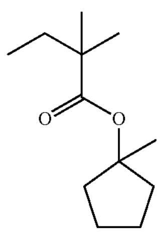 unit-26 | 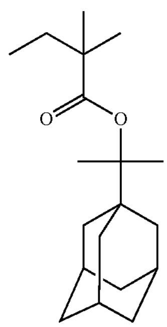 unit-29 | 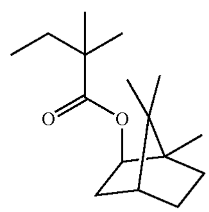 [SMILES: CCC(C)(C)C(=O)OC1CC2CCC1(C)C2(C)C] unit-9 | 40/50/5/5 | 17300 | 1.7 |
| Pol-21 | 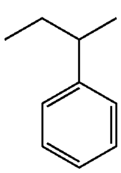 unit-12 | 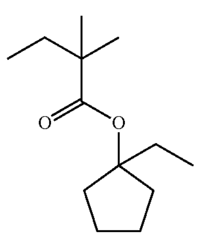 unit-27 | 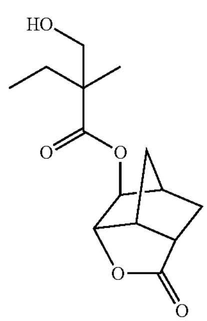 [SMILES: CCC(C)(CO)C(=O)OC1C2CC3C(=O)OC1C3C2] unit-11 | — | 40/30/30 | 21300 | 1.6 |

TABLE 6-continued

| Resin No | Unit 1 | Unit 2 | Unit 3 | Unit 4 | Composi-tional Ratio | Mw | Poly-disper-sity |
|---|---|---|---|---|---|---|---|
| Pol-22 | 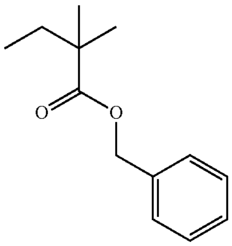 unit-7 | 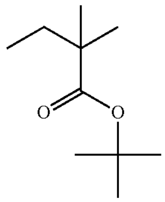 unit-23 | 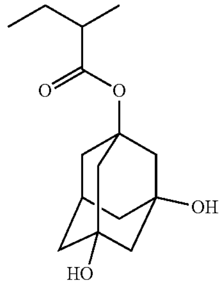 [SMILES: CCC(C)C(=O)OC12CC3CC(O)(CC(O)(C3)C1)C2] unit-6 | — | 40/50/10 | 17100 | 1.7 |
| Pol-23 | 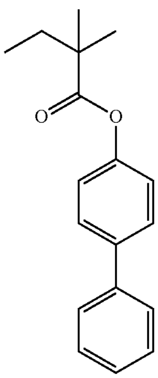 [SMILES: CCC(C)(C)C(=O)Oc1ccc(-c2ccccc2)cc1] unit-22 | 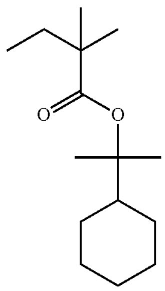 [SMILES: CCC(C)(C)C(=O)OC(C)(C)C1CCCCC1] unit-25 | — | — | 40/60 | 16800 | 1.7 |
| Pol-24 | 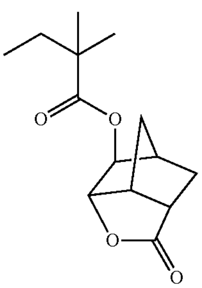 [SMILES: CCC(C)(C)C(=O)OC1C2CC3C(=O)OC1C3C2] unit-1 | 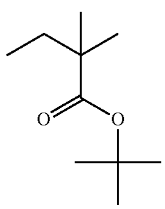 unit-23 | 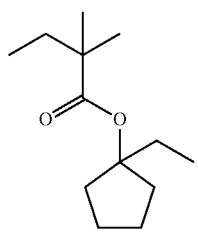 unit-27 | — | 30/40/30 | 22400 | 1.7 |

[Preparation of Resin Composition]

The components shown in Tables 7 to 10 below were dissolved in a solvent to prepare a resist solution, and this solution was filtered through a polyethylene filter having a pore size of 0.03 μm to prepare a resin composition (resist composition). In Tables 7 to 10 below, (mass %) is a value based on the entire solid content of the composition. The solid content concentration of each resin composition was appropriately adjusted in a range of 2.0 to 7.0 mass % so that the composition can be coated to the thickness shown in Tables 11 and 12 below.

TABLE 7

| Resin Composition | Resin-A (mass %)* | Resin-B (mass %) | Acid Generator-A (mass %) | Acid Generator-B (mass %) | Basic Compound-A (mass %) | Basic Compound-B (mass %) | Additive-1 (mass %) | Additive-2 (mass %) | Solvent (mass ratio) |
|---|---|---|---|---|---|---|---|---|---|
| R-1 | Pol-01 (93.45) | — | PAG-2 (6.2) | — | N-1 (0.05) | — | — | W-6 (0.30) | SL-8/SL-1 (90/10) |
| R-2 | Pol-02 (93.67) | — | PAG-1 (5.8) | — | N-1 (0.05) | N-4 (0.18) | — | W-5 (0.30) | SL-8/SL-1 (90/10) |
| R-3 | Pol-03 (89.50) | — | PAG-5 (4.3) | PAG-4 (6.2) | — | — | — | — | SL-10 (100) |
| R-4 | Pol-01 (99.42) | — | — | — | N-4 (0.18) | — | — | W-6 (0.40) | SL-8 (100) |

TABLE 7-continued

| Resin Composition | Resin-A (mass %)* | Resin-B (mass %) | Acid Generator-A (mass %) | Acid Generator-B (mass %) | Basic Compound-A (mass %) | Basic Compound-B (mass %) | Additive-1 (mass %) | Additive-2 (mass %) | Solvent (mass ratio) |
|---|---|---|---|---|---|---|---|---|---|
| R-5 | Pol-02 (79.76) | Pol-03 (19.94) | — | — | — | — | — | W-1 (0.30) | SL-8 (100) |
| R-6 | Pol-04 (99.70) | — | — | — | — | — | — | W-3 (0.30) | SL-1/SL-3 (80/20) |
| R-7 | Pol-05 (99.70) | — | — | — | — | — | — | W-4 (0.30) | SL-2/SL-7 (98/2) |
| R-8 | Pol-06 (89.82) | Pol-13 (9.98) | — | — | — | — | — | W-6 (0.20) | SL-2/SL-7 (98/2) |
| R-9 | Pol-09 (79.84) | Pol-12 (19.96) | — | — | — | — | — | W-6 (0.20) | SL-1 (100) |
| R-10 | Pol-07 (99.70) | — | — | — | — | — | — | W-1 (0.30) | SL-1/SL-5 (70/30) |
| R-11 | Pol-11 (99.70) | — | — | — | — | — | — | W-6 (0.30) | SL-1 (100) |
| R-12 | Pol-14 (99.70) | — | — | — | — | — | — | W-1 (0.30) | SL-1/SL-4 (90/10) |

TABLE 8

| Resin Composition | Resin-A (mass %)* | Resin-B (mass %) | Acid Generator-A (mass %) | Acid Generator-B (mass %) | Basic Compound-A (mass %) | Basic Compound-B (mass %) | Additive-1 (mass %) | Additive-2 (mass %) | Solvent (mass ratio) |
|---|---|---|---|---|---|---|---|---|---|
| R-13 | Pol-10 (89.60) | Pol-08 (9.96) | — | — | N-5 (0.44) | — | — | — | SL-1/SL-6 (95/5) |
| R-14 | Pol-15 (91.32) | — | PAG-8 (8.2) | — | N-4 (0.18) | — | — | W-1 (0.30) | SL-2/SL-7 (98/2) |
| R-15 | Pol-13 (84.03) | — | PAG-1 (5.8) | PAG-7 (9.5) | N-1 (0.05) | N-3 (0.32) | — | W-6 (0.30) | SL-1/SL-5 (70/30) |
| R-16 | Pol-05 (94.22) | — | PAG-6 (5.3) | — | N-4 (0.18) | — | — | W-6 (0.30) | SL-1/SL-5 (70/30) |
| R-17 | Pol-07 (91.50) | — | PAG-8 (8.2) | — | — | — | — | W-6 (0.30) | SL-1/SL-6 (95/5) |
| R-18 | Pol-13 (93.90) | — | PAG-1 (5.8) | — | — | — | — | W-4 (0.30) | SL-1/SL-5 (80/20) |
| R-19 | Pol-14 (93.50) | — | PAG-2 (6.2) | — | — | — | — | W-3 (0.30) | SL-1 (100) |
| R-20 | Pol-06 (95.40) | — | PAG-5 (4.3) | — | — | — | — | W-6 (0.30) | SL-1/SL-3 (80/20) |
| R-21 | Pol-16 (99.70) | | — | — | — | — | — | W-2 (0.30) | SL-1/SL-5 (70/30) |
| R-22 | Pol-17 (99.40) | — | — | — | — | — | Ad-1 (0.30) | W-4 (0.30) | SL-1/SL-5 (70/30) |
| R-23 | Pol-17 (74.55) | Pol-08 (18.64) | PAG-2 (6.2) | — | N-2 (0.16) | — | Ad-3 (0.15) | W-6 (0.30) | SL-1/SL-5 (80/20) |
| R-24 | Pol-17 (94.40) | — | PAG-3 (5.1) | — | — | — | Ad-5 (0.20) | W-2 (0.30) | SL-1/SL-5 (80/20) |

TABLE 9

| Resin Composition | Resin-A (mass %)* | Resin-B (mass %) | Acid Generator-A (mass %) | Acid Generator-B (mass %) | Basic Compound-A (mass %) | Basic Compound-B (mass %) | Additive-1 (mass %) | Additive-2 (mass %) | Solvent (mass ratio) |
|---|---|---|---|---|---|---|---|---|---|
| R-25 | Pol-18 (93.58) | — | PAG-1 (5.8) | — | N-3 (0.32) | — | — | W-6 (0.30) | SL-8/SL-9 (90/10) |
| R-26 | Pol-19 (94.20) | — | PAG-1 (5.8) | — | — | — | — | — | SL-8/SL-1 (90/10) |
| R-27 | Pol-20 (59.71) | Pol-18 (39.81) | — | — | N-4 (0.18) | — | — | W-2 (0.30) | SL-8 (100) |
| R-28 | Pol-21 (99.70) | — | — | — | — | — | — | W-3 (0.30) | SL-1/SL-3 (80/20) |
| R-29 | Pol-22 (99.70) | — | — | — | — | — | — | W-4 (0.30) | SL-2/SL-7 (98/2) |
| R-30 | Pol-23 (79.84) | Pol-21 (19.96) | — | — | — | — | — | W-6 (0.20) | SL-1 (100) |
| R-31 | Pol-22 (99.68) | — | — | — | N-3 (0.32) | — | — | — | SL-1/SL-6 (95/5) |

TABLE 10

| Resin Composition | Resin-A (mass %)* | Resin-B (mass %) | Acid Generator-A (mass %) | Acid Generator-B (mass %) | Basic Compound-A (mass %) | Basic Compound-B (mass %) | Additive-1 (mass %) | Additive-2 (mass %) | Solvent (mass ratio) |
|---|---|---|---|---|---|---|---|---|---|
| R-32 | Pol-22 (91.00) | — | PAG-8 (8.2) | — | N-4 (0.18) | N-3 (0.32) | — | W-1 (0.30) | SL-1/SL-5 (80/20) |
| R-33 | Pol-21 (84.35) | — | PAG-1 (5.8) | PAG-7 (9.5) | N-1 (0.05) | — | — | W-6 (0.30) | SL-1 (100) |
| R-34 | Pol-22 (91.50) | — | PAG-8 (8.2) | — | — | — | — | W-6 (0.30) | SL-1/SL-3 (80/20) |
| R-35 | Pol-23 (93.90) | — | PAG-1 (5.8) | — | — | — | — | W-4 (0.30) | SL-1/SL-5 (70/30) |
| R-36 | Pol-24 (99.50) | — | — | — | — | — | Ad-2 (0.20) | W-3 (0.30) | SL-1/SL-5 (70/30) |
| R-37 | Pol-23 (99.23) | — | — | — | N-3 (0.32) | — | Ad-4 (0.15) | W-6 (0.30) | SL-1 (100) |
| R-38 | Pol-24 (93.60) | — | PAG-1 (5.8) | — | — | — | Ad-6 (0.30) | W-4 (0.30) | SL-1/SL-5 (80/20) |

Components and abbreviations in Tables 7 to 10 are as follows.
[Acid Generator]
PAG-1
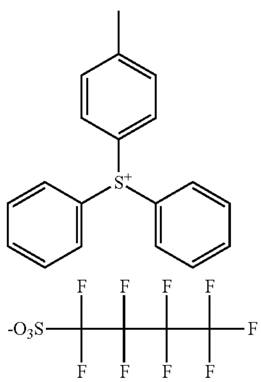
PAG-2
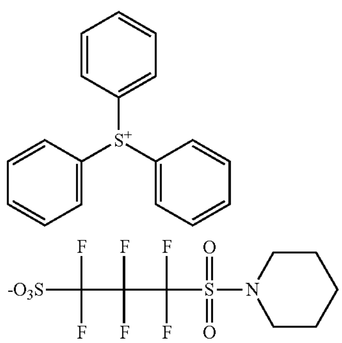
PAG-3
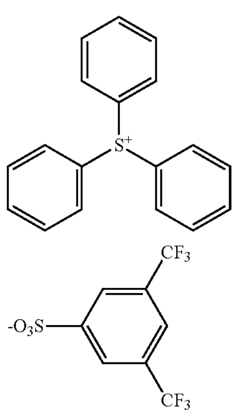
PAG-4
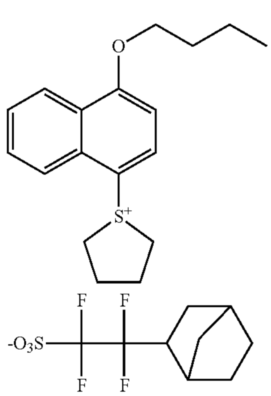
-continued
PAG-5
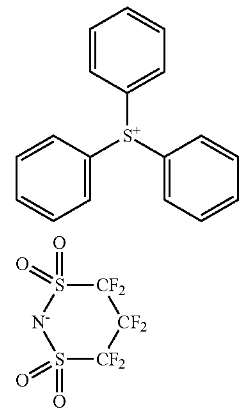
PAG-6
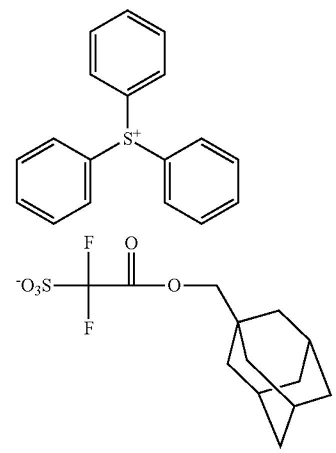
PAG-7
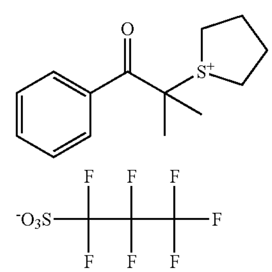
PAG-8
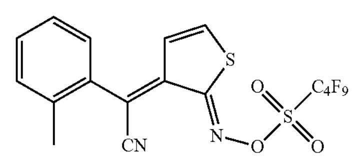
[Basic Compound ]
N-1
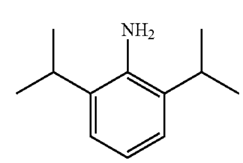
N-2
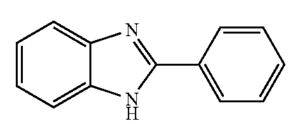

-continued

N-3

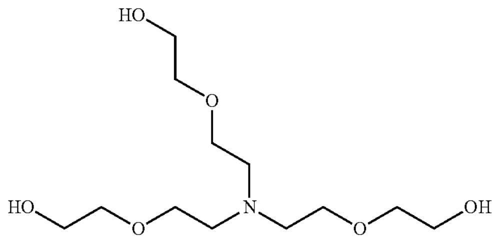

N-4

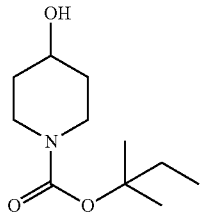

N-5

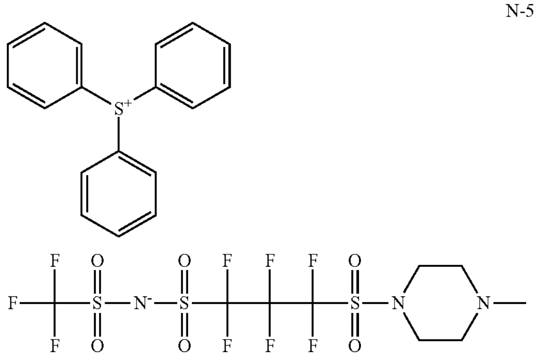

[Additive 1(Aromatic Compound)]

Ad-1

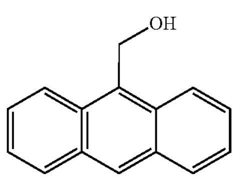

Ad-2

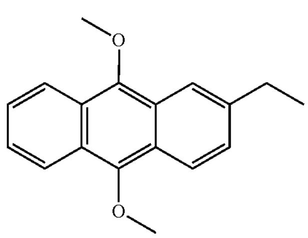

Ad-3

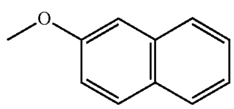

Ad-4

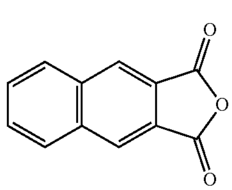

-continued

Ad-5

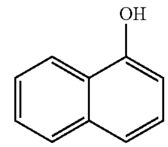

Ad-6

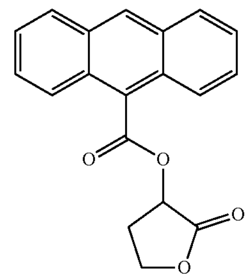

[Additive 2 (Surfactant)]

W-1: Megaface F176 (produced by Dainippon Ink and Chemicals, Inc.; fluorine-containing)

W-2: Megaface R08 (produced by Dainippon Ink and Chemicals, Inc.; fluorine- and silicon-containing)

W-3: Polysiloxane Polymer KP-341 (produced by Shin-Etsu Chemical Co., Ltd.; silicon-containing)

W-4: Troysol S-366 (produced by Troy Chemical)

W-5: KH-20 (produced by Asahi Glass Co., Ltd.)

W-6: PolyFox PF-6320 (produced by OMNOVA Solutions Inc., fluorine-containing)

[Solvent]

SL-1: Propylene glycol monomethyl ether acetate (PGMEA)

SL-2: Propylene glycol monomethyl ether propionate

SL-3: Ethyl lactate

SL-4: Propylene glycol monomethyl ether (PGME)

SL-5: Cyclohexanone

SL-6: γ-Butyrolactone

SL-7: Propylene carbonate

SL-8: 4-Methyl-2-pentanol

SL-9: Isobutyl isobutyrate

SL-10: Diisoamyl ether

The prepared resin composition was evaluated by the following methods.

Examples 1 to 19 and Comparative Example 1 (KrF Exposure)

An HMDS (hexamethyldisilazane) treatment (at 110° C. for 35 seconds) was applied to an 8-inch silicon wafer, and the first resin composition (resist composition) shown in the Table below was coated thereon and baked (Pre-Bake; PB) under the conditions shown in Table 11 below to form a bottom anti-reflective coating (lower layer) having the film thickness shown in the Table below. Subsequently, the second resist composition was coated on the obtained bottom anti-reflective coating and baked (PB) under the conditions shown in the Table below to form a resist film (upper layer) having the thickness shown in the Table below. In this way, a wafer having formed thereon a multi-layered film was obtained.

The obtained wafer was patternwise exposed through a binary mask having provided therein a trench pattern with a light-shielding part width of 170 nm and an opening part width of 270 nm (in Comparative Example 1, a binary mask having provided therein a trench pattern with a light-shielding part width of 270 nm and an opening part width of 170 nm) by using a KrF excimer laser scanner (PAS5500/850, manufactured by ASML) (NA: 0.80).

Thereafter, the wafer was baked (Post-Exposure Bake; PEB) under the conditions shown in the Table below, developed by puddling the developer shown in the Tale below for 30 seconds, rinsed by puddling the rinsing solution shown in the Table below (when the rinsing solution is not shown in the Table below, the rinsing was not performed), and then rotated at a rotational speed of 4,000 rpm for 30 seconds to obtain a pattern having a pitch of 440 nm and a trench width of 170 nm.

Examples 20 to 31 and Comparative Example 2 (ArF Exposure)

An HMDS (hexamethyldisilazane) treatment (at 110° C. for 35 seconds) was applied to an 8-inch silicon wafer, and the first resin composition (resist composition) shown in the Table below was coated thereon and baked (Pre-Bake; PB) under the conditions shown in Table 11 below to form a bottom anti-reflective coating (lower layer) having the film thickness shown in the Table below. Subsequently, the second resist composition was coated on the obtained bottom anti-reflective coating and baked (PB) under the conditions shown in the Table below to form a resist film (upper layer) having the thickness shown in the Table below. In this way, a wafer having formed thereon a multi-layered film was obtained.

The obtained wafer was patternwise exposed through a binary mask having provided therein a trench pattern with a light-shielding part width of 170 nm and an opening part width of 270 nm (in Comparative Example 2, a binary mask having provided therein a trench pattern with a light-shielding part width of 270 nm and an opening part width of 170 nm) by using an ArF excimer laser scanner (PAS5500/1100, manufactured by ASML) (NA: 0.75).

Thereafter, the wafer was baked (Post-Exposure Bake; PEB) under the conditions shown in the Table below, developed by puddling the developer shown in the Tale below for 30 seconds, rinsed by puddling the rinsing solution shown in the Table below (when the rinsing solution is not shown in the Table below, the rinsing was not performed), and then rotated at a rotational speed of 4,000 rpm for 30 seconds to obtain a pattern having a pitch of 440 nm and a trench width of 170 nm.

[Cross-Sectional Profile]

The cross-sectional profile of the obtained trench pattern was observed using a scanning electron microscope (S-4800) manufactured by Hitachi High-Technologies Corporation and evaluated as follows:

A: rectangular

B: slightly tapered or slightly reverse-tapered

C: tapered or reverse-tapered

[Scum Defect]

The number of scum defects (the number of scum defects per 8-inch silicon wafer) of the obtained pattern was counted and evaluated as follows:

AA: from 0 to 50 defects

A: from 51 to 100 defects

B: from 101 to 150 defects

C: 151 or more defects

The results of Examples by KrF Exposure and the results of Examples by ArF Exposure are shown in the Tables below, In the Tables below, for example, "100° C./60 s" means that heating is performed at 100° C. for 60 seconds. Abbreviations of developers and rinsing solutions in the Tables below stand for the followings.

[Developer/Rinsing Solution]

D-1: Butyl acetate

D-2: Pentyl acetate

D-3: 2-Heptanone

D-4: 1-Hexanol

D-5: 4-Methyl-2-pentanol

D-6: Decane

D-7: Octane

D-8: An aqueous 2.38 mass % TMAH (tetramethylammonium hydroxide) solution

D-9: Pure water

TABLE 11

(KrF Exposure)

| | Resist Film (upper layer) | | | Bottom Anti-Reflective Coating (lower layer) | | | | | | | |
|---|---|---|---|---|---|---|---|---|---|---|---|
| | Resin Composition | Film Thickness/ nm | PB | Resin Composition | Film Thickness/ nm | PB | PEB | Developer | Rinsing Solution | Cross-Sectional Profile | Scum Defect |
| Example 1 | R-1 | 100 | 100° C./60 s | R-6 | 100 | 100° C./60 s | 115° C./50 s | D-1 | — | A | AA |
| Example 2 | R-2 | 100 | 100° C./60 s | R-7 | 100 | 85° C./90 s | 100° C./50 s | D-1 | — | A | AA |
| Example 3 | R-1 | 100 | 100° C./50 s | R-8 | 100 | 100° C./60 s | 90° C./60 s | D-3 | D-4 | A | AA |
| Example 4 | R-1 | 100 | 90° C./60 s | R-9 | 90 | 140° C./60 s | 100° C./60 s | D-2 | D-7 | A | AA |
| Example 5 | R-2 | 80 | 100° C./60 s | R-10 | 140 | 100° C./60 s | 80° C./60 s | D-3 | — | A | AA |
| Example 6 | R-3 | 80 | 105° C./60 s | R-11 | 130 | 100° C./40 s | 125° C./60 s | D-2 | — | A | A |
| Example 7 | R-3 | 80 | 80° C./60 s | R-12 | 140 | 100° C./60 s | 80° C./60 s | D-1 | — | A | A |
| Example 8 | R-1 | 100 | 100° C./60 s | R-13 | 100 | 100° C./40 s | 100° C./60 s | D-1 | — | A | A |
| Example 9 | R-3 | 60 | 100° C./90 s | R-14 | 100 | 130° C./60 s | 85° C./90 s | D-1 | — | B | A |
| Example 10 | R-3 | 100 | 100° C./60 s | R-15 | 90 | 110° C./60 s | 100° C./60 s | D-1 | D-6 | B | A |
| Example 11 | R-3 | 80 | 100° C./60 s | R-16 | 90 | 120° C./60 s | 140° C./60 s | D-3 | — | B | A |
| Example 12 | R-1 | 100 | 140° C./60 s | R-17 | 100 | 100° C./60 s | 100° C./60 s | D-3 | — | B | A |
| Example 13 | R-3 | 60 | 100° C./60 s | R-18 | 140 | 105° C./50 s | 100° C./40 s | D-2 | — | B | B |
| Example 14 | R-5 | 100 | 100° C./40 s | R-19 | 140 | 90° C./50 s | 100° C./60 s | D-1 | — | B | B |
| Example 15 | R-4 | 100 | 105° C./60 s | R-20 | 100 | 100° C./60 s | 100° C./40 s | D-2 | D-5 | B | B |
| Example 16 | R-1 | 80 | 100° C./60 s | R-21 | 130 | 100° C./60 s | 130° C./60 s | D-1 | D-5 | A | AA |
| Example 17 | R-2 | 100 | 105° C./60 s | R-22 | 100 | 90° C./50 s | 110° C./60 s | D-1 | — | A | AA |
| Example 18 | R-2 | 100 | 100° C./60 s | R-23 | 100 | 110° C./60 s | 120° C./60 s | D-1 | — | B | AA |
| Example 19 | R-4 | 120 | 100° C./60 s | R-24 | 90 | 120° C./60 s | 120° C./60 s | D-1 | — | B | B |
| Comparative Example 1 | R-25 | 100 | 100° C./60 s | R-22 | 100 | 90° C./50 s | 130° C./60 s | D-8 | D-9 | C | C |

As apparent from Table 11 showing the results of Examples by KrF Exposure, in Examples using an organic developer, the scum on the substrate can be reduced and a pattern having a good cross-sectional profile can be formed, as compared with Comparative Example 1 using an alkali developer.

Also, in Examples 1 to 8, 16 and 17 where the resin composition for forming a resist film contains an acid generator and the resin composition for forming a bottom anti-reflective coating does not contain an acid generator, more excellent results are obtained in terms of the scum on substrate and the cross-sectional profile.

TABLE 12

(ArF Exposure)

| | Resist Film (upper layer) | | | Bottom Anti-Reflective Coating (lower layer) | | | | | | | |
|---|---|---|---|---|---|---|---|---|---|---|---|
| | Resin Composition | Film Thickness/nm | PB | Resin Composition | Film Thickness/nm | PB | PEB | Developer | Rinsing Solution | Cross-Sectional Profile | Scum Defect |
| Example 20 | R-25 | 100 | 100° C./60 s | R-28 | 100 | 130° C./60 s | 85° C./90 s | D-1 | — | A | AA |
| Example 21 | R-25 | 100 | 100° C./50 s | R-29 | 90 | 110° C./60 s | 100° C./60 s | D-1 | D-4 | A | AA |
| Example 22 | R-25 | 80 | 100° C./60 s | R-30 | 90 | 120° C./60 s | 140° C./60 s | D-3 | D-7 | A | AA |
| Example 23 | R-26 | 60 | 100° C./60 s | R-31 | 100 | 100° C./60 s | 100° C./60 s | D-3 | — | A | AA |
| Example 24 | R-26 | 100 | 100° C./40 s | R-32 | 140 | 105° C./50 s | 100° C./40 s | D-2 | — | A | A |
| Example 25 | R-26 | 100 | 105° C./60 s | R-33 | 140 | 90° C./50 s | 100° C./60 s | D-1 | — | A | A |
| Example 26 | R-27 | 80 | 100° C./60 s | R-34 | 100 | 100° C./60 s | 100° C./40 s | D-2 | — | B | B |
| Example 27 | R-27 | 100 | 100° C./60 s | R-35 | 130 | 100° C./40 s | 130° C./60 s | D-3 | — | B | B |
| Example 28 | R-27 | 100 | 100° C./60 s | R-34 | 140 | 100° C./60 s | 90° C./60 s | D-2 | D-5 | B | B |
| Example 29 | R-25 | 100 | 110° C./60 s | R-36 | 100 | 100° C./40 s | 110° C./60 s | D-1 | — | A | AA |
| Example 30 | R-26 | 100 | 100° C./60 s | R-37 | 100 | 110° C./60 s | 120° C./60 s | D-1 | — | A | A |
| Example 31 | R-27 | 100 | 100° C./60 s | R-38 | 100 | 100° C./40 s | 100° C./40 s | D-3 | — | B | B |
| Comparative Example 2 | R-25 | 100 | 100° C./60 s | R-29 | 100 | 100° C./40 s | 90° C./60 s | D-8 | D-9 | C | C |

As apparent from Table 12 showing the results of Examples by ArF Exposure, in Examples using an organic developer, the scum on the substrate can be reduced and a pattern having a good cross-sectional profile can be formed, as compared with Comparative Example using an alkali developer.

Also, in Examples 20 to 23, 29 and 30 where the resin composition for forming a resist film contains an acid generator and the resin composition for forming a bottom anti-reflective coating does not contain an acid generator, more excellent results are obtained in terms of the scum on substrate and the cross-sectional profile.

Industrial Applicability

According to the present invention, a pattern forming method ensuring that even in the case of forming a pattern having a fine space, scum on the substrate can be reduced and a pattern having a good cross-sectional profile can formed, a multi-layered resist pattern formed by the method, a multi-layered film for organic solvent development suitably used in the pattern forming method, a manufacturing method of an electronic device, and an electronic device can be provided.

This application is based on a Japanese patent application filed on Oct. 27, 2011 (Japanese Patent Application No. 2011-236456), and the contents thereof are incorporated herein by reference.

The invention claimed is:

1. A pattern forming method comprising:

(i) a step of forming a bottom anti-reflective coating on a substrate by using a first resin composition (I), (ii) a step of forming a resist film on the bottom anti-reflective coating by using a second resin composition (II), (iii) a step of exposing a multi-layered film having the bottom anti-reflective coating and the resist film, and (iv) a step of developing the bottom anti-reflective coating and the resist film in the exposed multi-layered film by using an organic solvent-containing developer to form a negative pattern, wherein the first resin composition (I) contains a first resin capable of increasing the polarity by the action of an acid to decrease the solubility for an organic solvent-containing developer, the second resin composition (II) contains a second resin capable of increasing the polarity by the action of an acid to decrease the solubility for an organic solvent-containing developer, at least either one of the first resin composition (I) and the second resin composition (II) contains a compound capable of generating an acid upon irradiation with an actinic ray or radiation, the first resin in the first resin composition (I) is a resin containing a repeating unit having an aromatic ring or the first resin composition (I) further contains an aromatic compound, and an amount of the organic solvent used in the organic developer in step (iv) is from 90 to 100 mass%, based on the entire amount of the developer.

2. The pattern forming method according to claim 1, wherein the content of a crosslinking agent selected from the group consisting of a crosslinking agent capable of crosslinking the first resin by the action of an acid to form a crosslinked product and a crosslinking agent capable of crosslinking to another crosslinking agent by the action of an acid to form a crosslinked product is 1 mass% or less based on the entire solid content of the first resin composition (I).

3. The pattern forming method according to claim 1, wherein the first resin composition (I) does not contain a crosslinking agent selected from the group consisting of a crosslinking agent capable of crosslinking the first resin by the action of an acid to form a crosslinked product and a crosslinking agent capable of crosslinking to another crosslinking agent by the action of an acid to form a crosslinked product.

4. The pattern forming method according to claim 1, wherein the weight average molecular weight of the first resin is from 1,000 to 200,000.

5. The pattern forming method according to claim 1, wherein the first resin composition (I) does not contain the compound capable of generating an acid upon irradiation with an actinic ray or radiation.

6. The pattern forming method according to claim 1, wherein the exposure in the step (iii) is exposure to an ArF excimer laser.

7. The pattern forming method according to claim 1, wherein the exposure in the step (iii) is exposure to a KrF excimer laser, and the first resin in the first resin composition (I) is a resin containing a repeating unit having a polycyclic aromatic group or the first resin composition (I) further contains a polycyclic aromatic compound.

8. The pattern forming method according to claim 1, wherein the organic solvent-containing developer is a developer containing at least one kind of an organic solvent selected from the group consisting of a ketone-based solvent, an ester-based solvent, an alcohol-based solvent, an amide-based solvent and an ether-based solvent.

9. The pattern forming method according to claim 1, wherein a water content ratio in the entire developer is less than 10 mass%.

10. The pattern forming method according to claim 1, wherein the developer contains substantially no water.

11. The pattern forming method according to claim 1, wherein the organic solvent-containing developer is a developer containing at least one kind of an organic solvent selected from the group consisting of a ketone-based solvent, an ester-based solvent, an amide-based solvent and an ether-based solvent.

12. The pattern forming method according to claim 1, wherein at least either one of the first resin composition (I) and the second resin composition (II) contains a basic compound.

13. The pattern forming method according to claim 12, wherein the first resin composition (I) contains a basic compound.

14. The pattern forming method according to claim 13, wherein the second resin composition (II) contains a basic compound.

15. The pattern forming method according to claim 1, wherein the solvent contained in the second resin composition (II) is an alcohol not having an oxygen atom except for a hydroxyl group, an ester compound having a carbon number of 7 or more, or an ether compound not having an oxygen atom except for an ether bond.

16. A multi-layered resist pattern formed by the pattern forming method according to claim 1.

17. A multi-layered film for organic solvent development, comprising:

a bottom anti-reflective coating formed on a substrate by using a first resin composition (I), and a resist film formed on the bottom anti-reflective coating by using a second resin composition (II), wherein the first resin composition (I) contains a first resin capable of increasing the polarity by the action of an acid to decrease the solubility for an organic solvent-containing developer, the second resin composition (II) contains a second resin capable of increasing the polarity by the action of an acid to decrease the solubility for an organic solvent-containing developer, at least either one of the first resin composition (I) and the second resin composition (II) contains a compound capable of generating an acid upon irradiation with an actinic ray or radiation, and the first resin in the first resin composition (I) is a resin containing a repeating unit having an aromatic ring or the first resin composition (I) further contains an aromatic compound.

18. A manufacturing method of an electronic device, comprising the pattern forming method according to claim 1.

19. An electronic device manufactured by the manufacturing method of an electronic device according to claim 18.

* * * * *